US007785971B1

(12) United States Patent
Bulucea et al.

(10) Patent No.: US 7,785,971 B1
(45) Date of Patent: Aug. 31, 2010

(54) FABRICATION OF COMPLEMENTARY FIELD-EFFECT TRANSISTORS WITH VERTICAL BODY-MATERIAL DOPANT PROFILES TAILORED TO ALLEVIATE PUNCHTHROUGH AND REDUCE CURRENT LEAKAGE

(75) Inventors: Constantin Bulucea, Milpitas, CA (US); Fu-Cheng Wang, San Jose, CA (US); Prasad Chaparala, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 567 days.

(21) Appl. No.: 11/703,350

(22) Filed: Feb. 6, 2007

Related U.S. Application Data

(60) Division of application No. 11/527,265, filed on Sep. 25, 2006, which is a division of application No. 10/922,035, filed on Aug. 18, 2004, now Pat. No. 7,145,191, which is a division of application No. 10/327,352, filed on Dec. 20, 2002, now Pat. No. 6,797,576, which is a continuation of application No. 09/947,012, filed on Sep. 4, 2001, now Pat. No. 6,599,804, which is a division of application No. 09/540,442, filed on Mar. 31, 2000, now Pat. No. 6,548,842.

(51) Int. Cl.
*H01L 21/336* (2006.01)
(52) U.S. Cl. .................. 438/290; 438/525; 257/402; 257/E27.061
(58) Field of Classification Search ................ 438/224, 438/290, 301–305, 308, 525, 526; 257/264, 257/402, 348, E27.061
See application file for complete search history.

(56) References Cited

U.S. PATENT DOCUMENTS

| 5,330,922 | A | 7/1994 | Erdeljac et al. | |
|---|---|---|---|---|
| 5,472,897 | A | 12/1995 | Hsu et al. | 437/44 |
| 5,548,143 | A | 8/1996 | Lee | 257/269 |
| 5,583,067 | A | 12/1996 | Sanchez | 437/44 |
| 5,605,855 | A | 2/1997 | Chang et al. | 437/45 |
| 5,719,081 | A | 2/1998 | Racanelli et al. | 438/290 |

(Continued)

OTHER PUBLICATIONS

Aoki et al., "Design and Performance of 0.1μm CMOS Devices Using Low-Impurity-Channel Transistors (LICT's)", *IEEE Elect. Dev. Lett.*, vol. 13, No. 1, Jan. 1992, pp. 50-52.

(Continued)

*Primary Examiner*—W. David Coleman
*Assistant Examiner*—Su C Kim
(74) *Attorney, Agent, or Firm*—Ronald J. Meetin

(57) ABSTRACT

Fabrication of complementary first and second insulated-gate field-effect transistors (110 or 112 and 120 or 122) from a semiconductor body entails separately introducing (i) three body-material dopants into the body material (50) for the first transistor so as to reach respective maximum dopant concentrations at three different locations in the first transistor's body material and (ii) two body-material dopants into the body material (130) for the second transistor so as to reach respective maximum dopant concentrations at two different locations in the second transistor's body material. Gate electrodes (74 or 94 and 154 or 194) are subsequently defined after which source/drain zones (60, 62 or 80, 82 and 140, 142 or 160, 162) are formed in the semiconductor body. The vertical dopant profiles resulting from the body-material dopants alleviate punchthrough and reduce current leakage.

52 Claims, 35 Drawing Sheets

U.S. PATENT DOCUMENTS

| | | | | |
|---|---|---|---|---|
| 5,719,422 | A | 2/1998 | Burr et al. | 257/336 |
| 5,773,863 | A | 6/1998 | Burr et al. | 257/344 |
| 5,963,801 | A | 10/1999 | Aronowitz et al. | |
| 6,051,482 | A | 4/2000 | Yang | 438/526 |
| 6,127,700 | A | 10/2000 | Bulucea | 257/335 |
| 6,194,293 | B1 | 2/2001 | Krivokapic | 438/525 |
| 6,197,668 | B1 | 3/2001 | Gardner et al. | 438/585 |
| 6,218,251 | B1 | 4/2001 | Kadosh et al. | 438/303 |
| 6,268,256 | B1 * | 7/2001 | Kuo | 438/305 |
| 6,297,114 | B1 | 10/2001 | Iwata et al. | 438/305 |
| 6,333,217 | B1 | 12/2001 | Umimoto et al. | 438/197 |
| 6,342,719 | B1 | 1/2002 | Arai | |
| 2001/0002719 | A1 * | 6/2001 | Shimizu et al. | 257/392 |
| 2002/0020888 | A1 * | 2/2002 | Yamashita et al. | 257/375 |

OTHER PUBLICATIONS

Davari et al, "A High-Performance 0.25-μm CMOS Technology: II-Technology", *IEEE Trans. Elect. Devs.*, vol. 39, No. 4, Apr. 1992, pp. 967-975.

Hwang et al, "Degradation of MOSFETs Drive Current Due to Halo Ion Implantation", *IEDM Tech. Dig.*, Int'l Elect. Devs. Meeting, Dec. 8-11, 1996, pp. 567-570.

Ogura et al, "A Half Micron MOSFET Using Double Implanted LDD", *IEDM Tech. Dig.*, Int'l Elect. Devs. Meeting, Dec. 11-15, 1982, pp. 718-721.

Su, "Tilt Angle Effect on Optimizing Halo PMOS Performance", 1997 Int'l Conf. Simulation Semicon. Procs. And Devs., Dec. 8-10, 1997, pp. 33-36.

Taur et al, "High Performance 0.1 μm CMOS Devices with 1.5 V Power Supply", *IEDM Tech. Dig.*, Int'l Elect. Devs. Meeting, Dec. 5-8, 1993, pp. 127-130.

* cited by examiner

Fig. 37
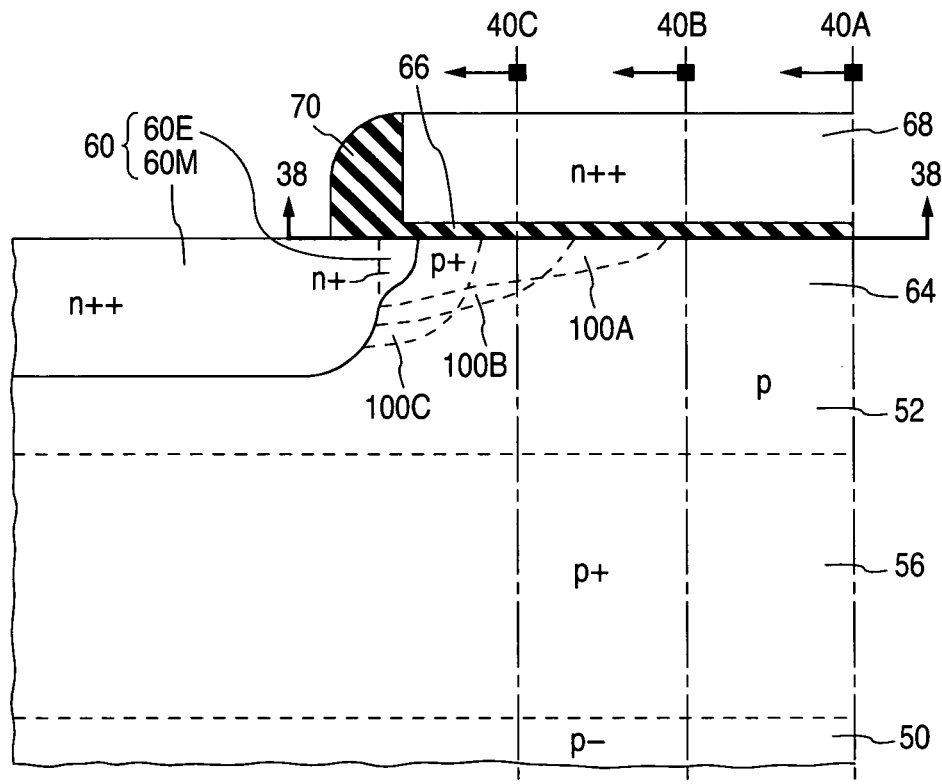
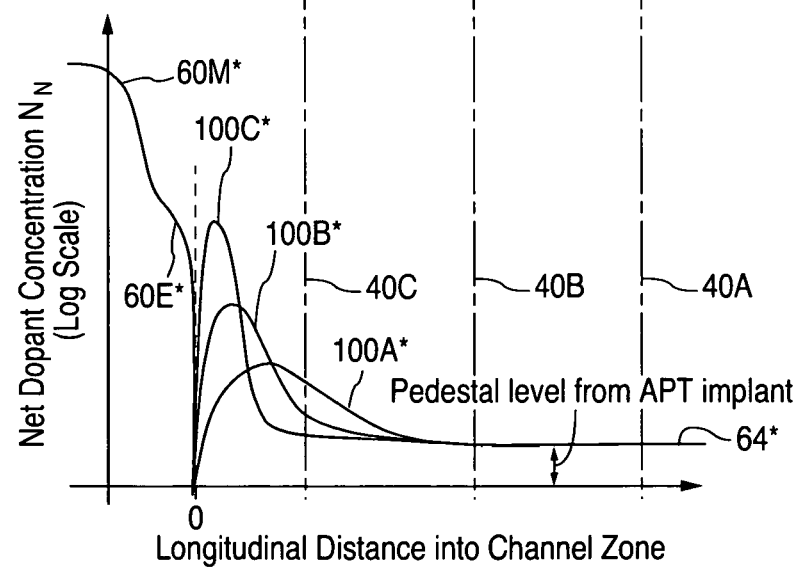
Fig. 38

FABRICATION OF COMPLEMENTARY FIELD-EFFECT TRANSISTORS WITH VERTICAL BODY-MATERIAL DOPANT PROFILES TAILORED TO ALLEVIATE PUNCHTHROUGH AND REDUCE CURRENT LEAKAGE

CROSS-REFERENCE TO RELATED APPLICATIONS

This is a division of U.S. patent application Ser. No. 11/527,265, filed 25 Sep. 2006, which is a division of U.S. patent application Ser. No. 10/922,035, filed 18 Aug. 2004, now U.S. Pat. No. 7,145,191 B1, which is a division of U.S. patent application Ser. No. 10/327,352, filed 20 Dec. 2002, now U.S. Pat. No. 6,797,576 B1, which is a continuation of U.S. patent application Ser. No. 09/947,012, filed 4 Sep. 2001, now U.S. Pat. No. 6,599,804 B2, which is a division of U.S. patent application Ser. No. 09/540,442, filed 31 Mar. 2000, now U.S. Pat. No. 6,548,842 B1.

FIELD OF USE

This invention relates to semiconductor technology and, in particular, to field-effect transistors ("FETs") of the insulated-gate type. All of the insulated-gate FETs ("IGFETs") described below are surface-channel enhancement-mode IGFETs except as otherwise indicated.

BACKGROUND

An IGFET is a semiconductor device in which a gate dielectric layer electrically insulates a gate electrode from a channel zone that extends between a source and a drain in a semiconductor body. The channel zone in an enhancement-mode IGFET is part of a body region, commonly termed the substrate or substrate region, that forms respective pn junctions with the source and drain. In an enhancement-mode IGFET, the channel zone consists of all the semiconductor body material situated between the source and drain. During operation of an enhancement-mode IGFET, charge carriers move from the source to the drain through a channel induced in the channel zone along the upper semiconductor surface. The channel length is the distance between the source and drain along the upper semiconductor surface.

Over the last forty years, the minimum value of IGFET channel length has decreased generally in the manner prescribed by Moore, "Progress in Digital Integrated Electronics," *Tech. Dig.*, 1975 Int'l Elec. Devs. Meeting, 1-3 Dec. 1975, pages 11-13. Per Moore's "law", the minimum channel length decreases roughly in proportion to a factor of $1/\sqrt{2}$ (approximately 0.7) every three years. IGFETs employed in state-of-the-art integrated circuits ("ICs") manufactured at volume-production quantities today have minimum channel lengths considerably less than 1 μm, typically 0.25 μm and moving towards 0.18 μm. The minimum channel length for volume-production ICs is expected to be roughly 0.1 μm in eight to ten years.

An IGFET that behaves generally in the way prescribed by the classical model for an IGFET is often characterized as a "long-channel" device. An IGFET is described as a "short-channel" device when the channel length is shortened to such an extent that the IGFET's behavior deviates significantly from the behavior of the classical IGFET model. Both short-channel and long-channel IGFETs are variously employed in ICs. Because drive current generally increases with decreasing channel length, the great majority of IGFETs used in very large scale integration applications are laid out to have as small a channel length as can be reliably produced with the available lithographic technology.

One short-channel effect is roll-off of the threshold voltage. See (a) Yau, "A Simple Theory to Predict the Threshold Voltage of Short-Channel IGFET's", *Solid-State Electronics*, October 1974, pages 1059-1069, and (b) Liu et al, "Threshold Voltage Model for Deep-Submicrometer MOSFET's", *IEEE Trans. Elec. Devs.*, Vol. 40, No. 1, January 1993, pages 86-95. The threshold voltage is the value of gate-to-source voltage at which an IGFET switches between its on and off states for given definitions of the on and off states.

FIG. 1 illustrates a typical example of how threshold voltage $V_T$ rolls off for a conventional n-channel enhancement-mode IGFET whose parameters, other than channel length L, are fixed. As FIG. 1 indicates, threshold voltage $V_T$ has relatively little variation in the long-channel regime where channel length L is greater than transition value $L_X$ approximately equal to 0.4 μm here. When channel length L drops below $L_X$, the IGFET enters the short-channel regime in which threshold voltage $V_T$ rolls off sharply to zero.

In designing IGFETs with increasingly reduced channel length, an important trade-off is between drive current and leakage current. The drive current, preferably high, is the current that flows between the source and drain when the IGFET is turned fully on. The leakage current, preferably low, is the current that flows between the source and drain when the IGFET is turned off with the gate electrode electrically shorted to the source. Decreasing the channel length typically leads to an increase in the drive current. However, the leakage current also typically increases when the channel length is reduced.

Due to the foregoing trade-off, a short-channel IGFET is typically designed so that channel length L is of a value close to where threshold voltage $V_T$ starts to roll off sharply to zero. An L value of 0.25 μm satisfies this requirement in FIG. 1. The resulting $V_T$ value of slightly more than 0.5 V is sufficiently high to enable a 0.25-μm n-channel IGFET to switch reliably between its on and off states. However, threshold voltage $V_T$ for an n-channel IGFET having an L value of 0.18 μm, as occurs in the next generation of IGFETs, is approximately 0.2 V. This is too low to be able to reliably turn such a 0.18-μm IGFET off at zero gate-to-source voltage, especially in light of typical manufacturing variations.

The scaling principles developed by Dennard et al, "Design of Ion-Implanted MOSFET's with Very Small Physical Dimensions" *IEEE J. Solid-State Circs.*, Vol. SC-9, No. 5, October 1974, pages 256-268, have been utilized in downsizing IGFETs. In brief, Dennard et al specifies that IGFET dimensions are to be reduced approximately in proportion to a given scaling factor as the average net dopant concentration in the channel zone, i.e., the semiconductor body material situated between the source and drain in an enhancement-mode IGFET, is increased by the scaling factor. The voltages across various parts of the reduced-dimension IGFET are also generally to be reduced in proportion to the scaling factor.

The scaling theory of Dennard et al functions relatively well down to channel length in the vicinity of 1 μm. Unfortunately, certain scaling limitations are encountered when the channel length is reduced significantly below 1 μm. For example, electron tunneling effects preclude reducing the gate dielectric thickness to the value prescribed by the scaling theory.

Also, when the threshold voltage is to be adjusted by simply implanting the channel zone with ions of the same conductivity type as the channel zone, it is typically preferable that the threshold adjust implant be distinguishable from the vertical dopant profile in the bulk of the channel zone. In scaling an IGFET to channel length significantly less than 1 µm according to the theory of Dennard et al, the threshold adjust implant merges inseparably into the vertical dopant profile in the bulk of the channel zone, thereby simply raising the average net dopant concentration in the channel zone by an approximately fixed amount that is largely independent of channel length. Attempting to extend the scaling theory to channel length significantly less than 1 µm does not work well.

Various techniques have been utilized to improve the performance of IGFETs, including those operating in the short-channel regime, as IGFET dimensions are reduced. One performance-improvement technique involves providing an IGFET with a two-part drain for reducing hot carrier injection. FIG. 2 illustrates such a conventional n-channel enhancement-mode IGFET 10 created from a monocrystalline silicon semiconductor body having region 12 of lightly doped p-type body material. IGFET 10 has n-type source 14, n-type drain 16, intervening p-type channel zone 18, gate electrode 20, gate dielectric layer 22, and gate sidewall spacers 24 and 26. Drain 16 consists of heavily doped main portion 16M and more lightly doped extension 16E. Source 14 similarly consists of heavily doped main portion 14M and more lightly doped extension 14E. When IGFET 10 is turned on, electrons travel from source 14 to drain 16 by way of a thin channel induced in channel zone 18 along the upper semiconductor surface.

A pair of depletion regions extend respectively along the drain/body and source/body junctions. Under certain conditions, especially when the channel length is small, the drain depletion region can extend laterally to the source depletion region and merge with it below the upper semiconductor surface. This phenomenon is termed punchthrough. If the drain depletion region punches through to the source depletion region, the operation of the IGFET cannot be controlled with the gate electrode. Accordingly, punchthrough normally needs to be avoided.

One conventional technique for inhibiting punchthrough as channel length is reduced, and also for shifting threshold voltage roll-off to shorter channel length, is to increase the dopant concentration of the channel zone in a pocket portion along the source. See Ogura et al, "A Half Micron MOSFET Using Double Implanted LDD," *IEDM Tech. Dig.*, Int'l Elec. Devs. Meeting, 11-15 Dec. 1982, pages 718-721. As an artifact of creating the increased-concentration pocket portion along the source, the dopant concentration in the channel zone is commonly increased in a corresponding pocket portion along the drain. Per Codella et al, "Halo Doping Effects in Submicron DI-LDD Device Design," *IEDM Tech. Dig.*, Int'l Elec. Devs. Meeting, 1-4 Dec. 1985, pages 230-233, the pocket portions are commonly referred to as "halo".

Increasing the dopant concentration in a halo pocket along the source reduces the thickness of the channel-zone part of the source depletion region, thereby deferring the onset of punchthrough. As the channel length is reduced, the halo pockets along the source and drain get closer together so as to increase the average net dopant concentration in the channel zone. This causes the threshold voltage to increase, thereby partially counteracting threshold voltage roll-off at short channel length.

FIG. 3 depicts a conventional n-channel enhancement-mode halo IGFET 30 as configured in Ogura et al or Codella et al. Except as described below, IGFET 30 contains the same regions as IGFET 10 in FIG. 2. As shown in FIG. 3, channel zone 18 in n-channel IGFET 30 includes a pair of p-type halo pocket portions 31 and 32 doped more heavily than the remainder of channel zone 18. Halo pockets 31 and 32 are situated along the inner boundaries of source 14 and drain 16 so as to inhibit punchthrough. Metal silicide layers 33, 34, and 35 respectively contact main source portion 14M, main drain portion 16M, and gate electrode 20.

Halo pockets 31 and 32 can be created in various ways. For example, p-type halo dopant is typically ion implanted through the upper semiconductor surface into the semiconductor body using gate electrode 20 as an implantation shield. The halo implant can be performed roughly perpendicular to the upper semiconductor surface as indicated in Ogura et al.

The halo implant can also be performed at a substantial angle to a perpendicular to the upper semiconductor surface. In this regard, see (a) Su, "Tilt Angle Effect on Optimizing HALO PMOS Performance," 1997 Int'l Conf. Simulation Semicon. Procs. and Devs., 8-10 Sep. 1997, pages 33-36, (b) Rodder et al, "A Sub-0.18 µm Gate Length CMOS Technology for High Performance (1.5 V) and Low Power (1.0 V)," *IEDM Tech. Dig.*, Int'l Elec. Devs. Meeting, 8-11 Dec. 1996, pages 563-566, (c) Hori, "A 0.1-µm CMOS Technology with Tilt-Implanted Punchthrough Stopper (TIPS)," *IEDM Tech. Dig.*, Int'l Elec. Devs. Meeting, 11-14 Dec. 1994, pages 75-78, and (d) Hwang et al, "Degradation of MOSFETs Drive Current Due to Halo Ion Implantation," *IEDM Tech. Dig.*, Int'l Elec. Devs. Meeting, 8-11 Dec. 1996, pages 567-570.

The threshold voltage of n-channel IGFET 30 is adjusted by introducing p-type dopant, typically boron, into a portion 36 of channel zone 18. The threshold adjust dopant typically has a retrograde dopant concentration profile in that the maximum concentration of the threshold adjust dopant occurs below the upper semiconductor surface. The maximum concentration of the threshold adjust dopant may occur in, or below, a depletion region that extends across channel zone 18 along the upper semiconductor surface during IGFET operation. For example, the information presented in Ogura et al indicates that the maximum concentration of the threshold adjust dopant in Ogura et al occurs in the surface depletion region slightly more than 0.1 µm below the upper semiconductor surface. As a result, the magnitude of the threshold voltage adjustment in Ogura et al is determined primarily by the dosage of the p-type dopant.

Shahidi et al, "High Performance Devices for a 0.15 µm CMOS Technology," *IEEE Elect. Dev. Lett.*, Vol. 14, No. 10, October 1993, pages 466-468, and Taur et al, "High Performance 0.1 µm CMOS Devices with 1.5 V Power Supply," *IEDM Tech. Dig.*, Int'l Elec. Devs. Meeting 1993, pages 127-130, describe embodiments of IGFET 30 in which p-type dopant is introduced into channel zone 18 in such a manner that the maximum concentration of the implanted dopant occurs 0.07-0.10 µm below the upper semiconductor surface. Instead of boron, Shahidi et al employs indium, a slow-diffusing species, as the p-type dopant for the implant into channel zone 18. Shahidi also employs indium for the halo pockets. While indium may provide profile steepness and better short-channel behavior, indium is not commonly used in semiconductor manufacturing processes and may cause process implementation difficulties.

Hwang et al, cited above, describes an n-channel IGFET in which a p-type implant is performed relatively deep into the channel zone in order to alleviate punchthrough. The depth of the maximum concentration of the p-type anti-punchthrough implant in this IGFET of Hwang et al appears to occur below the channel surface depletion region. In comparing a halo IGFET to an IGFET having an anti-punchthrough implant but no halo pocket(s), Hwang et al determines that less threshold voltage roll-off occurs in the halo IGFET.

Conventional semiconductor manufacturing processes achieve varying degrees of success in avoiding punchthrough and alleviating threshold voltage roll-off. It is desirable to have an IGFET structure and fabrication technique for overcoming these problems. In so doing, it is desirable to avoid use of semiconductor dopants which are not widely employed in volume-production IC fabrication and which could cause manufacturing difficulties. It is also desirable to have a semiconductor structure in which different IGFETs can readily be provided with different threshold voltages.

GENERAL DISCLOSURE OF THE INVENTION

The present invention furnishes an insulated-gate field-effect transistor whose doping is controlled to alleviate threshold voltage roll-off and avoid punchthrough at short channel length. The average doping in the channel zone of the present IGFET changes with channel length in such a manner that the variation of threshold voltage with channel length in the short-channel operational regime where threshold voltage roll-off occurs in an otherwise conventional IGFET is considerably less than in the conventional IGFET. The channel length of the present IGFET can thereby be reduced below the normal value at which threshold voltage roll-off occurs without having the magnitude of the threshold voltage drop significantly. Fabrication variations that result in unintended channel length differences do not lead to substantial threshold voltage differences in the present IGFET.

More particularly, the channel zone of the present IGFET is situated in body material of a semiconductor body. The channel zone laterally separates a pair of source/drain zones situated in the semiconductor body along its upper surface. The source/drain zones form pn junctions with the body material. A gate electrode overlies a gate dielectric layer above the channel zone.

The dopant profile of the present IGFET has two important characteristics, one directed primarily towards alleviating short-channel threshold voltage roll-off and the other directed primarily towards alleviating punchthrough. The first characteristic is that the net dopant concentration of the channel zone along the upper semiconductor surface longitudinally reaches a local surface minimum between the source/drain zones. The channel dopant profile along the upper semiconductor surface in the longitudinal direction, i.e., along the IGFET's channel length, thus typically has at least a half-saddle shape, typically a full saddle shape.

The average value of the channel zone's net dopant concentration normally increases with decreasing channel length for a given amount of semiconductor dopant (per unit channel width) producing the channel surface dopant profile. By arranging for the average net dopant concentration of the channel zone to vary in this manner, the magnitude of the threshold voltage of the present IGFET increases slowly with decreasing channel length in passing through the value of channel length at which short-channel threshold voltage roll-off starts to occur in an otherwise similar conventional IGFET. Since the magnitude of the threshold voltage of the present IGFET increases with decreasing channel length in this short-channel operational regime rather than decreasing sharply with decreasing channel length, the variation of the threshold voltage with channel length in the short-channel regime is considerably less than in the conventional IGFET. The onset of threshold voltage roll-off in the present IGFET is thereby advantageously shifted to lower channel length.

The second important characteristic of the dopant profile of the present IGFET is that the net dopant concentration of the body material reaches a local subsurface maximum more than 0.1 μm below the upper semiconductor surface but not more than 0.4 μm below the upper semiconductor surface. Also, the local subsurface maximum of the body material's net dopant concentration occurs below a channel surface depletion region that extends along the upper semiconductor surface into the channel zone. The local subsurface maximum of the body material's net dopant concentration normally exceeds the local surface minimum of the channel zone's net dopant concentration. The vertical dopant profile through the local subsurface minimum is therefore of a retrograde nature.

The semiconductor dopant which produces the local subsurface maximum in the body material's net dopant concentration causes the thicknesses of the body-material portions of the depletion regions along the source/drain zones to be reduced at a given voltage between the source/drain zones. The source/drain zone acting as the drain (at any particular time) is thereby inhibited from punching through to the source/drain zone acting as the source.

A feature of the present invention is that the gate dielectric layer is typically 2-10 nm in thickness. While the gate dielectric layer normally contains atoms of semiconductor material, typically silicon, and atoms of oxygen combined to form semiconductor oxide, typically silicon oxide, atoms of nitrogen may also be incorporated into the gate dielectric layer. That is, the gate dielectric layer may contain semiconductor oxynitride, typically silicon oxynitride.

In a structure containing two implementations of the present IGFET, the channel zones of the two IGFETs can readily be of sufficiently different length that the IGFETs differ significantly in threshold voltage. With the local surface minima in the net dopant concentrations of the channel zones being produced by approximately equal amounts of semiconductor dopant (per unit channel width) as occurs when IGFETs are manufactured under largely identical fabrication process conditions, the shorter channel zone normally has the higher average net dopant concentration. Accordingly, the FET with the shorter channel zone normally has the higher magnitude of threshold voltage.

While two IGFETs with significantly different threshold voltages can be provided in the same structure of the invention by suitably choosing the channel lengths, two such IGFETs can also be provided in different structures. In other words, identical fabrication process conditions can be employed to provide separate structures with IGFETs of significantly different threshold voltage by simply making the channel lengths sufficiently different.

Fabrication of an IGFET in accordance with the invention begins with a semiconductor body having body material of a first conductivity type. First semiconductor dopant, referred to here as the anti-punchthrough ("APT") dopant, of the first conductivity type is introduced into the body material. This doping step is performed in such a manner that, subsequent to providing an electrically insulated gate electrode above a portion of the body material intended to be a channel zone, the maximum concentration of the APT dopant occurs more than 0.1 μm into the body material but not more than 0.4 μm into the body material. The maximum concentration of the APT dopant also occurs below the location where a channel surface depletion region extends into the channel zone during IGFET operation. The doping characteristic achieved with the APT dopant provides punchthrough protection.

The APT dopant is normally ion implanted into the body material. Since the maximum concentration of the APT dopant occurs below the channel surface depletion region, substantially only part of the "head" (upper portion) of the implant of the APT dopant affects the IGFET's threshold voltage. Consequently, the threshold voltage can be controlled largely independent of channel length by simply adjusting the implantation energy. As the implantation energy increases, less of the APT dopant accumulates in the channel surface depletion region, thereby causing the magnitude of the threshold voltage to be reduced. The ability to control the threshold voltage by adjusting the implantation energy provides enhanced flexibility over a conventional threshold adjust implant in which adjustment of the implantation dosage is the primary mechanism for controlling the threshold voltage.

Later in the fabrication process after forming the gate electrode, second semiconductor dopant, referred to here as the halo dopant, of the first conductivity type is introduced into at least the intended channel-zone portion of the body material. Also, dopant, referred to here as the source/drain dopant, of a second conductivity type opposite to the first conductivity type is introduced into the semiconductor body to form a pair of source/drain zones laterally separated by the channel zone. These doping operations are performed in a way that enables the concentration of the halo dopant to longitudinally reach a local surface minimum in the channel zone along the upper semiconductor surface. The doping characteristic provided by the halo dopant alleviates short-channel threshold voltage roll-off and assists the APT dopant in providing punch-through protection.

The halo and source/drain dopants enter the body material by passing through the upper semiconductor surface. A shield formed with at least the gate electrode is preferably utilized to largely prevent the halo and source/drain dopants from passing through the section of the upper semiconductor surface underlying at least the gate electrode. The doping operation with the source/drain dopant may be performed in at least two separate steps so as to form each source/drain zone as a main portion and a more lightly doped extension. The channel zone is terminated by the source/drain extensions along the upper semiconductor surface.

The halo dopant forms one or more pocket portions akin to halo when the halo dopant is introduced into the intended channel-zone portion of the body material using a dopant-blocking shield consisting of at least the gate electrode. Angled ion implantation is preferably employed to introduce the halo dopant into the channel-zone portion of the body material. Specifically, ions of the halo dopant are implanted into the channel-zone portion of the body material at an average tilt angle of at least 15° relative to a direction generally perpendicular to the upper semiconductor surface. By using angled ion implantation, the halo dopant can be placed where it yields a large reduction in short-channel threshold voltage roll-off.

An additional feature of the present invention is that each source/drain zone can have a vertically "graded" junction characteristic. That is, in moving upward from the pn junction between a source/drain zone and the adjoining body material, the net dopant concentration in a vertical cross-section through the source/drain zone rises less sharply, on the average, to the maximum value of the net dopant concentration in that vertical cross-section than what would occur if the semiconductor dopant which defines the source/drain zone across that vertical cross-section were ion implanted at largely a single energy. The graded-junction characteristic reduces the junction capacitance, thereby leading to an increase in the IGFET switching speed.

The graded-junction characteristic is attained by configuring each source/drain zone to have a main source/drain portion and a more lightly doped lower source/drain portion which underlies, and is vertically continuous with, the main source/drain portion. In fabricating the present IGFET to have a vertically graded pn junction, first semiconductor of the second conductivity type is introduced into the semiconductor body at a first dosage and to a first average depth (below the upper semiconductor surface). Second semiconductor dopant of the second conductivity type is introduced into the semiconductor body at a second dosage less than the first dosage and to a second average depth greater than the first average depth such that the first dopant of the second conductivity type defines the main source/drain portions while the second dopant of the second conductivity type defines the more lightly doped lower source/drain portions.

More generally, a p-channel IGFET configured in accordance with the invention contains a channel zone situated in a semiconductor body having an upper surface. A gate electrode overlies a gate dielectric layer above the channel zone. The channel zone laterally separates a pair of p-type source/drain zones of the semiconductor body. Each p-type source/drain zone has a main source/drain portion and a more lightly doped lower source/drain portion underlying, and vertically continuous with, the main portion. Consequently, the p-channel IGFET has a graded-junction characteristic.

Fabrication of such a graded junction p-channel IGFET entails providing the gate electrode over the gate dielectric layer above a location for the channel zone in the semiconductor body. First, p-type semiconductor dopant is introduced, typically by ion implanting a species of the first p-type dopant, into the semiconductor body at a first dosage and to a first average depth. Second, p-type semiconductor dopant is introduced, likewise typically by ion implanting a species of the second p-type dopant, into the semiconductor body at a second dosage less than the first dosage and to a second average depth greater than the first average depth. The dopant-introduction steps are controlled so that the first p-type dopant defines the main portions of the source/drain zones, so that the second p-type dopant defines the lower source/drain portions, and so that the lower portions are more lightly doped than, and respectively vertically continuous with, the main portions.

The p-type dopant species, typically a boron-containing compound such as boron difluoride, employed in defining the main portions of the source/drain zones is preferably of greater molecular weight than the p-type dopant species, typically elemental boron, utilized in defining the lower source/drain portions. With boron being an atom of relatively low molecular weight and with the main source/drain portions being shallower than the lower source/drain portions, one reason for this difference in dopant species is that it is difficult to reliably control typical commercially available state-of-the-art ion-implantation equipment at the low implantation energy (e.g., 5 KeV) which would generally be appropriate if elemental boron were the p-type species utilized to define the main source/drain portions. Performing the implantation to define the main source/drain portions with a p-type dopant species, e.g., boron difluoride, of greater molecular weight than the p-type dopant species, e.g., elemental boron, utilized to define the lower source/drain portions thus facilitates accurately forming the graded-junction characteristic.

In short, an IGFET configured and fabricated according to the invention normally has a dopant profile that causes the onset of short-channel threshold voltage roll-off to be shifted to lower channel length than occurs in an otherwise similar conventional IGFET. Punchthrough is substantially alleviated in the present invention. The threshold voltage can be controlled largely independent of channel length by adjusting the energy of implanted ions of dopant utilized to avoid punchthrough. For the same, or substantially the same, fabrication process conditions, IGFETs of significantly different threshold voltage are achieved by simply utilizing appropriately different channel lengths. An IGFET, especially a p-type channel device, configured and fabricated according to the invention, can be provided with a graded-junction characteristic. The invention thus provides a large advance over the prior art.

BRIEF DESCRIPTION OF THE DRAWINGS

FIG. 19b is an experimental graph of extrapolated leakage current density as a function of drive current density for symmetrical n-channel IGFETs manufactured according to the invention at the APT and halo dosages of FIG. 19a.

FIG. 31b is an experimental graph of extrapolated leakage current density as a function of drive current density for symmetrical n-channel IGFETs manufactured according to the invention at the two rapid thermal anneal times of FIG. 31a.

FIG. 37 is a front cross-sectional view for a model of how dopant redistribution varies with channel length in three symmetrical long n-channel IGFETs configured according to the invention to be of different channel lengths.

FIG. 38 is a graph of net dopant concentration as a function of longitudinal distance into the channel zone for each of the n-channel IGFETs in the model of FIG. 37. The dopant profile of FIG. 38 is taken along plane 38-38 in FIG. 37.

Like reference symbols are employed in the drawings and in the description of the preferred embodiments to represent the same, or very similar, item or items.

DESCRIPTION OF THE PREFERRED EMBODIMENTS

Reference Notation and Other Conventions

Figure 1:
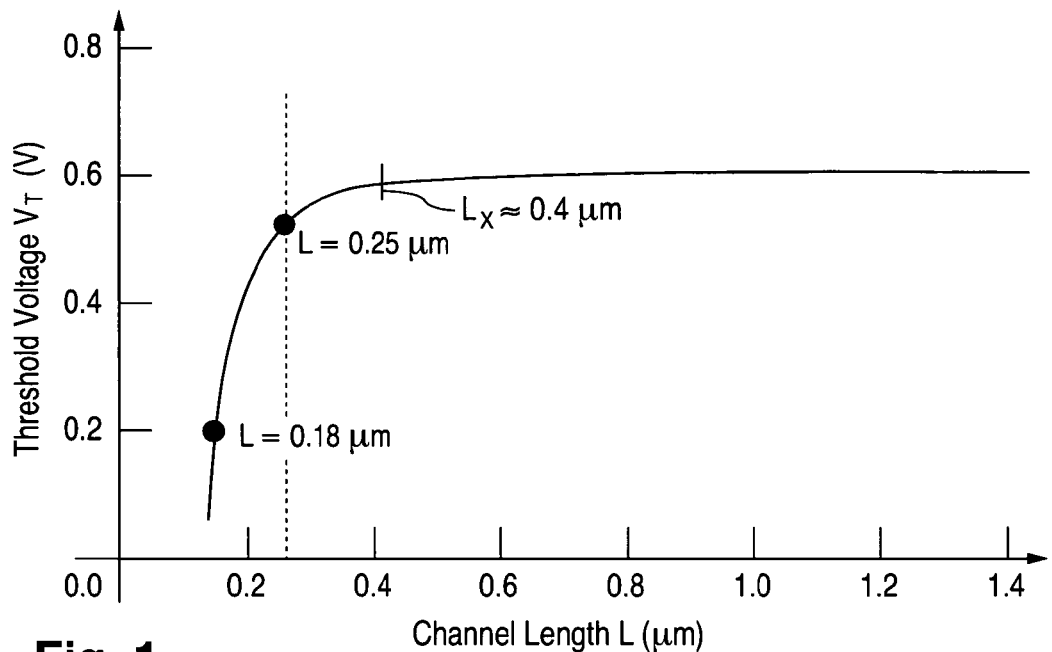
FIG. 1 is a graph of threshold voltage as a function of channel length for a conventional n-channel IGFET.
Figure 2:
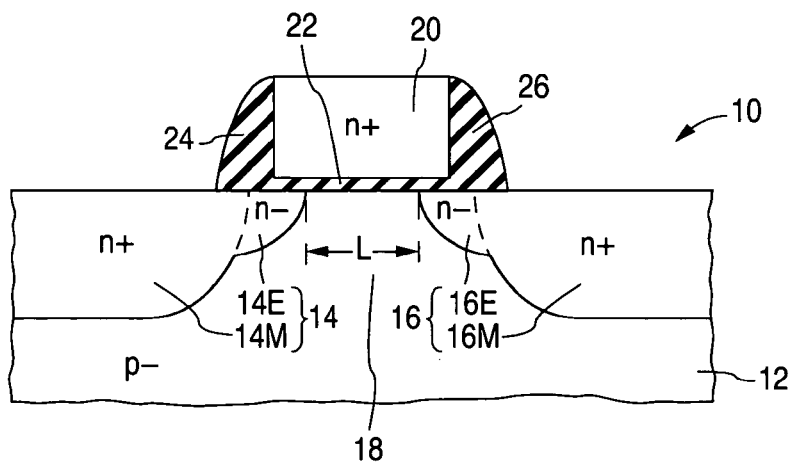
FIGS. 2 and 3 are front cross-sectional views of conventional n-channel IGFETs.
Figure 3:
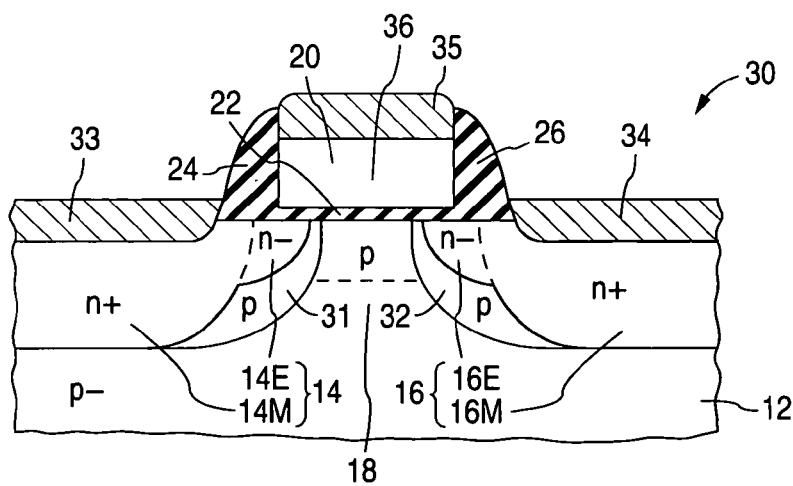

The reference symbols employed below and in the drawings have the following meanings:

A≡a halo dopant atom
AI≡a pair of dopant atom A and interstitial atom I
a≡a experimentally determined coefficient
b≡a experimentally determined coefficient
$C_{(A)}^{TOT}$≡total concentration (single and paired) of dopant atom A in crystal
$C_{GD}$≡a gate dielectric capacitance per unit area
$C_J$≡a capacitance per unit area of pn junction between body material and source/drain zone
c≡a lateral distance from gate electrode structure across location of source/drain zone to field-insulation region in direction along channel lengths
$D_{(A0)}$≡equilibrium diffusion constant of halo dopant atoms A
$DOSE_{APT}$≡a dosage of ions of anti-punchthrough dopant
$DOSE_{Halo}$≡a dosage of ions of halo dopant
$d_G$≡a lateral distance between gate electrode structures in direction along channel length of IGFET receiving halo ion implantation
$d_{Gmin}$≡minimum tolerable value of distance $d_G$
$d_M$≡lateral distance from gate electrode structure across location of source/drain zone to photoresist mask
$d_{Mmax}$≡maximum tolerable value of distance $d_M$
$d_{Mmin}$≡minimum tolerable value of distance $d_M$
$E_{BF2}$≡implantation energy of ions of boron difluoride during formation of main portions of p-type source/drain zones
$E_G$≡band-gap energy between conduction and valence bands
$h_G$≡height of gate electrode structure above gate dielectric layer
$h_M$≡height of photoresist mask above gate dielectric layer
I≡interstitial atom
$I_{DSAT}$≡widthwise drive current density or drive current per unit drain width
$I_{DSSX}$≡extrapolated widthwise leakage current density or extrapolated leakage current per unit drain width
$I_{DSS0}$≡actual widthwise leakage current density or actual leakage current per unit drain width
i≡width of field-insulation region in direction of channel lengths
$\vec{J}_{(AI)}$≡diffusion flux (current density) of interstitial-dopant pairs in crystal
K≡spatially dependent diffusion parameter
k≡Boltzmann's constant
L≡channel length along upper semiconductor surface
$L_C$≡operating value of channel length L in short-channel regime
$L_{DR}$≡drawn value of channel length L as given by drawn value of gate length
$L_{DRC}$≡desired operating value of drawn channel length $L_{DR}$ in short-channel regime
$L_X$≡transition value of channel length L
l≡normalization length
$N_{APT}$≡concentration of anti-punchthrough dopant
$N_B$≡net dopant concentration of body material
$N_C$≡average net dopant concentration in channel zone
$N_N$≡general net dopant concentration
$N_{POLY}$≡average net dopant concentration in gate electrode consisting of polycrystalline semiconductor material
$N_{S/D}$≡average net dopant concentration in source/drain zones
$n_i$≡intrinsic carrier concentration
$Q_{ss}$≡charge per unit area at interface between gate dielectric layer and channel zone
q≡electronic charge
$R_{Ext}$≡vertical range (average depth) of ions of drain-extension dopant
$R_{Halo}$≡vertical range (average depth) of ions of halo dopant T≡temperature $t_{d(INV)}$≡thickness of depletion region along surface of channel zone at inversion $t_{GD}$≡thickness of gate dielectric layer $t_{Halo}$≡lateral thickness of halo pocket portion directly after halo implantation at depth equal to vertical range $R_{Halo}$ $t_{SP}$≡bottom thickness of spacer along sidewall of gate electrode $V_{BI}$≡built-in voltage across pn junction $V_{DS}$≡drain-to-source voltage $V_{DS(TH)}$≡drain-to-source voltage at threshold point $V_{FB}$≡flat-band voltage $V_{GS}$≡gate-to-source voltage $V_T$≡general threshold voltage $V_{T0}$≡long-channel threshold voltage x≡lateral distance from channel center along upper semiconductor surface toward source/drain zone in direction of channel length y≡depth into semiconductor body measured from upper semiconductor surface α≡a average tilt angle at which ions of halo dopant are implanted into semiconductor body relative to direction generally perpendicular to upper semiconductor surface β≡average azimuthal angle, as measured in plane extending along upper semiconductor surface, at which ions of halo dopant impinge on photoresist mask relative to channel length direction $\Delta W_T$≡threshold voltage difference between long-channel and short-channel threshold voltages $\in_{GD}$≡permittivity of gate dielectric material $\in_{SC}$≡a permittivity of semiconductor material $\Phi_F$≡a Fermi potential (in volts) of semiconductor material in channel zone $\Phi_{FPOLY}$≡a Fermi potential (in volts) at net dopant concentration of gate electrode constituted with polycrystalline semiconductor material $\Phi_{M0}$≡a work function (in volts) of gate electrode $\Phi_S$≡potential across depletion region along surface of channel zone $\Phi_{S0}$≡work function (in volts) of semiconductor material in channel zone η≡fitting parameter χ≡electron affinity of semiconductor material Long-channel and short-channel n-channel IGFETs are respectively referred to here, i.e., both below and above in the Brief Description of the Drawings, as long and short n-channel IGFETs. Similarly, long-channel and short-channel p-channel IGFETs are respectively referred to here as long and short p-channel IGFETs. As used below, the term "surface-adjoining" means adjoining (or extending to) the upper semiconductor surface, i.e., the upper surface of a semiconductor body consisting largely of monocrystalline, or largely monocrystalline, semiconductor material.

An IGFET is described below as symmetrical when it is configured in largely a mirror-image manner along both of its source/drain zones and into the intervening channel zone. For instance, an IGFET having a separate halo pocket portion along each source/drain zone is typically described here as symmetrical provided that the source/drain zones are, except possibly for their lengths, largely mirror images of each other. However, due to factors such as partial shadowing during ion implantation into the location of one of the halo pockets, the dopant profiles in the halo pockets along the upper semiconductor surface may not largely be mirror images. In such cases, there is typically some asymmetry in the IGFET's operation even though the IGFET may be described as a symmetrical device.

In the following description, various situations are presented in which an imaginary line (not shown) is described as (a) extending between the two source/drain zones, or between the intended locations for the two source/drain zones, of an IGFET and thus across the IGFET's intervening channel zone, or across the intended location for the channel zone, or (b) extending from the center length-wise of an IGFET and towards one or each of the IGFET's two source/drain zones, or towards the intended location for one or each of the two source/drain zones, and thus partly across the IGFET's channel zone, or partly across the intended location for the channel zone. Each such imaginary line, regardless of whether it is situated along or below the upper semiconductor surface, typically extends along the IGFET's channel length. Subject to any perturbations which may cause the upper surface of the channel zone to be non-planar and which may, or may not, affect the dopant distribution below the channel zone's upper surface, each such imaginary line is typically approximately straight.

There is no particular channel-length value which generally separates the short-channel and long-channel regimes of IGFET operation or which generally distinguishes a short-channel IGFET from a long-channel IGFET. A short-channel IGFET, or an IGFET operating in the short-channel regime, is simply an IGFET whose characteristics are significantly affected by short-channel effects. A long-channel IGFET, or an IGFET operating in the long-channel regime, is the converse of a short-channel IGFET. While the channel length value of approximately 0.4 μm constitutes the boundary between the short-channel and long-channel regimes in the background art example of FIG. 1, the long-channel/short-channel boundary can occur at a higher or lower value of channel length depending on various factors such as gate dielectric thickness, minimum printable feature size, channel zone dopant concentration, and body-source/drain junction depth.

Associated Device Physics

In the present invention, threshold voltage roll-off is alleviated and punchthrough is inhibited at short channel length in multiple IGFETs which are of different channel length and which are manufactured according to the same, or largely the same, fabrication process in such a way that the average net dopant concentration in the channel zones of the IGFETs increases appropriately with decreasing channel length. An understanding of this phenomenon begins with the following device physics.

The reference symbol "$V_T$" is used here to represent the general threshold voltage of an IGFET. "$V_T$" also represents the threshold voltage of an IGFET operating in the short-channel regime. The threshold voltage of an IGFET operating in the long-channel regime is denoted by the symbol "$V_{T0}$".

Long-channel threshold voltage $V_{T0}$ for an n-channel IGFET is given approximately by the classical relationship:

$$V_{TO} = V_{FB} + \frac{qt_{d(INV)}N_c}{C_{GD}} + \Phi_s \quad (1)$$

where $V_{FB}$ is the flat-band voltage, q is the electronic charge, $t_{d(INV)}$ is the thickness of the depletion region along the upper surface of the channel zone at inversion, $N_C$ is the average net dopant concentration in the IGFET's channel zone, $C_{GD}$ is the gate dielectric capacitance per unit area, and $\Phi_S$ is the potential across the channel surface depletion region at the onset of strong inversion. For Eq. 1, the IGFET lies along a surface, referred to here as the upper semiconductor surface, of a doped monocrystalline semiconductor body having p-type body material that forms respective pn junctions with the IGFET's two source/drain zones. One of the source/drain zones acts as the source (at any given time), while the other source/drain zone acts as the drain. The channel zone consists of the body-material portion located between the source/drain zones.

For an IGFET whose gate electrode consists of doped polycrystalline semiconductor material, flat-band voltage $V_{FB}$ is controlled by the dopant concentration in the gate electrode. Flat-band voltage $V_{FB}$ is negative for an enhancement-mode n-channel silicon-gate IGFET.

Surface depletion region thickness $t_{d(INV)}$ at inversion is determined approximately from:

$$t_{d(INV)} = \sqrt{\frac{2\varepsilon_{SC}|\Phi_s|}{qN_c}} \quad (2)$$

where $\varepsilon_{SC}$ is the permittivity of the semiconductor material, typically silicon.

The value of long-channel threshold voltage $V_{T0}$ is controlled by ion implanting a suitable p-type dopant into the channel zone. Although the threshold-adjust implant is generally most effective when the mean depth of the threshold-adjust implant into the channel zone is less than surface depletion region thickness $t_{d(INV)}$, the lowest implant energy available with conventional ion implantation equipment is typically so high that the mean depth of the threshold-adjust implant is often greater than depletion thickness $t_{d(INV)}$ when channel length L is considerably less than 1 µm.

Surface depletion region potential $\Phi_S$ is twice the Fermi potential $\Phi_F$ of the semiconductor material in the channel zone. That is, $$\Phi_S = 2\Phi_F \quad (3)$$

for which Fermi potential $\Phi_F$, negative for n-type semiconductor material and positive for p-type semiconductor material, is given from:

$$|\Phi_F| = \frac{kT}{q}\ln\left(\frac{N_c}{n_i}\right) \quad (4)$$

where k is Boltzmann's constant, T is temperature, and $n_i$ is the intrinsic carrier concentration. Eqs. 1-4 indicate that long-channel threshold voltage $V_{T0}$ is a function of average net channel dopant concentration $N_C$. In attempting to scale an IGFET to shorter channel length, it is thus clear that threshold voltage $V_{T0}$ cannot be scaled independently of average channel concentration $N_C$.

Flat-band voltage $V_{FB}$ is determined from:

$$V_{FB} = \Phi_{MO} - \Phi_{SO} - \frac{Q_{SS}}{C_{GD}} \quad (5)$$

where $\Phi_{MO}$ is the work function of the gate electrode, $\Phi_{SO}$ is the work function of the semiconductor material at the upper surface of the channel zone at the flat-band condition, and $Q_{SS}$ is the charge per unit area at the interface between the gate dielectric and the channel zone. Assuming that the gate electrode consists of doped polycrystalline semiconductor material of the same basic type, e.g., silicon, as the remainder of the IGFET, work functions $\Phi_{MO}$ and $\Phi_{SO}$ are given as:

$$\Phi_{MO} = \chi + \frac{E_G}{2} - \Phi_{FPOLY} \quad (6)$$

$$\Phi_{SO} = \chi + \frac{E_G}{2} + \Phi_F \quad (7)$$

where $\Phi_{FPOLY}$ is the Fermi potential at the net dopant concentration of the polycrystalline semiconductor material in the gate electrode, $\chi$ is the electron affinity of the semiconductor material, and $E_G$ is the band-gap energy of the semiconductor material. Polycrystalline gate-electrode Fermi potential $\Phi_{FPOLY}$ is negative for n-type polycrystalline semiconductor material and positive for p-type polycrystalline semiconductor material.

Combining Eqs. 1-7 yields the following approximate relationship for long-channel threshold voltage $V_{T0}$ for an n-channel enhancement-mode IGFET:

$$V_{T0} = \frac{kT}{q}\ln\left(\frac{N_c}{n_i}\right) + \frac{2}{C_{GD}}\sqrt{N_C\varepsilon_{SC}kT\ln\left(\frac{N_c}{n_i}\right)} - \Phi_{FPOLY} - \frac{Q_{SS}}{C_{GD}} \quad (8)$$

Figure 4:
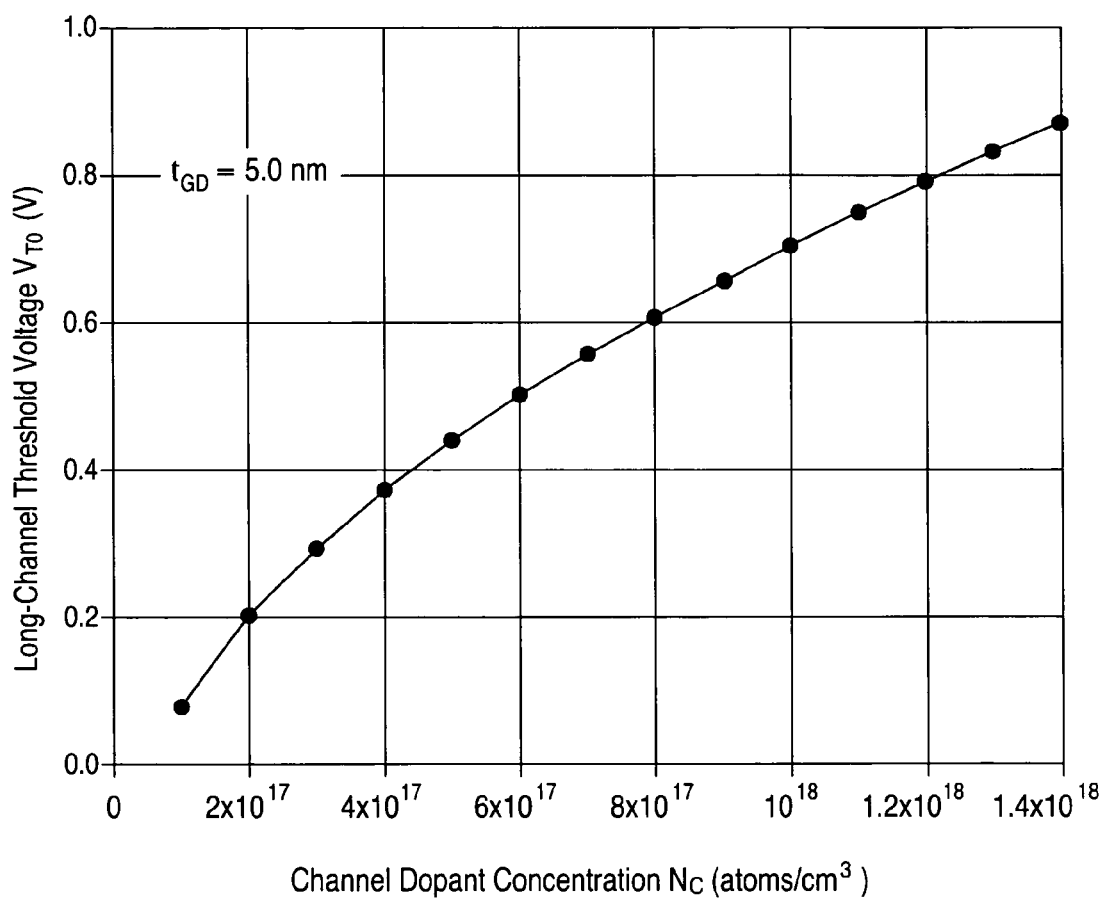
FIG. 4 is a graph of long-channel threshold voltage as a function of channel dopant concentration for an n-channel IGFET.

When the polycrystalline semiconductor material is of the same conductivity type, i.e., n-type, as the semiconductor material in the source/drain zones, when the semiconductor material, including that of the gate electrode, is silicon, and when the gate dielectric is silicon oxide, semiconductor permittivity $\varepsilon_{SC}$ is $1.04\times10^{-12}$ F/cm, polycrystalline gate-electrode Fermi potential $\Phi_{FPOLY}$ is $-0.57$ eV, and areal interface charge $Q_{SS}$ is approximately $10^{10}$q per unit area. At a value of 5 nm for gate dielectric thickness $t_{GD}$, areal gate dielectric capacitance $C_{GD}$ is $6.91\times10^{-7}$ F/cm². For these parametric values, FIG. 4 graphically illustrates how long-channel threshold voltage $V_{T0}$ varies with average net channel dopant concentration $N_C$ at room temperature. Threshold voltage $V_{T0}$ increases from approximately 0.1 V to approximately 0.9 V as average concentration $N_C$ in the channel zone is increased from $1\times10^{17}$ atoms/cm³ to $1.4\times10^{18}$ atoms/cm³.

The threshold voltage $V_T$ of a short-channel IGFET can be expressed as:

$$V_T = V_{T0} - \Delta V_T \quad (9)$$

where threshold voltage difference $\Delta V_T$ is positive for an n-channel IGFET and negative for a p-channel IGFET. Using the model proposed by Liu et al, cited above, threshold voltage difference $\Delta V_T$ is given as:

$$\Delta V_T = \frac{2(V_{BI} - \Phi_S) + V_{DS(TH)}}{2\cosh(L/2l)} \quad (10)$$

where $V_{BI}$ is the built-in voltage at the pn junction between the body material and the source/drain zone that acts as the source, $V_{DS(TH)}$ is the drain-to-source voltage at the threshold point, L is again the channel length, and l is a normalization length. In other words, $$V_T = V_{TO} - \frac{2(V_{BI} - \Phi_S) + V_{DS(TH)}}{2\cosh(L/2l)} \quad (11)$$

in the model of Liu et al.

Built-in voltage $V_{BI}$ for the junction between the body material and the source/drain zone acting as the source is given as:

$$V_{BI} = \frac{kT}{q}\ln\left(\frac{N_c N_{S/D}}{n_i^2}\right) \quad (12)$$

where $N_{S/D}$ is the average net dopant concentration in the source/drain zones. Drain-to-source voltage $V_{DS(TH)}$ at the threshold point, as conventionally defined, is quite small, typically 0.1 V or less. Normalization length l is determined from:

$$l = \sqrt{\frac{\varepsilon_{SC} t_{GD} t_{d(INV)}}{\varepsilon_{GD} \eta}} \quad (13)$$

where $\varepsilon_{GD}$ is the permittivity of the gate dielectric material, silicon oxide here, and $\eta$ is a fitting parameter that accounts for the two-dimensional nature of an actual IGFET.

Following the line of approximation utilized in Liu et al, Eq. 10 is reduced to:

$$\Delta V_T \approx [2(V_{BI} - 2\Phi_F) + V_{DS(TH)}]e^{-L/2l} \quad (14)$$

Using Eq. 9, threshold voltage $V_T$ in the short-channel regime is given approximately as:

$$V_T \approx V_{TO} - [2(V_{BI} - 2\Phi_F) + V_{DS(TH)}]e^{-L/2l} \quad (15)$$

where long-channel threshold voltage $V_{TO}$ is given generally from Eq. 1. Combining Eqs. 2, 3, 13, and 15 yields:

$$V_T = \quad (16)$$
$$V_{TO} - [2(V_{BI} - 2\Phi_F) + V_{DS(TH)}]\exp\left(-L/2\sqrt{\frac{2\varepsilon_{SC} t_{GD}}{\varepsilon_{GD}\eta}\sqrt{\frac{\varepsilon_{SC}\Phi_F}{qN_C}}}\right)$$

where long-channel threshold voltage $V_{TO}$ for an n-channel enhancement-mode IGFET is given specifically from Eq. 8, Fermi potential $\Phi_F$ is given from Eq. 4. and built-in voltage $V_{BI}$ is given from Eq. 12. Eq. 15 or 16 reflects the experimentally observed exponential nature of short-channel threshold voltage roll-off.

Examination of Eq. 15 or 16 in light of the dependencies of Fermi potential $\Phi_F$ and built-in voltage $V_{BI}$ on average net channel dopant concentration $N_C$ as given by Eqs. 4 and 12 indicates that increasing average concentration $N_C$ in the channel zone causes threshold voltage difference $\Delta V_T$ to decrease for typical values of drain-to-source voltage $V_{DS(TH)}$ at the threshold point.

In particular, average net source/drain dopant concentration $N_{S/D}$ exceeds average net channel dopant concentration $N_C$. As average channel concentration $N_C$ increases, the exponential term in Eq. 16 thereby decreases faster than the $[2(V_{BI} - 2\Phi_F) + V_{DS(TH)}]$ term increases. Consequently, increasing average channel concentration $N_C$ alleviates short-channel threshold voltage roll-off. That is, increasing average concentration $N_C$ causes the onset of threshold voltage roll-off to be shifted to lower channel length.

As mentioned above, increasing average net channel dopant concentration $N_C$ causes long-channel threshold voltage $V_{TO}$ to increase. In an IGFET fabrication process where the value of average channel concentration $N_C$ for a long-channel IGFET is approximately the same as the value of average concentration $N_C$ for a like-polarity short-channel IGFET, the amount of $V_{TO}$ increase that results from increasing concentration $N_C$ to alleviate short-channel threshold voltage roll-off by a useful amount would be unsuitably high. In quantitative terms, Eqs. 8 and 16 thus indicate that increasing concentration $N_C$ is not a suitable way for alleviating threshold voltage roll-off in a transistor fabrication process where concentration $N_C$ is approximately at the same value for long-channel and short-channel IGFETs.

An example is helpful to clarify this point. Consider the situation in which average net channel dopant concentration $N_C$ is $5 \times 10^{17}$ atoms/cm³, threshold voltage difference $\Delta V_T$ is 0.1 V, drain-to-source voltage $V_{DS(TH)}$ at the threshold point is 0.1 V, and the gate dielectric layer consists of silicon oxide for which gate dielectric thickness $t_{GD}$ is approximately 5 nm. Long-channel threshold voltage $V_{TO}$ is then approximately 0.45 V.

To reduce threshold voltage difference $\Delta V_T$ by a factor of 3 down to approximately 0.03 V, average net channel dopant concentration $N_C$ would need to increase by a factor of nearly 16. Average concentration $N_C$ in the channel zone would then roughly be $8 \times 10^{18}$ atoms/cm³. The resulting value of long-channel threshold voltage $V_{TO}$ would roughly be 2.4 V, a value which is unsuitably high compared to the $V_{TO}$ value of approximately 0.45 V that arises when average channel concentration $N_C$ is $5 \times 10^{17}$ atoms/cm³.

A similar result occurs with p-channel IGFETs except that the polarities of the various voltages are largely reversed. In short, increasing average net channel dopant concentration $N_C$ to alleviate threshold voltage roll-off in the situation where average channel concentration $N_C$ is approximately the same for both long-channel and short-channel IGFETs of the same polarity type leads to the magnitude of long-channel threshold voltage $V_{TO}$ becoming unsuitably large.

General Channel Doping Requirement for Alleviating Short-Channel Threshold Voltage Roll-Off The problem of the magnitude of long-channel threshold voltage $V_{TO}$ being unsuitably high in the foregoing situation is, in accordance with the invention, overcome by configuring multiple like-polarity enhancement-mode IGFETs manufactured according to the same, or largely the same, fabrication process in such a way that average net channel dopant concentration $N_C$ increases appropriately as channel length L decreases. Average channel concentration $N_C$ for a long-channel IGFET is at a nominal value. Average channel concentration $N_C$ for a like-polarity short-channel IGFET is at a value suitably greater than the nominal value so as to alleviate short-channel threshold voltage roll-off.

By appropriately controlling the variation of average net channel dopant concentration $N_C$ with channel length L, the threshold voltages of the long-channel and short-channel IGFETs can be set as desired, typically different, values. The long-channel and short-channel IGFETs can be provided in the same semiconductor structure and thus are manufactured according to the same fabrication process, or can be provided in separate semiconductor structures manufactured according to largely the same fabrication process.

An important facet of the present invention is that average net channel dopant concentration $N_C$ is a local, rather than global, parameter. More particularly, average channel concentration $N_C$ for any particular implementation of certain prior art IGFET fabrication processes is the same, or largely the same, for all n-channel or p-channel IGFETs manufactured according to that process implementation despite differences in channel length L. Although such a process implementation can be modified to change average concentration $N_C$, the new value of concentration $N_C$ substantially applies to all IGFETs manufactured according to the modified implementation of the prior art process regardless of the channel length. Because concentration $N_C$ is the same, or largely the same, for all IGFETs manufactured according to a particular implementation of any of these prior art fabrication processes, average channel concentration $N_C$ is a global parameter in these prior art processes.

In contrast, average net channel dopant concentration $N_C$ for n-channel or p-channel IGFETs manufactured according to an implementation of the fabrication process of the invention varies significantly with channel length L. This applies to both n-channel and p-channel IGFETs of different channel length in the same semiconductor structure and to n-channel and p-channel IGFETs of different channel length in different semiconductor structures manufactured according to largely the same fabrication process. When an implementation of the present process is modified to change average channel concentration $N_C$, the amount of change in average concentration $N_C$ for an IGFET of one value of channel length L may, and typically does, differ from the amount of change in concentration $N_C$ for a like-polarity IGFET of another value of channel length L. Since average concentration $N_C$ varies with channel length L for n-channel or p-channel IGFETs manufactured according to an implementation of the present fabrication process, average channel concentration $N_C$ is a local parameter in the invention.

Figure 5:
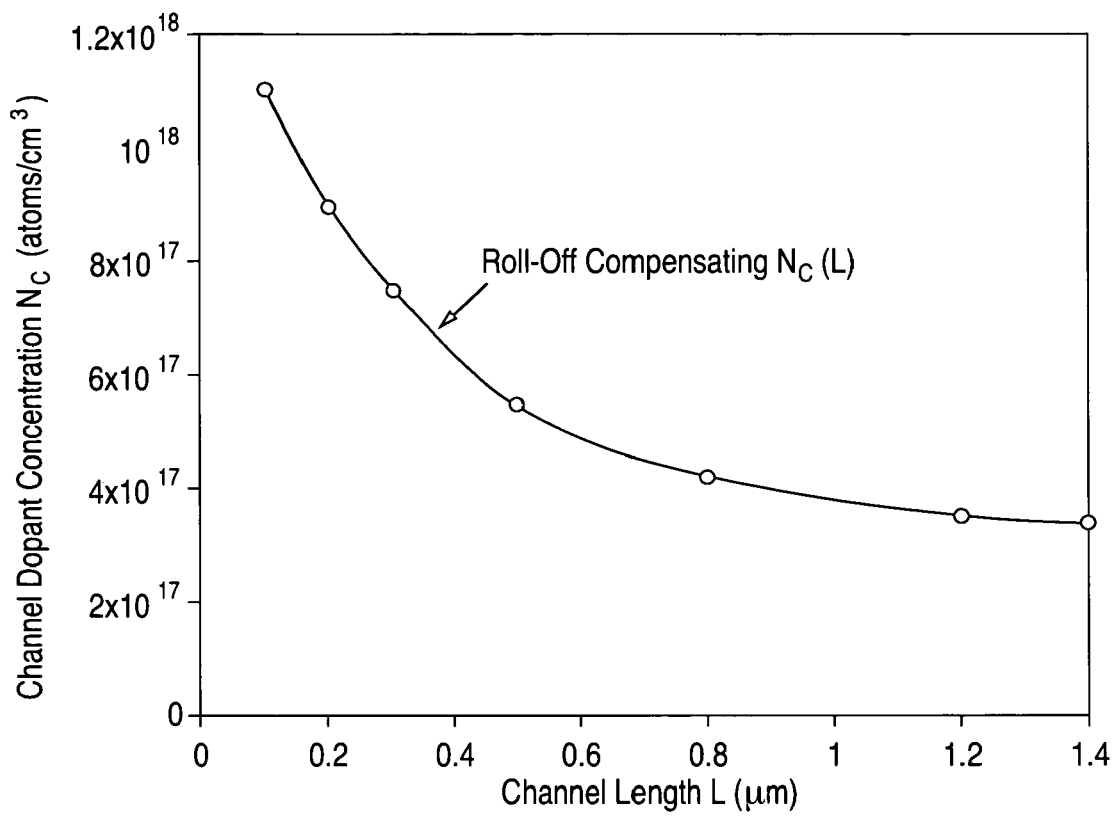
FIG. 5 is a graph of average channel dopant concentration as a function of channel length for IGFETs manufactured according to the invention.

FIG. 5 presents an example of how average net channel dopant concentration $N_C$ varies with channel length L and, in particular, increases suitably as channel length L decreases for n-channel and p-channel IGFETs manufactured according to an implementation of the present fabrication process so as to alleviate short-channel threshold voltage roll-off. The $N_C(L)$ characteristics of FIG. 5 apply to n-channel and p-channel IGFETs whose gate dielectric thickness $t_{GD}$ is approximately 5 nm. As FIG. 5 indicates, average channel concentration $N_C$ increases from approximately $3.5 \times 10^{17}$ atoms/cm$^3$ at an L value of 1.4 μm to approximately $9 \times 10^{17}$ atoms/cm$^3$ at an L value of 0.2 μm.

Figure 6:
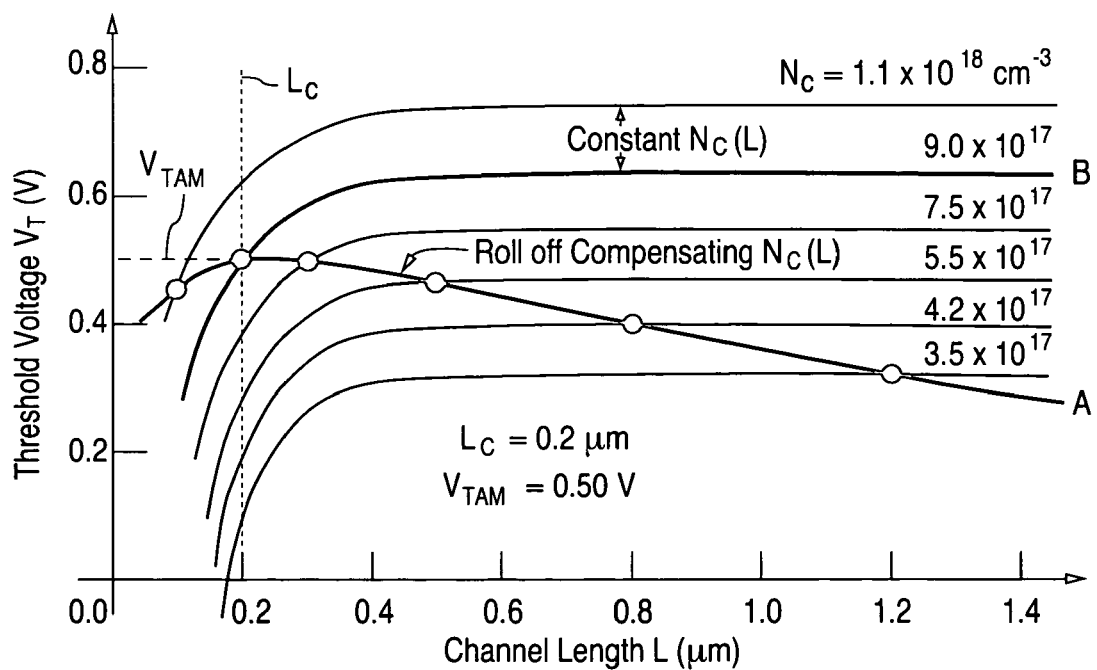
FIG. 6 is a graph of threshold voltage as a function of channel length for n-channel IGFETs manufactured according to the invention and for re-channel IGFETs manufactured at various fixed values of average net channel dopant concentration.

FIG. 6 illustrates how threshold voltage $V_T$ varies with channel length L for n-channel IGFETs configured so that average net channel dopant concentration $N_C$ decreases with increasing channel length L in the manner shown in FIG. 5. The $V_T(L)$ curve A labeled "Roll-off Compensating $N_C(L)$" in FIG. 6 corresponds to the $N_C(L)$ characteristic of FIG. 5. For comparison purposes, FIG. 6 also depicts six examples of how threshold voltage $V_T$ varies with channel length L for 5 nm-$t_{GD}$ n-channel IGFETs for which average channel concentration $N_C$ is constant with channel length L. These comparative examples, collectively labeled "Constant $N_C(L)$", are presented for $N_C$ values varying from $3.5 \times 10^{17}$ atoms/cm$^3$ to $1.1 \times 10^{18}$ atoms/cm$^3$, including an $N_C$ value of $9 \times 10^{17}$ atoms/cm$^3$. Each of the six constant $N_C(L)$ examples in FIG. 6 implements Eq. 15 or 16 presented above.

Examination of FIG. 6 shows that n-channel IGFETs manufactured according to a process implementation having the variable $N_C(L)$ characteristic of FIG. 5 have much better short-channel threshold voltage stability than the n-channel IGFETs having any of the constant values of average net channel dopant concentration $N_C$. Roll-off compensating $V_T(L)$ curve A of the invention reaches a maximum value $V_{TAM}$ of threshold voltage $V_T$ at an operating short-channel value $L_C$ of channel length L. Operating short-channel value $L_C$ is 0.2 μm in FIG. 6. As channel length L progressively drops below the short-channel $L_C$ value of 0.2 μm, threshold voltage $V_T$ for roll-off compensating $V_T(L)$ curve A decreases relatively softly at least down to an L value of 0.05 μm. In contrast, threshold voltage $V_T$ decreases very sharply as channel length L progressively drops below 0.2 μm for each of the six $V_T(L)$ curves having constant values of average channel concentration $N_C$ in FIG. 6.

Particularly note the $V_T(L)$ curve B having the constant $N_C$ value of $9 \times 10^{17}$ atoms/cm$^3$ in FIG. 6. This $N_C$ value is the value of average net channel dopant concentration $N_C$ at the 0.2-μm $L_C$ value for roll-off compensating $V_T(L)$ curve A. Threshold voltage $V_T$ is approximately 0.5 V at an L value of 0.2 μm for both curve A and curve B, the 0.5 V value of threshold voltage $V_T$ being maximum value $V_{TAM}$ for roll-off compensating $V_T(L)$ curve A. When channel length L drops from 0.2 μm to 0.1 μm, threshold voltage $V_T$ drops by more than 0.2 V for $V_T(L)$ curve B at the constant $N_C$ value of $9 \times 10^{17}$ atoms/cm$^3$. Should fabrication variations result in a short n-channel IGFET having a channel length of 0.1 μm, the resulting $V_T$ value of less than 0.3 V is so low compared to the 0.5-V value at a channel length of 0.2 μm as to normally be unacceptable.

On the other hand, the $V_T$ drop for roll-off compensating $V_T(L)$ curve A is only 0.05 V when channel length L drops from 0.2 μm to 0.1 μm. If fabrication variations result in a short n-channel IGFET having a channel length of 0.1 μm, the resulting $V_T$ value is 0.45 V for roll-off compensating $V_T(L)$ curve A. This $V_T$ value is relatively close to the $V_{TAM}$ value of 0.5 V and, importantly, would typically be acceptable.

In short, short-channel threshold voltage roll-off is significantly alleviated in n-channel enhancement-mode IGFETs fabricated according to a process implementation that provides the inventive variable $N_C(L)$ characteristic of FIG. 5 so as to achieve the roll-off compensating $V_T(L)$ characteristic of FIG. 6. The same occurs with p-channel enhancement-mode IGFETs except that $V_{TAM}$ generally represents the magnitude (absolute value) of threshold voltage $V_T$ at operating short-channel value $L_C$ since threshold voltage $V_T$ is negative for p-channel IGFETs. Consequently, the present invention increases tolerance to manufacturing variations.

As shown in FIG. 6, threshold voltage $V_T$ for roll-off compensating $V_T(L)$ curve A drops slowly as channel length L increases progressively above the operating short-channel $L_C$ value of 0.2 μm towards the long-channel regime. A corresponding $V_T$ change occurs with for p-channel IGFETs having the $N_C(L)$ characteristic of FIG. 5 except that threshold voltage $V_T$ rises slowly, rather than dropping slowly, as channel length L increases progressively above the operating short-channel $L_C$ value towards the long-channel regime. These $V_T(L)$ characteristics for n-channel and p-channel IGFETs enable threshold voltage $V_T$ to be maintained within reasonable limits when channel length L changes unintentionally due to process variations. These $V_T(L)$ characteristics also permit threshold voltage $V_T$ to be adjusted by adjusting channel length L during IC design for L values greater than $L_C$.

Figure 7:
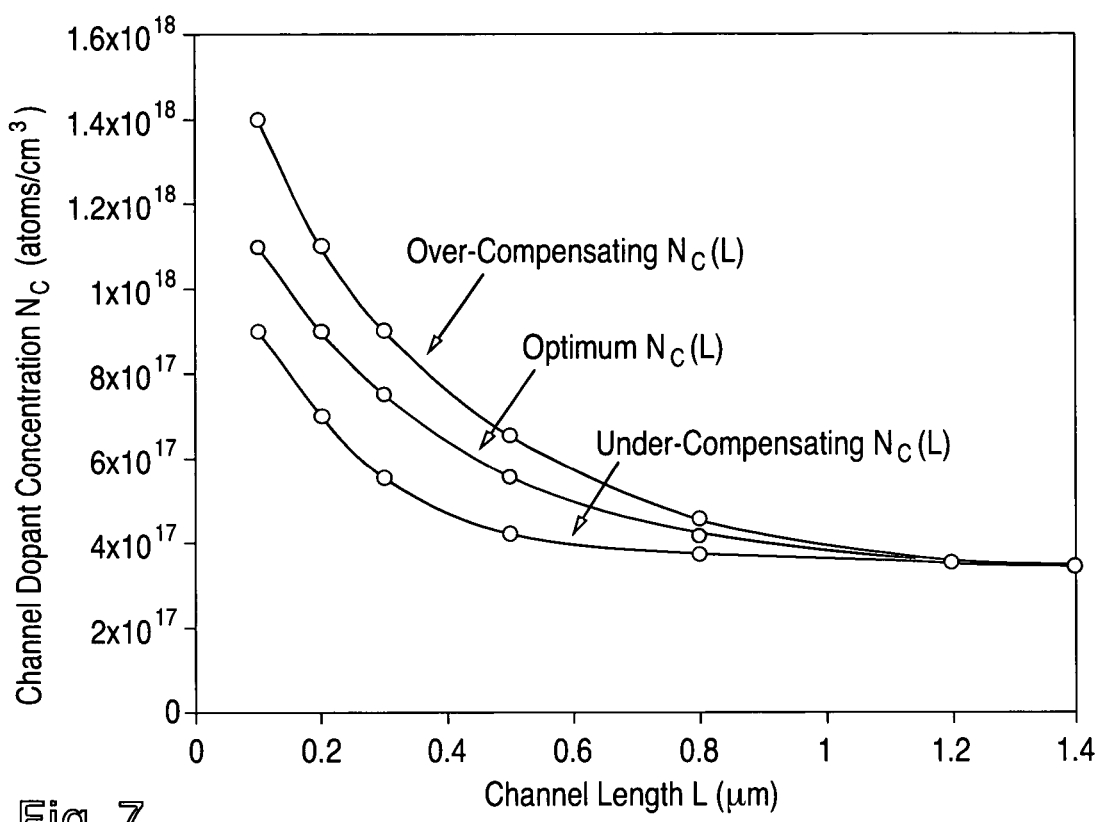
FIG. 7 is a graph of channel dopant concentration as a function of channel length for IGFETs manufactured according to the invention at various degrees of short-channel compensation.

Varying degrees of short-channel threshold voltage roll-off compensation can be achieved by suitably modifying how average net channel dopant concentration $N_C$ increases with decreasing channel length. FIG. 7 presents three examples of how average channel concentration $N_C$ increases with decreasing channel length for 5 nm-$t_{GD}$ IGFETs manufactured according to three corresponding implementations of the present fabrication process so as to alleviate threshold voltage roll-off. The middle $N_C(L)$ curve shown in FIG. 7 repeats the $N_C(L)$ curve shown in FIG. 5 and, as indicated by the label "Optimum $N_C(L)$", provides approximately optimum threshold voltage roll-off compensation. The upper and lower $N_C(L)$ curves in FIG. 7 respectively yield over-compensation and under-compensation in reducing threshold voltage roll-off.

Figure 8:
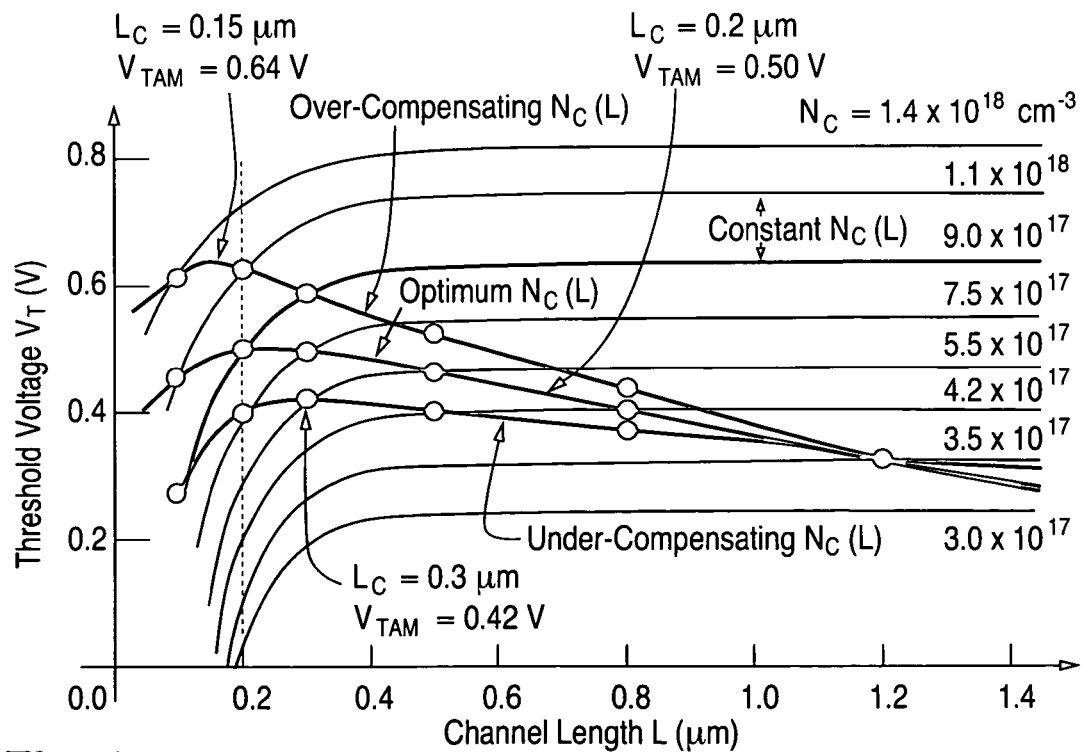
FIG. 8 is a graph of threshold voltage as a function of channel length for n-channel IGFETs manufactured according to the invention at various degrees of short-channel compensation and for n-channel IGFETs manufactured at various fixed values of average net channel dopant concentration.

FIG. 8 illustrates how threshold voltage $V_T$ varies with channel length L for n-channel IGFETs configured so that average net channel dopant concentration $N_C$ varies with channel length L according to each of the $N_C(L)$ curves shown in FIG. 7. The thick-line curves labeled "Over-Compensating $N_C(L)$", "Optimum $N_C(L)$", and "Under-Compensating $N_C(L)$" in FIG. 8 respectively correspond to the like-labeled $N_C(L)$ curves in FIG. 7. For comparison purposes, FIG. 8 also depicts eight examples of how threshold voltage $V_T$ varies with channel length L for 5 nm-$t_{GD}$ n-channel IGFETs for which average channel concentration $N_C$ is constant with channel length L. The middle six of these eight constant $N_C(L)$ curves in FIG. 8 repeat the six constant $N_C(L)$ curves in FIG. 6.

The $V_{TAM}$ value for the under-compensating $V_T(L)$ curve in FIG. 8 is less than the $V_{TAM}$ value for the optimum $V_T(L)$ curve and occurs at a higher $L_C$ value than for the optimum $V_T(L)$ curve. Accordingly, the under-compensating $V_T(L)$ curve has a smaller reduction in threshold voltage roll-off for channel length L in the vicinity of 0.2 µm, the $L_C$ value for the optimum $V_T(L)$ curve. Somewhat the opposite occurs with the over-compensating $V_T(L)$ curve in FIG. 8. The $V_{TAM}$ value for the over-compensating $V_T(L)$ curve is greater than the $V_{TAM}$ value for the optimum $V_T(L)$ curve and occurs at a lower $L_C$ value than for the optimum $V_T(L)$ curve. As a result, the effect of the optimum $V_T(L)$ curve is to alleviate threshold voltage roll-off by shifting it to lower channel length while keeping threshold voltage $V_T$ relatively high, especially in the vicinity of operating short-channel value $L_C$. The derivative $dV_T/dL$ of threshold voltage $V_T$ with channel length L is small in magnitude, preferably zero, at value $L_C$.

Threshold voltage $V_T$ decreases with increasing channel length for each of the three roll-off compensating $V_T(L)$ curves in FIG. 8. The greatest $V_T$ decrease with increasing channel length above $L_C$ occurs with the over-compensating $V_T(L)$ curve, and the lowest $V_T$ decrease with increasing channel length above $L_C$ occurs with the under-compensating $V_T(L)$ curve. For each of the three $V_T(L)$ roll-off compensating curves, threshold voltage $V_T$ is at least 0.03 V less than maximum value $V_{TAM}$ when channel length L is 0.3 µm greater than $L_C$. Also, threshold voltage $V_T$ is at least 0.1 V less than value $V_{TAM}$ for each of the three $V_T(L)$ roll-off compensating curves when channel length L is 1.0 µm greater than $L_C$.

As is evident from a comparison of the three $V_T(L)$ roll-off compensating curves in FIG. 8, the optimum $V_T(L)$ curve provides a fully adequate reduction in threshold voltage roll-off in the vicinity of a channel length of 0.2 µm while having an intermediate decrease in threshold voltage $V_T$ with increasing channel length above $L_C$. Although this characteristic is typically optimum, the over-compensating $V_T(L)$ curve may be preferred in situations where unintentional channel-length variations caused by process variations generally result in channel length L being on the low side of the nominal L value.

Structure of IGFETs Configured According to Invention

Figure 9A:
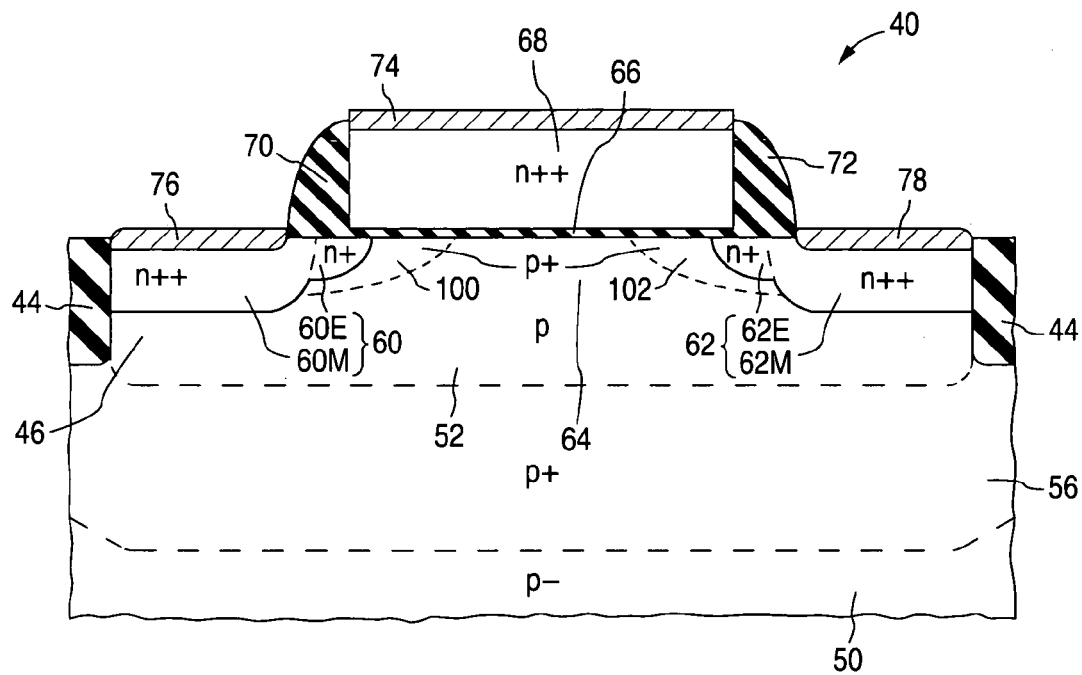
FIGS. 9a and 9b are front cross-sectional views of respective symmetrical long and short n-channel IGFETs configured and manufactured according to the invention.
Figure 9B:
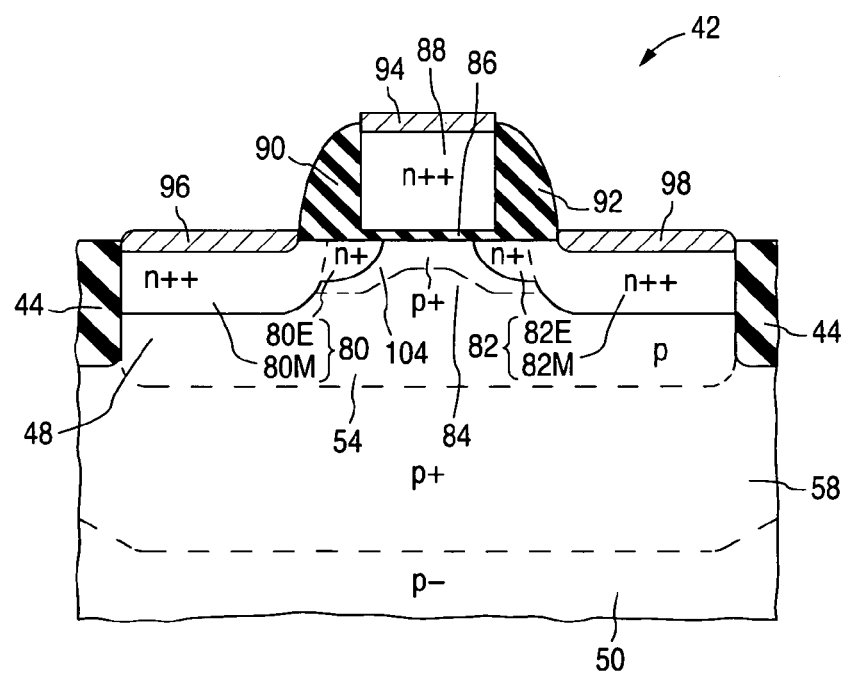

FIGS. 9a and 9b respectively illustrate cross sections of a pair of symmetrical n-channel enhancement-mode IGFETs 40 and 42 manufactured according to the same, or largely the same, fabrication process of the invention so as to be of different channel length. IGFET 40 is a long-channel device. IGFET 42 is a short-channel device. IGFETs 40 and 42 are configured in accordance with the invention to implement the $N_C(L)$ principles described in the previous section in order to significantly alleviate short-channel threshold voltage roll-off.

N-channel IGFETs 40 and 42 may be part of the same overall semiconductor structure and thus are manufactured according to the same fabrication process. For simplicity, IGFETs 40 and 42 are treated here as being part of the same semiconductor structure in the following description of FIGS. 9a and 9b. Alternatively, IGFETs 40 and 42 may be parts of separately fabricated, and thus different, semiconductor structures. In this case, largely the same fabrication process is utilized to manufacture IGFETs 40 and 42. In addition, the semiconductor structure or structures containing n-channel IGFETs 40 and 42 typically includes p-channel IGFETs configured in a similar, but complementary, manner to IGFETs 40 and 42.

For the indicated case in which n-channel IGFETs 40 and 42 are part of the same semiconductor structure, IGFETs 40 and 42 are created from a monocrystalline silicon ("monosilicon") semiconductor body along whose upper surface is situated a recessed field region 44 of electrically insulating material, typically primarily silicon oxide. Field-insulating region 44 laterally separates a group of active regions in the monosilicon semiconductor body. The semiconductor portions of IGFET 40 are provided in one such active region 46. The semiconductor portions of IGFET 42 are provided in another such active region 48.

The semiconductor body contains p-type body material 50. IGFETs 40 and 42 may be formed from a single (continuous) region of p-type body material 50 or from a pair of laterally separated regions of body material 50. In the latter case, n-type material of the semiconductor body normally separates the two regions of p-type body material 50 below field insulation 44. The bulk of body material 50 is lightly doped p-type.

P-type body material 50 includes a pair of surface-adjoining upper portions 52 and 54 which respectively encompass parts of active regions 46 and 48. Upper body-material portions 52 and 54 consist principally of moderately doped p-type semiconductor material (monosilicon). As discussed further below, upper portions 52 and 54 include some surface-adjoining heavily doped p-type semiconductor material. In the example of FIGS. 9a and 9b, upper portions 52 and 54 are illustrated as extending deeper into the semiconductive body than field insulation 44 and thus respectively deeper into the semiconductor body than active regions 46 and 48. Alternatively, field insulation 44 can extend deeper into the semiconductor body than upper portions 52 and 54. As discussed further below, upper portions 52 and 54 are doped in such a way as to alleviate both threshold voltage roll-off and punch-through.

Body material 50 also includes a pair of heavily doped well portions 56 and 58. P+ well portion 56 is situated between upper body-material portion 52 and the lightly doped bulk of body material 50. Similarly, p+ well portion 58 is situated between upper body-material portion 54 and the lightly doped bulk of body material 50. Although p+ wells 56 and 58 are described here as separate portions of body material 50, they may form a single, continuous p+ well.

Long n-channel IGFET 40 in FIG. 9a has a pair of composite n-type source/drain zones 60 and 62 situated in active region 46 along the upper semiconductor surface. Source/drain zone 60 consists of a very heavily doped main portion 60M and a more lightly doped extension 60E. Source/drain zone 62 consists of a very heavily doped main portion 62M and a more lightly doped extension 62E. Although source/drain extensions 60E and 62E are more lightly doped than n++ main source/drain portions 60M and 62M, extensions 60E and 62E are still heavily doped n-type.

A channel zone 64 of p-type upper body-material portion 52 laterally separates source/drain zones 60 and 62. In particular, n+ source/drain extensions terminate channel zone 64 along the upper semiconductor surface. A gate dielectric layer 66 lies on channel zone 64. A gate electrode 68 consisting of very heavily doped n-type polycrystalline silicon ("polysilicon") lies on gate dielectric layer 66 above channel zone 64. Gate electrode 68 partially overlies source/drain extensions 60E and 62E but normally does not extend above main source/drain portions 60M and 62M.

A pair of electrically insulating spacers 70 and 72 are situated along the opposite transverse sidewalls of gate electrode 68 respectively above source/drain zones 60 and 62. Metal silicide layers 74, 76, and 78 are respectively situated on components 68, 60M, and 62M. Silicide layers 74, 76, and 78, typically consisting of cobalt silicide, facilitate making electrical contact to gate electrode 68 and source/drain zones 60 and 62.

Short n-channel IGFET 40 in FIG. 9b has a pair of composite n-type source/drain zones 80 and 82 situated in active region 48 along the upper semiconductor surface. Source/drain zone 80 consists of a very heavily doped main portion 80M and a more lightly doped extension 80E. Source/drain zone 82 consists of a very heavily doped main portion 82M and a more lightly doped extension 82E. Source/drain extensions 80E and 82E, while being more lightly doped than n++ main source/drain portions 80M and 82M, are heavily doped n-type. Source/drain zones 80 and 82, along with source/drain zones 60 and 62, extend to approximately the same depth below the upper semiconductor surface.

A channel zone 84 of p-type upper body-material portion 54 laterally separates source/drain zones 80 and 82. Specifically, p+ source/drain extensions 80E and 82E terminate channel zone 84 along the upper semiconductor surface. A gate dielectric layer 86 lies on channel zone 84. A gate electrode 88 consisting of very heavily doped n-type polysilicon lies on gate dielectric layer 86 above channel zone 84. Gate electrode 88 partially overlies source/drain extensions 80E and 82E but normally does not extend above main source/drain portions 80M and 82M.

A pair of electrically insulating spacers 90 and 92 are situated along the opposite transverse sidewalls of gate electrode 88 respectively above source/drain zones 80 and 82. Metal silicide layers 94, 96, and 98 are respectively situated on components 86, 80M, and 82M. Silicide layers 94, 96, 98, typically consisting of cobalt silicide, facilitate making electrical contact to gate electrode 88 and source/drain zones 80 and 82.

In IGFETs 40 and 42, gate sidewall spacers 70, 72, 90, and 92 may be formed with various electrical insulators. For instance, spacers 70, 72, 90, and 92 may consist largely of silicon nitride, largely of silicon oxide, a combination of silicon nitride and silicon oxide, or a combination of either or both of these insulators with another insulator such as tetraethyl orthosilicate ("TEOS"). In a typical implementation, each spacer 70, 72, 90, or 92 consists of a thin silicon oxide layer, a thin overlying TEOS layer, and an overlying main silicon nitride portion.

Spacers 70, 72, 90, and 92 each have a bottom thickness of 30-150 nm, typically 100 nm.

For simplicity and to maintain generality, the (potential) presence of different electrically insulating regions in any of gate sidewall spacers 70, 72, 90, and 92 is not indicated in the drawings. A single type of shading is utilized for all of each of spacers 70, 72, 90, and 92 in the drawings. The same applies to other such electrically insulating spacers shown in the drawings.

P-type channel zones 64 and 84 are configured in the following way. Channel zone 64 in long-channel IGFET 40 contains a pair of laterally separated heavily doped halo pocket portions 100 and 102 as indicated in FIG. 9a. P+ halo pocket portion 100 adjoins source/drain extension 60E along all of the pn-junction portion between extension 60E and channel zone 64. P+ halo pocket portion 102 similarly adjoins source/drain extension 62E along all of the pn junction portion between extension 62E and channel zone 64. Halo pockets 100 and 102 extend respectively below source/drain extensions 60E and 62E to respectively meet main source/drain portions 60M and 62M. Pockets 100 and 102 achieve the closest proximity to each other at, or close to, the upper semiconductor surface.

Figure 10A:
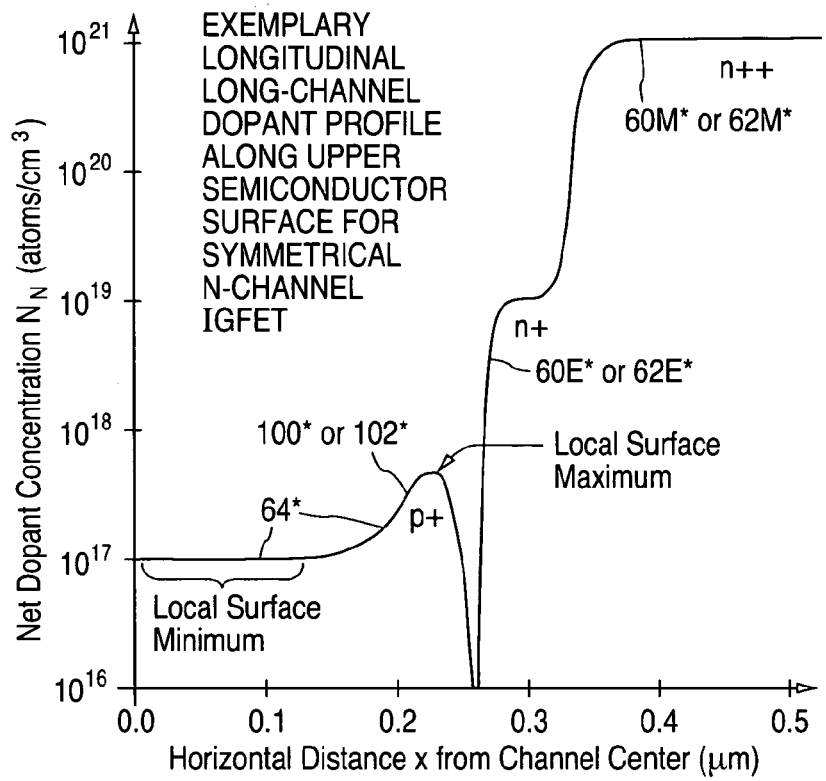
FIGS. 10a and 10b are exemplary graphs of net dopant concentration along the upper semiconductor surface as a function of longitudinal horizontal distance from the channel center for the respective long and short n-channel IGFETs of FIGS. 9a and 9b.

P+ halo pocket portions 100 and 102 provide channel zone 64 with a net dopant concentration that reaches a local surface minimum along the upper semiconductor surface in the longitudinal direction, i.e., along the channel length, at a location between source/drain zones 60 and 62. An understanding of the shape of the dopant profile in channel zone 64 along the upper semiconductor surface is facilitated with the assistance of FIG. 10a which presents an example of how the net dopant concentration $N_N$ in long-channel IGFET 40 varies along the upper semiconductor surface in the longitudinal direction. Horizontal direction x in FIG. 10a is measured from the center lengthwise (channel center) of channel zone 64 along the upper semiconductor surface longitudinally towards either source/drain zone 60 or source/drain zone 62. Curve segments 64*, 100*, 102*, 60E*, 62E*, 60M*, and 62M* in FIG. 10a respectively represent the net dopant concentrations of components 64, 100, 102, 60E, 62E, 60M, and 62M along the upper semiconductor surface.

The local surface minimum in the net dopant concentration of channel zone 64 in the longitudinal direction occurs in the upper semiconductor surface portion situated between halo pocket portions 100 and 102. As indicated by the flat portion of curve segment 64* in FIG. 10a, the net dopant concentration of channel zone 64 is approximately constant at the longitudinal local surface minimum along a non-zero portion of an imaginary line (not shown) extending longitudinally from the channel center along the upper semiconductor surface to each source/drain zone 60 or 62. Hence, the net dopant concentration of channel zone 64 is approximately constant at the longitudinal local surface minimum along a non-zero portion of a longer imaginary line (likewise, not shown) extending longitudinally between source/drain zones 60 and 62 along the upper semiconductor surface. The non-zero portion of the longer line terminates at halo pockets 100 and 102. The flat non-haloed portion of curve segment 64* also indicates that an exemplary value for the longitudinal local surface minimum in the net dopant concentration of channel zone 64 is $1 \times 10^{17}$ atoms/cm$^3$.

Part of curve segment 64* is also marked 100* or 102* in FIG. 10a. As indicated by curve segment 100* or 102*, the net surface dopant concentration of channel zone 64 increases in moving away from the location of the longitudinal local surface minimum longitudinally towards source/drain zone 60 or 62 and longitudinally reaches a local surface maximum at a location close to source/drain extension 60E or 62E. Consequently, the surface dopant profile in channel zone 64 is shaped generally like a long saddle in the longitudinal direction. FIG. 10a illustrates one half of the long saddle shape for channel zone 64.

P-type channel zone 84 in short-channel IGFET 42 contains a pair of heavily doped halo pocket portions merged together to form a single heavily doped composite halo pocket portion 104 that extends fully across channel zone 84. See FIG. 9b. P+ extended halo pocket portion 104 adjoins source/drain extension 80E along all of the pn-junction portion between extension 80E and channel zone 84. Extended halo pocket portion 104 likewise adjoins source/drain extension 82E along all of the pn-junction portion between extension 82E and channel zone 84. Extended pocket 104 extends below source/drain extensions 80E and 82E to respectively meet main source/drain portions 80M and 82M.

Figure 10B:
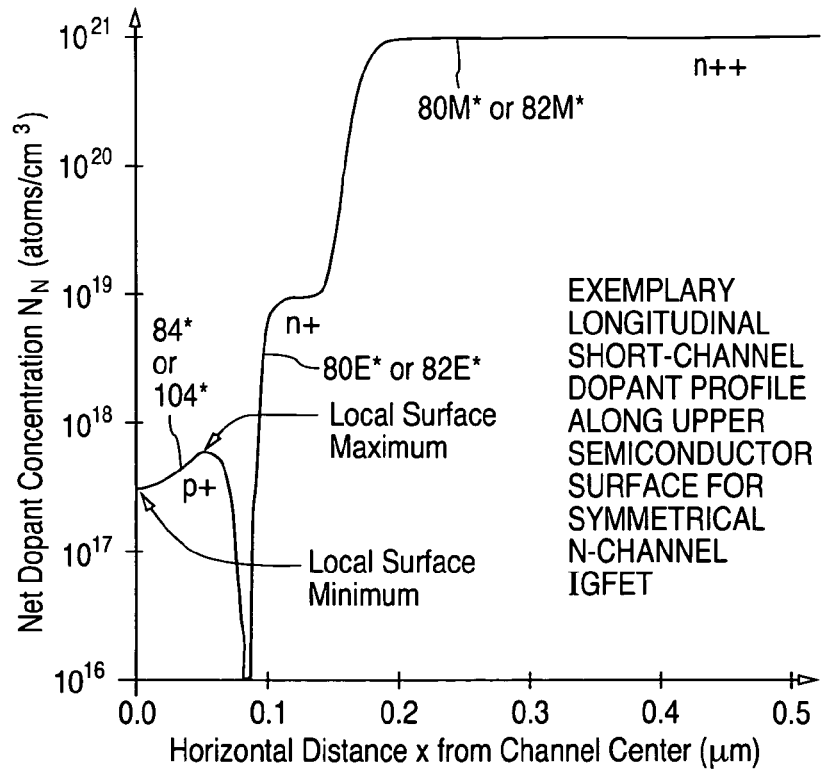

Similar to what occurs in channel zone 64, p+ extended halo pocket portion 104 provides channel zone 84 with a net dopant concentration that reaches a local surface minimum along the upper semiconductor surface in the longitudinal direction at a location between source/drain zones 80 and 82. An understanding of the shape of the dopant profile in channel zone 84 along the upper semiconductor surface is facilitated with the assistance of FIG. 10b which presents an example of how the net dopant concentration $N_N$ in short-channel IGFET 42 varies along the upper semiconductor surface in the longitudinal direction. Horizontal distance x in FIG. 10b is measured from the center lengthwise (channel center) of channel zone 84 along the upper semiconductor surface longitudinally towards either source/drain zone 80 or source/drain zone 82. Curve segments 84*, 104*, 80E*, 82E*, 80M*, and 82M* respectively represent the net dopant concentrations of components 84, 104, 80E, 82E, 80M, and 82M along the upper semiconductor surface.

The local surface minimum in the net dopant concentration of channel zone 84 in the longitudinal direction occurs at approximately the channel center of channel zone 84. Because composite halo pocket portion 104 extends fully across channel zone 84, the net surface dopant concentration of extended pocket portion 104, as represented by curve segment 104* in FIG. 10b, is the same as the net surface dopant concentration of channel zone 84, as represented by curve segment 84* in FIG. 10b. As indicated by curve segment 84* or 104* in FIG. 10b, the longitudinal local surface minimum in the net dopant concentration of channel zone 84 is significantly greater than $1 \times 10^{17}$ atoms/cm$^3$. An exemplary value for the longitudinal local surface minimum in the net dopant concentration of channel zone 84 is $4 \times 10^{17}$ atoms/cm$^3$. In any event, the longitudinal local surface minimum in the net dopant concentration of channel zone 84 is greater than the corresponding longitudinal local surface minimum in the net dopant concentration of channel zone 64.

The longitudinal local surface minimum in the net dopant concentration of channel zone 84 can be described as a occurring approximately at the center point of an imaginary line (not shown) extending longitudinally between source/drain zones 80 and 82 along the upper semiconductor surface. As indicated by curve portion 84*(or 104*) in FIG. 10b, the net surface dopant concentration of channel zone 84 increases in moving away from the point location of the longitudinal local surface minimum longitudinally towards source/drain zone 80 or 82 so as to longitudinally reach a local surface maximum at a location close to source/drain extension 80E or 82E.

Also, as described below in connection with FIGS. 36 and 37, the longitudinal local surface maximum in the net dopant concentration of channel zone 84 is normally greater than the corresponding longitudinal local surface maximum in the net dopant concentration for channel zone 64.

Somewhat similar to the dopant profile in channel zone 64 of long-channel IGFET 40, the surface dopant profile in channel zone 84 of short-channel IGFET 42 is shaped generally like a saddle in the longitudinal direction. FIG. 10b illustrates one half of the saddle shape for channel zone 84.

Separate halo pocket portions 100 and 102 and extended halo pocket portion 104 are defined by p-type dopant referred to here, for convenience, as the p-type halo dopant. As discussed below, the p-type halo dopant is introduced into channel zones 64 and 84 in the same doping operation.

The amount of p-type halo dopant utilized, per unit width of channel zone 84, to define extended halo pocket portion 104 is approximately equal to the amount of p-type halo dopant utilized, per unit width of channel zone 64, to define both of halo pocket portions 100 and 102. Accordingly, the surface dopant profiles in channel zones 84 and 64 are defined by approximately equal amounts of halo dopant per unit channel width. The halo dopant utilized to define halo pockets 100 and 102 and extended pocket 104 increases average net dopant concentration $N_C$ in each of channel zones 64 and 84. Inasmuch as channel zone 84 is of lesser channel length than channel zone 64, channel zone 84 is of greater average net dopant concentration than channel zone 64.

In other words, the presence of separate halo pocket portions 100 and 102 and extended halo pocket portion 104 causes average net channel dopant concentration $N_C$ to increase as channel length L decreases. By suitably choosing the amount of p-type halo dopant utilized, per unit channel width, to define halo pockets 100 and 102 and extended halo pocket 104, an $N_C(L)$ variation closely approximating the $N_C(L)$ curves of FIGS. 5 and 7 is implemented. Accordingly, a $V_T(L)$ variation closely approximating the threshold voltage roll-off compensating $V_T(L)$ curves of FIGS. 6 and 8 is implemented. Configuring halo pockets 100 and 102 and extended halo pocket 104 in the foregoing manner thereby alleviates short-channel threshold voltage roll-off. In addition, IGFET 42 which is of shorter channel length than IGFET 40 and is thereby of greater average net channel dopant concentration than IGFET 40 is of significantly greater threshold voltage than IGFET 40.

From another perspective, short-channel IGFET 42 and the channel surface dopant profile of FIG. 10b are the respective end products of long-channel IGFET 40 and the channel surface dopant profile of FIG. 10a as channel length L is reduced from the L value of channel zone 64 to the L value of channel zone 84. Halo pocket portions 100 and 102 then enable average net channel dopant concentration $N_C$ to increase with decreasing channel length for a given amount of p-type halo dopant, per unit channel width, producing halo pockets 100 and 102 and thereby causing the net dopant concentration in channel zone 64 to vary in the indicated saddle-shaped manner along the upper semiconductor surface in the longitudinal direction.

Also, for a given amount of p-type halo dopant, per unit channel width, causing the net dopant concentration of channel zone 84 to vary in the indicated saddle-shaped manner along the upper semiconductor surface in the longitudinal direction, the longitudinal local surface minimum of the net dopant concentration in channel zone 84 increases with decreasing channel length. This starts to occur when channel length L is made so small that halo pockets 100 and 102 in channel zone 64 just touch each other and start to evolve into extended halo pocket 104 of channel zone 84.

Figure 11:
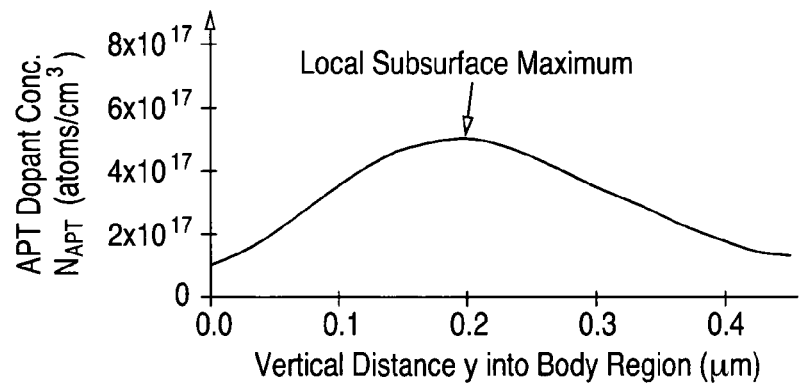
FIG. 11 is an exemplary graph of APT dopant concentration as a function of vertical distance into the body material at the channel center for the re-channel IGFETs of FIGS. 9a and 9b.

Body material 50 in both long-channel IGFET 40 and short-channel IGFET 42 is provided with a primary ion-implanted p-type dopant that substantially reduces punch-through. This ion-implanted dopant is for convenience, referred to here as the p-type anti-punchthrough (again, "APT") dopant even though it may do more than alleviate punchthrough. FIG. 11 illustrates an example of the vertical dopant profile for the p-type APT dopant. Vertical distance (or depth) y in FIG. 11 is measured from the upper semiconductor surface downward.

The p-type APT dopant in FIG. 11 has a concentration $N_{APT}$ that normally reaches a maximum value at a y depth of more than 0.1 µm below the upper semiconductor surface. The subsurface maximum in APT dopant concentration $N_{APT}$ normally occurs at a y depth of no more than 0.4 µm. Depth y of the subsurface maximum in concentration $N_{APT}$ is preferably 0.15-0.35 µm, typically 0.2 µm as depicted in FIG. 11.

Figure 12A:
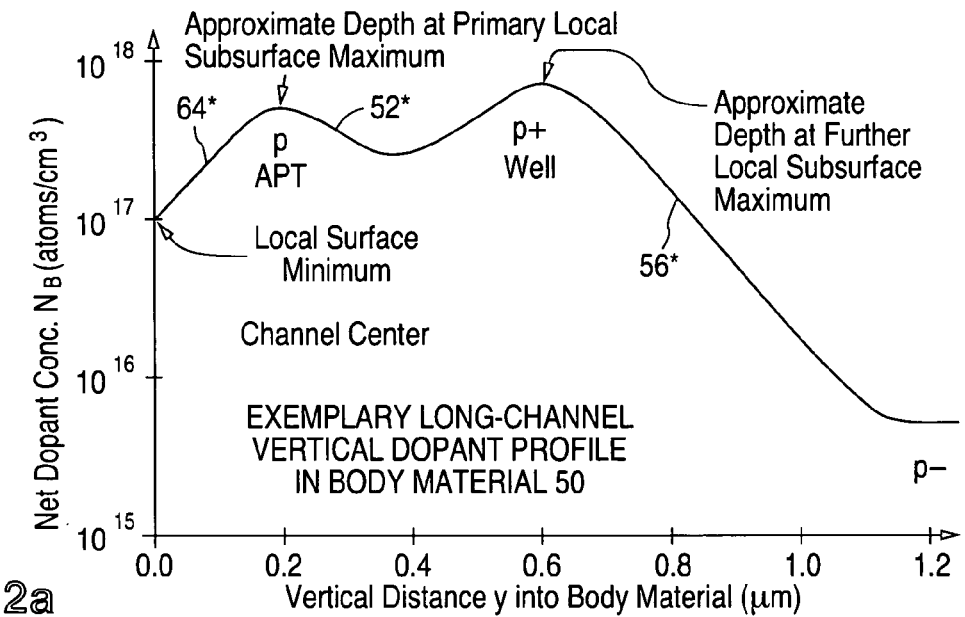
FIGS. 12a and 12b are exemplary graphs of net dopant concentration as a function of vertical distance into the body material at the channel center for the respective long and short n-channel IGFETs of FIGS. 9a and 9b.
Figure 12B:
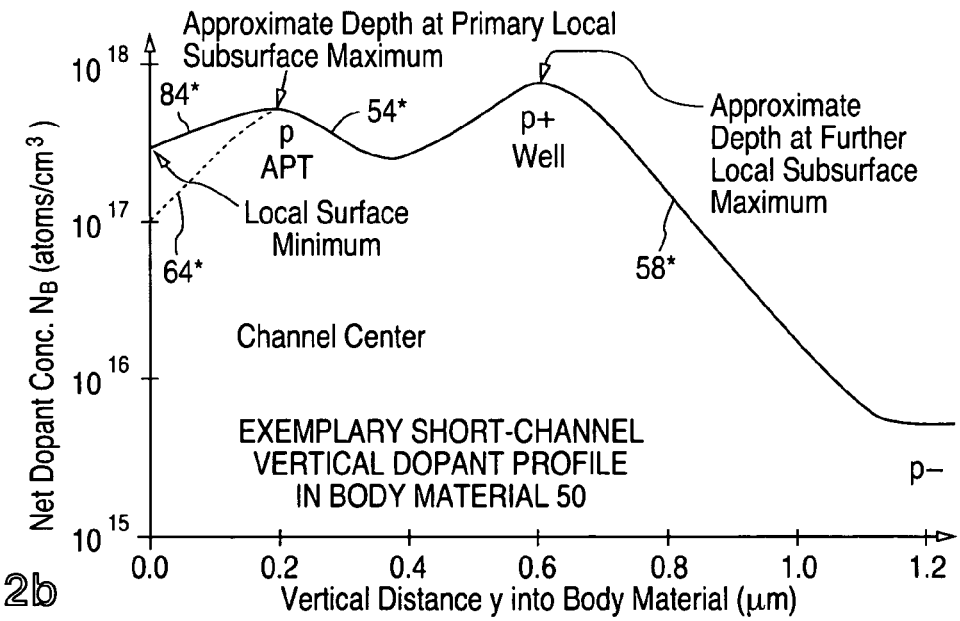

FIGS. 12a and 12b respectively illustrate how the p-type APT dopant affects the vertical dopant profiles in long n-channel IGFET 40 and short n-channel IGFET 42. In particular, FIGS. 12a and 12b depict examples of how the net dopant concentration $N_B$ in body material 50 varies in the vertical direction along cross sections respectively extending through the channel centers of IGFETs 40 and 42. Vertical distance (or depth) y in FIGS. 12a and 12b is measured from the upper semiconductor surface downward. Curve segments 64*, 52*, and 56* in FIG. 12a respectively represent the net dopant concentrations of components 64, 52, and 56 for IGFET 40. Curve segments 84*, 54*, and 58* in FIG. 12b respectively represent the net dopant concentrations of components 84, 54, and 58 for IGFET 42. Dotted curve segment 64* in FIG. 12b repeats solid curve segment 64* in FIG. 12a.

Upper body-material portion 52 for long-channel IGFET 40 is defined substantially by the combination of the p-type APT and halo dopants. Since neither of halo pocket portions 100 and 102 is present at the channel center in IGFET 40, curve segment 52* at the channel center closely reflects the vertical dopant profile of the p-type APT dopant in FIG. 11. Along a vertical location where halo pocket 100 or 102 is present, the net dopant concentration of upper portion 52 in the vicinity of the upper semiconductor surface is elevated compared to what is represented by curve segment 52* in FIG. 12a.

Upper body-material portion 54 for short-channel IGFET 42 is likewise defined substantially by the combination of the p-type APT and halo dopants. Because extended halo pocket portion 104 is present at the channel center in IGFET 42, curve segment 54* at the channel center in the vicinity of the upper semiconductor surface is elevated compared to the vertical dopant profile for the p-type APT dopant in FIG. 11. The amount of increased doping at the channel center is approximately the concentration difference between curve segments 84* and 64* in FIG. 12b. As indicated by curve segments 84* and 64*, the amount of increased doping at the channel center for IGFET 42 increases from essentially zero at a location below the upper semiconductor surface to a maximum at the upper semiconductor surface.

The p-type APT dopant is provided to p-type body material 50 in such a way that the net dopant concentration $N_B$ of body material 50 reaches a primary local subsurface maximum in each of upper body-material portions 52 and 54 at a y depth of more than 0.1 µm below the upper semiconductor surface but not more than 0.4 µm below the upper semiconductor surface. Net body dopant concentration $N_B$ for IGFET 40 or 42 may be approximately constant at its primary local subsurface maximum along a non-zero portion of, and typically nearly all of, an imaginary line (not shown) extending longitudinally from the channel center to each of source/drain zones 60 and 62 or 80 and 82 at the depth of the primary local subsurface maximum for that IGFET 40 or 42.

Alternatively, due to vertical spreading of the p-type halo dopant and greater presence of the halo dopant close to source/drain zones 60 and 62 or 80 and 82 than to the channel center, the primary local subsurface maximum in net body dopant concentration $N_B$ for IGFET 40 or 42 may occur at a non-zero distance longitudinally away from the channel center, typically close to each of source/drain zones 60 and 62 or 80 and 82. In either case, the depths of the primary local subsurface maxima in concentration $N_B$ for IGFETs 40 and 42 are respectively approximately the same as the depths at which the left-most humps of curve segments 52* and 54* in FIGS. 12a and 12b reach their maximum values. Depth y of each primary local subsurface maximum in concentration $N_B$ is preferably 0.15-0.35 µm, typically 0.2 µm, for each of IGFETs 40 and 42.

By having the p-type APT dopant reach maximum concentration more than 0.1 µm below the upper semiconductor surface, the vertical dopant profiles for channel zones 64 and 84 are of a soft retrograde nature. This is illustrated by curve curved segments 64* and 84* in FIGS. 12a and 12b. Also, the longitudinal local surface minimum in the net dopant concentration of channel zone 64 or 84 is less than the corresponding primary local subsurface maximum in net body dopant concentration $N_B$.

A depletion region (not shown) is induced in each of channel zones 64 and 84 along the upper semiconductor surface. The net dopant concentration in channel zones 64 and 84 is sufficiently high, especially along the upper semiconductor surface, that thickness $t_{d(INV)}$ of the surface depletion region at inversion for channel zone 64 or 84 is normally less than 0.1 µm. For example, surface depletion thickness $t_{d(INV)}$ is normally 0.04-0.06 µm, typically 0.05 µm. Accordingly, the primary local subsurface maximum in net body dopant concentration $N_B$ for each of IGFETs 40 and 42 normally occurs below its surface depletion region.

The p-type APT dopant causes net body dopant concentration $N_B$ to be considerably higher in channel zones 64 and 84 than in the bulk of body material 50. As indicated by curve segment 64* in FIG. 12a, the minimum value of the net dopant concentration in channel zone 64 is its longitudinal local surface minimum, $1 \times 10^{17}$ atoms/cm$^3$ in the example of FIG. 12a. The minimum value of the net dopant concentration in channel zone 84 is also its longitudinal local surface minimum and, as indicated by comparing curve segments 84* and 64* in FIG. 12b, is greater than the corresponding longitudinal local surface minimum in the net dopant concentration of channel zone 64. Hence, the longitudinal minimum value of the net dopant concentration in channel zones 64 and 84 is the longitudinal local surface minimum of the net dopant concentration in channel zone 64.

The longitudinal local surface minimum of the net dopant concentration in channel zone 64 is normally at least 10 times greater, typically 50 times greater, than the value of net dopant concentration $N_B$ in the bulk of body material 50. A depletion region (not shown) extends along the pn junction between body material 50 and each of source/drain zones 60, 62, 80, and 82. By utilizing the p-type APT dopant to so elevate the doping in channel zones 64 and 84 and by positioning the p-type APT dopant for channel zones 64 and 84 in the manner described above, the thickness in the body-side portion of each of these body-to-source/drain depletion regions is considerably reduced at any given value of drain-to-source voltage. The APT dopant thereby significantly inhibits the source/drain zone 60 or 62 which acts as the drain (at any particular time) for IGFET 40 from punching through to the other source/drain zone 62 or 60. The APT dopant likewise significantly inhibits the drain-acting source/drain zone 80 or 82 for IGFET 42 from punching through to the other source/drain zone 82 or 80.

P+ wells 56 and 58 are defined by a further ion-implanted p-type dopant provided to body material 50. This further ion-implanted dopant is referred to here, for convenience, as the p-type well dopant. Implantation of the p-type well dopant is accomplished in such a way that net dopant concentration $N_B$ of body material 50 reaches a pair of further local subsurface maxima at depths respectively below the depths of the primary local subsurface maxima in net body dopant concentration $N_B$. See FIGS. 12a and 12b. Depth y of the further local subsurface maxima in net body dopant concentration $N_B$ is normally 0.4-0.7 µm, typically 0.6 µm.

The further local subsurface maxima in net body dopant concentration $N_B$ for IGFETs 40 and 42 may occur away from their channel centers. However, the halo dopant typically has substantially no effect on body concentration $N_B$ at the depth of the further local subsurface maxima in body concentration $N_B$ for both of IGFETs 40 and 42. Accordingly, concentration $N_B$ for IGFET 40 or 42 is typically approximately constant at its further local subsurface maxima along a non-zero portion of, and typically nearly all of, an imaginary line (not shown) extending from the channel center to each of source/drain zones 60 and 62 or 80 and 82 at the depth of the further local subsurface maxima for IGFET 40 or 42. The depth and magnitude of the further local subsurface maxima in concentration $N_B$, in combination with the vertical Gaussian-like spread in the p-type well dopant, are normally of such a nature that the p-type well dopant has no significant effect on the net dopant concentration along the upper semiconductor surface.

Net dopant concentration $N_B$ in the lightly doped (p−) bulk of body material 50 is normally $3\times10^{15}$-$8\times10^{15}$ atoms/cm$^3$, typically $5\times10^{15}$ atoms/cm$^3$. Each of the primary local subsurface maxima in net body dopant concentration $N_B$ is normally $2\times10^{17}$-$8\times10^{17}$ atoms/cm$^3$, typically $5\times10^{17}$ atoms/cm$^3$. Each of the further local subsurface maxima in concentration $N_B$ is normally $5\times10^{17}$-$1\times10^{18}$ atoms/cm$^3$, typically $8\times10^{17}$ atoms/cm$^3$. Also, the local surface minimum in the net dopant concentration of channel zone 64 is $5\times10^{16}$-$2\times10^{17}$ atoms/cm$^3$, typically $1\times10^{17}$ atoms/cm$^3$.

Main source/drain portions 60M, 62M, 80M, and 82M, normally extend 0.1-0.2 µm, typically 0.18 µm, below the upper semiconductor surface. The vertical dimensions of FETs 40 and 42 are typically chosen so that main portions 60M, 62M, 80M, and 82M extend to lesser depths below the upper semiconductor surface than both the primary and further local subsurface maxima in net body dopant concentration $N_B$.

Main source/drain portions 60M, 62M, 80M, and 82M reach their maximum net dopant concentrations at, or close to (no more than 0.1 µm below), the upper semiconductor surface. The maximum net dopant concentration in main portions 60M, 62M, 80M, and 82M is normally $2\times10^{20}$-$2\times10^{21}$ atoms/cm$^3$, typically $1\times10^{21}$ atoms/cm$^3$. Source/drain extensions 60E, 62E, 80E, and 82E likewise reach their maximum net dopant concentrations at, or close to (no more than 0.05 µm below), the upper semiconductor surface. The maximum net dopant concentration in extensions 60E, 62E, 80E, and 82E is normally $5\times10^{18}$-$2\times10^{19}$ atoms/cm$^3$, typically $1\times10^{19}$ atoms/cm$^3$.

Source/drain zones 60 and 62 of long-channel IGFET 40 are typically configured so that the pn junction between upper body-material portion 52 and each of zones 60 and 62 has a "graded" characteristic. More particularly, in moving upward from the junction between body-material portion 52 and source/drain zone 60 or 62 along a vertical cross-section through the center lengthwise of main portion 60M or 62M of that zone 60 or 62, the vertical dopant profile rises less sharply, on the average, to the profile's maximum value than what would occur if the n-type dopant which defines source/drain zone 60 or 62 along that cross-section through main portion 60M or 62M were ion implanted at largely a single energy. The graded-junction characteristic is achieved by providing each source/drain zone 60 or 62 with a lower portion which underlies, and is more lightly doped than, main portion 60M or 62M. Source/drain zones 80 and 82 of short-channel IGFET 42 are then typically configured in the same way so that the pn junction between upper body-material portion 54 and each of zones 80 and 82 is a graded junction.

By configuring source/drain zones 60, 62, 80, and 82 so as to have graded-junction characteristics, the junction capacitance is reduced. Consequently, the switching speeds of IGFETs 40 and 42 are increased. For simplicity, the graded-junction features of source/drain zones 60, 62, 80, and 82 are not shown in FIGS. 9a and 9b or in the later drawings. Except for the p-channel graded-junction features shown in FIGS. 18a and 18b discussed below, the graded-junction features of other source/drain zones are likewise not shown in the drawings.

Thickness $t_{GD}$ of each of gate dielectric layers 66 and 86 is normally 2-10 nm, preferably 3-5 nm, typically 4 nm. Gate dielectric layers 66 and 86 normally contain atoms of silicon and oxygen. With no other element being present to a significant degree in layers 66 and 86, the silicon and oxygen form silicon oxide.

Gate dielectric layers 66 and 86 of n-channel IGFETs 40 and 42 are typically formed at the same time as the gate dielectric layers of p-channel IGFETs in the present semiconductor structure. When the gate electrodes of the p-channel IGFETs are formed with boron-doped polysilicon, atoms of nitrogen may be incorporated into the gate dielectric layers of the p-channel IGFETs, and thus also into gate dielectric layers 66 and 86 of IGFETs 40 and 42, to inhibit boron in the gate electrodes of the p-channel IGFETs from penetrating into the channel zones of the p-channel IGFETs. Gate dielectric layers 66 and 86 of n-channel IGFETs 40 and 42, along with the gate dielectric layers of the p-channel IGFETs, then consist of silicon oxynitride.

Threshold voltage $V_T$ of each of n-channel IGFETs 40 and 42 depends specifically on the average net dopant concentration in the IGFET's channel surface depletion region. In particular, threshold voltage $V_T$ increases as the average net dopant concentration in the surface depletion region increases, and vice versa. By setting IGFET 42 at shorter channel length than IGFET 40 so that the presence of separate halo pocket portions 100 and 102 and extended halo pocket portion 104 enables the local surface minimum in the net dopant concentration of channel zone 84 to be greater than the local surface minimum in the net dopant concentration of channel zone 64 and, consequently, so that short-channel IGFET 42 is of greater average net channel dopant concentration than long-channel IGFET 40, the average net dopant concentration in the surface depletion region of IGFET 42 is greater than the average net dopant concentration in the surface depletion region of IGFET 40. Hence, short-channel IGFET 42 is of greater threshold voltage than long-channel IGFET 40.

The channel surface depletion regions of IGFETs 40 and 42 normally contain parts of the p-type APT dopant. Consequently, threshold voltage $V_T$ of IGFET 40 or 42 can normally be controlled by controlling the characteristics of the APT dopant. When the total dosage of the APT dopant is increased, the amount of APT dopant in each surface depletion region is normally increased so as to increase the average net dopant concentration in each surface depletion region. Since threshold voltage $V_T$ increases with increasing average net dopant concentration in the surface depletion region, threshold voltage $V_T$ of each of IGFETs 40 and 42 can be increased by increasing the total dosage of the APT dopant, and vice versa.

At any given value of channel length L, threshold voltage $V_T$ for n-channel IGFET 40 or 42 typically increases approximately linearly with increasing dosage of the p-type APT dopant for relatively small variations in the APT dosage. Threshold voltage $V_T$ for IGFET 40 or 42 also typically increases approximately linearly with increasing dosage of the p-type halo dopant for relatively small variations in the halo dosage at any given value of channel length L. Consequently, threshold voltage $V_T$ for IGFET 40 or 42 at any given value of channel length L is described approximately by the following relationship for relatively small variations in the APT and halo dosages:

$$V_T = a \cdot \text{DOSE}_{Halo} + b \cdot \text{DOSE}_{APT} \tag{17}$$

where $\text{DOSE}_{Halo}$ is the dosage of the halo dopant, $\text{DOSE}_{APT}$ is the dosage of the APT dopant, and a and b are coefficients dependent on channel length L. Coefficients a and b are positive for n-channel IGFET 40 or 42.

Coefficients a and b are determined experimentally at each channel length value of interest for a semiconductor fabrication process whose characteristics are fixed aside from variations in the halo and APT dosages. While determining coefficients a and b can be laborious, Eq. 17 shows that a desired value of threshold voltage $V_T$ at any given value of channel length L can be achieved by suitably adjusting the halo dosage or/and the APT dosage.

The head of a distribution of semiconductor dopant ion implanted through a specified surface of a semiconductor body and into the body consists of the portion of the implanted dopant situated between the specified surface of the body and the location at which the dopant reaches maximum concentration. For a dopant implanted through the upper semiconductor surface, the head of the dopant is therefore the upper portion of the dopant. As mentioned above, the primary local subsurface maxima in net dopant concentration $N_B$ of body material 50 normally occur respectively below the surface depletion regions. Since the primary local subsurface maxima in net body dopant concentration $N_B$ are formed by the p-type APT dopant, substantially only part of the head of the APT implant is normally present in each channel surface depletion region.

The p-type APT dopant is introduced into the semiconductor body by ion implantation. Increasing the implantation energy causes the primary local subsurface maxima in net body dopant concentration $N_B$ for IGFETs 40 and 42 to occur at greater depth below the upper semiconductor surface so that the length of the head of the APT dopant is increased. As the head of the APT dopant becomes longer, less of the APT dopant accumulates in each channel surface depletion region. This reduces the average net dopant concentration in each surface depletion region. Since threshold voltage $V_T$ decreases with decreasing average net dopant concentration in the associated surface depletion region, threshold voltage $V_T$ of each of IGFETs 40 and 42 can be decreased by increasing the implantation energy of the APT dopant so as to increase the depth at which the primary local subsurface maxima in net body dopant concentration $N_B$ occurs below the upper semiconductor surface, and vice versa.

As further mentioned above, the implanted p-type well dopant which creates the further local subsurface maxima in net body dopant concentration $N_B$ normally has no significant effect on the net dopant concentration along the upper semiconductor surface. More particularly, the amount of well dopant present in the channel surface depletion regions is normally insignificant compared to the amount of implanted p-type APT dopant present in the surface depletion regions. Accordingly, the p-type well dopant normally has no significant effect on threshold voltage $V_T$ of IGFET 40 or 42.

N-channel IGFETs 40 and 42 can be modified by providing body material 50 with a third ion-implanted p-type dopant to flatten the vertical dopant profile between the primary (APT) and further (well) local subsurface maxima in net body dopant concentration $N_B$ for each of IGFETs 40 and 42 and thereby bolster the performance characteristics by eliminating weak areas where current leakage can occur, including well-to-well leakage. This third dopant is referred to here, for convenience, as the isolation dopant because it helps isolate p-wells 56 and 58 from an adjacent n-type well so as to avoid well-to-well leakage.

Figure 13A:
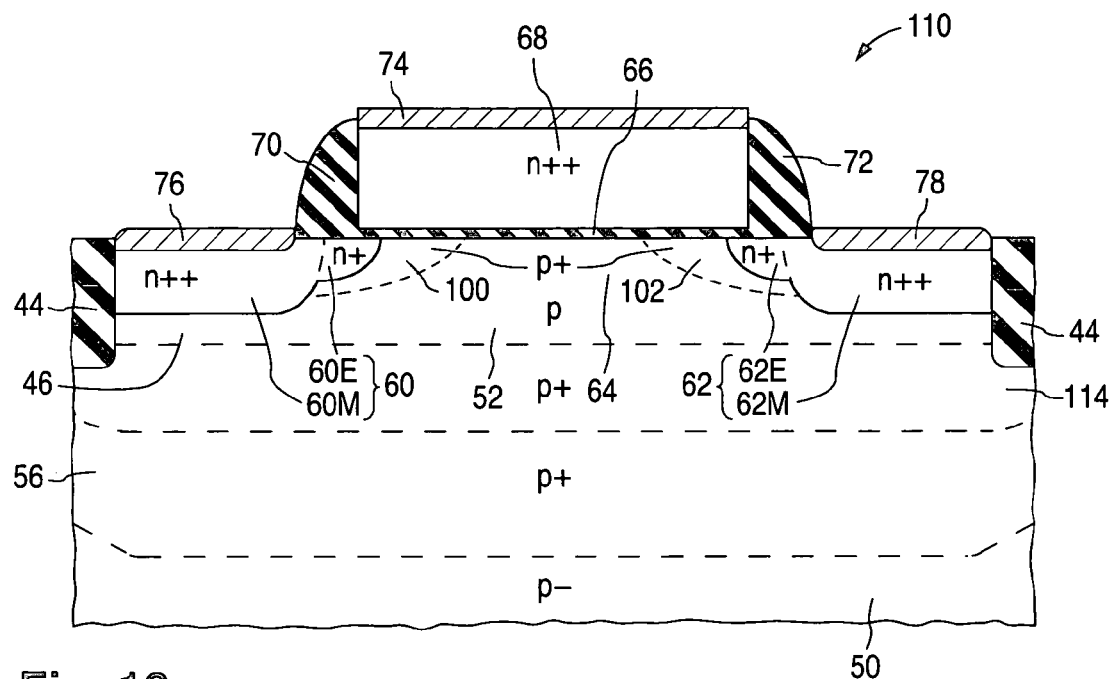
FIGS. 13a and 13b are front cross-sectional views of additional respective symmetrical long and short n-channel IGFETs configured and manufactured according to the invention.
Figure 13B:
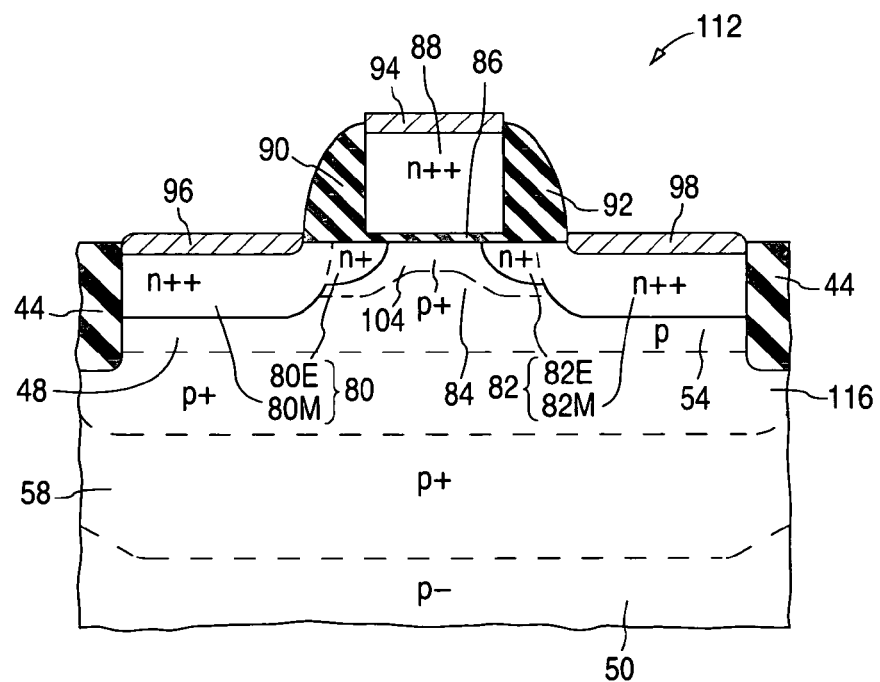

FIGS. 13*a* and 13*b* respectively illustrate a symmetrical long n-channel IGFET 110 and a symmetrical short n-channel IGFET 112 created from a monosilicon semiconductor body furnished with the p-type isolation dopant along with the p-type APT and well dopants. Except for the isolation dopant, IGFETs 110 and 112 are respectively identical to IGFETs 40 and 42. Accordingly, short-channel threshold voltage roll-off is alleviated in IGFETs 110 and 112 in substantially the same way as in IGFETs 40 and 42.

Body material 50 in n-channel IGFETs 110 and 112 contains a pair of heavily doped intermediate portions 114 and 116 defined by the p-type isolation dopant. P+ intermediate portion 114 lies between upper body-material portion 52 and well 56 and extends partly into active region 46 for IGFET 110. P+ intermediate portion 116 lies between upper body-material portion 54 and well 58 and extends partly into active region 48 for IGFET 112. Although intermediate portions 114 and 116 are described here as heavily doped, they can also be described as moderately doped.

Figure 14A:
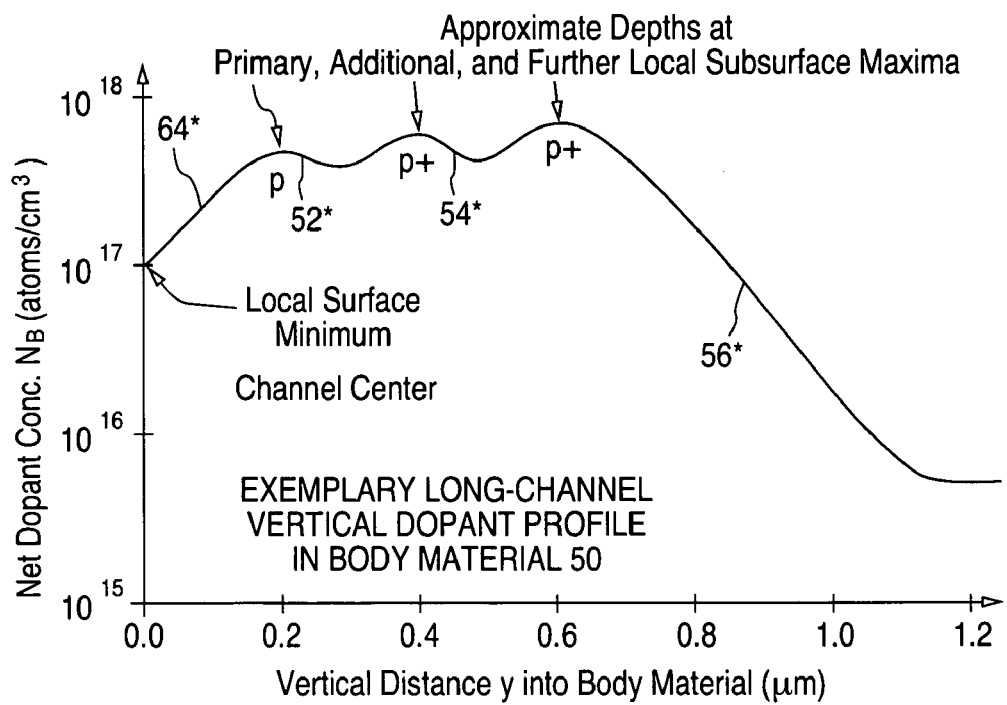
FIGS. 14a and 14b are exemplary graphs of net dopant concentration as a function of vertical distance into the body material at the channel center for the respective long and short n-channel IGFETs of FIGS. 13a and 13b.
Figure 14B:
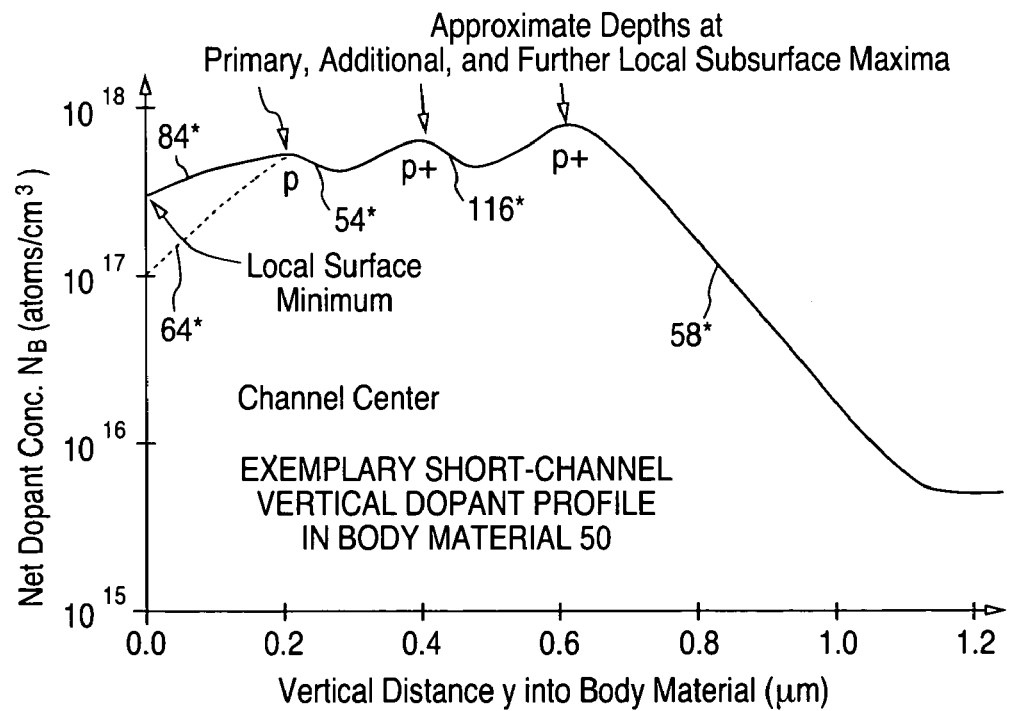

FIGS. 14*a* and 14*b* depict how the p-type isolation dopant affects the vertical dopant profiles along cross sections respectively extending through the channel centers in n-channel IGFETs 110 and 112. Aside from this, FIGS. 14*a* and 14*b* largely respectively repeat FIGS. 12*a* and 12*b*. Curve segment 114* in FIG. 14*a* represents the net dopant concentration of intermediate body-material portion 114. Curve segment 116* in FIG. 14*b* represents the net dopant concentration of intermediate body-material portion 116.

Intermediate body-material portions 114 and 116 are defined by providing the semiconductor body with the p-type isolation dopant in such a way that net dopant concentration $N_B$ of body material 50 reaches a pair of additional local subsurface maxima at depths respectively below the depths of the primary subsurface maxima in net body concentration $N_B$ but respectively above the depths of the further local subsurface maxima in body concentration $N_B$. Depth y of the additional local subsurface maxima in concentration $N_B$ is normally 0.3-0.5 μm, typically 0.4 μm, below the upper semiconductor surface. Each of the additional local subsurface maxima in concentration $N_B$ is normally $2 \times 10^{17} - 8 \times 10^{17}$ atoms/cm$^3$, typically $5 \times 10^{17}$ atoms/cm$^3$.

The semiconductor structure containing long n-channel IGFET 40 and/or short n-channel IGFET 42, or long n-channel IGFET 110 and/or short n-channel IGFET 112, normally also contains a long p-channel IGFET and/or a short p-channel IGFET. The p-channel IGFETs typically are, but need not be, configured analogously to n-channel IGFETs 40 and 42, or n-channel IGFETs 110 and 112, for alleviating short-channel threshold voltage roll-off and avoiding punchthrough in accordance with the invention.

Figure 15A:
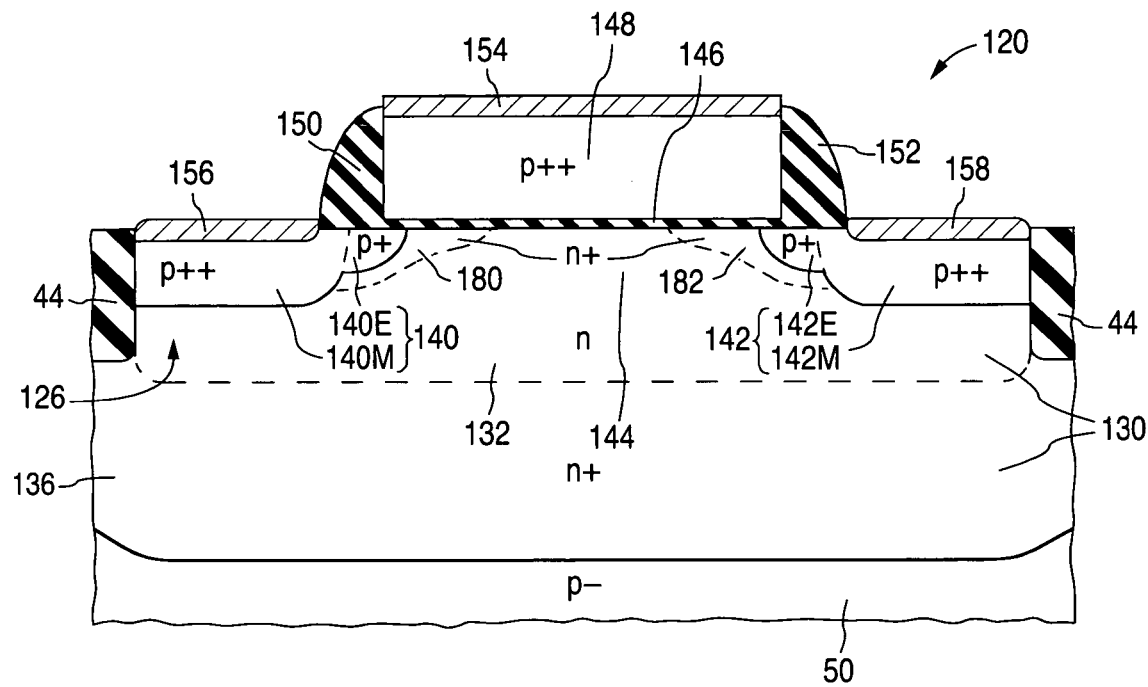
FIGS. 15a and 15b are front cross-sectional views of respective symmetrical long and short p-channel IGFETs configured and manufactured according to the invention, typically along with the n-channel IGFETs of FIGS. 9a and 9b.
Figure 15B:
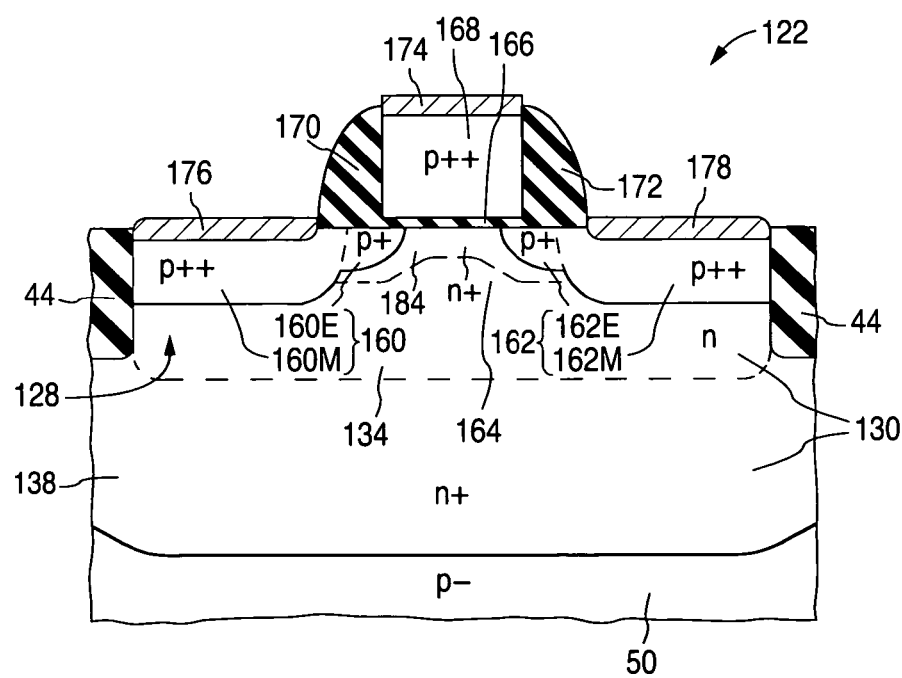

FIGS. 15*a* and 15*b* respectively illustrate a symmetrical long p-channel IGFET 120 and a symmetrical short p-channel IGFET 122 so configured according to the invention. Just as the semiconductor structure containing one or more n-channel IGFETs configured according to the invention need not contain any p-channel IGFET configured according to the invention, the semiconductor structure containing long p-channel IGFET 120 and/or short p-channel IGFET 122 need not contain any n-channel IGFET configured according to the invention.

P-channel IGFETs 120 and 122 may be part of the same overall semiconductor structure and thus are manufactured according to the same fabrication process. For simplicity, p-channel IGFETs 120 and 122 are treated here as being part of the same semiconductor structure in the following description of FIGS. 15*a* and 15*b*. Alternatively, IGFETs 120 and 122 may be part of separately fabricated, and thus different, semiconductor structures. In this case, largely the same fabrication process is employed to manufacture IGFETs 120 and 122.

For the indicated case in which p-channel IGFETs 120 and 122 are part of the same semiconductor structure, the active semiconductor portions of IGFETs 120 and 122 are respectively formed in active regions 126 and 128 laterally surrounded by field-insulating region 44. The semiconductor body utilized for creating IGFETs 120 and 122 contains n-type body material 130 situated over the lightly doped bulk of p-type body material 50. IGFETs 120 and 122 may be formed from a single region of n-type body material 130 or from a pair of laterally separated regions of body material 130. In the latter case, part of p-type body material 50 normally laterally separates the two regions of n-type body material 130 below field insulation 44.

N-type body material 130 includes a pair of upper portions 132 and 134 respectively analogous to, and doped in a complementary way, to upper portions 52 and 54 of p-type body material 50. N-type body material 130 also includes a pair of heavily doped well portions 136 and 138 respectively analogous to p+ well portions 56 and 58 of body material 50.

P-channel IGFETs 120 and 122 contain source/drain zones (including source/drain extensions and graded-junction features), channel zones, a pair of laterally separated halo pocket portions in the channel zone of long-channel IGFET 120, a pair of halo pocket portions merged together to form a composite extended halo pocket portion in the channel zone of short-channel IGFET 122, gate dielectric layers, doped polysilicon gate electrodes, gate sidewall spacers, and metal silicide layers configured the same as the corresponding elements in n-channel IGFETs 40 and 42 but indicated by reference symbols 80 higher in FIGS. 15*a* and 15*b*. Each of the semiconductor regions in p-channel IGFETs 120 and 122 is of the same relative dopant concentration level, but of opposite conductivity type, to the corresponding semiconductor region in n-channel IGFETs 40 and 42. Pn junction depths are typically slightly greater in p-channel IGFETs 120 and 122 than in n-channel IGFETs 40 and 42. Subject to these comments, short-channel threshold voltage roll-off and punchthrough are alleviated in p-channel IGFETs 120 and 122 in substantially the same way as in n-channel IGFETs 40 and 42.

Separate halo pocket portions 180 and 182 for long p-channel IGFET 120 and extended halo pocket portion 184 for short p-channel IGFET 122 are defined by n-type halo dopant analogous to the p-type halo dopant used for n-channel IGFETs 40 and 42. N-type upper body-material portions 132 and 134 for p-channel IGFETs 120 and 122 are defined by the combination of the n-type halo dopant and an ion-implanted n-type APT dopant analogous to the p-type APT dopant used for n-channel IGFETs 40 and 42. P-channel IGFETs 120 and 122 may also be modified analogous to the way in which n-channel IGFETs 40 and 42 are modified to produce n-channel IGFETs 110 and 112.

Threshold voltage $V_T$ for a p-channel IGFET of the invention can be controlled in the same way utilized to control threshold voltage $V_T$ for an n-channel IGFET of the invention. For example, threshold voltage $V_T$ of p-channel IGFET 120 or 122 can be controlled by adjusting the implantation energy of the n-type APT dopant. At any given value of channel length L, threshold voltage $V_T$ of IGFET 120 or 122 thus satisfies Eq. 17 for small variations in the APT and halo dosages subject to coefficients a and b being negative here.

Fabrication of IGFET Structure According to Invention

FIGS. 16*a*-16*m* (collectively "FIG. 16") illustrate a complementary-IGFET process in accordance with the invention for manufacturing n-channel IGFETs 40 and 42 and p-channel IGFETs 120 and 122. Only the fabrication of short-channel IGFETs 42 and 122 is, for simplicity, actually depicted in FIG. 16. Long-channel IGFETs 40 and 120 are manufactured according to the same fabrication steps utilized to manufacture short-channel IGFETs 42 and 122. The only difference in fabrication is that IGFETs 40 and 120 are respectively laid out to be of greater channel length than IGFETs 42 and 122. To help clarify the fabrication of long-channel IGFETs 40 and 120, reference symbols particular to the manufacture of IGFETs 40 and 120 are generally indicated parenthetically after the respective reference symbols for short-channel IGFETs 42 and 122 in the fabrication process described below.

Although the semiconductor structure created according to the present complementary-IGFET fabrication process is described below as having all of IGFETs 40, 42, 120, and 122, the semiconductor structure may have only one of n-channel IGFETs 40 and 42 and/or only one of p-channel IGFETs 120 and 122. Any of IGFETs 40, 42, 120, and 122 not created in the semiconductor structure described below are normally created in one or more other semiconductor structures fabricated according to largely the same fabrication steps as utilized in the below-described fabrication process. Also, the fabrication steps unique to the creation of p-channel IGFETs 120 and 122 can be deleted from the fabrication process so that the semiconductor structure only contains n-channel IGFET 40 and/or n-channel IGFET 42, and vice versa.

Except for the p-type and n-type halo ion implantation steps, all of the ion implantation steps in the present fabrication process are performed roughly perpendicular to the lower semiconductor surface and thus roughly perpendicular to the upper semiconductor surface. More particularly, all of the non-halo implantation steps are performed at a selected angle, typically 7°, to the vertical. This small deviation from perpendicularity for the non-halo implantation steps is used to avoid undesirable ion channeling effects. For simplicity, the small non-halo deviation from perpendicularity is not indicated in FIG. 16.

Unless otherwise indicated, the species of n-type dopant utilized in each of the n-type ion implantations in the fabrication process of FIG. 16 consists of the specified n-type dopant in elemental form. That is, each n-type ion implantation is performed with ions of the specified n-type dopant element rather than with ions of a chemical compound that contains the n-type dopant. The species of p-type dopant employed in each of the p-type ion implantations variously consists of the p-type dopant, normally boron, in elemental or compound form. Hence, each p-type ion implantation is normally performed with boron ions or with ions of a boron-containing compound.

The starting point for the fabrication process of FIG. 16 is a monocrystalline semiconductor body consisting of a heavily doped p-type substrate 200 and an overlying lightly doped p-type epitaxial layer 50P. See FIG. 16a. P+ substrate 200 is a semiconductor wafer formed with <100> monosilicon doped with boron to achieve a typical resistivity of 0.015 ohm-cm. For simplicity, substrate 200 is not shown in the remainder of FIG. 16. Alternatively, the starting point can simply be a lightly doped p-type substrate.

P− epitaxial layer 50P consists of epitaxially grown <100> monosilicon doped with boron to achieve a typical resistivity of 30 ohm-cm corresponding to the typical value, $5 \times 10^{15}$ atoms/cm$^3$, for net dopant concentration $N_B$ in the bulk of p-type body material 50. Epitaxial layer 50P is a precursor to body material 50, the letter "P" at the end of a reference symbol being utilized here to indicate a precursor to a region identified by the portion of the reference symbol preceding the letter "P". The thickness of epitaxial layer 50P is typically 5.5 μm.

Field-insulating region 44 is provided along the upper surface of p− epitaxial layer 50P so as to define active regions 48 (46) and 128 (126) for IGFETs 42 (40) and 122 (120). See FIG. 16b. Field insulation 44 is preferably created according to a trench-oxide technique such as that described in Wang, U.S. patent application Ser. No. 09/211,703, filed 14 Dec. 1998, now U.S. Pat. No. 6,461,932 B1, the contents of which are incorporated by reference. In this case, field insulation 44 typically extends 0.35 μm into epitaxial layer 50P. Field insulation 44 may also be created according to a local-oxidation technique. In providing field insulation 44, a thin screen insulating layer 202 of silicon oxide is thermally grown along the upper surface of epitaxial layer 50P. Screen-oxide layer 202 is typically 15 nm in thickness.

Figure 16A:
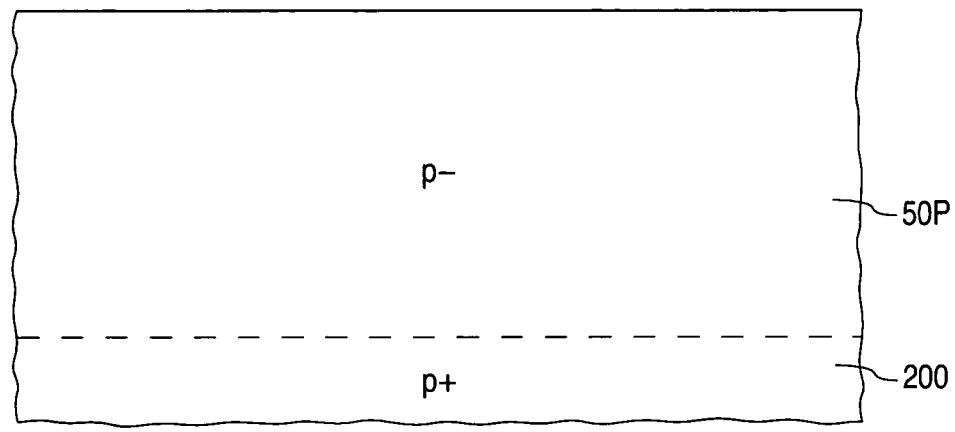
FIGS. 16a-16m are front cross-sectional views representing steps in a fabrication process according to the invention for manufacturing the IGFETs of FIGS. 9a, 9b, 15a, and 15b.
Figure 16B:
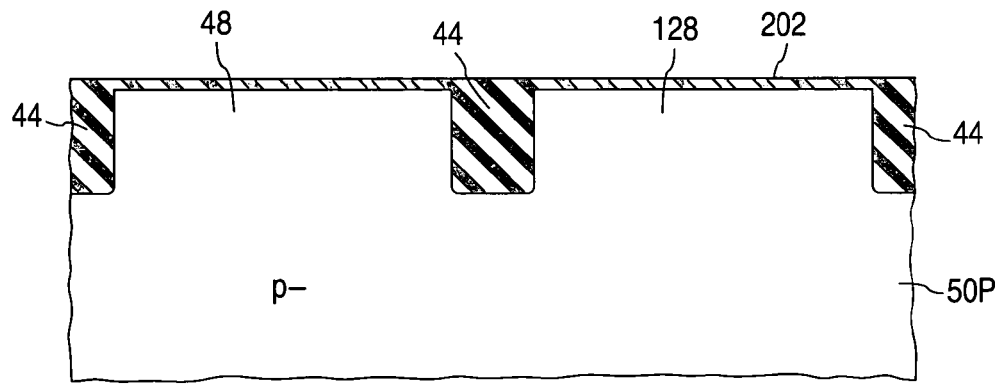
Figure 16C:
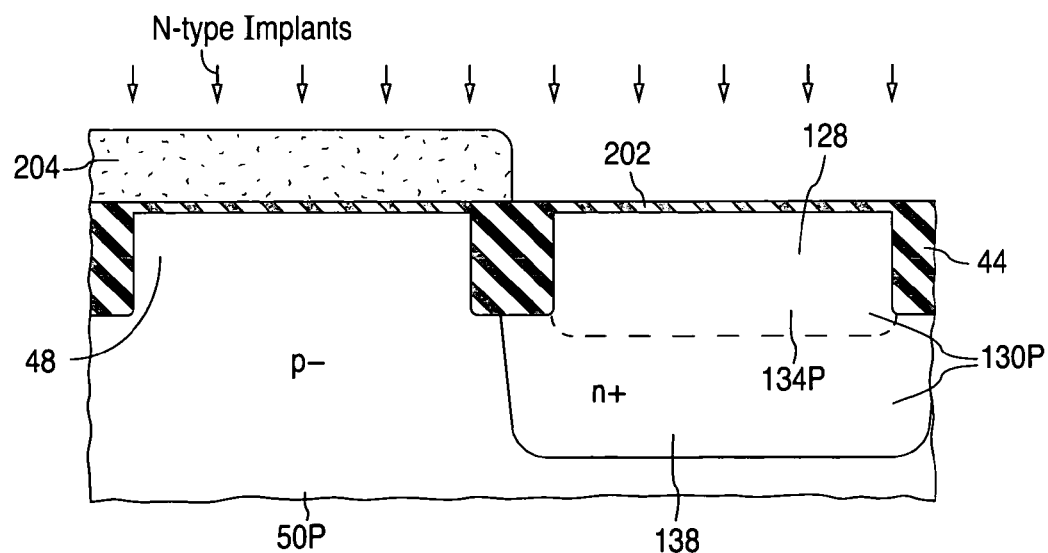
Figure 16D:
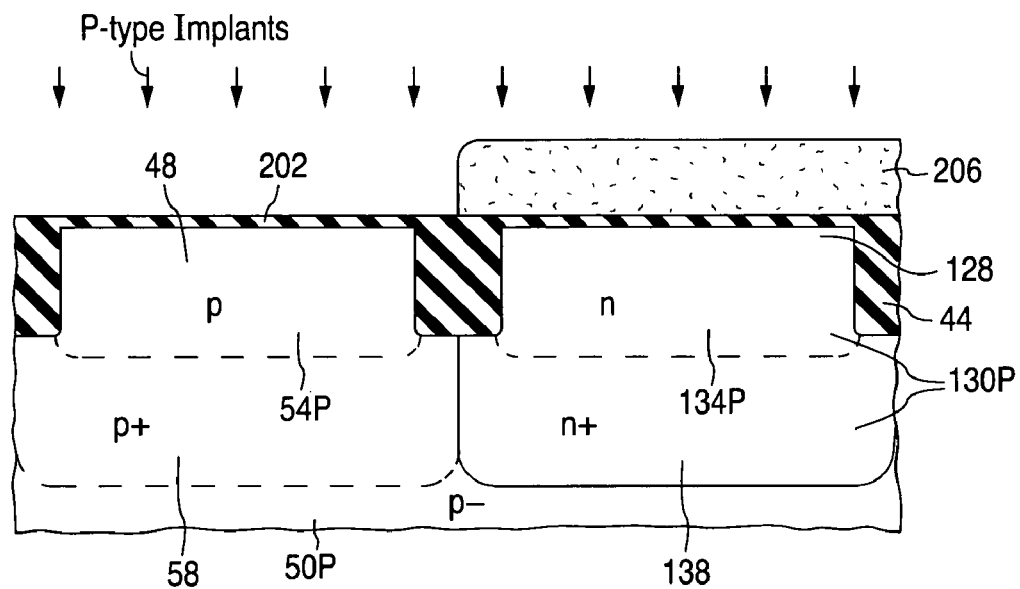
Figure 16E:
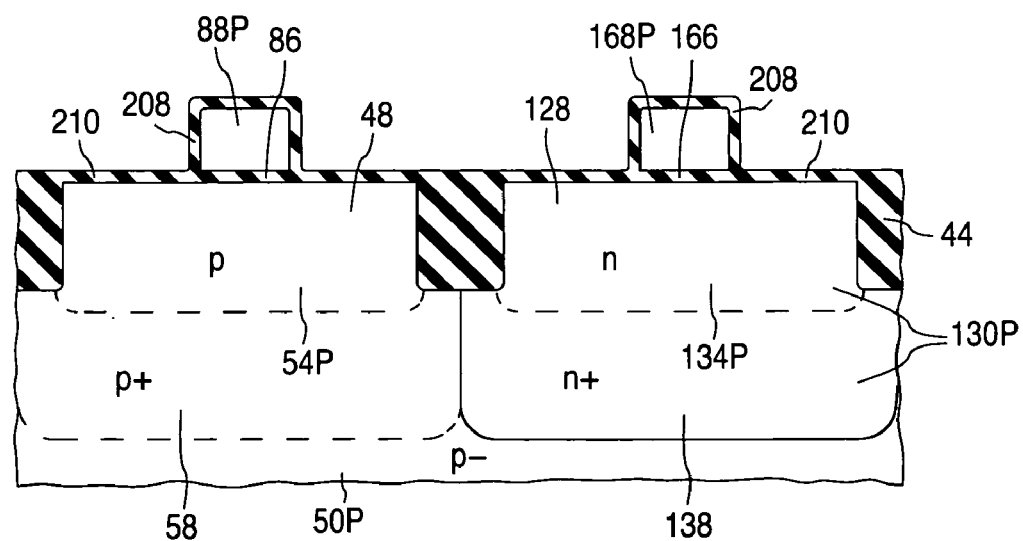

A photoresist mask 204 is formed on screen-oxide layer 202 above active region 48 (46) as indicated in FIG. 16c. Precursor n-type body material 130P is formed in p− epitaxial layer 50P by introducing n-type dopant through the section of screen oxide 202 not covered by photoresist 204 and into the underlying semiconductor material. Body material 130P consists of a moderately doped n-type surface-adjoining precursor upper portion 134P (132P) and an underlying heavily doped n-type well portion 138 (136).

N+ well 138 (136) is defined by ion implanting a species of an n-type well dopant at a heavy dosage through the uncovered section of screen oxide 202 and into epitaxial layer 50P. The dosage of the n-type well dopant is $5 \times 10^{12}$-$4 \times 10^{13}$ ions/cm$^2$, typically $2 \times 10^{13}$ ions/cm$^2$. The n-type well dopant may consist of phosphorus or arsenic. The implantation energy for the n-type well dopant is typically selected so that, in the final semiconductor structure, the n-type well dopant has no significant effect on the average net dopant concentration along the upper semiconductor surface, and, in particular, has no significant effect on threshold voltage $V_T$ of p-channel IGFET 122 (120). For the typical case in which phosphorus constitutes the n-type well dopant, the implantation energy is 400-600 KeV, typically 500 KeV.

N upper body-material portion 134P (132P) is defined by introducing a species of an n-type dopant at a moderate dosage through the uncovered section of screen-oxide layer 202 and into epitaxial layer 50P. This n-type dopant serves, at least, to alleviate punchthrough and is, for convenience, referred to as the n-type APT dopant. Introduction of the n-type APT dopant into the semiconductor body is performed by ion implantation. The dosage of the n-type APT dopant is $1 \times 10^{12}$-$1 \times 10^{13}$ ions/cm$^2$, typically $3 \times 10^{12}$ ions/cm$^2$. The n-type APT dopant may consist of phosphorus or arsenic.

In the final semiconductor structure, the n-type APT dopant has a vertical dopant profile similar to that shown in FIG. 11 for the p-type APT dopant. The implantation energy for the n-type APT dopant is selected so that, after gate electrode 168 (148) is created for p-channel IGFET 122 (120), the n-type APT dopant reaches a maximum concentration in upper body-material portion 134 (132) at a depth of more than 0.1 μm below the upper semiconductor surface but not more than 0.4 μm below the upper semiconductor surface. The depth of the maximum concentration of the n-type APT dopant is preferably 0.15-0.35 μm, typically 0.2 μm, below the upper semiconductor surface. For the typical case in which phosphorus constitutes the n-type APT dopant, the implantation energy is 120-140 KeV, typically 130 KeV.

The n-type APT dopant causes net dopant concentration $N_B$ of n-type body material 130 in the final semiconductor structure to reach a primary local subsurface maximum in n-type upper body-material portion 134 at a depth of more than 0.1 μm below the upper semiconductor surface but not more than 0.4 μm below the upper semiconductor surface. The depth of the primary local subsurface maximum in concentration $N_B$ is preferably 0.15-0.35 μm, typically 0.2 μm, below the upper semiconductor surface. Also, the depth of the primary local subsurface maximum in concentration $N_B$ for p-channel IGFET 122 (120) is normally greater than the thickness of its channel surface depletion region.

Similar to what was said above about the p-type APT dopant, substantially only part of the head of the n-type APT dopant is present in the surface depletion region of p-channel IGFET 122 (120). The magnitude of threshold voltage $V_T$ of IGFET 122 (120) can thereby be decreased largely independent of channel length by increasing the implantation energy of the n-type APT dopant so as to increase the depth at which the primary local subsurface $N_B$ maximum occurs in upper body-material portion 134 (132), and vice versa.

Implantation of the n-type APT dopant can be performed before implanting the n-type well dopant. Also, if the semiconductor structure is to be provided with an ion-implanted n-type isolation dopant analogous to the p-type isolation dopant described above, the n-type isolation dopant is ion implanted through the uncovered section of screen oxide 202 while photoresist 204 is in place. The n-type isolation dopant may consist of phosphorus or arsenic. When phosphorus constitutes the n-type isolation dopant, the implantation energy is typically 230 KeV. The n-type isolation implant can be performed as the first, second, or third of the three n-type implantations. Photoresist 204 is removed after performing these two or three n-type implantations.

A photoresist mask 206 is formed on screen oxide 202 above active region 128 (126). See FIG. 16d. P-type dopant is introduced through the section of screen oxide 202 not covered by photoresist 206 and into the underlying semiconductor material to provide epitaxial layer 50P with a moderately doped p-type surface-adjoining precursor upper portion 54P (52P) and a heavily doped p-type well portion 58 (56).

P+ well 58 (56) is defined by ion implanting a species of the above-mentioned p-type well dopant at a heavy dosage through the uncovered section of screen oxide 202. The dosage of the p-type well dopant is $1 \times 10^{13}$-$3 \times 10^{13}$ ions/cm$^2$, typically $2\times10^{13}$ ions/cm$^2$. The p-type well dopant may consist of boron in elemental form or in the form of boron difluoride. The implantation energy for the p-type well dopant is typically selected so that, in the final semiconductor structure, the p-type well dopant does not significantly affect threshold voltage $V_T$ of n-channel IGFET 42 (40). For the typical case in which the p-type well dopant consists of elemental boron, the implantation energy is 200-220 KeV, typically 210 KeV.

P upper body-material portion 54P (52P) is defined by ion implanting a species of the above-mentioned p-type APT dopant at a moderate dosage through the uncovered section of screen oxide 202. The dosage of the p-type APT dopant is $2\times10^{12}$-$1\times10^{13}$ ions/cm$^2$, typically $5\times10^{12}$ ions/cm$^2$. The p-type APT dopant may consist of boron in elemental form or in the form of boron difluoride.

FIG. 11 illustrates the typical vertical dopant profile for the p-type APT dopant in the final semiconductor structure. The implantation energy for the p-type APT dopant is selected so that, after gate electrode 88 (68) is created for n-channel IGFET 42 (40), the p-type APT dopant reaches a maximum concentration in upper body-material portion 54 (52) at a depth of more than 0.1 µm below the upper semiconductor surface but not more than 0.4 µm below the upper semiconductor surface. For the typical case in which the p-type APT dopant consists of elemental boron, the implantation energy is 40-70 KeV, typically 60 KeV.

Implantation of the p-type APT dopant can be performed before implanting the p-type well dopant. If the semiconductor structure is to be provided with intermediate p-type body-material portion 116 (114), the above-mentioned p-type isolation dopant for intermediate portion 116 (114) is implanted through the uncovered section of screen oxide 202 while photoresist 206 is in place. The p-type isolation dopant normally consists of elemental boron implanted at an energy of 110 KeV. The p-type isolation dopant can be performed as the first, second, or third of the three p-type implantations. Photoresist 206 is removed after performing these two or three p-type implantations.

A thermal anneal is optionally performed on the resultant semiconductor structure to repair lattice damage and place the implanted n-type and p-type dopants in energetically more stable sites so as to minimize further diffusion of these dopants during subsequent thermal operations, especially the final anneal described below. This optional anneal, referred to here as the well-APT anneal, is preferably a rapid thermal anneal ("RTA") at 1000-1100° C., typically 1075° C., for 5-20 sec., typically 10 sec. The RTA is normally performed in a non-reactive environment, typically nitrogen, but can be done in a reactive, e.g., oxidizing, environment. By using the RTA, the implanted dopants are activated without significant dopant movement (redistribution). Although the above-mentioned implantation steps define precursor upper body-material portions 54P (52P) and 134P (132P) and wells 58 (56) and 138 (136), the annealing step completes the formation of these regions.

Subsequent to the well-APT anneal, screen oxide 202 is removed, and the upper semiconductor surface is cleaned. A composite gate dielectric layer, portions of which constitute gate dielectric layers 86 (66) and 166 (146), is provided along the upper semiconductor surface to a thickness of 2-10 nm. See FIG. 16e. The composite gate dielectric layer is normally thermally grown. To prevent redistribution of the dopants in upper body-material portions 54P (52P) and 134P (132P) and wells 58 (56) and 138 (136), the thermal growth of the composite gate dielectric is usually performed in a "wet" environment according to a thermal profile in which the maximum thermal-oxidation temperature is relatively low, typically 700-900° C.

The thermally grown composite gate dielectric layer typically consists of silicon oxide for which the wet environment is formed with oxygen and hydrogen. The thickness of the silicon oxide is normally 3-5 nm, typically 4 nm. Alternatively, in thermally growing the composite gate dielectric layer, atoms of nitrogen may be incorporated into the composite gate dielectric by providing oxygen from a gas, such as nitrous oxide or nitric oxide, containing nitrogen in a reactive form in order to prevent boron in gate electrode 168 (148) of p-channel IGFET 122 (120) from diffusing into channel zone 164 (144). The thickness of the resulting silicon oxynitride is likewise normally 3-5 nm, typically 4 nm.

Figure 17:
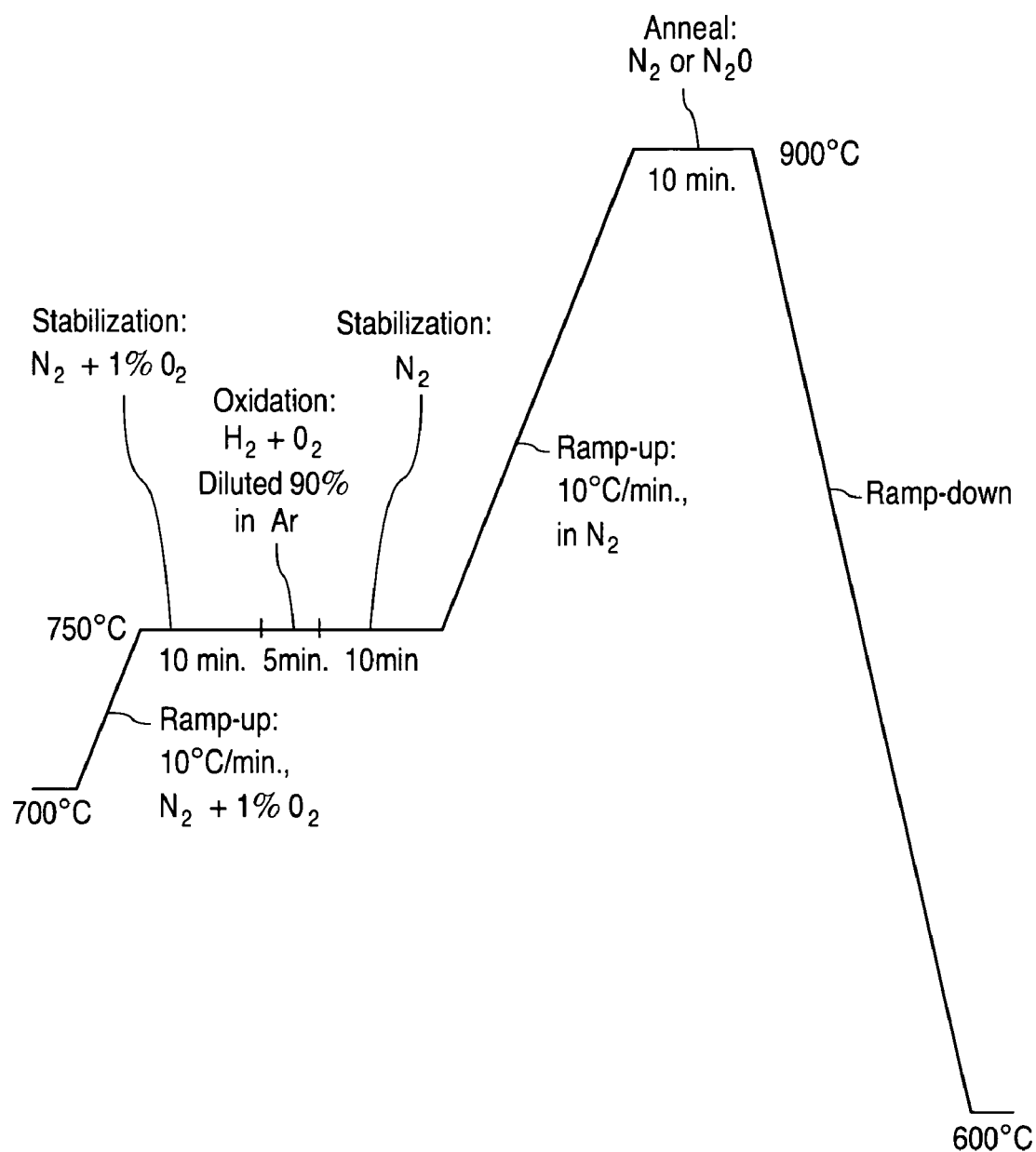
FIG. 17 is an exemplary graph of temperature as a function of time for growing a gate dielectric layer in the fabrication process of FIGS. 16a-16m.

FIG. 17 illustrates a typical thermal schedule for growing the composite gate dielectric layer according to a low-temperature wet oxidation technique, including the optional incorporation of nitrogen into the gate dielectric. The thermal schedule in FIG. 17 consists of a ramp-up from 700° C. to 750° C. at 10° C./min. in nitrogen with 1% oxygen, a stabilization at 750° C. for 10 min. in nitrogen with 1% oxygen, a thermal oxidation at 750° C. for 3-6 min., typically 5 min., in hydrogen and oxygen diluted 90% in argon, a stabilization at 750° C. for 10 min. in nitrogen, a ramp-up from 750° C. to 900° C. at 10° C./min. in nitrogen, an anneal at 900° C. for 10-15 min., typically 10 min., in nitrogen or nitrous oxide, and a ramp-down from 900 DC to 600° C. in nitrogen. The resulting gate dielectric thickness is typically targeted to be 4 nm.

The anneal at 900° C. in nitrogen or nitrous oxide determines whether the composite gate dielectric layer consists of silicon oxide or silicon oxynitride. When the 900° C. anneal is done is nitrogen, the gate dielectric layer consists substantially of silicon oxide. The gate dielectric layer consists of silicon oxynitride when the 900° C. anneal is done in nitrous oxide. This occurs because nitrous oxide is much more reactive than nitrogen and results in nitrogen being introduced into the gate dielectric.

Returning to FIG. 16e, a layer of largely undoped (intrinsic) polysilicon is deposited on top of the composite gate dielectric layer to a thickness of 200-300 nm, typically 250 nm. Utilizing a suitable photoresist mask (not shown), the polysilicon layer is patterned to produce precursor gate electrodes 88P (68P) and 168P (148P) respectively for IGFETs 42 (40) and 122 (120). Portions of the composite gate dielectric underlying precursor gate electrodes 88P (68P) and 168P (148P) respectively constitute gate dielectric layers 86 (66) and 166 (146) for IGFETs 42 (40) and 122 (120). Surface-adjoining parts of upper body-material portions 54P (52P) and 134P (132P) situated generally below, and extending laterally slightly beyond the opposite ends length-wise of precursor gate electrodes 88P (68P) and 168P (148P), respectively constitute intended locations for channel zones 84 (64) and 164 (144) of IGFETs 42 (40) and 122 (120).

A dielectric layer 208 of silicon oxide is thermally grown along the exposed surface of precursor polysilicon gate electrodes 88P (68P) and 168P (148P) to seal them. Seal-oxide layer 208 is typically 8 nm in thickness. During the polysilicon sealing step, the thickness of the gate dielectric material located along the portions of the upper semiconductor surface not covered by gate electrodes 88P (68P) and 168P (148P) increases slightly. This composite surface dielectric layer is indicated by reference symbol 210 in FIG. 16e.

Figure 16F:
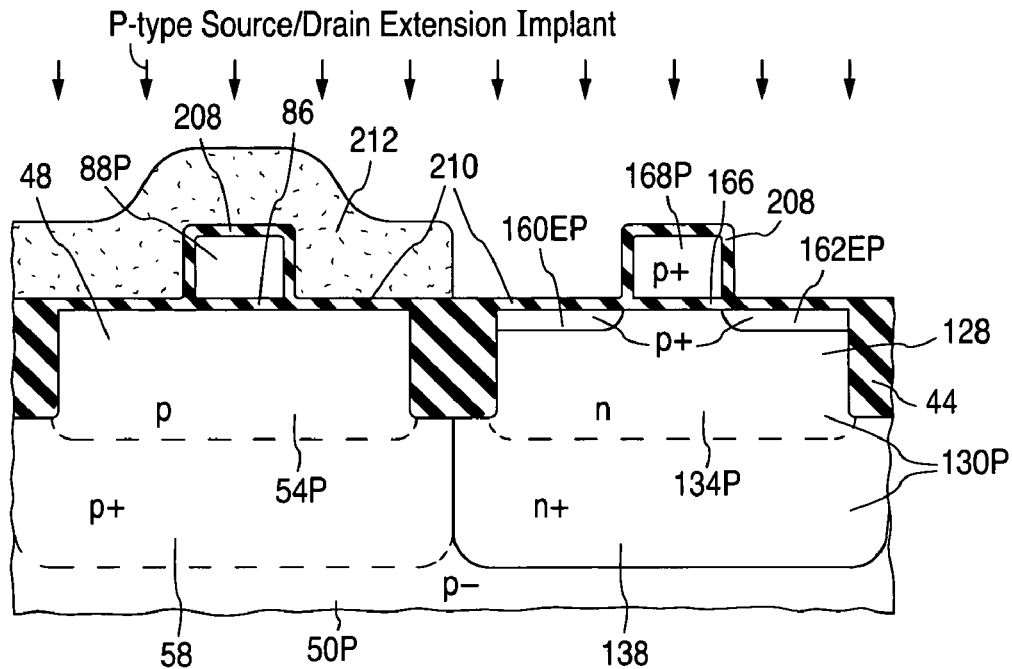

A photoresist mask 212 is formed on the portions of dielectric layers 208 and 210 overlying active region 48 (46) as shown in FIG. 16f. A pair of laterally separated heavily doped p-type precursor source/drain extensions 160EP and 162EP (140EP and 142EP) for p-channel IGFET 122 (120) are defined in n upper body-material portion 134P (132P) along the upper semiconductor surface by ion implanting a species of a p-type dopant at a heavy dosage through uncovered portions of surface dielectric layer 210 and into a pair of laterally separated surface-adjoining segments of body-material portion 134P (132P). The material consisting of photoresist mask 212, field insulation 44, gate electrode 168P (148P), and the portion of seal oxide 208 situated along electrode 168P (164P) forms a shield that largely blocks the p-type source/drain extension dopant from simultaneously passing through the upper semiconductor surface section directly underlying the shield.

The dosage of the p-type source/drain extension dopant is $3 \times 10^{13}$-$1 \times 10^{14}$ ions/cm$^2$, typically $6 \times 10^{13}$ ions/cm$^2$. The p-type source/drain extension dopant may consist of boron in elemental form or in the form of boron difluoride. For the typical case in which the p-type source/drain extension dopant consists of boron in the form of boron difluoride, the implantation energy is 8-15 KeV, typically 10 KeV.

Figure 16G:
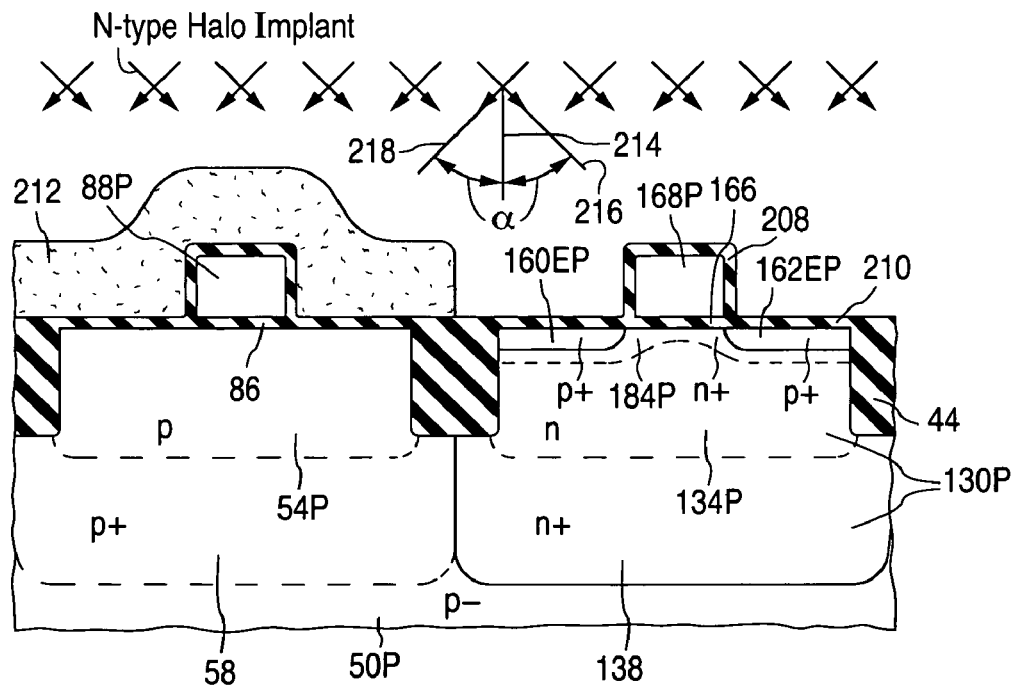

With photoresist mask 212 in place, a halo doping operation is performed for p-channel IGFET 122 (120) by appropriately introducing an n-type halo dopant into upper body-material portion 134P (132P) at a heavy dosage. For short-channel IGFET 122, the halo doping is performed in such a manner as to define a pair of heavily doped n-type precursor halo portions that merge together to establish a single heavily doped n-type composite precursor halo pocket portion 184P in the body-material portion intended for channel zone 164. See FIG. 16g. The merger of the two n+ precursor halo portions to define n+ precursor halo pocket portion 184P for IGFET 122 may occur during the halo doping operation as indicated in the example of FIG. 16g or later in the fabrication process. N+ halo pocket 184P extends laterally fully across the intended location for channel zone 164 and at least partway across (the location for) each of source/drain extensions 160EP and 162EP. FIG. 16g depicts an example in which halo pocket 184P extends fully across (the locations for) extensions 160EP and 162EP and thus fully across active region 128.

For long-channel IGFET 120, the halo doping causes a pair of laterally separated heavily doped n-type precursor halo pocket portions 180P and 182P (not shown) to be defined in the body-material portion intended for channel zone 144. N+ halo pocket portion 180P extends laterally partway across the intended location for channel zone 144 and at least partway across (the location for) source/drain extension 140EP. Similarly, n+ halo pocket portion 182P extends laterally partway across the intended location for channel zone 144 and at least partway across (the location for) source/drain extension 142EP.

Shadowing by items such as photoresist mask 212 and adjacent gate electrodes, including any material situated along the gate electrodes, may cause halo pocket 184P (180P and 182P) not to extend fully across (the locations for) source/drain extensions 160EP and 162EP (140EP and 142EP). See the models discussed below in connection with FIGS. 34, 35, and 36. In the most extreme case, halo pocket 184P (180P and 182P) extends only slightly across (the location for) extensions 160EP and 162EP (140EP and 142EP). When such shadowing occurs, electrically inconsequential portions of the n-type halo dopant may enter (the locations for) extensions 160EP and 162EP (140EP and 142EP) at locations (not indicated) spaced laterally apart from halo pocket 184P (180P and 182P).

The n-type halo dopant for IGFET 122 (120) is introduced by ion implantation through uncovered portions of surface dielectric layer 210 and through a pair of laterally separated primary sections of the upper semiconductor surface. The material consisting of photoresist mask 212, field insulation 44, gate electrode 168P (148P), and the portion of seal oxide 208 situated along electrode 168P (148P) forms a shield which largely blocks the n-type halo dopant from simultaneously passing through the upper semiconductor surface section directly underlying the shield.

Portions of the n-type halo dopant penetrate laterally under precursor gate electrode 168P (148P) from generally opposite directions along the length of IGFET 122 (120), i.e., laterally inward from the opposite transverse sides of gate electrode 168P (148P). In particular, the n-type halo dopant is of such characteristics and is implanted into upper body-material portion 134P (132P) in such a way and subsequent processing is performed on the semiconductor structure in such a manner that, in the final semiconductor structure, the n-type halo dopant has penetrated considerably further laterally under gate electrode 168 (148) from both directions along the IGFET's length than has the p-type source/drain extension dopant.

The concentration of the n-type halo dopant reaches a local surface minimum along the upper semiconductor surface in the intended location for channel zone 164 (144) of IGFET 122 (120) at a position between the intended locations for source/drain zones 160 and 162 (140 and 142) and increases in moving away from the location of the local surface minimum towards the intended location for each of source/drain zones 160 and 162 (140 and 142). Since n+ precursor extended halo pocket 184P for short-channel IGFET 122 is defined by the merger of two n+ halo portions that penetrate below precursor gate electrode 168P, the local surface minimum in the concentration of the halo dopant in the intended channel-zone location for IGFET 122 is greater than zero and occurs approximately at the location of the channel center. The location of the local surface minimum in the concentration of the halo dopant in the intended channel-zone location for IGFET 122 can be described as occurring approximately at the center point of an imaginary line (not shown) extending between the intended locations for source/drain zones 160 and 162 along the upper semiconductor surface.

The local surface minimum in the concentration of the n-type halo dopant in the intended location for channel zone 144 of long-channel IGFET 120 is zero because n+ precursor halo pockets 180P and 182P do not merge. This zero value for the local surface minimum in the concentration of the halo dopant in the intended channel-zone location for IGFET 120 occurs along a non-zero portion of an imaginary line (not shown) extending between the intended locations for source/drain zones 140 and 142 along the upper semiconductor surface. The local surface minimum in the concentration of the halo dopant is, of course, greater for short-channel IGFET 122 than for long-channel IGFET 120. Also, the amount of n-type halo dopant in the intended channel-zone location for IGFET 122 is approximately the same as the amount of n-type halo dopant in the intended channel-zone location for IGFET 120.

Angled ion implantation is preferably utilized to introduce the n-type halo dopant into upper-body material portion 134P (132P). Ions of a species of the n-type halo dopant are implanted into the semiconductor body at an average tilt angle α of at least 15°, normally at least 25°, relative to a direction perpendicular to the lower semiconductor surface and therefore generally perpendicular to the upper semiconductor surface. In FIG. 16g, reference symbol 214 represents a vertical line extending perpendicular to the lower semiconductor surface and thus generally perpendicular to the upper semiconductor surface. Tilt angle α is measured relative to a vertical line such as line 214.

Tilt angle α is also generally determined in a vertical plane, i.e., a plane extending generally perpendicular to the upper semiconductor surface, extending approximately in the direction of the channel length of the IGFET being fabricated. Accordingly, there are two determinations of angle α and thus two parts (or steps) in the n-type halo implantation. As shown in FIG. 16g, angle α is measured both to the right of vertical line 214 to a principal impingement axis 216 and to the left of line 214 to another principal impingement axis 218. Part, typically approximately one half, of the ions of the n-type halo dopant species impinge on the semiconductor body generally along, i.e., approximately parallel on the average to, principal axis 216. The remainder, likewise typically approximately one half, of the ions of the n-type halo dopant species impinge on the semiconductive body generally along principal axis 218. To implement both determinations of angle α, either the semiconductor body can be rotated appropriately about a vertical axis, or the ion implantation beam can be suitably moved.

Principal impingement axes 216 and 218 are typically largely fixed during the implantation of the n-type halo dopant. Nonetheless, principal axes 216 and 218 can be varied during the n-type halo dopant implantation. When axes 216 and 218 are fixed, the value of tilt angle α for axis 216 can differ from the value of angle α for axis 218. The two determinations of angle α are usually close to each other, normally within 10° of each other, preferably within 5° of each other, and typically approximately equal to each other.

The angled implantation arrangement illustrated in FIG. 16g is a version of a more general angled ion implantation arrangement in which impingement of ions of the n-type halo dopant species on photoresist mask 212 and the underlying semiconductor body is also characterized by an azimuthal (rotational) angle measured from some reference line in a plane extending generally parallel to the upper semiconductor surface. For instance, the reference line typically extends in the longitudinal direction for IGFET 122 (120), i.e., along the channel length from the location for one of source/drain zones 160 and 162 (140 and 142) to the location for the other. Using that definition, FIG. 16g depicts the situation in which the ions impinging on the semiconductor body at one of the determinations of tilt angle α are at an average azimuthal angle of 0° while the ions impinging on the semiconductor body at the other determination of angle α are at an average azimuthal angle of 180°. Hence, the angled implantation arrangement in FIG. 16g is performed from two opposite azimuthal orientations, one being in the positive direction of the reference line extending in the longitudinal direction, and the other being in the negative direction of the reference line.

The angled implantation arrangement of FIG. 16g is typically preferred if no significant amount of undesired ion channeling occurs when ions of the n-type halo dopant species enter the semiconductor body from the two azimuthal orientations of FIG. 16g. Should a significant amount of undesired ion channeling occur with the azimuthal arrangement of FIG. 16g, azimuthal orientations different from that represented in FIG. 16g are utilized to reduce the ion channeling.

In general, again using the preceding definition of azimuthal angle, one part of the ions of the n-type halo dopant species impinge on photoresist mask 212 and the semiconductor body at a first average azimuthal angle which normally differs from 0° by no more than 60°, preferably differs from 0° by no more than 45°, and typically differs from 0° by 30-35° to safely avoid ion channeling. The remainder of the ions impinge on mask 212 and the semiconductor body at a second average azimuthal angle which normally differs from 180° by no more than 60°, preferably differs from 180° by no more than 45°, and typically differs from 180° by 30-35° to safely avoid ion channeling. The two azimuthal angles normally differ by approximately 180°. Hence, one of the azimuthal angles is typically 30-35° (or −30-−35°) while the other azimuthal angle is typically 210-215° (or 145-150°).

Principal impingement axis 216 is at one of the azimuthal angles relative to the reference line. Principal impingement axis 218 is at the other azimuthal angle relative to the reference line. When the azimuthal angles differ by approximately 180°, principal axes 216 and 218 cross each other at an axial angle approximately equal to the sum of (a) tilt angle α for axis 216 and (b) tilt angle α for axis 218.

In the typical situation where the first and second azimuthal angles respectively differ from 0° and 180°, shadowing by items such as field insulation 44 typically produces some transverse asymmetry, i.e., asymmetry in the direction of the channel width, in the n-type halo doping across halo pocket 184P (180P and 182P). The degree of transverse halo asymmetry typically increases with increasing difference between the first azimuthal angle and 0° and/or with increasing difference between the second azimuthal angle and 180°.

The transverse halo asymmetry can be partially or wholly overcome by appropriately performing each above-mentioned part of the n-type halo implantation in two parts (or steps). Specifically, part of the n-type halo implantation at the first azimuthal angle is conducted at an azimuthal angle greater than 0° while the remainder of the implantation at the first azimuthal angle is conducted at an azimuthal angle less than 0°, both of these azimuthal angles meeting the broad specifications given above for the first azimuthal angle. The two azimuthal angles may, for example, differ from 0° by approximately equal amounts and thus be approximately equal in magnitude but of opposite sign.

Similarly part of the n-type halo implantation at the second azimuthal angle is conducted at an azimuthal angle greater than 180° while the remainder of the n-type halo implantation at the second azimuthal angle is conducted at an azimuthal angle less than 180°, both of these azimuthal angles meeting the broad specifications given above for the second azimuthal angle. The two azimuthal angles used here may, for instance, differ from 180° by approximately equal amounts. Further information on the azimuthal factors involved in angled ion implantation of the present type is presented in Wang et al, U.S. patent application Ser. No. 09/540,734, filed 31 Mar. 2000, now U.S. Pat. No. 6,566,204 B1, the contents of which are incorporated by reference to the extent not already disclosed herein.

The geometry of the semiconductor structure during the n-type halo dopant implantation is arranged so that the n-type halo dopant species ions directed along principal impingement axis 216 pass through part or all of the section of surface dielectric layer 210 to the immediate left of gate dielectric layer 166 (146) and, at least in part, end up in a part of upper body-material portion 134P (132P) located below precursor gate electrode 168P (148P) generally near its left-hand transverse side. Similarly, the n-type halo dopant species ions directed along principal impingement axis 218 pass through part or all of the section of upper dielectric layer 210 to the immediate right of gate dielectric 166 (146) and, at least in part, end up in a part of upper portion 134P (132P) located below gate electrode 168P (148P) generally near its right-hand transverse side.

The total dosage of the n-type halo dopant species is $8\times10^{12}$-$3\times10^{13}$ ions/cm$^2$, typically $1.6\times10^{13}$ ions/cm$^2$. Half of the n-type halo dosage is preferably furnished along each of principal impingement axes 216 and 218. Tilt angle α is typically 30° for the n-type halo implantation. The n-type halo dopant may consist of arsenic or phosphorus. For the typical case in which arsenic constitutes the n-type halo dopant, the implantation energy is 125-175 KeV, typically 150 KeV. Photoresist mask 212 is removed after completing the n-type halo implantation.

Figure 16H:
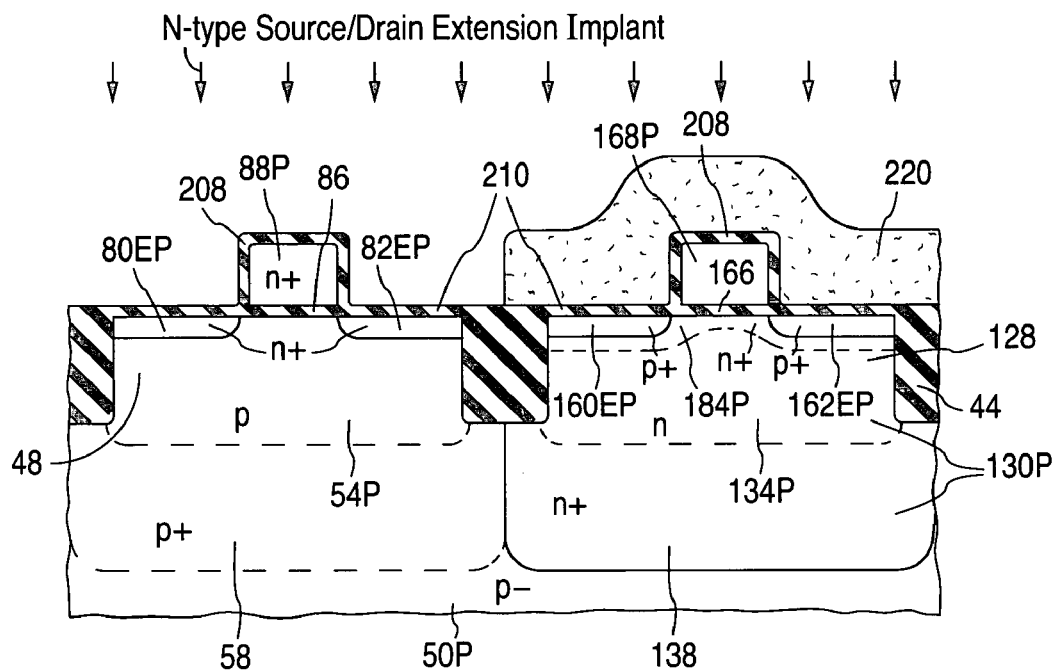

A photoresist mask 220 is formed on the portion of dielectric layers 208 and 210 overlying active region 128 (126) as shown in FIG. 16h. A pair of laterally separated heavily doped n-type precursor source/drain extensions 80EP and 82EP (60EP and 62EP) for n-channel IGFET 42 (40) are defined in p– upper body-material portion 54P (52P) along the upper semiconductor surface by ion implanting a species of an n-type dopant at a heavy dosage through uncovered portions of surface dielectric layer 210 and into a pair of laterally separated suggest-adjoining segments of body-material portion 54P (52P). The material consisting of photoresist mask 220, field insulation 44, gate electrode 88P (68P), and the portion of seal oxide 208 situated along electrode 88P (86P) forms a shield that largely blocks the n-type source/drain extension dopant from simultaneously passing through the upper semiconductor surface section directly underlying the shield.

The dosage of the n-type source/drain extension dopant is $3\times10^{14}$-$1\times10^{15}$ ions/cm$^2$, typically $5\times10^{14}$ ions/cm$^2$. The n-type source/drain extension dopant may consist of arsenic or phosphorus. For the typical case in which arsenic constitutes the n-type source/drain extension dopant, the implantation energy is 10-30 KeV, typically 20 KeV.

Figure 16I:
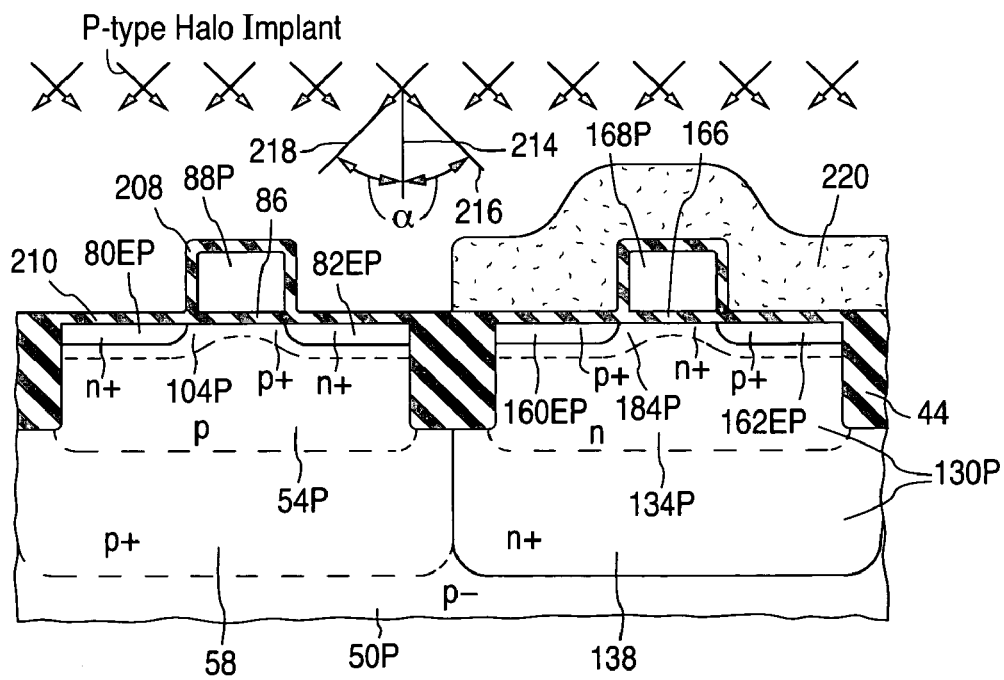
Figure 16J:
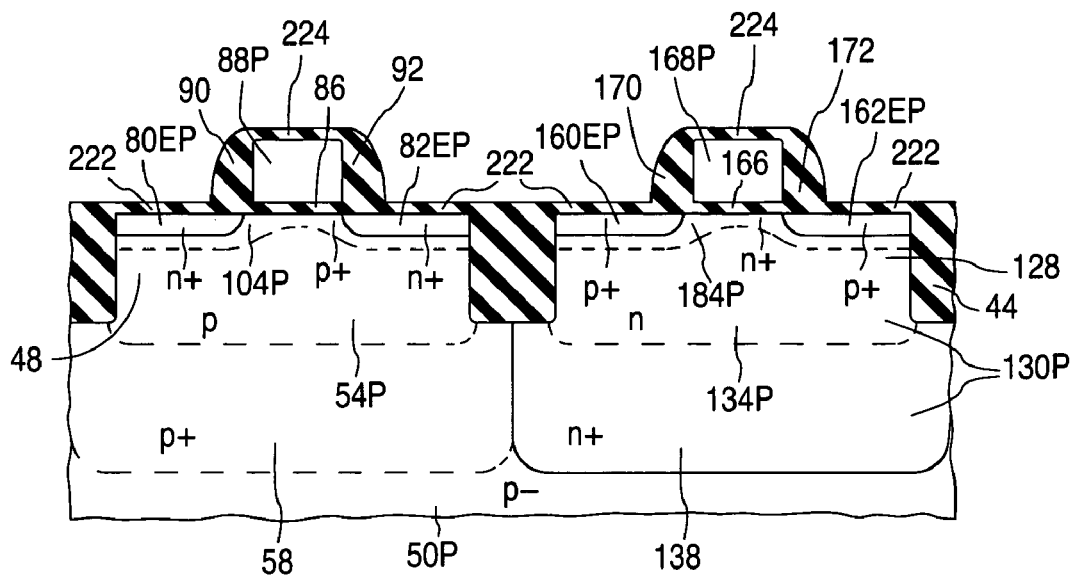

With photoresist mask 220 in place, a halo doping operation is performed for n-channel IGFET 42 (40) by appropriately introducing the above-mentioned p-type halo dopant into upper body-material portion 54P (52P) at a heavy dosage. For short-channel IGFET 42, the halo doping is performed in such a way as to define a pair of heavily doped p-type precursor halo pocket portions that merge together to establish a single heavily doped p-type composite precursor halo pocket portion 104P in the body-material portion intended for channel zone 84. See FIG. 16i. The merger of the two p+ precursor halo portions to define p+ precursor extended halo pocket portion 104P for IGFET 42 may occur during the p-type halo doping operation as indicated in the example of FIG. 16i or later in the fabrication process. P+ halo pocket 104P extends laterally across the intended location for channel zone 84 and at least partway across (the location for) each of source/drain extensions 80EP and 82EP. FIG. 16i illustrates an example where halo pocket 104P extends fully across (the locations for) extensions 80EP and 82EP and therefore fully across active region 48.

For long-channel IGFET 40, the halo doping causes a pair of laterally separated heavily doped p-type precursor halo pocket portions 100P and 102P (not shown) to be defined in the body-material portion intended for channel zone 64. P+ halo pocket portion 100P extends laterally partway across the intended location for channel zone 84 and at least partway across (the location for) source/drain extension 60EP. Similarly, p+ halo pocket 102P extends laterally partway across the intended location for channel zone 84 and at least partway across (the location for) source/drain extension 62EP.

As discussed below in connection with FIGS. 34-36, shadowing by photoresist mask 220 and adjacent gate electrodes, including material situated along the electrodes, may cause halo pocket 104P (100P and 102P) not to extend fully across (the locations for) source/drain extensions 80EP and 82EP (60EP and 62EP). At the extreme, halo pocket 104P (100P and 102P) extends only slightly across (the locations for) extensions 80EP and 82EP (60EP and 62EP). When such shadowing is a factor, electrically inconsequential portions of the p-type halo dopant may enter (the locations for) extensions 80EP and 82EP (60EP and 62EP) at locations (not indicated) laterally separated from halo pocket 104P (100P and 102P).

The p-type halo dopant for IGFET 42 (40) is introduced by implanting ions of a species of the dopant through uncovered portions of surface dielectric layer 210 and through a pair of laterally separated primary sections of the upper semiconductor surface. The material consisting of photoresist mask 220, field insulation 44, precursor gate electrode 88P (68P), and the portion of seal oxide 208 situated along electrode 88P (68P) forms a shield which largely blocks the p-type halo dopant from simultaneously passing through the upper semiconductor surface section directly underlying the shield.

Portions of the p-type halo dopant penetrate laterally under precursor gate electrode 88P (68P) from generally opposite directions along the length of IGFET 42 (40), i.e., laterally inward from the opposite transverse sides of gate electrode 88P (68P). Specifically, the p-type halo dopant is of such characteristics and is implanted into upper body-material portion 54P (52P) in such a manner and subsequent processing is performed on the semiconductor structure in such a way that, in the final semiconductor structure, the p-type halo dopant has penetrated considerably further laterally under gate electrode 88 (68) from both directions along the IGFET's length than has the n-type source/drain extension dopant.

The concentration of the p-type halo dopant reaches a local surface minimum along the upper semiconductor surface in the intended location for channel zone 84 (64) of IGFET 42 (40) at a position between the intended locations for source/drain zones 80 and 82 (60 and 62) and increases in moving away from the location of the local surface minimum towards the intended location for each of source/drain zones 80 and 82 (60 and 62). Since p+ precursor extended halo pocket 104P for short-channel IGFET 42 is defined by the merger of two p-type halo portions that penetrate below precursor gate electrode 88P, the local surface minimum in the concentration of the p-type halo dopant in the intended channel-zone location for IGFET 42 is greater than zero and occurs approximately at the location of the channel center. The location of the local surface minimum in the concentration of the halo dopant in the intended channel-zone location for IGFET 42 can be described as occurring approximately at the center point of an imaginary line (not shown) extending between the intended locations for source/drain zones 80 and 82 along the upper semiconductor surface.

The local surface minimum in the concentration of the p-type halo dopant in the intended location for channel zone 64 of long-channel IGFET 40 is zero because p+ precursor halo pockets 100P and 102P do not merge. This zero value for the local surface minimum in the concentration of the halo dopant in the intended channel-zone location for IGFET 40 occurs along a non-zero portion of an imaginary line (not shown) extending between the intended locations for source/drain zones 60 and 62 along the upper semiconductor surface. The local surface minimum in the concentration of the halo dopant is, or course, greater for short-channel IGFET 42 than for long-channel IGFET 40. Also, the amount of p-type halo dopant in the intended channel-zone location for IGFET 42 is approximately the same as the amount of p-type halo dopant in the intended channel-zone location for IGFET 40.

Angled ion implantation is preferably employed to introduce the p-type halo dopant into upper body-material portion 54P (52P). The angled implantation for the p-type halo dopant is performed in the manner generally described above for the angled implantation of the n-type halo dopant. Accordingly, average tilt angle α is at least 15°, normally at least 25°, for implanting the p-type halo dopant. FIG. 16*i* repeats vertical line 214 and principal impingement axes 216 and 218 for the two determinations of angle α. The azimuthal considerations described above for the n-type halo implantation likewise apply to the p-type halo implantation.

The geometry of the semiconductor structure during the p-type halo dopant implantation is arranged so that the p-type halo dopant species ions directed along principal impingement axis 216 pass through part or all of the section of upper dielectric layer 210 to the immediate left of gate dielectric layer 86 (66) and, at least in part, end up in the part of upper body-material portion 54P (52P) located below precursor gate electrode 88P (68P) generally near its left-hand transverse side. Similarly, the p-type halo dopant species ions directed along principal impingement axis 218 pass through part or all of the section of dielectric layer 210 to the immediate right of gate dielectric layer 86 (66) and, at least in part, end up in part of upper portion 54P (52P) located below gate electrode 88P (68P) generally near its right-hand transverse side.

The total dosage of the p-type halo dopant species is $8 \times 10^{12}$-$1.5 \times 10^{13}$ ions/cm$^2$, typically $1 \times 10^{13}$ ions/cm$^2$. Half of the p-type halo dosage is preferably furnished along each of impingement axes 216 and 218. Tilt angle α is typically 35° for the p-type halo implantation. The p-type halo dopant may consist of boron in elemental form or in the form of boron difluoride. For the typical case in which the p-type halo dopant consists of boron in the form of boron difluoride, the implantation energy is 50-100 KeV, typically 75 KeV. Photoresist mask 220 is removed after completing the p-type halo implantation.

The n-type halo doping operation can be performed before the p-type source/drain extension doping operation. Photoresist mask 212 is then created before the n-type halo doping and removed after the p-type source/drain extension doping. Similarly, the p-type halo doping operation can be performed before the n-type source/drain extension doping operation. In this case, photoresist mask 220 is created before the p-type halo doping and removed after the n-type source/drain extension doping. In addition, the combination of the n-type source/drain extension doping, the p-type halo doping, and the formation/removal of photoresist 220 can be performed before the combination of the p-type source/drain extension doping, the n-type halo doping, and the formation/removal of photoresist 212.

An extended-time furnace anneal, referred to as the source/drain extension anneal, at a relatively low temperature may be performed at this point to remove defects caused by the heavy dosages of the source/drain extension implants. When performed, the source/drain extension anneal is done at 540-560° C., typically 550° C., for 60-120 min., typically 90 min., in a non-reactive environment or in a reactive oxygen-containing environment. When the source/drain extension anneal is done in a reactive oxygen-containing environment, the thicknesses of dielectric layers 208 and 210 increases slightly.

Next, dielectric spacer pair 90 and 92 (70 and 72) for IGFET 42 (40) and dielectric spacer pair 170 and 172 (150 and 152) for IGFET 122 (120) are provided respectively along the transverse sidewalls of precursor gate electrodes 88P (68P) and 168P (148P). See FIG. 16*j*. In particular, a thin layer of tetraethyl orthosilicate (again, "TEOS") is deposited on top of the structure, typically to a thickness of 30 nm. A considerably thicker layer of silicon nitride is deposited on the TEOS layer, typically to a thickness of 100 nm. An anisotropic etch is performed generally perpendicular to the upper semiconductor surface to remove largely all the silicon nitride, except for portions situated on the TEOS layer to the sides of gate electrodes 88P (68P) and 168P (148P). Each gate sidewall spacer 90, 92, 170, or 172 (70, 72, 150, or 152) thereby consists of a main silicon nitride portion situated on a TEOS footer which overlies portions of dielectric layers 208 and 210.

The portions of the TEOS layer not covered by the silicon nitride portions of gate sidewall spacers 90, 92, 170, and 172 (70, 72, 150, and 152) are removed. The underlying portions of dielectric layers 208 and 210 are partially, but not totally, removed. Items 222 and 224 in FIG. 16*j* respectively indicate the remainders of dielectric layers 210 and 208 not covered by sidewall spacers 90, 92, 170, and 172 (70, 72, 150 and 152).

Figure 16K:
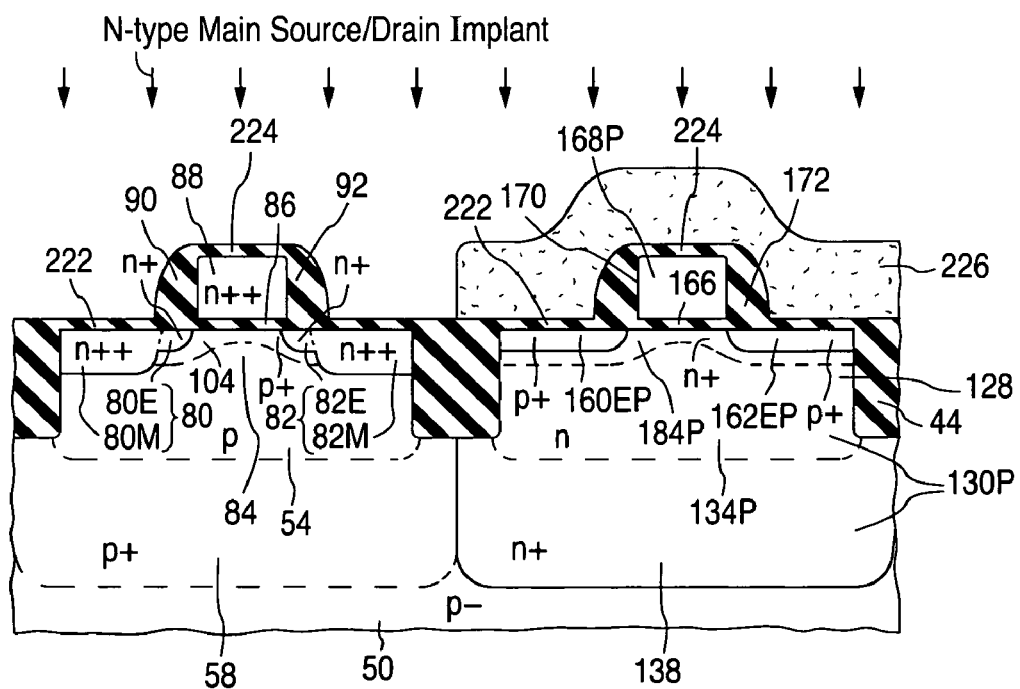
Figure 16L:
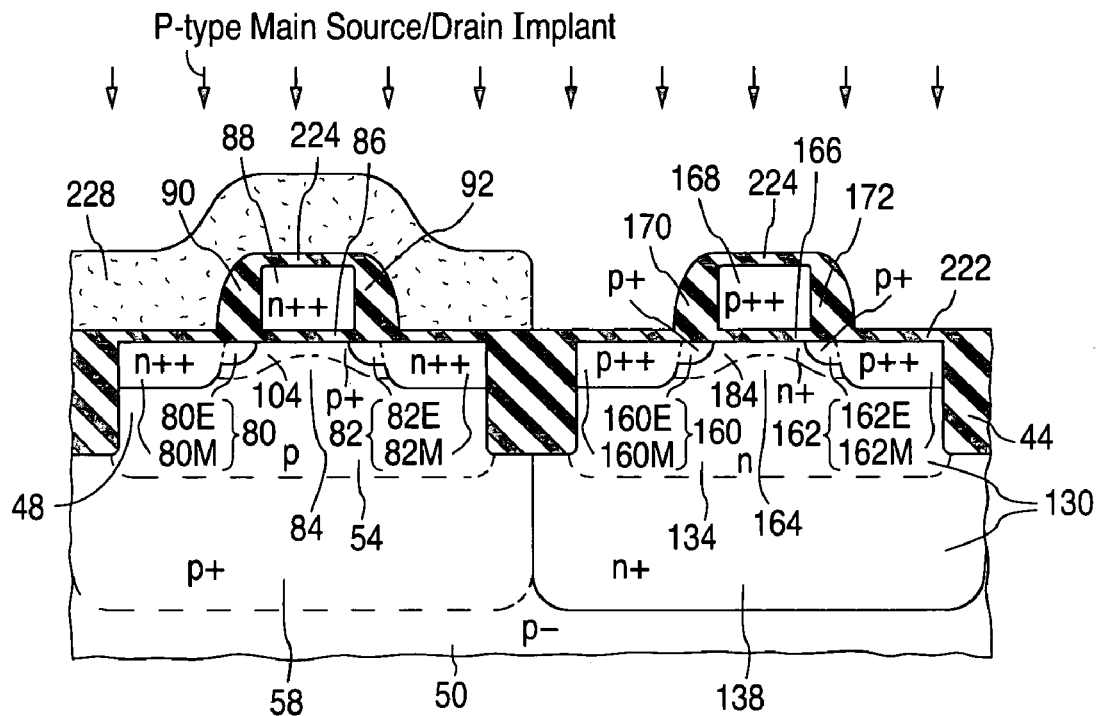

A photoresist mask 226 is formed on sidewall spacers 170 and 172 (150 and 152) and on the portions of dielectric layers 222 and 224 overlying active region 128 (126) as shown in FIG. 16*k*. N++ main source/drain portions 80M and 82M (60M and 62M) for re-channel IGFET 42 (40) are defined in upper body-material portion 54P (52P) by ion implanting a species of n-type dopant at a very heavy dosage through the uncovered portions of dielectric layer 222 and into a pair of laterally separated surface-adjoining segments of body-material portion 54P (52P).

When n-type source/drain zones 80 and 82 (60 and 62) for IGFET 42 (40) are to be provided with respective lower portions (not shown) more lightly doped than n++ main source/drain portions 80M and 82M (60M and 62M), the more lightly doped lower source/drain portions are defined in upper body-material portion 54P (52P) by ion implanting a species of an n-type dopant at a heavy dosage through the uncovered portions of dielectric layer 222, through the same two upper semiconductor surface sections through which the n-type main source/drain dopant species is implanted, and into a pair of laterally separated segments of body-material portion 54P (52P). The material consisting of photoresist mask 226, field insulation 44, gate electrode 88P (68P), and spacers 90 and 92 (70 and 72) forms a shield that largely blocks the n-type dopants for main source/drain portions 80M and 82M (60M and 62M) and the lower source/drain portions from simultaneously passing through the upper semiconductor surface section directly underlying the shield.

The n-type dopant which defines the lower source/drain portions is furnished at a considerably lighter dosage, but penetrates significantly deeper (on the average) below the upper semiconductor surface, i.e., has a longer range, than the n-type dopant which defines main source/drain portions 80M and 82M (60M and 62M). As a result, the dopant profile along a vertical cross-section through the center lengthwise of each of main source/drain portions 80M and 82M (60M and 62M) has a graded characteristic in the vicinity of the pn junction between body-material portion 54P (52P) and each of source/drain zones 80 and 82 (60 and 62). This graded characteristic, especially for source/drain zone 80 or 82 (60 or 62) acting as the drain during IGFET operation, reduces the junction capacitance, thereby increasing the switching speed of IGFET 42 (40).

Either the implantation for main source/drain portions 80M and 82M (60M and 62M) or the implantation for the more lightly doped lower portions of source/drain zones 80 and 82 (60 and 62) may be done first. In a typical implementation, the lighter-dosage/longer-range n-type implantation for the lower source/drain portions is performed first at a dosage of $2 \times 10^{13}$-$4 \times 10^{13}$ ions/cm$^2$, typically $3.5 \times 10^{13}$ ions/cm$^2$. Although the lower portions of source/drain zones 80 and 82 (60 and 62) are more lightly doped that main source/drain portions 80M and 82M (60M and 62M), the lower source/drain portions are heavily doped n-type. The n-type lower source/drain dopant may consist of phosphorus or arsenic. For the typical case in which phosphorus constitutes the n-type lower source/drain dopant, the implantation energy is 50-70 KeV, typically 60 KeV.

The heavier-dosage/shorter range n-type implantation for main source/drain portions 80M and 82M (60M and 62M) is subsequently done at a dosage of $5 \times 10^{15}$-$1 \times 10^{16}$ ions/cm$^2$, typically $7 \times 10^{15}$ ions/cm$^2$. The n-type main source/drain may consist of arsenic or phosphorus. For the typical case in which arsenic constitutes the n-type main source/drain dopant, the implantation energy is 40-60 KeV, typically 50 KeV.

In the final graded-junction structure for re-channel IGFET 42 (40), n++ main source/drain portions 80M and 82M (60M and 62M) are formed with (a) the two parts of the heavier-dosage/shorter-range n-type main source/drain dopant situated respectively in the locations for main portions 80M and 82M (60M and 62M) and (b) two considerably smaller parts of the lighter-dosage/longer-range n-type lower source/drain dopant situated respectively in the n++ main source/drain locations. Since main source/drain portions 80M and 82M (60M and 62M) contain considerably more of the heavier-dosage/shorter-range n-type dopant than of the lighter-dosage/longer-range n-type dopant, main portions 80M and 82M (60M and 62M) are largely formed by the heavier-dosage/shorter-range n-type main source/drain dopant. The n+ lower source/drain portions are formed with the parts of the lighter-dosage/shorter-range n-type lower source/drain dopant located respectively below main portions 80M and 82M (60M and 62M). The combination of each main source/drain portion 80M or 82M (60M or 62M) and the underlying lower source/drain portion forms a composite main source/drain portion having an overall very heavy doping n-type.

Due to the presence of spacers 90 and 92 (70 and 72), main source/drain portions 80M and 82M (60M and 62M) respectively partially overlap precursor source/drain extensions 80EP and 82EP (60EP and 62EP). Main portions 80M and 82M (60M and 62M) are doped much heavier than, and extend deeper into upper body-material portion 54P (52P) than, precursor extensions 80EP and 82EP (60EP and 62EP). Hence, the remainders of precursor extensions 80EP and 82EP (60EP and 62EP) now respectively constitute n+ source/drain extensions 80E and 82E (60E and 62E). Similarly, the p-type remainders of precursor body material 50P, precursor upper body-material portion 54P (52P), and precursor extended halo pocket 104P (separate precursor halo pockets 100P and 102P) now respectively constitute p-type body material 50, p-type upper body-material portion 54 (52), and p+ extended halo pocket 104 (separate p+ halo pockets 100 and 102).

Some p-type and n-type dopant was introduced into precursor gate electrode 88P (68P) during the p-type and n-type doping operations performed prior to the n-type main and lower-portion source/drain doping operations. However, the total amount of p-type dopant introduced into precursor gate electrode 88P (68P) is insignificant compared to the amount of n-type dopant introduced into gate electrode 88P (68P) during the n-type main source/drain doping. Accordingly, precursor gate electrode 88P (68P) is now n++gate electrode 88 (68). Also, gate electrode 88 (68) is of the same conductivity type, i.e., n-type, as source/drain zones 80 and 82 (60 and 62).

After removing photoresist mask 226, a photoresist mask 228 is formed on sidewall spacers 90 and 92 (70 and 72) and on the portion of dielectric layers 222 and 224 overlying active region 48 (46). See FIG. 16*l*. P++ main source/drain portions 160M and 162M (140M and 142M) for p-channel IGFET 122 (120) are defined in upper body-material portion 134P (132P) by ion implanting a species of a p-type dopant at a very heavy dosage through the uncovered portions of dielectric layer 222 and into a pair of laterally separated surface-adjoining segments of body-material portion 134P (132P).

Figure 18A:
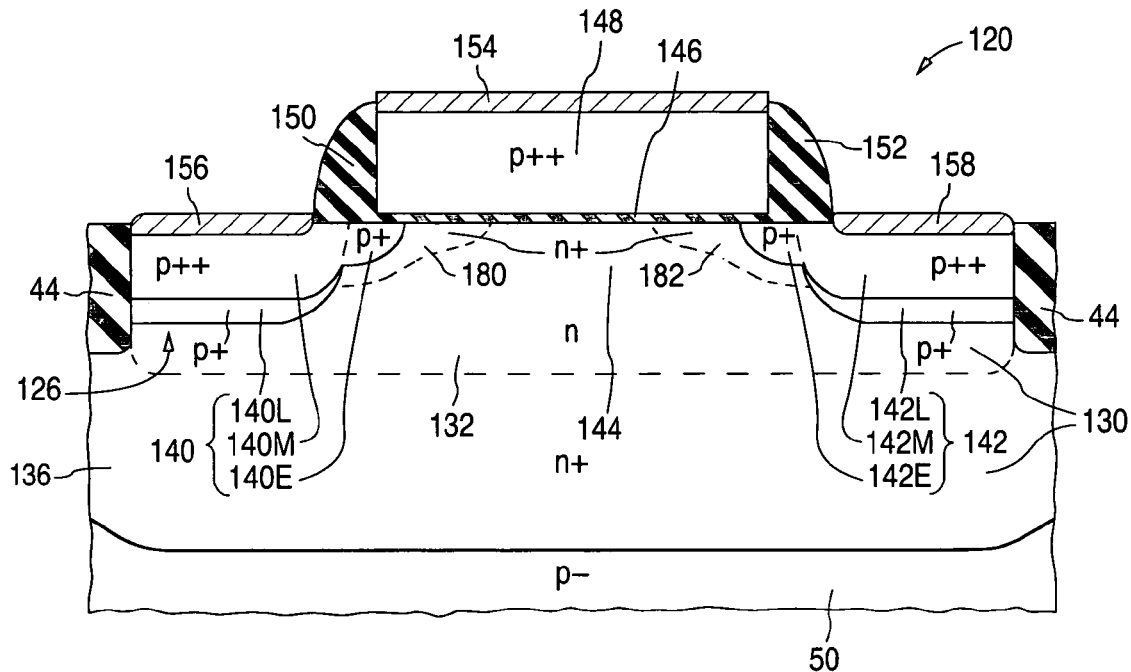
FIGS. 18a and 18b are front cross-sectional views of respective symmetrical long and short p-channel IGFETs configured and manufactured according to the invention.
Figure 18B:
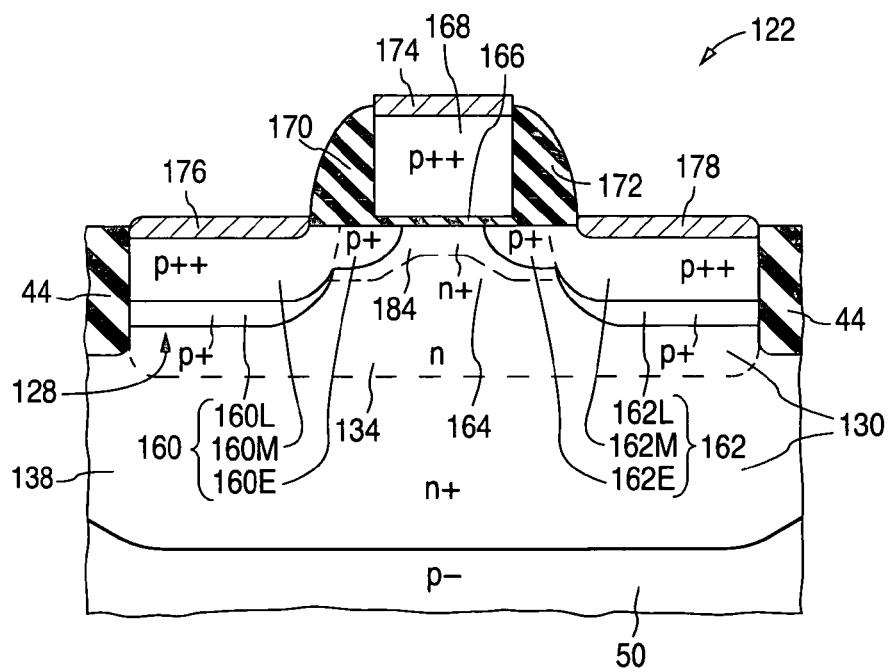

When source/drain zones 160 and 162 (140 and 142) of IGFET 122 (120) are to be provided with respective lower portions more lightly doped than p++ main source/drain portions 160M and 162M (140M and 142M), the more lightly doped lower source/drain portions are defined in upper body-material portion 134P (132P) by ion implanting a species of a p-type dopant at a heavy dosage through the uncovered portions of dielectric layer 222 and through the same two upper semiconductor surface sections through which the p-type main source/drain dopant species is implanted. Although the more lightly doped lower portions of source/drain zones 160 and 162 (140 and 142) are not shown in FIG. 16*l*, FIGS. 18*a* and 18*b* respectively illustrate the final structures of long p-channel IGFET 120 and short p-channel IGFET 122 when they have more lightly doped lower source/drain portions. Items 140L and 142L in FIG. 18*a* are the more lightly doped lower portions of source/drain zones 140 and 142 in long-channel IGFET 120. Items 160L and 162L in FIG. 18*b* are the more lightly doped lower portions of source/drain zones 160 and 162 in short-channel IGFET 122. The material formed with photoresist mask 228, field insulation 44, precursor gate electrode 168P (148P), and spacers 170 and 172 (150 and 152) forms a shield that largely blocks the p-type source/drain dopants for main source/drain portions 160M and 162M (140M and 142M) and lower source/drain portions 160L and 162L (140L and 142L) from simultaneously passing through the upper semiconductor surface section directly underlying the shield.

The p-type dopant which defines lower source/drain portions 160L and 162L (140L and 142L) is furnished at a considerably lighter dosage, but penetrates significantly deeper (on the average) below the upper semiconductor surface, i.e., has a longer range, than the p-type dopant which defines main source/drain portions 160M and 162M (140M and 142M). Consequently, the dopant profile along a vertical cross-section through the center lengthwise of each of main source/drain portions 160M and 162M (140M and 142M) has a graded characteristic in the vicinity of the pn junction between body-material portion 134P (132P) and each of source/drain zones 160 and 162 (140 and 142). This graded characteristic, especially for source/drain zone 160 or 162 (140 or 142) acting as the drain during IGFET operation, reduces the junction capacitance so as to increase the switching speed of IGFET 122 (120).

Either the implantation for main source/drain portions 160M and 162M (140M and 142M) or the implantation for lower source/drain portions 160L and 162L (140L and 162L) may be done first. In a typical implementation, the lighter-dosage/longer-range p-type implantation for lower source/drain portions 160L and 162L (140L and 142L) is performed first at a dosage of $3 \times 10^{13}$-$6 \times 10^{13}$ ions/cm$^2$, typically $4 \times 10^{13}$ ions/cm$^2$. Although lower source/drain portions 160L and 162L (140L and 142L) are more lightly doped than main source/drain portions 160M and 162M (140M and 142M), lower source/drain portions 160L and 162L (140L and 142L) are heavily doped p-type. The p-type lower source/drain dopant may consist of boron in elemental form or in the form of boron difluoride. For the typical case in which the p-type lower source/drain dopant consists of elemental boron, the implantation energy is 20-35 KeV, typically 25 KeV.

The heavier-dosage/shorter-range p-type implantation for main source/drain portions 160M and 162M (140M and 142M) is subsequently done at a dosage of $2.5\times10^{15}$-$1\times10^{16}$ ions/cm$^2$, typically $5\times10^{15}$ ions/cm$^2$. The p-type main source/drain dopant may consist of boron in the form of boron difluoride or in elemental form. For the typical case in which the p-type main source/drain dopant consist of boron in the form of boron difluoride, the implantation energy is 20-30 KeV, typically 25 KeV.

In the final graded-junction structure for IGFET 122 (120), p++ main source/drain portions 160M and 162M (140M and 142M) are formed with (a) the two parts of the heavier-dosage/shorter-range n-type main source/drain dopant situated respectively in the locations for main portions 160M and 162M (140M and 142M) and (b) two considerably smaller parts of the lighter-dosage/longer-range p-type lower source/drain dopant situated respectively in the p++ main source/drain locations. Inasmuch as main source/drain portions 160M and 162M (140M and 142M) contain considerably more of the heavier-dosage/shorter-range p-type dopant than of the lighter-dosage/longer-range p-type dopant, main portions 160M and 162M (140M and 142M) are largely formed by the heavier-dosage/shorter-range p-type dopant. P+ lower source/drain portions 160L and 162L (140L and 142L) are formed with the parts of the lighter-dosage/longer-range p-type lower source/drain dopant located respectively below main source/drain portions 160M and 162M (140M and 142M). The combination of each main source/drain portion 160M or 162M (140M or 142M) and underlying lower source/drain portion 160L or 162L (140L or 142L) forms a composite main source/drain portion having an overall very heavy doping p-type.

As indicated above, the species of p-type dopant utilized in defining main source/drain portions 160M and 162M (140M and 142M) is typically boron difluoride whereas the species of p-type dopant employed in defining lower source/drain portions 160L and 162L (140L and 142L) is typically elemental boron. Boron difluoride has a greater molecular weight than boron. Consequently, the species of p-type dopant utilized in the heavier-dosage/shorter-range implantation for main source/drain portions 160M and 162M (140M and 142M) is of greater molecular weight than the species of the p-type dopant utilized in the lighter-dosage/longer-range implantation for lower source/drain portions 160L and 162L (140L and 142L).

The energy needed to ion implant a species of semiconductor dopant to a given depth into a semiconductor body generally increases as the molecular weight of the dopant species increases. With conventional commercially available state-of-the-art ion implantation equipment, it is commonly difficult to accurately control ion implantation at implantation energy below 10 KeV. Boron is an atom of relatively low molecular weight. The implantation energy that would be needed to implant ions of elemental boron to define main source/drain portions 160M and 162M (140M and 142M) is less than 10 KeV, e.g., 5 KeV. By performing the heavier-dosage/shorter-range implantation for main source/drain portions 160M and 162M (140M and 142M) with a p-type dopant species of greater molecular weight than the p-type dopant utilized in the lighter-dosage/longer-range implantation for lower source/drain portions 160L and 162L (140L and 142L), the implantation energy of the heavier-dosage/shorter-range implantation for main portions 160M and 162M (140M and 142M) is increased. This facilitates accurately forming the graded-junction characteristics for source/drain zones 160 and 162 (140 and 142).

Figure 18C:
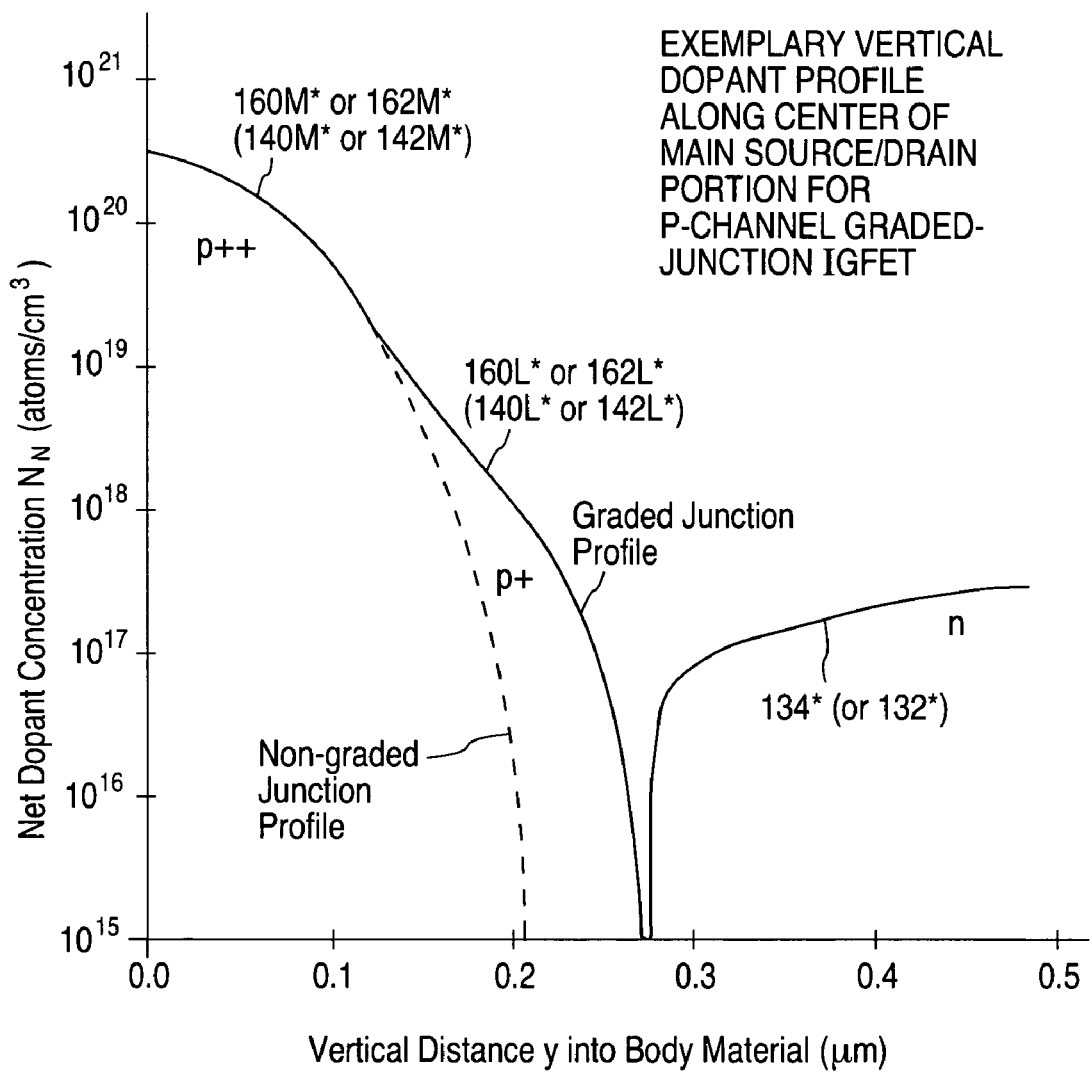
FIG. 18c is an exemplary graph of net dopant concentration as a function of vertical distance into a source/drain zone along a vertical cross section through the center of the main portion of the source/drain zone in the p-channel IGFET of FIG. 18a or 18b.

FIG. 18c presents an example of how net dopant concentration $N_H$ varies in the vertical direction through source/drain zone 160 or 162 (140 or 142) of p-channel IGFET 122 (120) along a cross-section extending vertically through the center length-wise of main source/drain portion 160M or 162M (140M or 142M). Vertical distance (or depth) y in FIG. 18c is measured from the upper semiconductor surface downward. Curve segments 160M*, 162M*, 160L*, 162L*, and 134*(140M*, 142M*, 140L*, 142L*, and 132*) respectively represent the net dopant concentrations in components 160M, 162M, 160L, 162L, and 134 (140M, 142M, 140L, 142L and 132). As shown by curve segments 160M* and 160L* (140M* and 140L*) or 162M* and 162L* (or 142M* and 142L*), the vertical dopant profile for main portion 160M (140M) or 162M (142M) merges into the vertical dopant profile for lower portion 160L (140L) or 162L (142L).

The dashed line in FIG. 18c indicates how the vertical dopant profiles for main source/drain portions 160M and 162M (140M and 142M) would appear if more lightly doped lower source/drain portions 160L and 162L (140L and 142L) were absent, i.e., IGFET 122 (120) did not have graded-junction characteristics. Comparison of the composite vertical dopant profile formed by curve segments 160M* and 160L* (140M* and 140L*) or 162M* and 162L* (or 140L* and 142L*) to the non-graded vertical dopant profile represented by the combination of the dashed-curve segment and curve segment 160M* or 162M* (140M* or 142M*) shows that, in moving from the pn junction between body-material portion 134 (132) and source/drain zone 160 or 162 (140 or 142), the vertical dopant profile through the center length-wise of main source/drain portion 160M or 162M (140M or 142M) rises less sharply, on the average, to the maximum net dopant concentration in main portion 160M or 162M (140M or 142M) than what would occur if the p-type dopant which defines zone 160 or 162 (140 or 142) along that cross-section were ion implanted at a single energy, i.e., lower source/drain portion 160L or 162L (140L or 142L) were absent. Hence, IGFET 122 (120) has a graded junction characteristic.

Due to the presence of spacers 170 and 172 (150 and 152), main source/drain portions 160M and 162M (140M and 142M) respectively partially overlap precursor source/drain extensions 160EP and 162EP (140EP and 142EP). Main portions 160M and 162M (140M and 142M) are doped much heavier than, and extend deeper into upper body-material portion 134P (132P) than, precursor extensions 160EP and 162EP (140EP and 142EP). Hence, the remainders of precursors extensions 160EP and 162EP (140EP and 142EP) now respectively constitute p+ source/drain extensions 160E and 162E (140E and 142E). Similarly, the n-type remainders of precursor upper body-material portion 134P (132P) and precursor extended halo pocket 184P (separate precursor halo pockets 180P and 182P) now respectively constitute n-type upper body-material portion 134 (132) and n+ extended halo pocket 184 (separate n+ halo pockets 180 and 182).

Some n-type and p-type dopant was introduced into precursor gate electrode 168P (148P) during the n-type and p-type doping operations prior to the p-type main and lower-portion source/drain doping operations. However, the total amount of n-type dopant introduced into precursor gate electrode 168P (148P) is insignificant compared to the amount of p-type dopant introduced into gate electrode 168P (148P) during the p-type main source/drain doping. Accordingly, precursor gate electrode 168P (148P) is now p++ gate electrode 168 (148). Also, gate electrode 168 (148) is of the same conductivity type (p-type) as source/drain zones 160 and 162 (140 and 142).

After removing photoresist mask 228, a capping layer (not shown) of dielectric material is formed on top of the structure. The capping dielectric layer typically consists of TEOS deposited by plasma-enhanced chemical vapor deposition to a thickness of 20 nm.

The semiconductor structure is now thermally annealed to repair lattice damage and activate the implanted source/drain and halo dopants. The anneal, referred to as the source/drain-halo anneal, is of such a nature that, at the end of the anneal, gate electrode 88 (68) extends slightly over source/drain extensions 80E and 82E (160E and 162E), and gate electrode 168 (148) extends slightly over source/drain extensions 160E and 162E (140E and 142E).

The source/drain-halo anneal is typically an RTA at 1000-1100°, typically 1075° C., for 5-20 sec., preferably 10-15 sec., typically 12 sec. The RTA typically includes a ramp-up from 525° C. to the anneal temperature at 60-90° C./sec., typically 75° C./sec. The RTA also typically includes a ramp-down from the anneal temperature to 700° C. at −40-−60° C./sec., typically −50° C./sec. The RTA is preferably done in an non-reactive environment, typically nitrogen. Alternatively, the RTA can be done in a reactive oxygen-containing environment. In this case, silicon oxide grows along the upper silicon (both monosilicon and polysilicon) surfaces. The so-grown oxide can replace the capping dielectric layer.

The source/drain-halo anneal may include an extended-time furnace anneal performed before the source/drain-halo RTA at temperature considerably below the RTA annealing temperature. When performed, the furnace anneal is done at 540-560° C., typically 550° C., for 60-120 min., typically 90 min., in a non-reactive environment, or in a reactive oxygen-containing environment. The source/drain anneal is typically performed in an environment containing nitrogen and oxygen. When so done, the thicknesses of the dielectric layers along the upper silicon surfaces increase slightly. Although the above-mentioned halo and source/drain implantation steps define source/drain zones 80 and 82 (60 and 62), source/drain zones 160 and 162 (140 and 142), extended halo pocket 104 (separate halo pockets 100 and 102), and extended halo pocket 184 (separate halo pockets 180 and 182), the source/drain-halo anneal consisting of the RTA and the optional furnace anneal completes the formation of these regions.

The thin layers of dielectric material, including dielectric layers 222 and 224, are removed along the upper semiconductor surface and along the top surfaces of gate electrodes 88 (68) and 168 (148). Field insulation 48 and spacers 90 and 92 (70 and 72) and 170 and 172 (150 and 142) remain substantially in place.

Figure 16M:
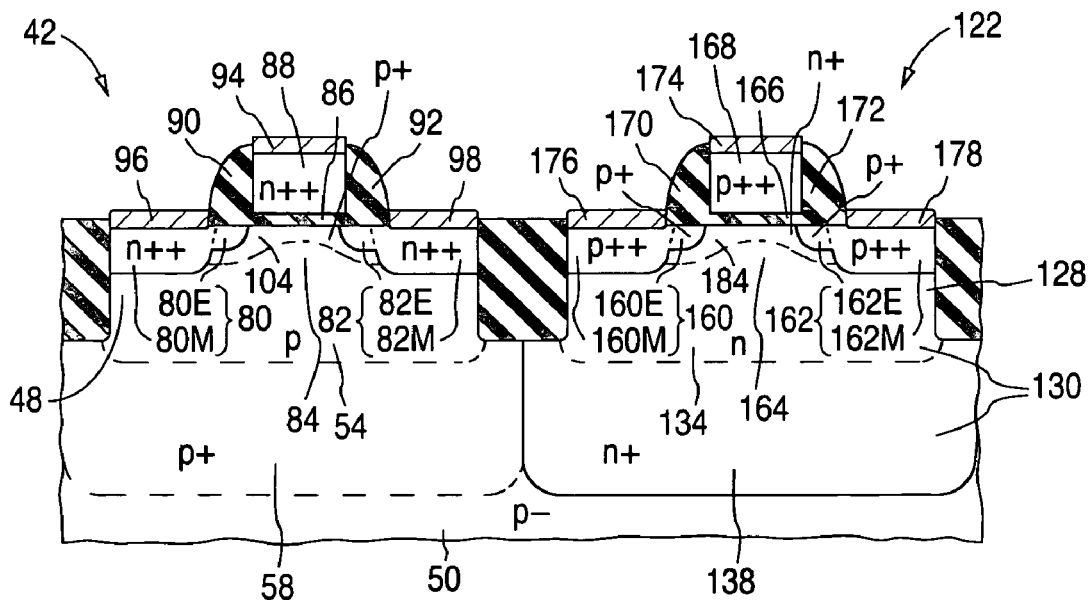

Metal silicide layers 94, 96, 98, 174, 176, and 178 (74, 76, 78, 154, 156, and 168) are respectively formed along the upper surfaces of components 88, 80M, 82M, 168, 160M and 162M (68, 60M, 62M, 148, 140M, and 142M) as shown in FIG. 16m. This typically entails depositing a thin layer of a suitable metal, typically cobalt, on the upper surface of the structure and then causing the metal to react with the underlying silicon to form silicide layers 94, 96, 98, 174, 176, and 178 (74, 76, 78, 154, 156, and 158). The unreacted metal is subsequently removed. The metal silicide thickness is 25-35 nm, typically 30 nm. The metal silicide formation completes the basic fabrication of n-channel IGFET 42 (40) and p-channel IGFET 122 (120).

In subsequent process operations (not illustrated in the drawings), a layer of dielectric material is deposited on the upper surface of the structure of FIG. 16m. Using a suitable photoresist mask, contact openings are etched through the dielectric material down to metal silicide layers 94, 96, 98, 174, 176, and 178 (74, 76, 78, 154, 156, and 158). Alternatively, a self-aligned contact technique can be utilized to form contact openings through the dielectric material provided over the structure.

A layer of interconnect metal typically consisting principally of aluminum is deposited on the upper surface of the resulting structure. Using a suitable photoresist mask, the interconnect metal is patterned into a desired shape. The metallization process may include the formation of tungsten plugs. As desired, one or more further patterned metal interconnect layers can be provided over the structure.

Experimental Program

Symmetrical n-channel and p-channel IGFETs were fabricated from semiconductor wafers to experimentally examine various aspects of the invention. The numerical values for the process and device parameters utilized in manufacturing these IGFETs were based on process and device computer simulations performed with the DIOS-ISE (process) and DESSIS-ISE (device) simulators using their default process and material coefficients as appropriate. See (a) Strecker, *DIOS-ISE*, ISE TCAD Manuals, Release 5, Vol. 3, Integrated Systems Engineering, 1997, and (b) Escoffier et al, *DESSIS-ISE*, ISE TCAD Manuals, Release 5, Vol. 5, Integrated Systems Engineering, 1997. Although all of the wafers utilized during the experimental program were processed to create both n-channel and p-channel IGFETs, the experimental discussion presented below deals primarily with n-channel IGFETs.

As used below in connection with an IGFET, the term "drawn channel length" means the value of the length of the IGFET's gate electrode as drawn on the mask used to define the gate electrode. The drawn channel length, represented by symbol $L_{DR}$, invariably differs from both the actual gate length and actual channel length L. However, drawn channel length $L_{DR}$ is a very useful experimental parameter because actual channel length L is generally difficult to measure precisely.

Halo and APT implants were applied in various ways to four lots of complementary-IGFET wafers processed without graded junction characteristics during the experimental program. These four lots of wafers are referred to here as the first, second, third, and fourth lots. The wafers in each lot were processed the same and thus largely simultaneously except for variations applied to splits (sub-lots) of each lot. Each split consisted of two or more wafers. Although the different lots were not processed largely simultaneously, the same processing steps were performed on all four wafer lots except for the variations applied to the splits. Part of the information obtained from the four wafer lots was compared to information obtained from a fifth lot, referred to here as the reference lot, of complementary-IGFET wafers provided with APT implants and with halo implants but at very low halo dosages.

Each wafer was laid out so that the channel-length directions of the n-channel IGFETs and the p-channel IGFETs whose parameters were measured during the experimental program extended parallel to one another. The halo implants, both n-type and p-type, were performed at azimuthal angles of 33°, 123°, 213°, and 303° to a reference line extending in the direction of the channel lengths of these IGFETs. Each wafer also included n-channel and p-channel IGFETs whose channel-lengths directions extended perpendicular to the channel-length directions of the IGFETs whose parameters were measured.

The graphical information generated for a particular wafer lot, or for a split of that wafer lot, is generally indicated in the following drawings by the designation applied to that wafer lot, or the split of that wafer lot. Each of the data points on a curve described below normally represents the average of multiple measurements. For example, each experimentally measured value of threshold voltage $V_T$ at a given value of drawn channel length $L_{DR}$ for a particular $V_T(L_{DR})$ curve is normally the average of multiple values of threshold voltage $V_T$ at the given $L_{DR}$ value.

One experiment entailed varying the dosage of the p-type ion-implanted halo dopant in one direction as the dosage of the p-type ion-implanted APT dopant was varied in the opposite direction for n-channel IGFETs having a target threshold voltage of 0.4 V at a desired short-channel operating value $L_{DRC}$ of 0.18 μm for drawn channel length $L_{DR}$. Four splits, referred to here as process designs W, X, Y, and Z, of the first lot of wafers were employed in this experiment. Using boron for the p-type halo and APT implants, designs X, Y, and Z had the following p-type halo and APT dosages as determined by computer simulation:

a. Design X—high halo dose of $1.5 \times 10^{13}$ ions/cm$^2$ and low APT dose of $1.8 \times 10^{12}$ ions/cm$^2$
b. Design Y—medium halo dose of $1.3 \times 10^{13}$ ions/cm$^2$ and medium APT dose of $3.8 \times 10^{12}$ ions/cm$^2$
c. Design Z—low halo dose of $1.2 \times 10^{13}$ ions/cm$^2$ and high APT dose of $6.5 \times 10^{12}$ ions/cm$^2$ Design W, which served as a baseline for comparison purposes, had the high p-type boron halo dose of design X but no p-type APT dopant.

The p-type boron halo implantations for the wafers in the first lot were all performed at an implantation energy of 75 KeV and a tilt angle of 40°. For inventive designs X, Y, and Z, the implantation energy for the p-type boron APT dopant was 50 KeV. The wafers in the first lot were laid out so that the drawn value $L_{DR}$ of channel length L varied from 0.14 μm to 20 μm.

Subject to the variations applied to the different splits and subject to the comments presented below, the wafers in the first lot were processed in the manner described above in connection with FIG. 16 but without graded-junction characteristics. The gate dielectric layers in the first wafer lot were grown according to the thermal schedule of FIG. 17. The final anneal during the gate dielectric growth was performed with nitrous oxide so that the gate dielectric layers were all nitrided. The annealing operations utilized in manufacturing the first lot were solely RTAs. No isolation implants were utilized in processing the first lot.

Figure 19A:
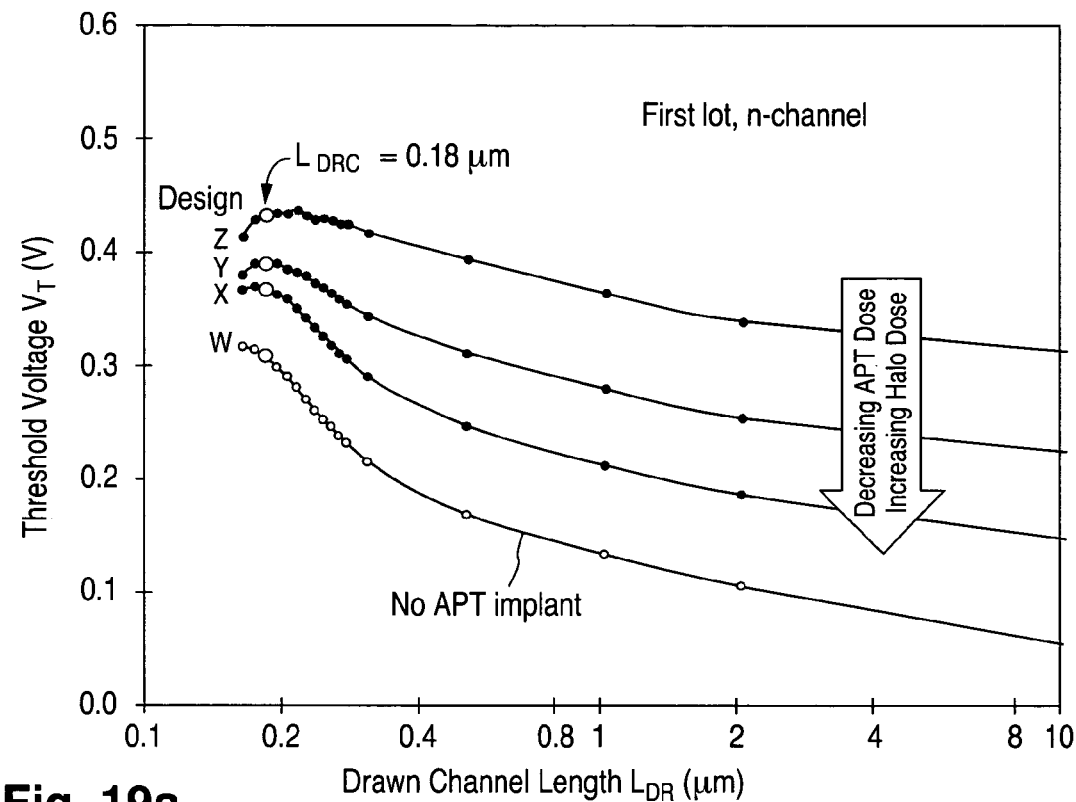
FIG. 19a is an experimental graph of threshold voltage as a function of drawn channel length for symmetrical n-channel IGFETs manufactured according to the invention at various APT and halo dosages.

FIG. 19a illustrates how threshold voltage $V_T$ varied with drawn channel length $L_{DR}$ for n-channel IGFETs made according to process designs W, X, Y, and Z in the first wafer lot. The large circles on the $V_T(L_{DR})$ curves for designs W, X, Y, and Z present the $V_T$ values measured at the desired short-channel $L_{DRC}$ operating value of 0.18 μm. The measured value of threshold voltage $V_T$ at the $L_{DRC}$ value of 0.18 μm is within 0.04 V of the target $V_T$ value of 0.4 V for each of inventive designs X, Y, and Z. This shows that the computer simulation provided good approximation to the experimentally manufactured IGFETs. The measured $V_T$ value at the $L_{DRC}$ value of 0.18 μm for baseline design W is considerably below the target $V_T$ value of 0.4 V because the p-type halo dose for design W was not adjusted sufficiently upward to compensate for the absence of a p-type APT implant in design W.

As FIG. 19a indicates, short-channel threshold voltage roll-off is alleviated in the n-channel IGFETs fabricated according to all of inventive designs X, Y, and Z. Among designs X, Y, and Z, the largest shift in threshold voltage roll-off toward lower threshold voltage occurs with design X at the high halo dose. For the range of parameter values considered in the experiment involving designs X, Y, and Z, increasing the halo dosage therefore leads to more alleviation in short-channel threshold voltage roll-off.

Among inventive designs X, Y, and Z in the first wafer lot, design Y had the smallest variation in threshold voltage $V_T$ in the immediate vicinity of the desired short-channel $L_{DRC}$ value of 0.18 μm. Accordingly, design Y is largely optimum in terms of minimizing $V_T$ variations that result from unintended manufacturing variations in channel length L at the desired $L_{DRC}$ value of 0.18 μm for short n-channel IGFETs.

Examination of FIG. 19a indicates that short-channel threshold voltage roll-off is substantially alleviated in the n-channel IGFETs of baseline design W. However, the IGFETs of design W lack the APT implant and thus are more susceptible to punchthrough than the IGFETs of any of inventive designs X, Y, and Z. Also, in moving from the short-channel regime to the long-channel regime, the IGFETs of design W have a lower value of threshold voltage $V_T$ at any particular value of drawn channel length $L_{DR}$ than the IGFETs of any of designs X, Y, and Z.

Figure 19B:
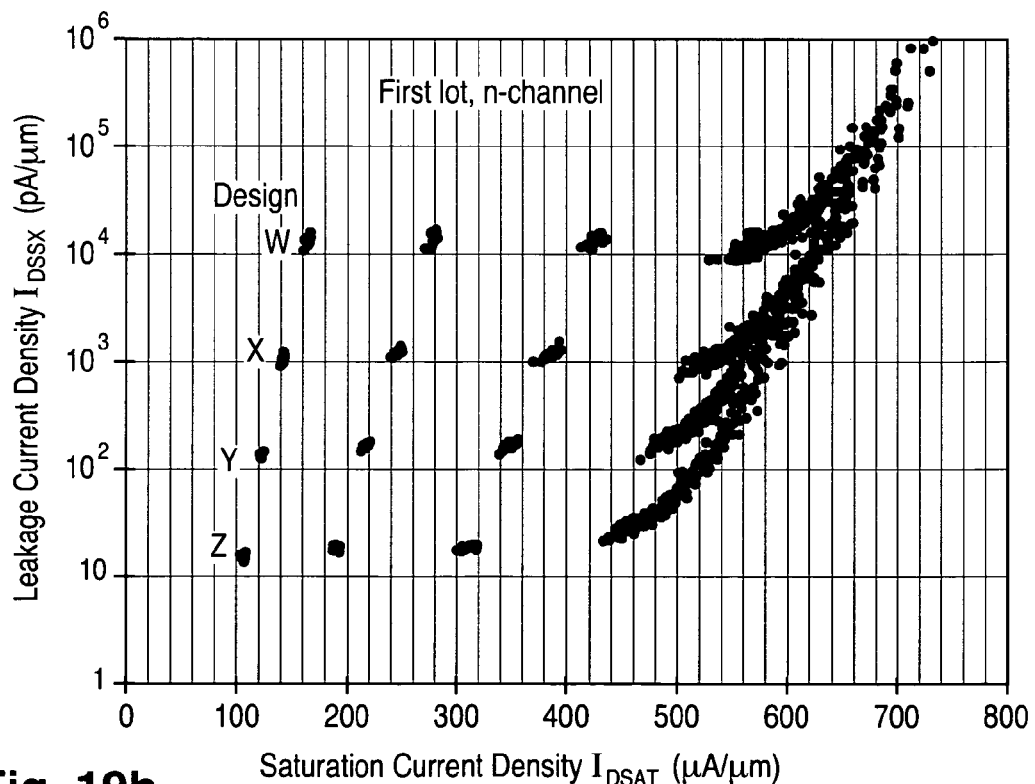

FIG. 19b depicts how extrapolated widthwise leakage current density $I_{DSSX}$ varied with widthwise drive current density $I_{DSAT}$ for n-channel IGFETs of designs W, X, Y, and Z in the first wafer lot. Leakage current density $I_{DSSX}$ is the extrapolated drain leakage current per unit drain width determined by linearly extrapolating the actual drain current per unit drain width, in a logarithmic-linear representation as a function of gate-to-source voltage $V_{GS}$, to zero gate-to-source voltage. Drive current density $I_{DSAT}$ is the drain drive current per unit drain width. Each point in FIG. 19b represents a different IGFET. Clusters of points are distinguishable generally to the left in FIG. 19b, where each cluster is at a different target $L_{DR}$ value.

As FIG. 19b indicates, leakage current density $I_{DSSX}$ at any particular value of drive current density $I_{DSAT}$ less than approximately 500 μA/μm decreased in going from design X to design Z. In light of the generally lower leakage current density, design Z may be preferably from a practical viewpoint, especially in an IC having a large number of long-channel IGFETs. Also, design Z yields an $I_{DSAT}$ value of nearly 600 μA/μm at an actual leakage current density $I_{DSS0}$, i.e., actual drain leakage current per unit drain width, of 1 nA/μm. This $I_{DSAT}$ value is nearly 20% higher than that obtained with otherwise similar n-channel IGFETs which have generally flat channel dopant profiles along the upper semiconductor surface and thus which lack the p-type halo implants used in the present invention.

Figure 20:
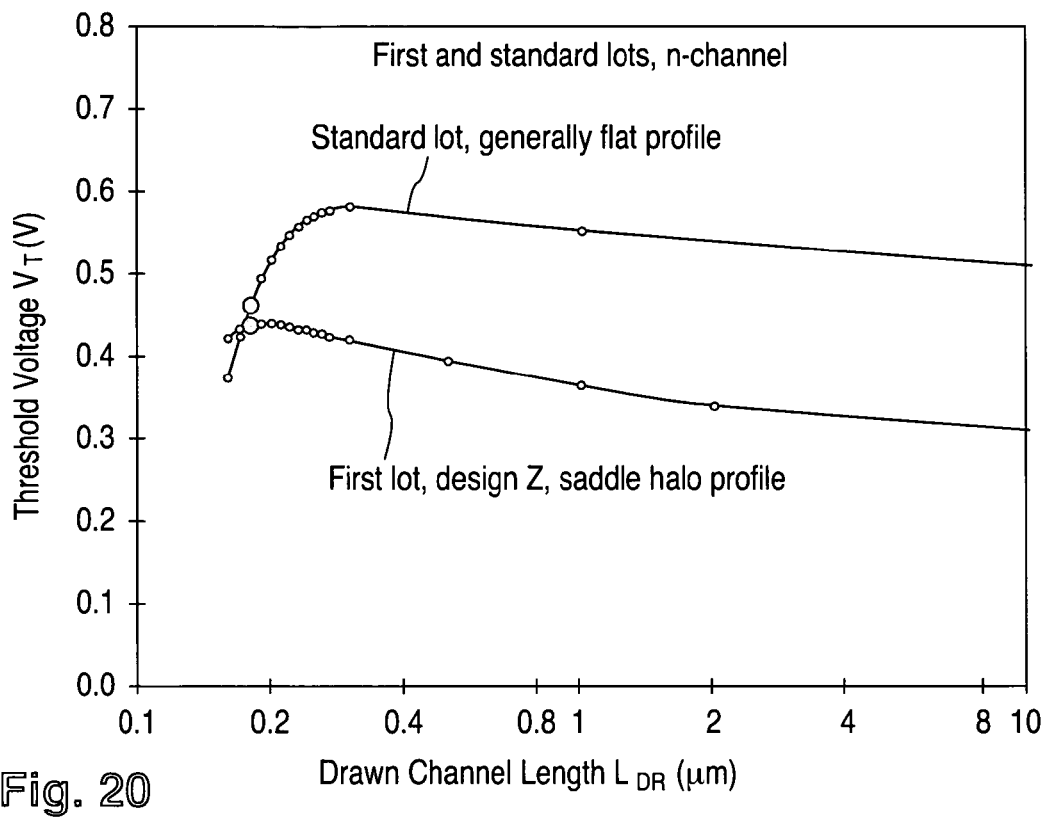
FIG. 20 is an experimental graph of threshold voltage as a function of drawn channel length for symmetrical n-channel IGFETs manufactured according to the invention and for symmetrical n-channel IGFETs manufactured with a very low halo dosage.

FIG. 20 illustrates $V_T(L_{DR})$ variations for n-channel IGFETs of design Z in the first lot of wafers compared to n-channel IGFETs of the above-mentioned reference lot of wafers in which a p-type halo implant was performed at a very low dosage, $5 \times 10^{12}$ ions/cm$^2$. A p-type threshold-adjust implant was utilized for the n-channel IGFETs in the reference wafer lot. In contrast to the double-humped vertical channel-center dopant profile, as illustrated generally in FIGS. 12a and 12b, of n-channel IGFETs configured according to the invention, the vertical channel-center dopant profile for the n-channel IGFETs in the reference lot was relatively flat. Rather than being performed solely by RTA as occurred in the first wafer lot, wafer annealing subsequent to ion implantation of all the source/drain dopants in the reference lot was performed in a furnace for extended time at temperature considerably below typical RTA temperature.

Computer simulation was utilized to provide the reference lot with a target $V_T$ value of 0.4 V at the desired short-channel $L_{DRC}$ operating value of 0.18 μm. Aside from (a) performing the halo implants at very low dosages, (b) the use of an extended-time furnace anneal subsequent to ion implantation of all the source/drain dopants, (c) the use of threshold-adjust implants, and (d) variations in the parameter values needed to provide the reference lot with the target 0.4-V value of threshold voltage $V_T$ at the $L_{DRC}$ value of 0.18 μm, the reference lot was processed largely the same as inventive designs X, Y, and Z in the first lot.

The large dark circles on the $V_T(L_{DR})$ curves in FIG. 20 present the $V_T$ values at the desired short-channel $L_{DRC}$ operating value of 0.18 μm. Comparison of the two $V_T(L_{DR})$ curves in FIG. 20 shows how short-channel threshold voltage roll-off is greatly alleviated in the present invention. Short-channel threshold voltage roll-off was much stronger (worse) with the reference wafer lot than with inventive design Z. In fact, aside from the fact that the reverse short-channel effect, i.e., the slow decrease in threshold voltage $V_T$ with increasing channel length in going from the short-channel regime to the long-channel regime is not represented in the simplified conventional $V_T(L_{DR})$ curve presented above in FIG. 1, the $V_T(L_{DR})$ curve for the reference lot of FIG. 20 is quite similar to the $V_T(L_{DR})$ curve of FIG. 1. This arises because, in both cases, the vertical channel-center dopant profile is relatively flat.

A split, referred to as process design Y', of the second lot of wafers was utilized to investigate the effect of incorporating nitrogen into the gate dielectric material. As mentioned above, nitrogen was incorporated into the gate dielectric layers of the first lot. Hence, the gate dielectric layers of the first lot, including design Y, consisted of silicon oxynitride. Design Y' of the second lot was processed at the conditions of design Y of the first lot except that the final anneal during the gate dielectric growth in design Y' was performed with nitrogen rather than nitrous oxide. Accordingly, the gate dielectric layers in the IGFETs of design Y' were non-nitrided, i.e., the gate dielectric layers for design Y' consisted substantially only of silicon oxide.

Figure 21:
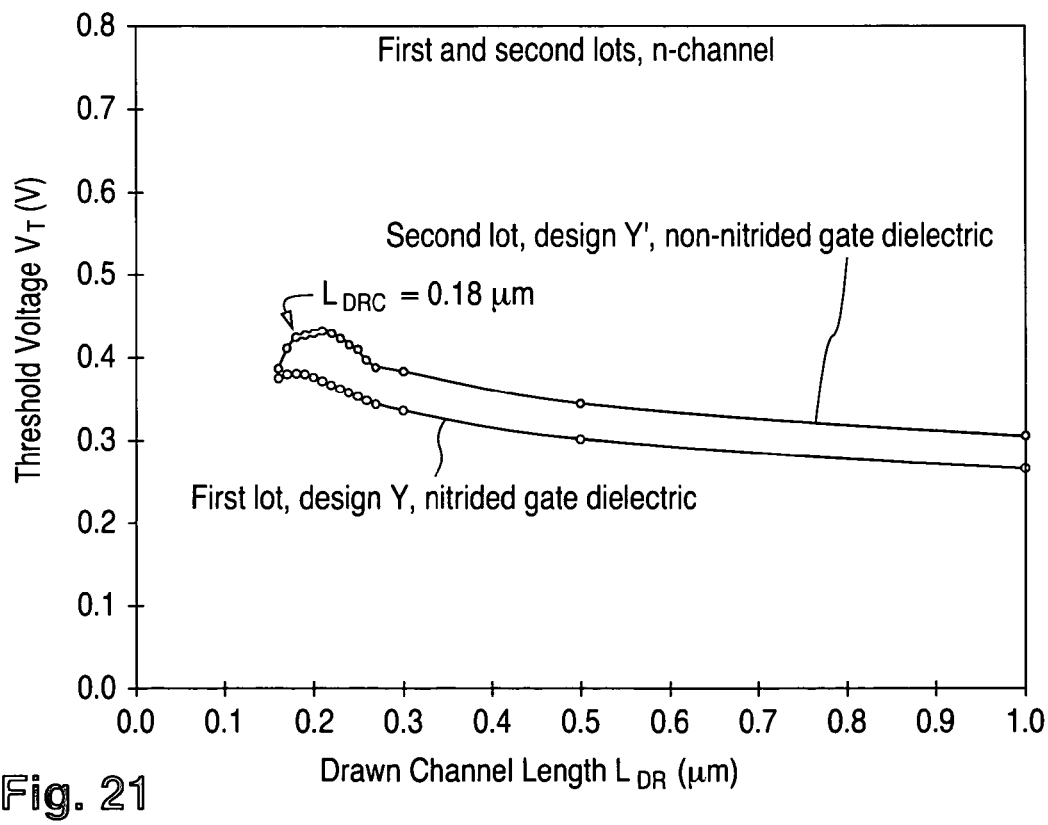
FIG. 21 is an experimental graph of threshold voltage as a function of drawn channel length for symmetrical n-channel IGFETs manufactured according to the invention with silicon oxide and silicon oxynitride gate dielectric layers.

FIG. 21 depicts $V_T(L_{DR})$ variations for n-channel IGFETs manufactured according to process designs Y and Y', i.e., respectively with and without gate dielectric nitridation. As FIG. 21 shows, the $V_T(L_{DR})$ curve for design Y is generally of approximately optimal shape for alleviating threshold voltage roll-off in the immediate vicinity of the desired short-channel $L_{DRC}$ operating value of 0.18 μm. However, the $V_T(L_{DR})$ curve for design Y' overshoots slightly in the vicinity of the $L_{DRC}$ value of 0.18 μm. This suggests that an upward doping distortion occurs in the vicinity of the 0.18-μm $L_{DRC}$ value for design Y'. In general, nitriding the gate dielectric layer appears beneficial for achieving a $V_T(L_{DR})$ curve of largely optimal shape for alleviating short-channel threshold voltage roll-off, at least for n-channel IGFETs.

A split, referred to as process design Y", of the second wafer lot was employed to investigate the effect of modifying the source/drain-halo anneal to include a furnace anneal for extended time at temperature considerably below typical RTA temperature. As mentioned above, all of the annealing operations in the first lot were solely RTAs. Design Y" of the second lot was processed at the conditions of design Y of the first lot except that a furnace anneal was performed at 900° C. for 15 min after the n-type main and lower-portion source/drain implants but before the p-type main and lower-portion source/drain implants.

Figure 22:
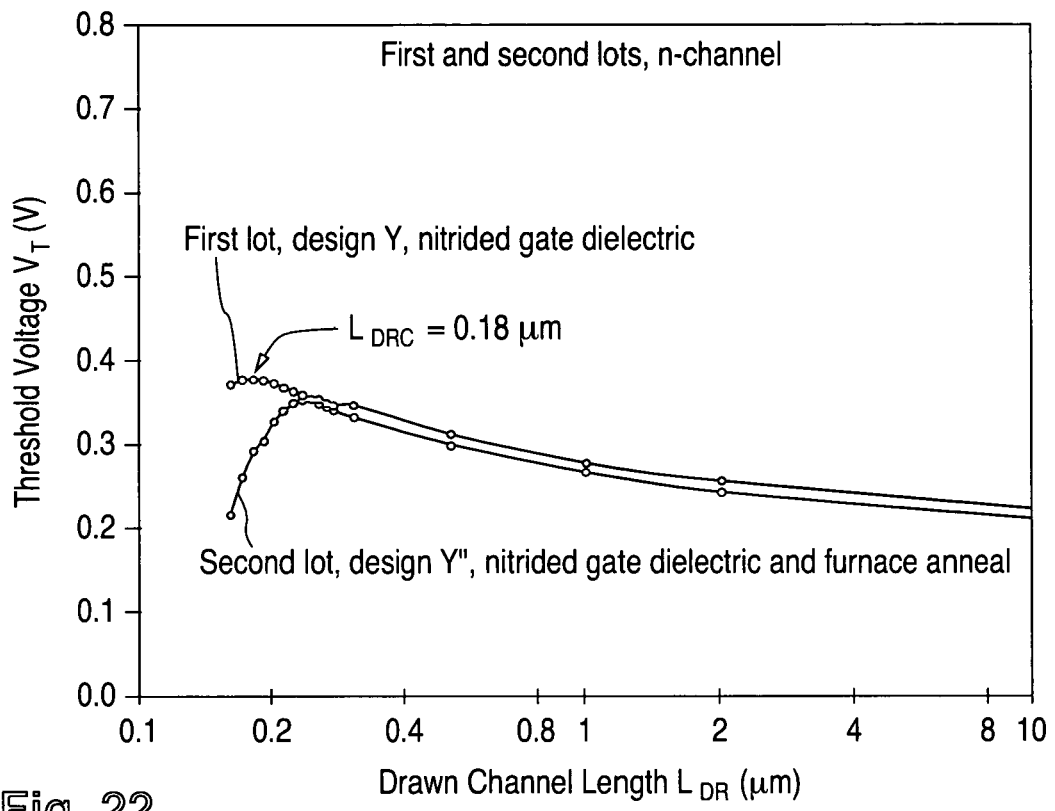
FIG. 22 is an experimental graph of threshold voltage as a function of drawn channel length for symmetrical n-channel IGFETs manufactured according to the invention with silicon oxynitride gate dielectric layers created with, and without, extended-time furnace anneal.

FIG. 22 illustrates $V_T(L_{DR})$ variations for n-channel IGFETs manufactured according to process designs Y and Y".

As FIG. 22 indicates, inclusion of the extended-time furnace anneal in design Y" caused much of the undesirable short-channel threshold voltage roll-off to be brought back. Comparison of the $V_T(L_{DR})$ curves in FIG. 22 suggests that more vertical dopant movement occurred with the extended-time furnace anneal of design Y" than with the source/drain-halo RTA of design Y, thereby causing the vertical channel-center dopant profile in design Y" to be relatively flat. In turn, this then caused average net channel dopant concentration $N_C$ in the n-channel IGFETs of design Y" to be reduced to a level at which threshold voltage roll-off occurs greatly in the immediate vicinity of the short-channel $L_{DRC}$ value of 0.18 μm. It appears that actual channel length L in design Y" was shortened due to lateral movement of the n-type source/drain extension dopant during the extended-time furnace anneal.

Additionally, the long-channel portions of the $V_T(L_{DR})$ curves for process designs Y and Y" are very close to each other. Inclusion of the extended-time furnace anneal in design Y" thus had little effect on threshold voltage $V_T$ in the long-channel regime.

The effect of varying the energy of ion implanting the p-type APT dopant was examined with the third lot of wafers. In particular, the p-type boron APT dopant for n-channel IGFETs was implanted at energies of 50, 55, and 60 KeV in three splits of the third lot. The depth of the maximum value of the concentration of the APT dopant at the lowest APT implantation energy, and thus at all three of the APT implantation energies, occurred below the channel surface depletion region for each of the n-channel IGFETs. The dosage of the boron APT dopant was $1 \times 10^{13}$ atoms/cm$^3$ in all of the splits utilized to examine the effect of the APT energy.

Figure 23:
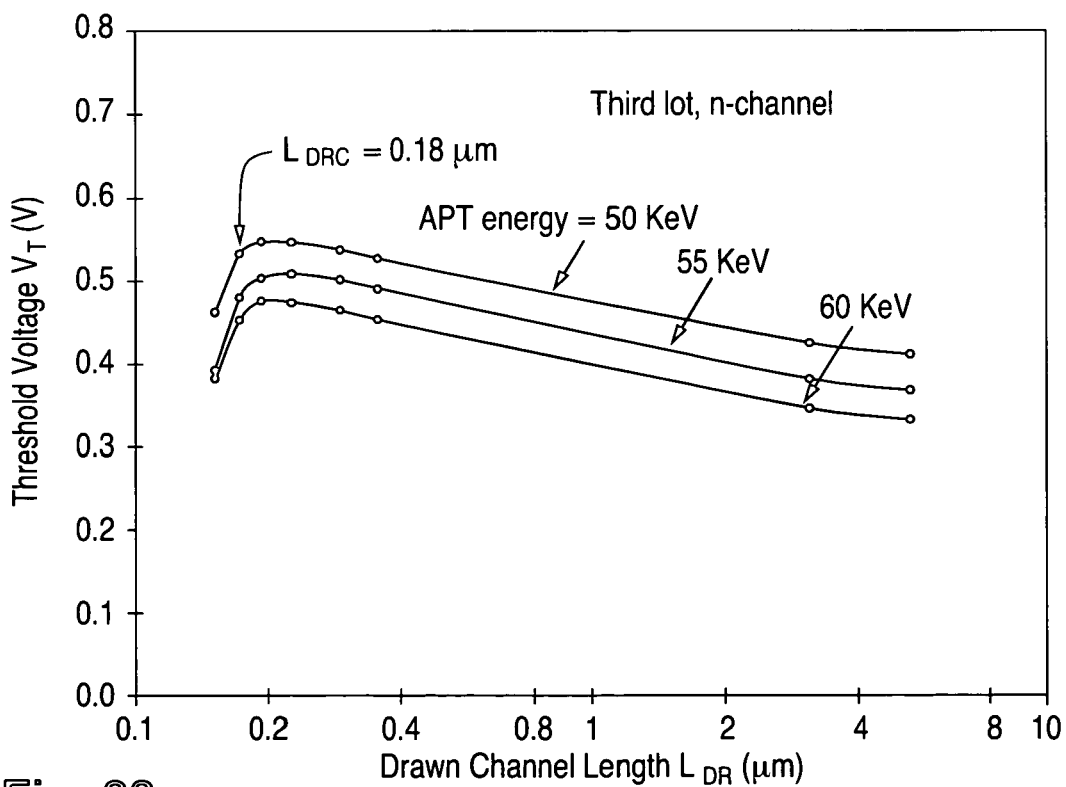
FIG. 23 is an experimental graph of threshold voltage as a function of drawn channel length for symmetrical n-channel IGFETs manufactured according to the invention at various APT implantation energies.

FIG. 23 depicts $V_T(L_{DR})$ variations for the splits at the APT implantation energies of 50, 55, and 60 KeV. As the three $V_T(L_{DR})$ curves in FIG. 23 indicate, threshold $V_T$ at any given value of drawn channel length $L_{DR}$ decreases with increasing APT energy. More particularly and unlike the threshold voltage control illustrated in FIG. 19a and achieved by changing the APT or/and halo dosages, the $V_T$ control obtained by changing the APT implantation energy maintained the basic shape of the $V_T(L_{DR})$ curve. Approximately the same amount of threshold roll-off relief is achieved at all three of the APT energies.

Also, the $V_T$ control for n-channel IGFETs was nearly linear for the APT implantation energy range from 50 KeV to 60 KeV. Threshold voltage $V_T$ decreased approximately 8 mV for each KeV of increase in the APT energy for n-channel IGFETs. It is expected that threshold voltage $V_T$ of p-channel IGFETs manufactured according to the invention can likewise be controlled in a nearly linear manner as a function of the implantation energy of the n-type APT dopant.

The following phenomena appeared to be involved in controlling threshold voltage as a function of the energy of the APT implant. The p-type APT implant for an n-channel IGFET is typically performed with boron, a small atom, at a sufficiently high energy that the APT implant introduces relatively few point defects into the IGFET's channel zone. Hence, the diffusion constant of the ion-implanted p-type halo dopant remains approximately constant, for a given halo dosage, as determined by the amount and spatial distribution of the point defects created by the halo implant at the given halo dosage. Changing the energy of the APT implant does not significantly affect the distribution of the halo dopant. For a given halo dosage, the halo dopant thus serves largely as a background parameter independent of the change in energy of the APT implant.

Partially repeating what was stated above, threshold voltage $V_T$ of a surface-channel enhancement-mode IGFET depends on the average net dopant concentration in the channel surface depletion region through which the channel extends during IGFET operation. Because the maximum concentration of the APT dopant occurs below the channel surface depletion region in each of the present IGFETs, only part of the head of the APT implant is present in the channel surface depletion region.

Figure 24A:
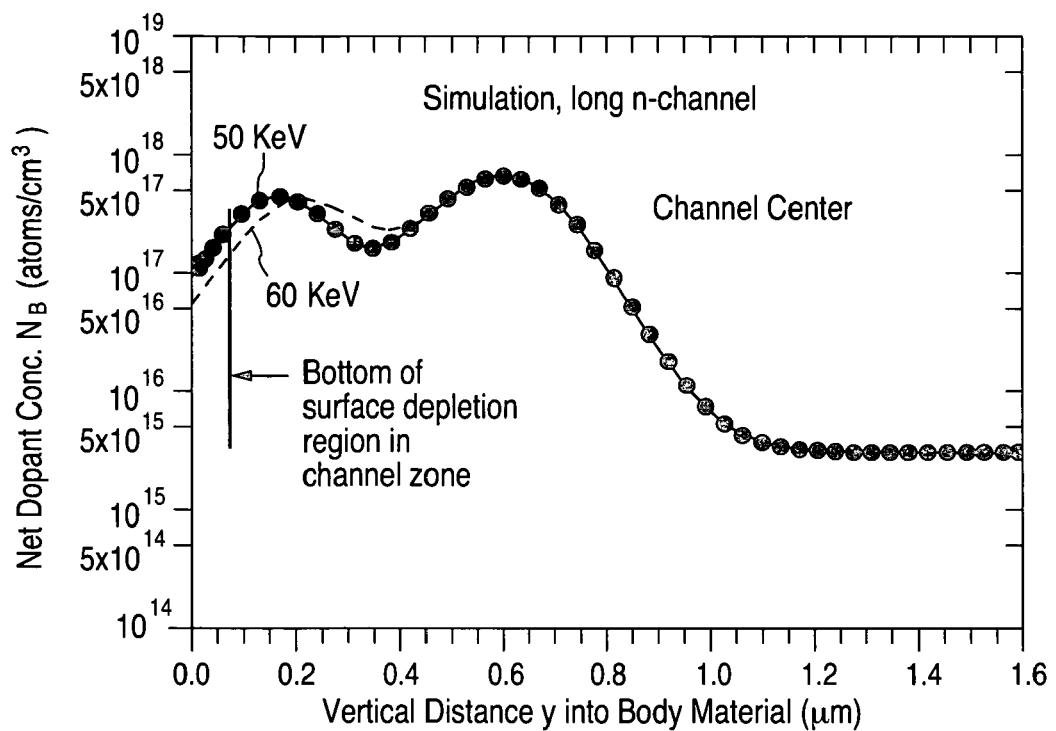
FIGS. 24a and 24b are exemplary graphs of net dopant concentration as a function of vertical distance into the body material along vertical planes respectively extending through the channel center and situated near a source/drain zone for computer simulations of symmetrical long n-channel IGFETs manufactured according to the invention at two of the APT implantation energies of FIG. 23.
Figure 24B:
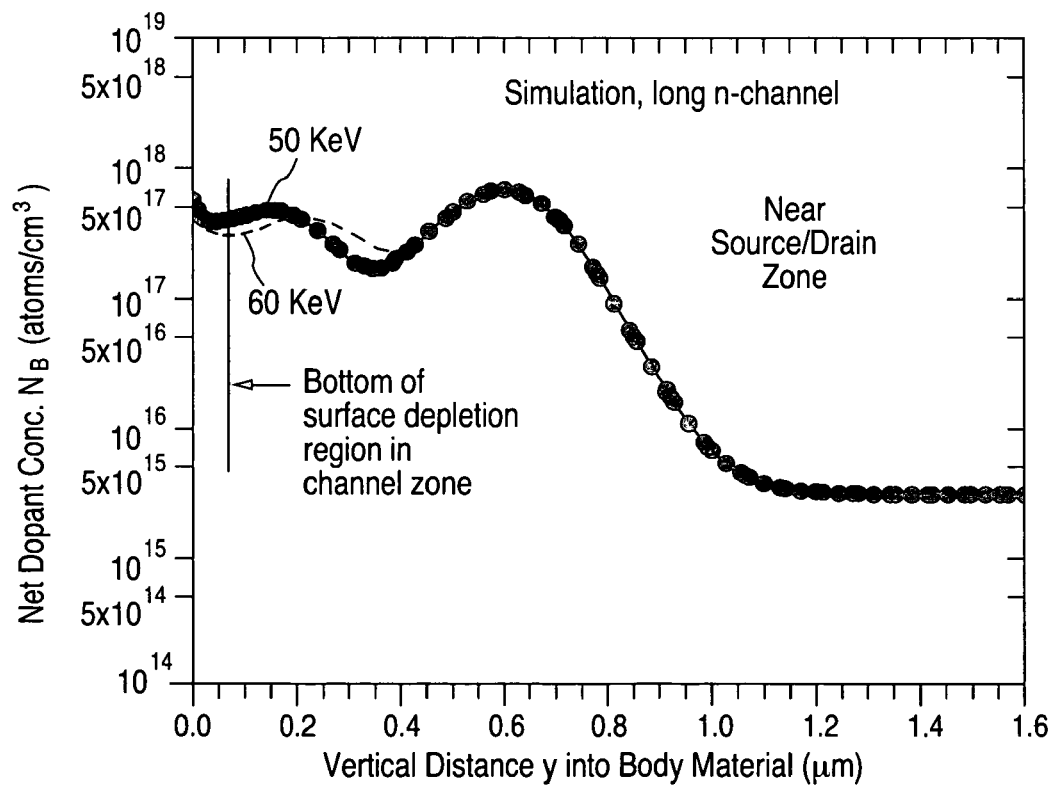

The foregoing relationship between the channel surface depletion region and the distribution of the implanted APT dopant can be seen in FIGS. 24a and 24b, particularly FIG. 24a, which present computer simulations of vertical dopant profiles for long n-channel IGFETs of the third lot at p-type APT implantation energies of 50 and 60 KeV. FIG. 24a is taken along the channel center where the APT dopant is present but (substantially) none of the p-type halo dopant is present. FIG. 24b is taken along a location near a source/drain zone where both the APT and halo dopants are present.

Referring to FIG. 24a, the dopant variation along each of the two left-hand humps in FIG. 24a largely represents the dopant profile of the APT implant in that portion of the channel zone of the associated IGFET whose APT implant is performed at the indicated value of 50 or 60 KeV. As these portions of the dopant profile in FIG. 24a indicate, only part of the head of the APT implant is present in the channel surface depletion regions.

FIG. 24a also indicates that the head of the APT implant drops downward as the energy of the APT implant increases from 50 KeV to 60 KeV. Consequently, the average net dopant concentration in the channel surface depletion region decreases as the APT energy increases. Increasing the APT implantation energy thus causes threshold voltage $V_T$ to decrease, typically in an approximately linear manner, for long n-channel IGFETs, and vice versa. Largely the same applies to the $V_T$ magnitude of long p-channel IGFETs.

The same phenomenon occurs in short-channel IGFETs except that the halo dopant is present at the channel centers. Because the distribution of the halo dopant in the channel zone of a short-channel IGFET does not change significantly due to a change in the implantation energy of the APT dopant, increasing the energy of the APT implant causes the magnitude of threshold voltage $V_T$ to similarly decrease, typically in an approximately linear manner, for a short-channel IGFET, and vice versa. Importantly, controlling threshold voltage $V_T$ by adjusting the energy of the APT implant is substantially independent of channel length L.

The ability to use the APT implantation energy for controlling threshold voltage $V_T$ substantially independent of channel length L is highly advantageous. This capability enables threshold voltage $V_T$ to be shifted upward or downward by approximately the same amount over the entire range of channel length L in an IC manufactured by a fabrication process which is fixed except for the energies of the APT implants.

Like-polarity IGFETs in different parts of an integrated circuit can also be provided with different threshold voltages by utilizing different values of the APT implantation energy for the different like-polarity IGFETs. For example, in an integrated circuit having a memory portion and a logic portion, the IGFETs in the memory portion can be furnished with threshold voltages of high magnitude to achieve low standby power by performing memory APT implants at low energies into the memory portion while the logic portion is appropriately shielded from, or otherwise prevented from receiving, the memory APT implants. The reverse of this procedure can be employed to furnish IGFETs in the logic portion with threshold voltages of low magnitude so as to achieve high drive current and thus fast switching.

Figure 25:
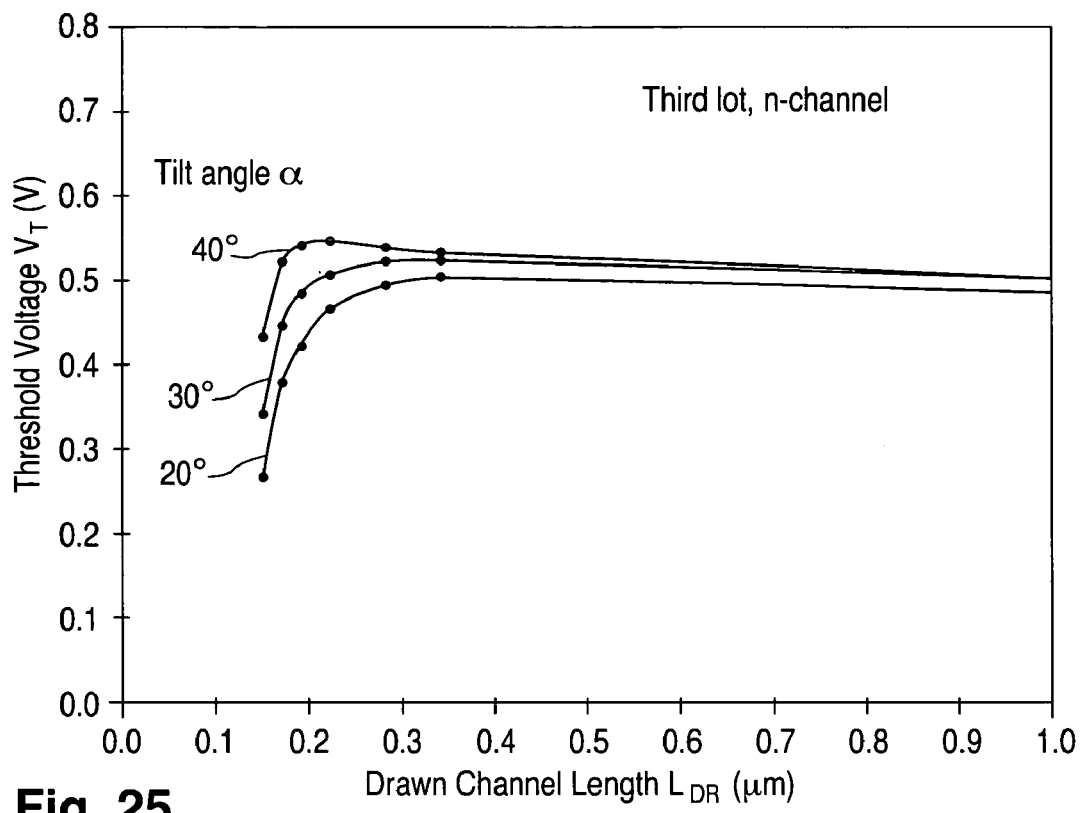
FIGS. 25 and 26 are experimental graphs of absolute threshold voltage as a function of drawn channel length for respective symmetrical n-channel and p-channel IGFETs manufactured according to the invention at various halo implantation angles.

The effect of varying tilt angle α of the halo implants for both n-channel and p-channel IGFETs was examined with the third lot of wafers. FIG. 25 depicts $V_T(L_{DR})$ variations for n-channel IGFETs in three splits at values of 20°, 30°, and 40° for tilt angle α. The p-type halo dopant was boron in all three splits. The azimuthal angles for the n-type halo implant were, as specified above, 33°, 123°, 213°, and 303°.

As indicated in FIG. 25, good short-channel threshold voltage roll-off compensation occurred at the 40° tilt angle for n-channel IGFETs. Threshold voltage roll-off compensation disappeared when tilt angle α was dropped to 30° or lower for n-channel IGFETs. The net result is that largely optimum threshold voltage roll-off compensation for n-channel IGFETs occurs when angle α is approximately 35°-40° at the specific p-type halo dosage used in the third wafer lot.

Figure 26:
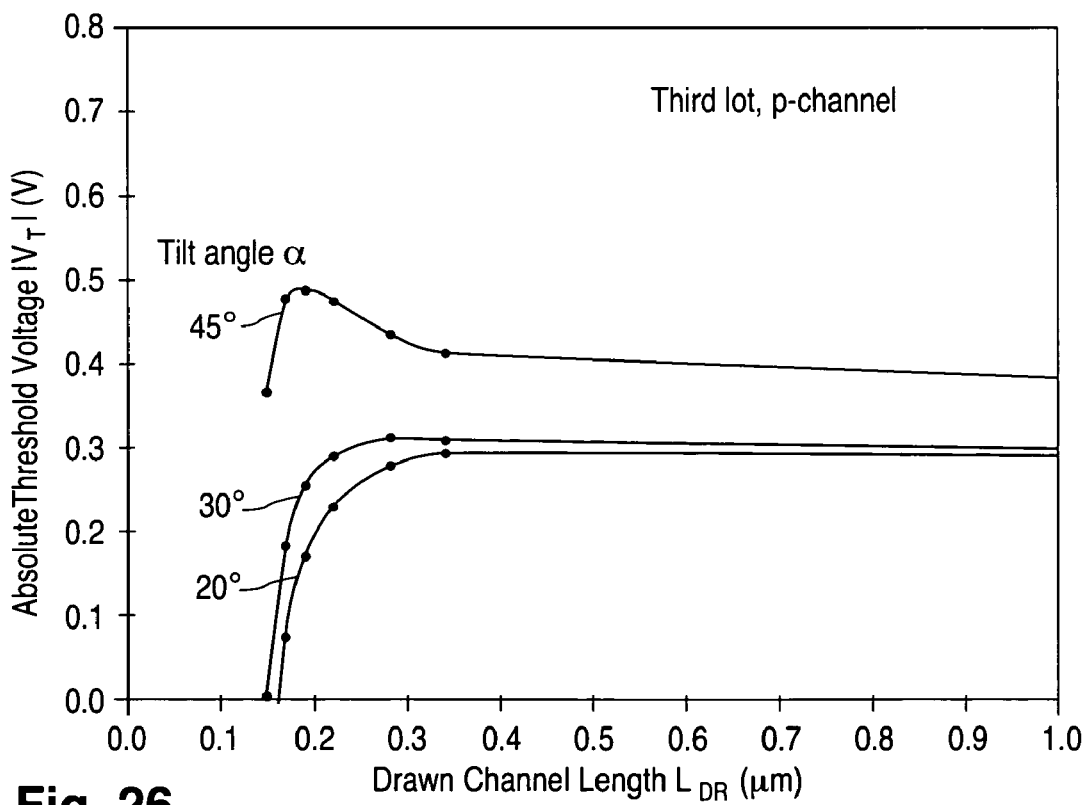

FIG. 26 depicts the $V_T(L_{DR})$ variations for p-channel IGFETs in three splits at values of 20°, 30°, and 45° for tilt angle α. The n-type halo dopant was arsenic for all three splits. As indicated in FIG. 26, short-channel threshold voltage roll-off compensation for p-channel IGFETs occurred with significant overshoot at the 45° tilt angle and disappeared as tilt angle α dropped to 30° or lower. As with the n-channel IGFETs, FIG. 26 suggests that largely optimum threshold voltage roll-off compensation for p-channel IGFETs occurs when angle α is approximately 35°-40° at the specific n-type halo dosage employed in the third wafer lot.

The 5° width in the optimum tilt angle range for both n-channel and p-channel IGFETs provides sufficient room to allow for manufacturing tolerances and to avoid specific tilt angle values at which undesired implantation channeling occurs. While the value of tilt angle α in the range of 35°-40° is optimum for the exemplary implementation of the present manufacturing used in the experimental program, another range of tilt angle α, including a range width of 5° or more, may be optimum for another implementation of the present manufacturing process.

Figure 27A:
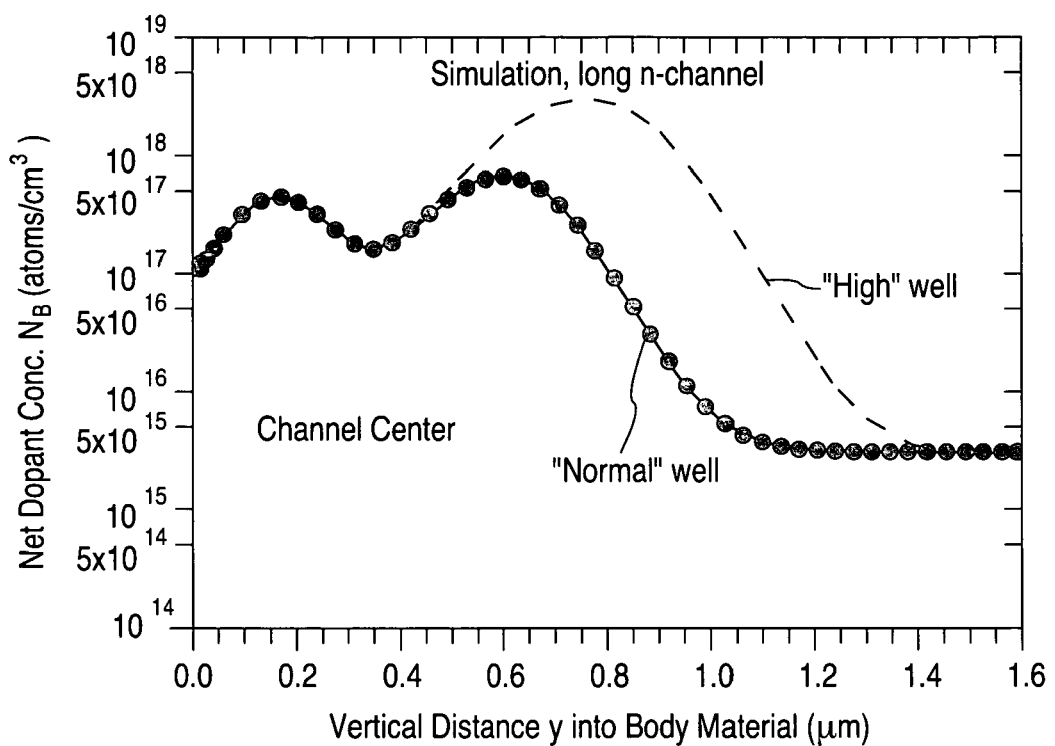
FIGS. 27a and 27b are exemplary graphs of net dopant concentration as a function of vertical distance into the body material along vertical planes respectively extending through the channel center and situated near a source/drain zone for computer simulations of symmetrical long n-channel IGFETs manufactured according to the invention with normal well and high well implants.
Figure 27B:
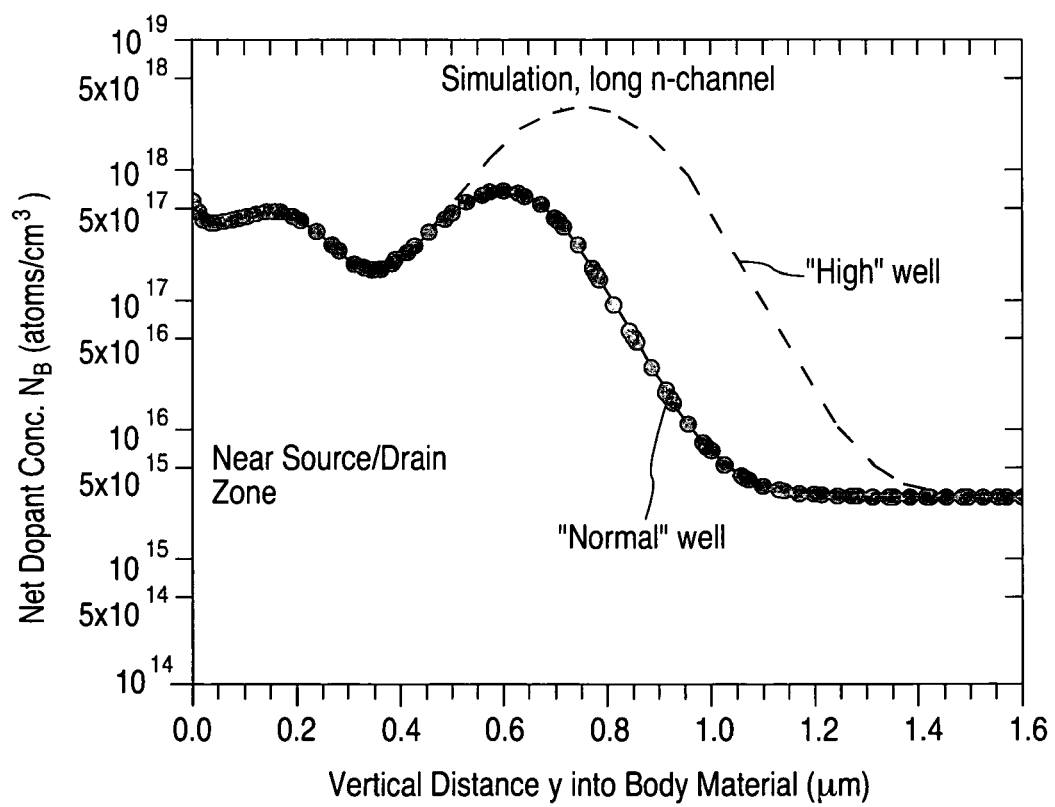

The effect of utilizing high-energy/high-dosage wells was examined with the fourth lot of wafers. FIGS. 27a and 27b present computer simulations of vertical dopant profiles for two long n-channel IGFETs, one having a "normal" p-type well and the other having a high-energy/high-dosage p-type well referred to here simply as a "high" p-type well. FIG. 27a is taken along the channel center. FIG. 27b is taken along a location near a source/drain zone.

The normal p-type well is the p-type well employed and/or simulated in the first, second, and third wafer lots. The maximum dopant concentration of the high p-type well is greater than, and occurs deeper below the upper semiconductor surface, than the maximum concentration of the normal p-type well. The characteristics of a high well for an n-channel IGFET were simulated/chosen so as to have substantially the same dopant profile along the upper semiconductor surface as that present in the associated n-channel IGFET having a normal well. Use of such a high well is important from the point of view of improving the ability of an IC to avoid undesired latch-up.

Figure 28:
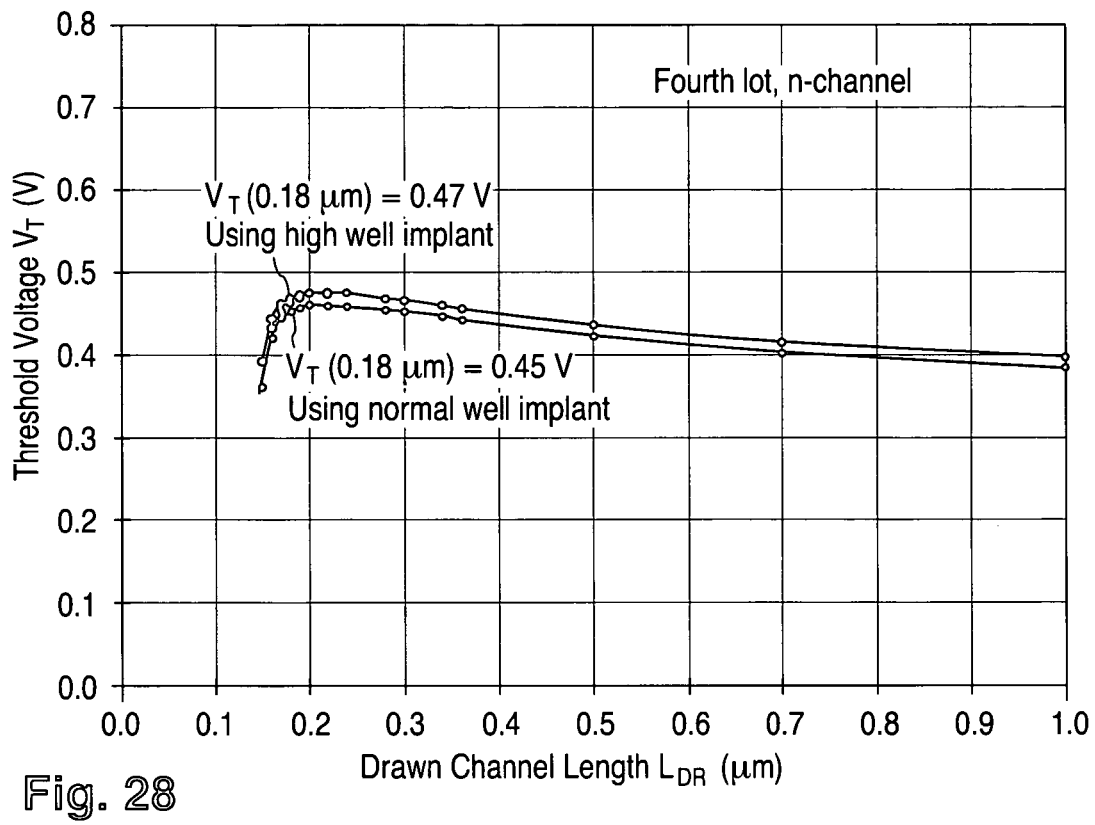
FIG. 28 is an experimental graph of threshold voltage as a function of drawn channel length for symmetrical n-channel IGFETs manufactured according to the invention with normal well and high well implants.

FIG. 28 illustrates $V_T(L_{DR})$ variations for n-channel IGFETs in two splits provided respectively with the normal and high p-type wells. There is a small, approximately 0.02-V, difference between the $V_T(L_{DR})$ curves for the splits with the normal and high p-type wells. This difference occurred even though the characteristics of the high well were chosen in accordance with the computer simulation to have substantially the same dopant profile along the upper semiconductor surface as that achieved with the normal well. The $V_T$ difference is attributed to insufficient simulation accuracy and can be compensated for by making a small increase, approximately 2.5 KeV, in the energy of the p-type APT implant for the split with the high p-type wells.

The effect of thinning the gate dielectric layer was investigated with the fourth wafer lot for n-channel and p-channel IGFETs. One split was processed to create gate dielectric layers of both n-channel and p-channel IGFETs at the nominal target thickness of 4 nm utilized in the first, second, and third lots. Another split was processed to provide both n-channel and p-channel IGFETs with thinner gate dielectric layers at a reduced target thickness of 3.5 nm. The gate dielectric layers at both target thicknesses were nitrided in the manner described above.

Figure 29:
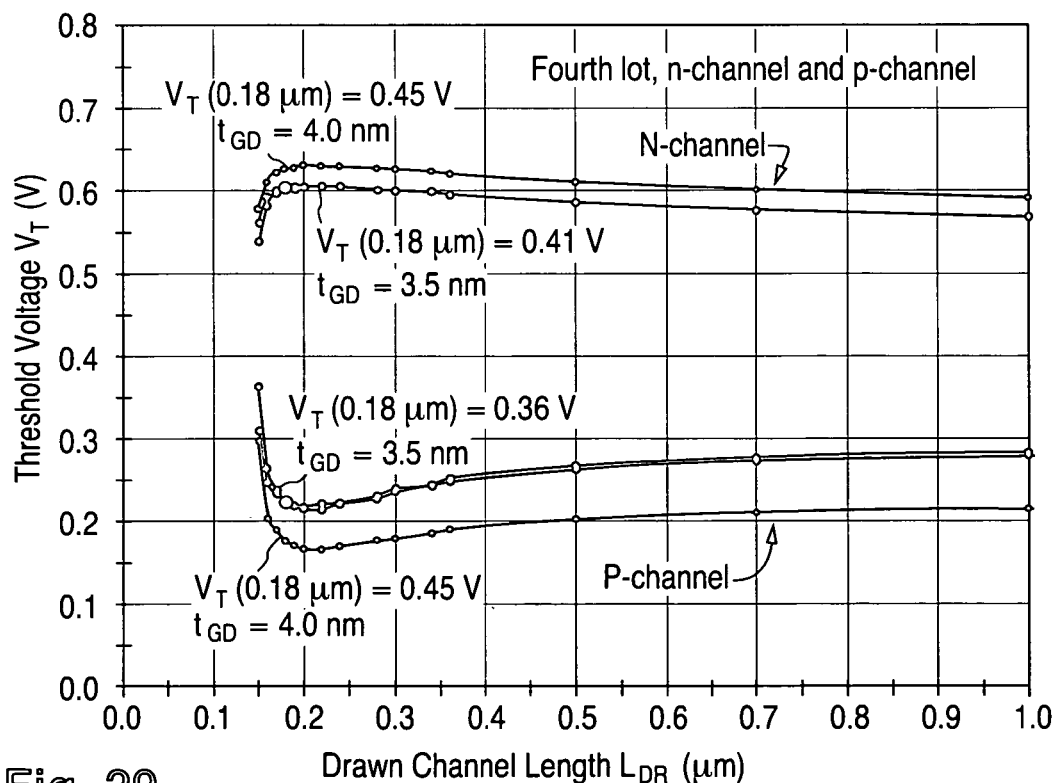
FIG. 29 is a experimental graph of threshold voltage as a function of drawn channel length for symmetrical n-channel and p-channel IGFETs manufactured according to the invention at two gate dielectric thicknesses.

FIG. 29 depicts $V_T(L_{DR})$ variations for n-channel and p-channel IGFETs in the two splits where the target values of gate dielectric thickness $t_{GD}$ respectively were 4 and 3.5 nm. As FIG. 29 indicates, thinning the gate dielectric layer did not have any significant effect on short-channel threshold voltage roll-off compensation. The IGFETs of reduced gate dielectric thickness achieved largely the same amounts of threshold voltage roll-off relief as the IGFETs of the nominal gate dielectric thickness.

Threshold voltage $V_T$ of the n-channel IGFETs at the reduced gate dielectric thickness was a small, approximately constant, amount lower than threshold voltage $V_T$ of the n-channel IGFETs at the nominal gate dielectric thickness across the entire channel-length range examined in the experiment. Threshold voltage $V_T$ of the p-channel IGFETs at reduced dielectric thickness was similarly lower than threshold voltage $V_T$ of the p-channel IGFETs at the nominal gate dielectric thickness across the entire channel-length range examined in the experiment. The difference in threshold voltage $V_T$ was significantly greater for the p-channel IGFETs than for the n-channel IGFETs. This showed that thinning the gate dielectric layer has a greater impact on p-channel IGFETs than on n-channel IGFETs.

In addition, the $V_T$ difference between the p-channel IGFETs of different gate dielectric thickness increased slightly with increasing channel length. Both this variation in the $V_T$ difference and the greater $V_T$ difference for p-channel IGFETs than for n-channel IGFETs appear to be caused by boron in the p-type polysilicon gate electrodes of the p-channel IGFETs penetrating through the gate dielectric layers and into the underlying n-type channel zones. Boron penetration into the channel zones of the p-channel IGFETs partially compensates the n-type doping in the channel zones. As described above, nitrogen can be incorporated into the gate dielectric layers of p-channel IGFETs to reduce boron penetration through their gate dielectric layers.

Figure 30:
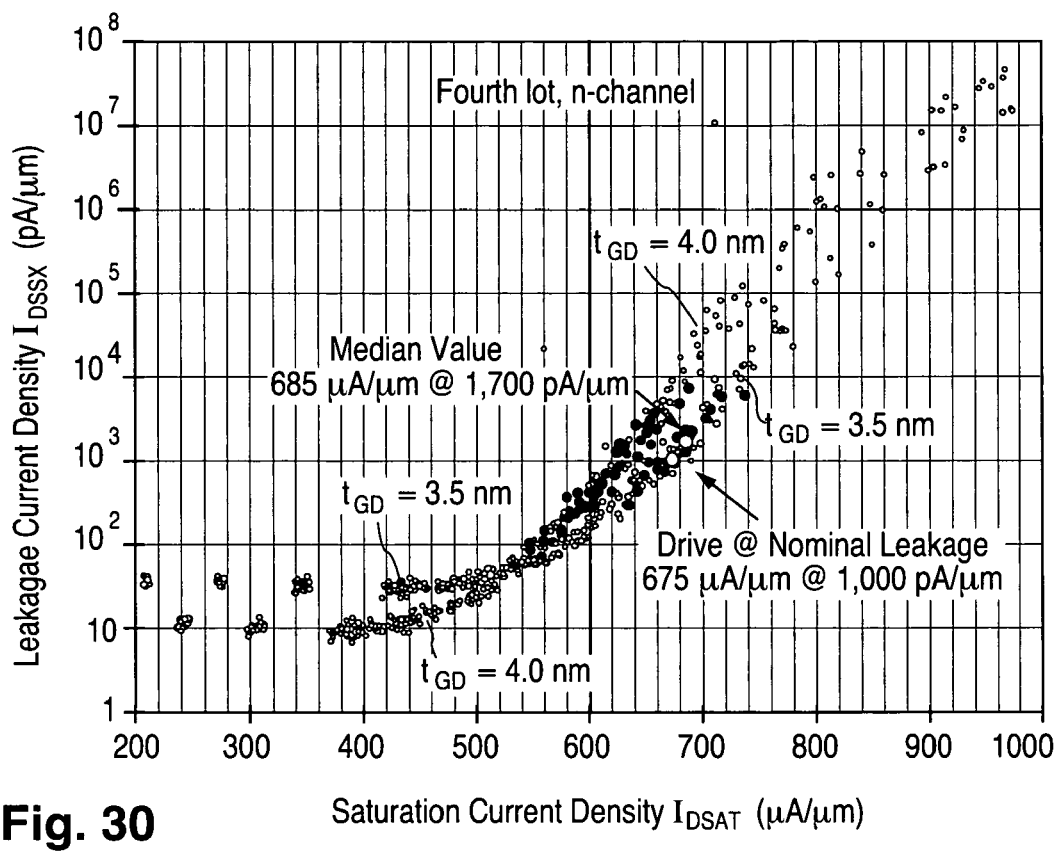
FIG. 30 is an experimental graph of extrapolated leakage current density as a function of drive current density for symmetrical n-channel IGFETs manufactured according to the invention at the two gate dielectric thicknesses of FIG. 29.

FIG. 30 illustrates how extrapolated leakage current density $I_{DSSX}$ varied with drive current density $I_{DSAT}$ for the preceding n-channel IGFETs at the gate dielectric thicknesses $t_{GD}$ of 4 and 3.5 nm. As in FIG. 19b, each point in FIG. 30 represents a different IGFET. The following leakage-drive characteristics at the desired short-channel $L_{DR}$ operating value of 0.18 μm were extrapolated from FIG. 30 at the standard value of 1 nA/nm for actual drive current density $I_{DSS0}$:

$I_{DSAT}$=675 μA/μm at $t_{GD}$=3.5 nm
$I_{DSAT}$=625 μA/μm at $t_{GD}$=4 nm

The $I_{DSAT}$ value for n-channel IGFETs at both gate dielectric thicknesses is greater than the $I_{DSAT}$ value of 600 μA/μm achieved above in process design Z of the first wafer lot.

The effect of reducing the time of the RTA in the source/drain-halo anneal was examined with the fourth lot for n-channel IGFETs. One split was processed with the nominal RTA time of 15 sec. used in the first, second, and third lots. Another split was processed with a reduced RTA time of 12 sec.

Figure 31A:
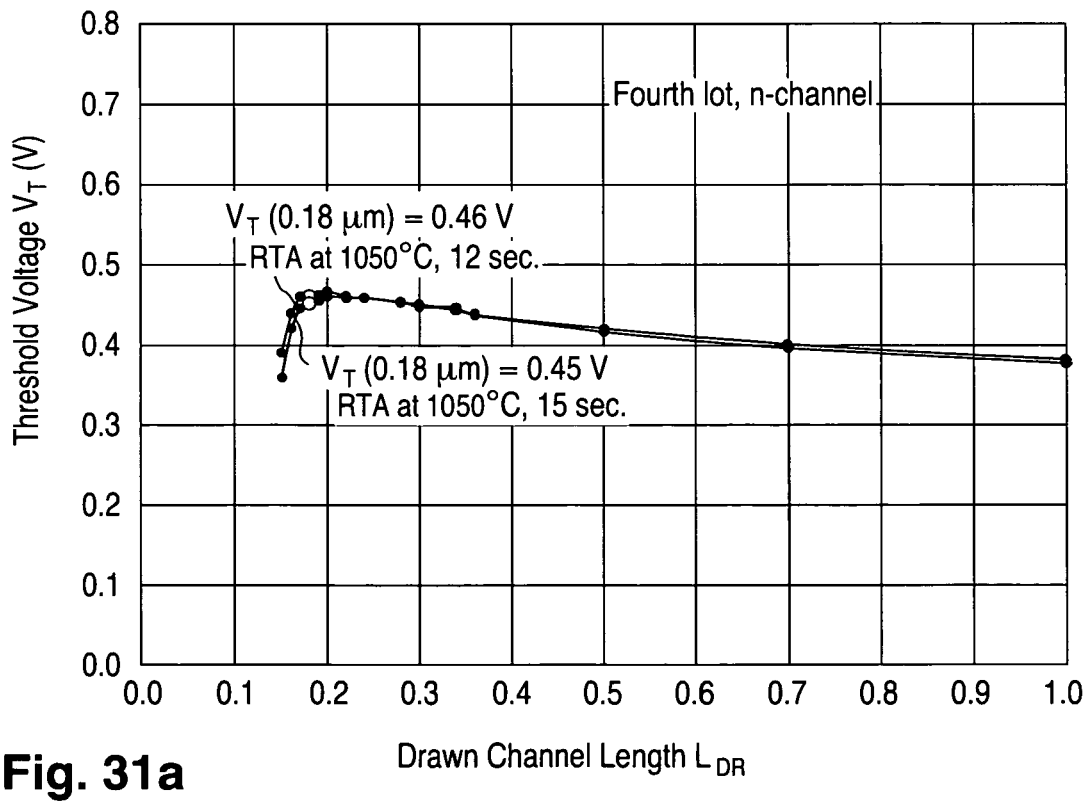
FIG. 31a is an experimental graph of threshold voltage as a function of drawn channel length for symmetrical n-channel IGFETs manufactured according to the invention at two different times of source/drain-halo rapid thermal anneal.
Figure 31B:
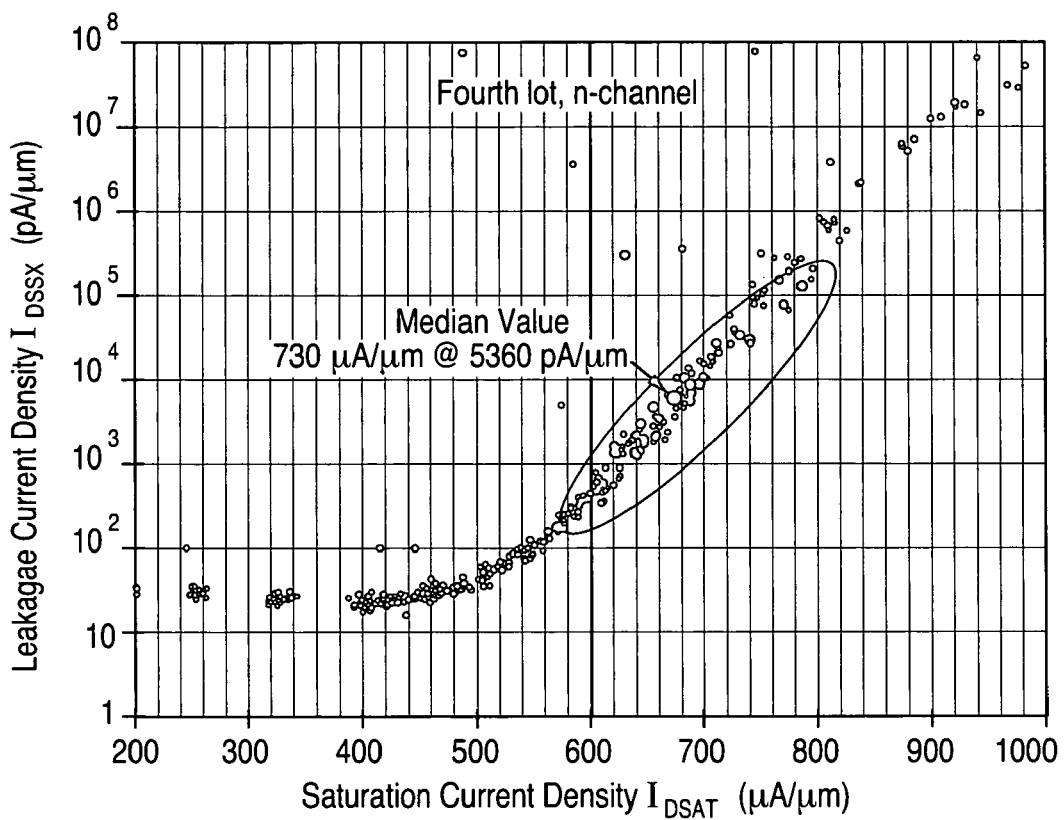

FIG. 31a depicts $V_T(L_{DR})$ variations for n-channel IGFETs in the two splits where the RTA times were 15 and 12 sec. FIG. 31b illustrates the corresponding $I_{DSSX}(I_{DSAT})$ graph. No significant difference is observed between the n-channel IGFETs processed at the two different RTA times. This indicates that a substantial process margin is present in the source/drain-halo RTA time for n-channel IGFETs. Reducing the RTA time in the source/drain-halo anneal is important because undesirable boron penetration through the gate dielectric layers of p-channel IGFETs decreases as the RTA time is reduced.

N-channel and p-channel IGFETs were provided with graded-junction characteristics in an additional lot of wafers during the experimental program. As with each of the first four lots, the wafers in the additional lot were processed the same and thus largely simultaneously except for variations applied to the splits of the additional lot. Likewise, each split of the additional lot consisted of two or more wafers.

Subject to the variations applied to the different splits, the wafers in the additional lot were processed as described above in connection with FIG. 16. Except for a baseline split, each source/drain zone of the IGFETs in the wafers of the additional lot was provided with a lower portion underlying, and more lightly doped, than the very heavily doped main portion of that source/drain zone so as to create a graded body-source/drain pn junction. Boron, either in elemental form or in the form of boron difluoride, was the p-type dopant for all p-type ion implantations in the additional lot.

P-channel IGFETs having graded junctions were compared to p-channel IGFETs having non-graded junctions in four splits, including the above-mentioned baseline split, of the additional lot. The main portions of the p-type source/drain zones of the p-channel IGFETs in these four splits were formed by ion implanting boron in the form of boron difluoride at various values of ion implantation energy $E_{BF2}$. For the baseline split and one of the other three splits, implantation energy $E_{BF2}$ was 25 KeV. $E_{BF2}$ values of 20 and 15 KeV were respectively used for the remaining two splits.

The baseline split was not provided with graded-junction characteristics. Accordingly, the source/drain zones of the p-channel IGFETs in the baseline split lacked lower portions more lightly doped than the main source/drain portions. The more lightly doped portions of the p-type source/drain zones of the graded-junction p-channel IGFETs in the other three splits were formed by ion implanting boron in the form of elemental boron.

Figure 32:
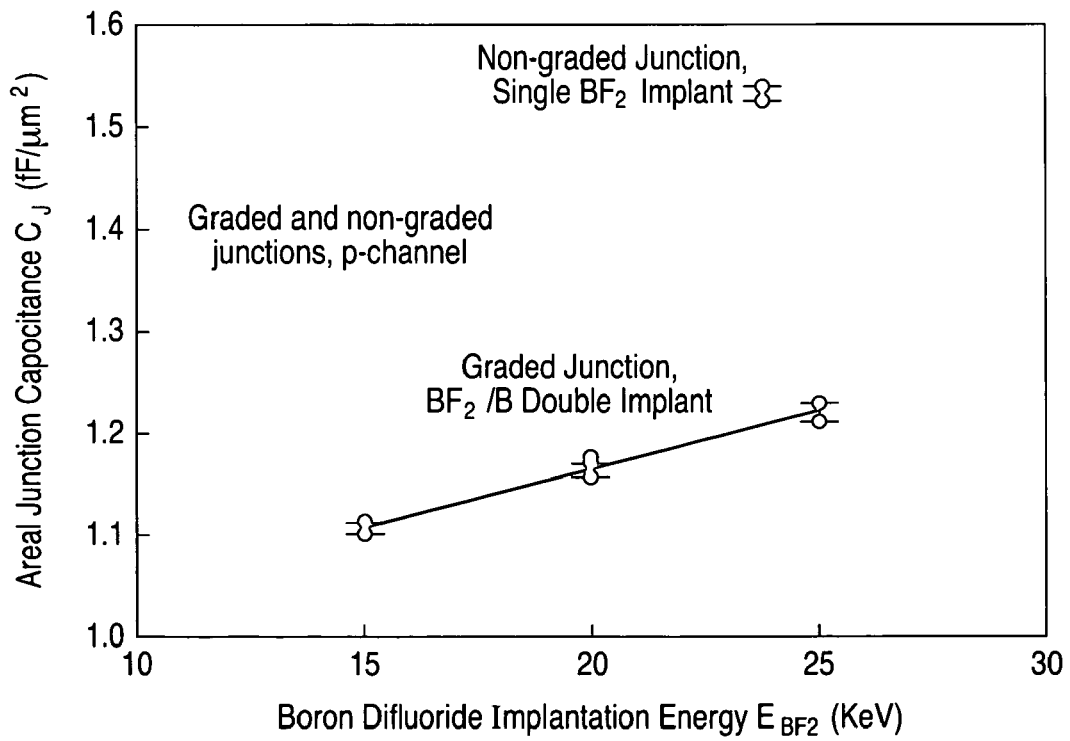
FIG. 32 is an experimental graph of areal junction capacitance as a function of boron difluoride ion implantation energy for symmetrical p-channel IGFETs manufactured according to the invention with and without graded-junction characteristics.

FIG. 32 illustrates how areal junction capacitance $C_J$ varied as a function of boron difluoride implantation energy $E_{BF2}$ for p-channel IGFETs in the preceding four splits, including the baseline split. Areal capacitance $C_J$ is the capacitance per unit area along a pn junction between a source/drain zone and the adjoining body material. As FIG. 32 indicates, areal junction capacitance $C_J$ was considerably higher for the baseline split having the non-graded junctions than for the other three splits having graded junctions. This confirms that the use of graded junctions in p-channel IGFETs fabricated according to the invention reduces the junction capacitance.

FIG. 32 also shows that areal junction capacitance $C_J$ for the p-channel IGFETs in the three splits having graded junctions decreased with decreasing boron difluoride implantation energy $E_{BF2}$. This arises because reducing implantation energy $E_{BF2}$ decreases the range (average depth) of the ions of the boron difluoride implanted to form the main portions of the p-type source/drain zones in the graded-junction p-channel IGFETs. Since the more lightly doped lower portions of the p-type source/drain zones define the body-source/drain pn junctions except along the source/drain extensions, decreasing the range of the boron difluoride ions implanted to form the main source/drain portions causes the average steepness of the graded junctions, and thus the junction capacitance, to decrease. Inasmuch as reducing the junction capacitance generally causes the switching speed to increase, FIG. 32 indicates that implantation energy $E_{BF2}$ should be made as small as reasonably feasible without causing fabrication control problems.

The bottom thickness $t_{SP}$ of the gate sidewalls spacers (70, 72, 90, 92, 150, 152, 170, and 172) for the n-channel and p-channel IGFETs in the preceding four splits of the additional wafer lot was approximately 100 nm. The effect of reducing sidewall spacer thickness $t_{SP}$ was examined by processing two splits of the additional lot to have a $t_{SP}$ value of approximately 70 nm. The IGFETs in the two reduced-$t_{SP}$ splits had graded-junction characteristics. Boron difluoride implantation energy $E_{BF2}$ was 25 KeV in one of the reduced-$t_{SP}$ splits and 15 KeV in the other split.

Figure 33:
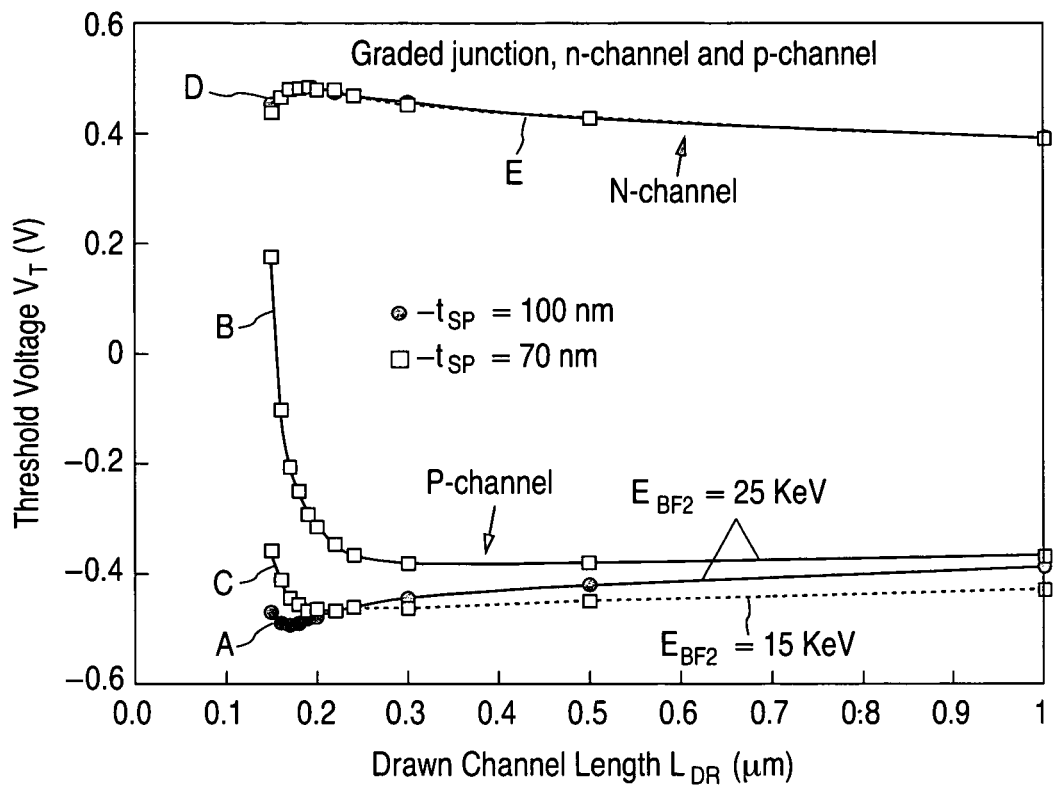
FIG. 33 is an experimental graph of threshold voltage as a function of drawn channel length for symmetrical graded-junction n-channel and p-channel IGFETs manufactured according to the invention at two different values of sidewall spacer thickness and, for p-channel IGFETs, at two different values of boron difluoride ion implantation energy.

FIG. 33 presents $V_T(L_{DR})$ variations for (a) graded-junction IGFETs in the earlier-mentioned split having the $E_{BF2}$ value of 25 KeV and the nominal $t_{SP}$ value of 100 nm, (b) graded-junction p-channel IGFETs in the reduced-$t_{SP}$ split having the $E_{BF2}$ value of 25 KeV and the reduced $t_{SP}$ value of 70 nm, and (c) graded-junction p-channel IGFETs in the reduced-$t_{SP}$ split having the $E_{BF2}$ value of 15 KeV and the reduced-$t_{SP}$ value of 70 nm. These three $V_T(L_{DR})$ variations are respectively labeled as curves A, B, and C in FIG. 33. FIG. 33 also presents the $V_T(L_{DR})$ variation, curve D, for graded-junction n-channel IGFETs in the split having the nominal $t_{SP}$ value of 100 nm along with the $V_T(L_{DR})$ variation, curve E, for graded-junction n-channel IGFETs in the two reduced-$t_{SP}$ splits having the reduced $t_{SP}$ value of 70 nm.

Referring first to curves A and B for which boron difluoride implantation energy $E_{BF2}$ is the same, 25 KeV, FIG. 33 shows that reducing gate sidewall spacer thickness $t_{SP}$ from 100 nm to 70 nm in the graded-junction p-channel IGFETs caused threshold voltage roll-off at short-channel length to increase. However, as indicated by curves B and C for which gate sidewall spacer thickness $t_{SP}$ is the same, 70 nm, much of the undesirable increase in threshold voltage roll-off was eliminated in graded-junction p-channel IGFETs by reducing implantation energy $E_{BF2}$ from 25 KeV to 15 KeV. In addition to again showing the benefits of reducing implantation energy $E_{BF2}$, this shows that there is a significant process window with respect to parameters $t_{SP}$ and $E_{BF2}$ for alleviating threshold voltage roll-off in graded-junction p-channel IGFETs.

Curves D and E for n-channel IGFETs at the respective nominal and reduced $t_{SP}$ values are virtually identical. As shown by comparing curve D or E for graded-junction n-channel IGFETs to curve A for graded-junction p-channel IGFETs, the graded-junction re-channel IGFETs at either $t_{SP}$ value had roughly the same amount of threshold voltage roll-off alleviation as the graded-junction p-channel IGFETs at the nominal $t_{SP}$ value of 100 nm and the $E_{BF2}$ value of 25 KeV. Hence, choosing appropriate parametric values to alleviate threshold voltage roll-off is quite important in designing the p-channel portions of the present fabrication process.

Shadowing Effects on Halo Implantation

The effect of shadowing during the halo doping operations needs to be considered when, as is preferably the situation, the halo dopings are performed by angled ion implantation. Shadowing during angled halo implantation can arise from either or both of two types of features that protrude significantly above the upper semiconductor surface: (a) gate electrode structures formed with gate electrodes, or precursors to gate electrodes, and any material situated on the top and side surfaces of the gate electrodes or their precursors and (b) masks, typically consisting of photoresist, utilized to prevent halo dopant from being implanted into certain parts of the semiconductor material. If shadowing is not properly taken into account during angled halo implantation, halo pockets may only be partially formed or, in extreme cases, may not be formed at all.

Figure 34:
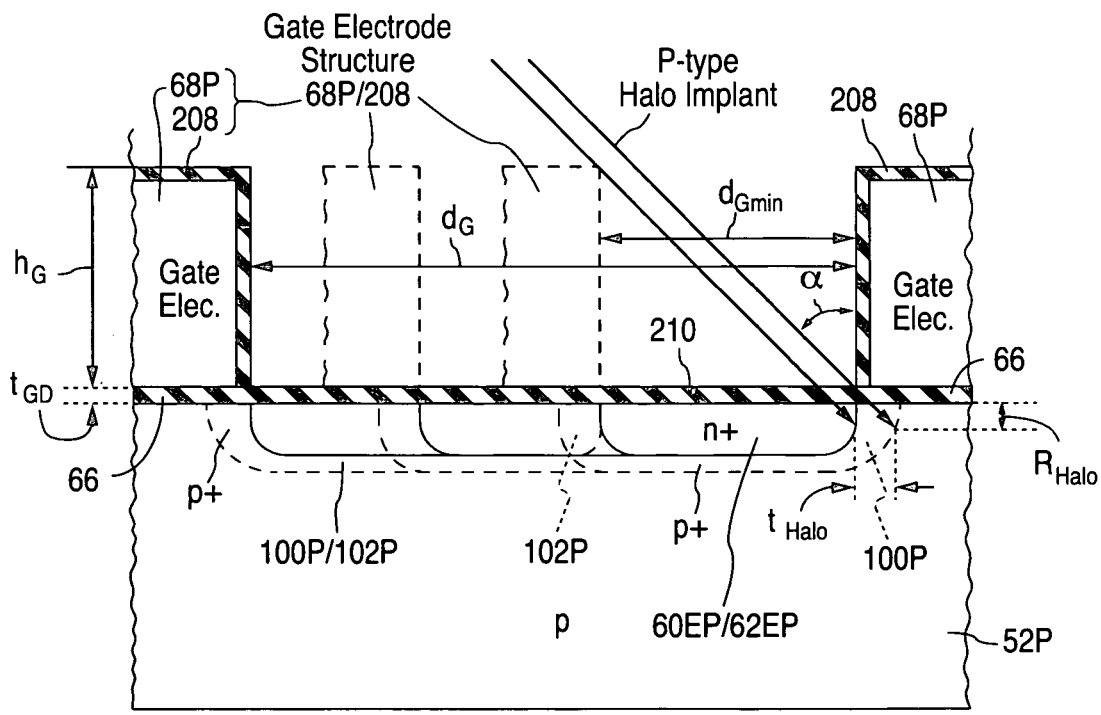
FIG. 34 is a front cross-sectional view for a model of how shadowing by a gate electrode structure affects angled halo ion implantation.

FIG. 34 presents a simplified model of how shadowing by a gate electrode structure of one IGFET can affect angled implantation of a halo pocket of another IGFET referred to here as the halo-receiving IGFET. The IGFET whose gate electrode structure poses shadowing concern is referred to here as the halo-interfering IGFET because its gate electrode structure invariably blocks some of the ions of the halo dopant from entering the semiconductor material of the halo-receiving IGFET regardless of whether the blockage is great enough to damage the function of the halo pocket of the halo-receiving IGFET. The components, including the gate electrode structures, of both the halo-receiving IGFET and the halo-interfering IGFET are typically exposed through a common opening in a halo photoresist mask (not shown) situated over the semiconductor structure under fabrication.

Both of the IGFETs under fabrication in the model of FIG. 34 are normally of the same polarity type. In FIG. 34, the two IGFETs are illustrated as long n-channel devices. However, one or both of the IGFETs can be of the short n-channel type. Both of the IGFETs can also be p-channel IGFETs variously of the long-channel or short-channel type. Under certain circumstances, the halo-interfering IGFET can be complementary to the halo-receiving IGFET.

The two exemplary n-channel IGFETs in the model of FIG. 34 are shown as having a common precursor source/drain extension 60EP/62EP. Alternatively, part of field-insulation region 44 can laterally separate source/drain extension 60EP or 62EP of the halo-receiving IGFET from source/drain extension 60EP/62EP of the halo-interfering IGFET. A similar type of source/drain extension sharing or separation can arise when both IGFETs are p-channel devices. In the case where the two IGFETs are complementary to each other, field insulation 44 normally laterally separates the intended locations for the source/drain zones of the two IGFETs.

The n-type source/drain extension implantation can, as indicated above, be done after the p-type halo implantation. If so, item 60EP/62EP in FIG. 34 represents the intended location for common source/drain extension 60EP/62EP.

Regardless of whether the halo-receiving and halo-interfering IGFETs are long-channel or short-channel devices and regardless of whether they are of the same or opposite polarity type, each IGFET has a gate electrode structure consisting at least of the IGFET's gate electrode, or precursor to the gate electrode. When any material, such as electrical insulation, is situated on the top and/or side surfaces of the gate electrode or the precursor to the gate electrode during the halo implantation, that material forms part of the gate electrode structure. Each of the n-channel IGFETs being fabricated in the model of FIG. 34 has a gate electrode structure 68P/208 consisting of precursor gate electrode 68P and seal-oxide layer 208. The gate electrode structures are laterally separated by distance $d_G$ in the direction along the channel length of the halo-receiving IGFET.

In the model of FIG. 34, ions of the p-type halo dopant species are being implanted at tilt angle $\alpha$ to form a common precursor halo pocket portion 100P/102P for the two IGFETs. With the ions impinging from upper left to lower right as shown in FIG. 34, the halo-receiving IGFET is the IGFET being formed at the right-hand side of the figure. When the ions impinge from upper right to lower left, the roles of the two IGFETs are reversed. The halo-interfering IGFET is then the IGFET being formed at the left-hand side of FIG. 34. The model of FIG. 34 is simplified in that the ions are assumed to impinge on the semiconductor body at opposite azimuthal angles of 0° and 180° relative to a reference line extending in the longitudinal direction of the two IGFETs.

FIG. 34 illustrates what happens during the angled halo implantation as a result of reducing separation distance $d_G$, i.e., bringing gate electrode structures 68P/208 of the two IGFETs closer together, in laying out the two IGFETs. Due to the angled implantation, shadowing by gate electrode structure 68P/208 of the halo-interfering IGFET, whether it is being formed to the left as depicted in the part of the p-type halo implantation presented in FIG. 34 or to the right as occurs in the other (unshown) part of the p-type halo implantation, progressively inhibits ions of the p-type halo dopant species from entering the semiconductor body as distance $d_G$ is reduced. When distance $d_G$ is made sufficiently small, shadowing by gate electrode structures 68P/208 of the two IGFETs causes halo pocket 100P/102P to split into halo pockets 102P and 100P. Pocket 102P is a halo pocket for the left-hand IGFET, while pocket 100P is a halo pocket for the right-hand IGFET. As distance $d_G$ is made even smaller, the lengths, in the longitudinal direction, of pockets 100P and 102P are progressively reduced.

If the two IGFETs are laid out so that distance $d_G$ between the gate electrode structures drops down to or below a minimum value $d_{Gmin}$, the halo implant is rendered inefficient or, in the worst case, useless. When distance $d_G$ equals $d_{Gmin}$, shadowing by gate electrode structure 68P/208 of the halo-interfering IGFET to the left in the part of the halo implantation presented in FIG. 34 blocks the angled entry of ions into the semiconductor body to such a degree that halo pocket 100P of the right-hand halo-receiving IGFET underlies its gate electrode structure 68P/208 but does not extend significantly laterally across (the location for) source/drain extension 60EP/62EP. Halo pocket 100P becomes smaller and eventually disappears as distance $d_G$ is reduced below $d_{Gmin}$. Subject to the halo-interfering/halo-receiving roles being reversed for the two IGFETs, the same occurs to halo pocket 102P of the left-hand IGFET.

While ions of the n-type halo dopant species are assumed to impinge on the semiconductor body at the opposite azimuthal angles of 0° and 180° relative to a reference line extending in the IGFETs' longitudinal direction during the two respective parts of the n-type halo implantation in the simplified model of FIG. 34, the ions typically impinge on the semiconductor body at average azimuthal angles that respectively differ significantly from 0° and 180°. Let $\beta$ generally represent the average azimuthal angle, as measured from the indicated longitudinal reference line in a plane extending generally parallel to the upper semiconductor surface, at which the ions impinge on the semiconductor body during each part of the n-type halo implantation. General azimuthal angle $\beta$ then has two values, one for each part of the n-type halo implantation. Assume that the two $\beta$ values differ by 180° as is typically the case.

Upon taking azimuthal angle $\beta$ into account for the 180° azimuthal-difference assumption given in the previous paragraph, minimum value $d_{Gmin}$ is given approximately by the following relationship:

$$d_{Gmin} = (h_G + t_{GD} + R_{Halo}) \tan \alpha \cdot |\cos \beta| \qquad (18)$$

where $h_G$ is the height of the gate electrode structure (68P/208P here) of the halo-interfering IGFET above the gate dielectric layer (66 here), $t_{GD}$ is the thickness of the gate dielectric layer (66 here) of the halo-receiving IGFET, and $R_{Halo}$ is the vertical range (average depth) of the ions of the halo dopant (p-type halo dopant here) into the semiconductor body. For Eq. 18, it is immaterial whether dielectric material (210 here) is, or is not, present along the upper semiconductor surface portion where the halo dopant enters the semiconductor body. Also, it is immaterial which of the two $\beta$ values is used in Eq. 18 since $|\cos(180°+\beta)|$ equals $|\cos \beta|$.

The factor $(t_{GD}+R_{Halo}) \tan \alpha \cdot |\cos \beta|$ in Eq. 18 accounts for the lateral thickness $t_{Halo}$ of halo pocket 100P directly after the halo implantation at a depth below the upper semiconductor surface equal to vertical range $R_{Halo}$ of the halo dopant. Lateral thickness $t_{Halo}$ here is the distance by which halo pocket 100P extends from precursor source/drain extension 60EP/62EP laterally below right-hand gate electrode structure 68P/208 at a depth equal to $R_{Halo}$. Atoms of the halo dopant are present across all of lateral halo thickness $t_{Halo}$. If factor $(t_{GD}+R_{Halo}) \tan \alpha \cdot |\cos \beta|$ were not present in Eq. 18, atoms of the halo dopant might be present to some degree below gate electrode structure 68P/208 of the right-hand IGFET in FIG. 34 but would normally not be present at the desired concentration across all of thickness $t_{Halo}$. The same applies to halo pocket 102P of the left-hand IGFET.

In cases where part of the p-type halo implantation is performed at two or more azimuthal angles which differ from 0° by less than 90°, the values of angles $\alpha$ and $\beta$ for insertion into Eq. 18 to determine minimum value $d_{Gmin}$ are those which yield the highest value for the factor $\tan \alpha \cdot |\cos \beta|$. If tilt angle $\alpha$ is the same for the two or more azimuthal angles but they differ from 0° by different amounts, value $d_{Gmin}$ is determined by the azimuthal angle that differs the least from 0°, i.e., the smallest azimuthal angle. Similarly, when part of the p-type halo implantation is conducted at two or more azimuthal angles which differ from 180° by less than 90°, the values of angles $\alpha$ and $\beta$ for insertion into Eq. 18 are those for which factor $\tan \alpha \cdot |\cos \beta|$ yields the lowest value. If the two or more azimuthal angles differ from 180° by different amounts while tilt angle $\alpha$ is constant, value $d_{Gmin}$ is determined by the azimuthal angle that differs the least from 180°.

As indicated above, the halo implant will not perform the desired function if distance $d_G$ between the gate electrode structures is less than $d_{Gmin}$. In other words, separation distance $d_G$ and minimum value $d_{Gmin}$ should satisfy the relationship:

$$d_G \geq d_{Gmin} \qquad (19)$$

where value $d_{Gmin}$ is given by Eq. 18. Relationship 19 is employed to satisfy layout design rules for the minimum distance between gate electrodes of adjoining IGFETs in the direction of the length of each IGFET. Relationship 19 applies to the situation in which the adjoining IGFETs are of the same polarity type and have their component material exposed through a common opening in a photoresist mask. In view of what is said above, relationship 19 can also apply to the situation in which the adjoining IGFETs are of opposite polarity type and in which the halo implantation is performed selectively without the use of a photoresist mask or equivalent.

Satisfying relationship 19 applies regardless of whether the two adjoining IGFETs are laid out to have a common source/drain zone or to have adjoining source/drain zones laterally separated by part of field insulation 44. However, relationship 19 is often inherently satisfied when part of field insulation 44 laterally separates otherwise adjoining source/drain zones of the two adjacent IGFETs. Hence, specific attention must be paid to satisfying relationship 19 when the two adjacent IGFETs are laid out to have a common source/drain zone.

FIG. 34 illustrates the situation in which the gate electrode structures of the two adjacent IGFETs extend generally parallel to each other. This is the most critical situation in which relationship 19 needs to be satisfied because, if separation distance $d_G$ is less than $d_{Gmin}$, ions of the halo dopant are normally prevented from passing into the semiconductor material below the gate electrode structure of the halo-receiving IGFET along more of the width of the gate electrode structure of the halo-receiving IGFET than when the gate electrode structure of the two IGFETs are at a non-zero angle to each other. Nonetheless, if distance $d_G$ is less than $d_{Gmin}$, at least partial blockage of halo ions into the semiconductor material below the gate electrode structure of the halo-receiving IGFET can occur when the gate electrode structures of the two IGFETs are at the most severe angle, 90°, to each other. Consequently, satisfying relationship 19 is important regardless of the angle between the gate electrode structures.

Figure 35:
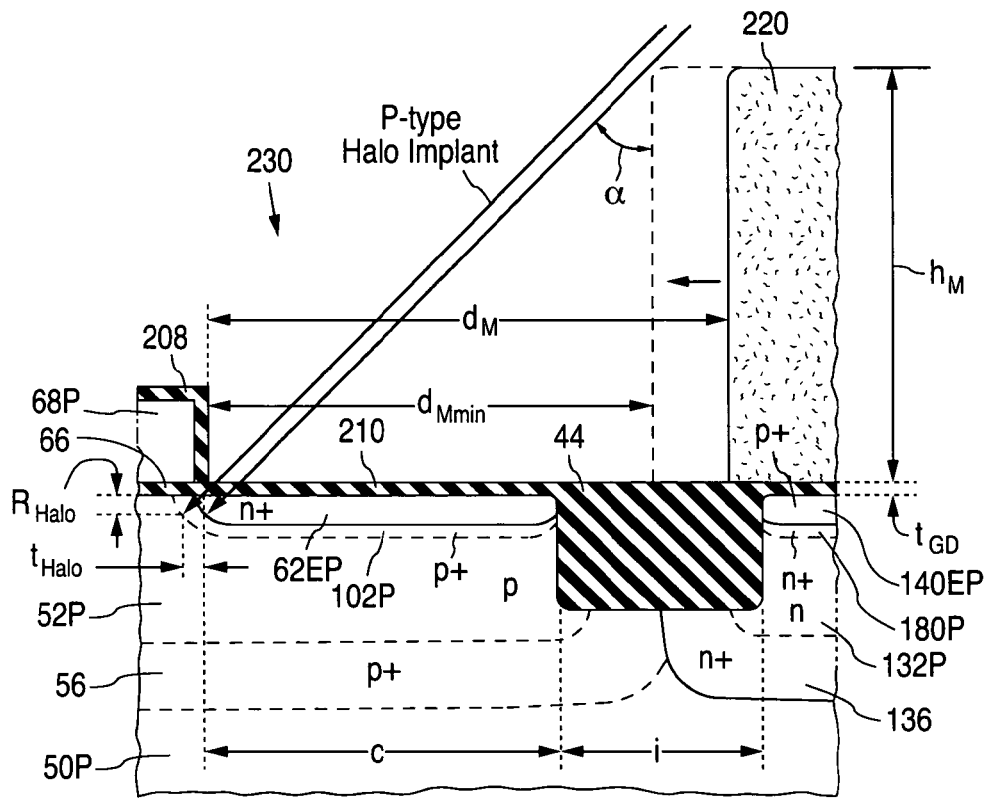
FIGS. 35 and 36 are front cross-sectional and layout views for a model of how photoresist mask shadowing affects angled halo ion implantation. The cross section of FIG. 35 is taken through plane 35-35 in FIG. 36.

Turning to shadowing effects that can arise with implantation masks such as those made of photoresist, FIG. 35 presents a simplified model of how shadowing by a photoresist mask can affect angled implantation of a halo pocket of an IGFET (again) referred to here as the halo-receiving IGFET. FIG. 36 represents a layout view of the model of FIG. 35.

Figure 36:
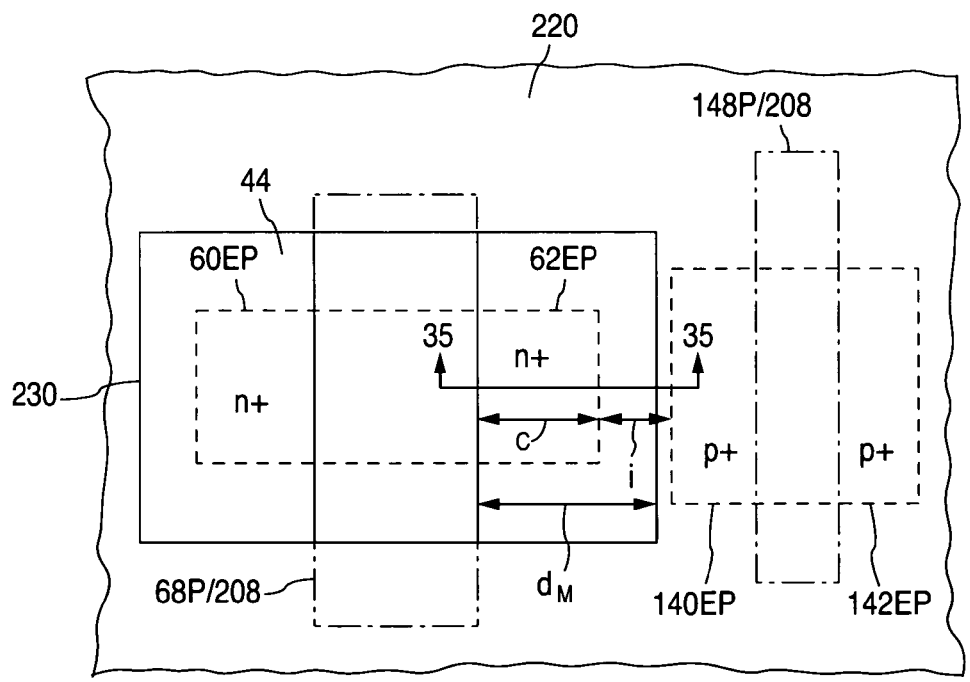

The halo-receiving IGFET in the model of FIGS. 35 and 36 is, for example, illustrated as a long n-channel device (40) but can as well be a short n-channel device (42). In either case, the photoresist mask is photoresist 220. Alternatively, the halo-receiving IGFET can be a p-channel device of the long-channel type (120) or the short-channel type (122). In this case, the photoresist mask is photoresist 212. The halo-receiving IGFET is typically symmetrical but, as discussed below, can be asymmetrical.

In the model of FIGS. 35 and 36, ions of the p-type halo dopant are being implanted at tilt angle α through an opening 230 in photoresist mask 220 to form halo pocket portion 102P of the halo-receiving IGFET. Similar to the model of FIG. 34, the model of FIGS. 35 and 36 is simplified in that the ions of the halo dopant species are assumed to impinge on photoresist mask 220 and the underlying semiconductor body at opposite azimuthal angles of 0° and 180° relative to a reference line extending in the longitudinal direction of the halo-receiving IGFET. Item $d_M$ in FIGS. 35 and 36 is the distance extending from the side of gate electrode structure 68P/208 overlying the intended location for halo pocket 102P in the longitudinal direction across the directly adjoining source/drain location to the nearest edge of photoresist mask 220. Although FIG. 35 illustrates precursor drain/extension 62EP as being present during the p-type halo implantation, extension 62EP can be created after performing the p-type halo implantation. In that case, item 62P in FIG. 35 represents the intended location of extension 62EP.

FIG. 35 illustrates what happens during angled halo implantation as a result of reducing separation distance $d_M$, i.e., bringing photoresist mask 220 closer to gate electrode structure 68P/208 of the halo-receiving IGFET, during the fabrication of photoresist 220. Due to the angled implantation, shadowing by photoresist 220 starts to significantly inhibit ions of the p-type halo dopant from entering the mono-silicon semiconductor body to form halo pocket 102P and, in particular, to form the part of pocket 102P below gate electrode structure 68P/208, when distance $d_M$ is at or below a minimum tolerable value $d_{Mmin}$. If photoresist 220 is configured so that distance $d_M$ is less than minimum value $d_{Mmin}$, the halo implantation becomes inefficient or, in the worst case, useless.

More particularly, FIG. 35 illustrates halo pocket 102P as extending fully across (the location for) source/drain extension 62EP. Depending on the value of tilt angle α and the horizontal and vertical dimensions of the features along the upper semiconductor surface, this configuration of pocket 102P can arise solely from the illustrated ion implantation from upper right to lower left or from both the implantation from upper right to lower left and the associated implantation from upper left to lower right. In any event, shadowing by photoresist mask 220 and/or gate electrode structure 68P/208 typically causes halo pocket 102P to split into a left-hand portion and a right-hand portion when distance $d_M$ is made sufficiently small. The right-hand portion is largely electrically inconsequential in the model of FIG. 35 and is not mentioned further here. The left-hand portion is, for convenience, referred to here as halo pocket 102P.

Similar to what was said above about the model of FIG. 34, further reduction in distance $d_M$ causes the length, in the longitudinal direction, of halo pocket 102P to be progressively reduced. When distance $d_M$ equals $d_{min}$, shadowing by photoresist mask 220 blocks the angled entry of ions into the semiconductor body to such an extent that halo pocket 102P underlies gate electrode structure 68P/208 but does not extend significantly laterally across (the location for) source/drain extension 62EP. Reducing distance $d_M$ below $d_{Mmin}$ causes halo pocket 102P to become smaller and eventually disappear.

Upon taking azimuthal angle β into account for the 180° azimuthal-difference assumption mentioned above in connection with the gate-shadowing model of FIG. 34, minimum value $d_{Mmin}$ is given approximately by the following relationship:

$$d_{Mmin} = (h_M + t_{GD} + R_{Halo}) \tan \alpha \cdot |\cos \beta| \tag{20}$$

where $h_M$ is the height (thickness) of the photoresist mask (220 here) above the gate dielectric layer (66 here). As with Eq. 18, it is immaterial which of the two 180° different β values is used in Eq. 20 since $|\cos(180°+\beta)|$ equals $|\cos \beta|$. Similar to what was said above in connection with Eq. 18, the factor $(t_{GD}+R_{Halo})\tan \alpha \cdot |\cos \beta|$ in Eq. 20 accounts of the lateral thickness $t_{Halo}$ of halo pocket 102P at a depth below the upper semiconductor surface equal to vertical halo range $R_{Halo}$ so that atoms of the halo dopant are present across all of thickness $t_{Halo}$. The comments made above about what values of angles α and β are to be utilized to determine minimum value $d_{Gmin}$ from Eq. 18 when part of the p-type halo implantation is performed at two or more azimuthal angles which differ from 0° by less that 90° or when part of the p-type halo implantation is performed at two or more azimuthal angles which differ from 180° by less than 90° apply to determining minimum value $d_{Mmin}$ from Eq. 20.

Eq. 20 applies, of course, to forming any halo pocket described above. Separation distance $d_M$ is then generally the distance from the gate electrode structure of the halo-receiving IGFET across the location for each source/drain zone of the halo-receiving IGFET to the photoresist mask used in the halo implantation.

As indicated above, the halo implantation will not yield the desired benefit if separation distance $d_M$ is less than $d_{Mmin}$. Alternatively stated, separation distance $d_M$ and minimum value $d_{Mmin}$ should satisfy the relationship:

$$d_M \geq d_{Mmin} \tag{21}$$

where value $d_{Mmin}$ is given by Eq. 20. Satisfying relationship 21 provides one constraint in locating the mask opening that exposes the location where the halo-receiving IGFET is being formed.

The component material of two or more like-polarity IGFETs, whose channel lengths are situated essentially end-to-end (aside from lateral separation between the channel lengths) so that the IGFETs will be generally in a straight line, may be exposed through a common opening in a photoresist mask during halo implantation of the IGFETs. The IGFETs may be laid out to variously have one or more common source/drain zones or to variously have source/drain zones laterally separated by one or more parts of field insulation 44. In such cases, relationship 20 is applied to the component material of the IGFET at each end of the line of IGFETs.

As described below in connection with FIGS. 41a, 41b, 42a, and 42b, an asymmetrical long-channel IGFET configured in accordance with the invention may have only a single halo pocket rather than two halo pockets. The single halo pocket is formed by implanting ions of the halo dopant in such a manner that the halo ions pass directly by only one of the two opposite transverse sides of the gate electrode structure of the long-channel IGFET. A halo pocket for an asymmetrical short-channel IGFET configured in accordance with the invention is formed in the same way. Although the halo pocket for the long-channel IGFET adjoins only one of its source/drain zones, the halo pocket for the short-channel IGFET normally adjoins both of its source/drain zones due to the reduced channel length.

The asymmetrical long-channel and short-channel IGFETs can be fabricated in the manner generally described in Wang et al, U.S. patent application Ser. No. 09/540,734, cited above, by appropriately controlling the photoresist mask through which the halo dopant is introduced into the semiconductor body. For this purpose, relationship 21 is applied to only one of the transverse sides of the gate electrode structure of each such asymmetrical IGFET. The complement of relationship 21, excluding the factor $(t_{GD}+R_{Halo}) \tan \alpha - |\cos \beta|$, is applied to the other transverse side of the IGFET's gate electrode structure so that halo ions do not significantly pass by that transverse side of the gate electrode structure and into the IGFET's channel zone subject to separation distance $d_M$ not being so small along that transverse side of the gate electrode structure as to significantly impair the passage of ions of the n-type source/drain extension dopant directly by that transverse side of the gate electrode structure and into the underlying monosilicon.

The model of FIGS. 35 and 36 also facilitates understanding what precautions need to be taken with a photoresist mask to avoid having angled halo implantation detrimentally affect the manufacture of another IGFET adjacent to, and of opposite polarity type to, the halo-receiving IGFET. As depicted in FIGS. 35 and 36, this situation can arise when the halo-receiving IGFET and the other IGFET, referred to here as the complementary IGFET, are arranged so that (aside from lateral separation between the channel lengths), their channel lengths are situated essentially end-to-end. Part of field insulation 44 laterally separates semiconductor material of the two IGFETs.

Inasmuch as the halo-receiving IGFET is an re-channel device in the exemplary model of FIGS. 35 and 36, the complementary IGFET is a p-channel IGFET and is illustrated as being of the long-channel type (120) but can be of the short-channel type (122). The polarities of the IGFETs can, of course, be reversed.

When the channel lengths of the halo-receiving and complementary IGFETs are arranged in the foregoing end-to-end manner and thus extend in the same direction, separation distance $d_M$ must be less than a maximum tolerable value $d_{Mmax}$ to avoid having the halo ions enter the channel zone of the complementary IGFET and damage its performance. In particular, the absolute value of threshold voltage $V_T$ of the complementary IGFET will drop below the expected value if distance $d_M$ is greater than $d_{Mmax}$.

Maximum value $d_{Mmax}$ is given approximately as:

$$d_{Mmax} = 2c + i + R_{Ext} \tan \alpha \cdot |\cos \beta| \tag{22}$$

where c is the distance from the gate electrode structure of the halo-receiving IGFET across the intended or actual location for one of its source/drain zones to field insulation 44 in the direction along the channel lengths, i is the width of the intervening part of field insulation 44 in the direction along the channel lengths, and $R_{Ext}$ is the vertical range (average depth) of the ions of the source/drain extension dopant for the complementary IGFET.

As mentioned above, the magnitude of threshold voltage $V_T$ of the complementary IGFET will be undesirably low if separation distance $d_M$ is greater than $d_{Mmax}$. Hence, separation distance $d_M$ and maximum value $d_{Mmax}$ should satisfy the relationship:

$$d_M \geq d_{Mmax} \tag{23}$$

Combining relationships 21 and 23 yields:

$$d_{Mmin} \leq d_M \leq d_{Mmax} \tag{24}$$

where values $d_{Mmin}$ and $d_{Mmax}$ are respectively given by Eqs. 20 and 22. Relationship 24 is utilized in laying out both the halo-receiving and complementary IGFETs and in determining the location of the mask opening so that the halo pocket for the halo-receiving IGFET is created properly without causing the magnitude of threshold voltage $V_T$ of the complementary IGFET to drop below the expected value.

Dopant Diffusion Effects

The alleviation of short-channel threshold voltage roll-off in IGFETs configured according to the invention has been explained above in terms of locally increasing average net channel dopant concentration $N_C$. While this explanation does conform to experimental observation, threshold voltage $V_T$ of an IGFET such as one of the present IGFETs depends specifically on the characteristics at, or very close to, the upper semiconductor surface. When semiconductor dopant of the same conductivity type as the body material of the channel zone diffuses to the upper channel surface to raise the net channel surface dopant concentration, threshold voltage $V_T$ normally generally increases according to Eq. 1 above.

By furnishing one of the present IGFETs with one or more halo pockets, the average net channel dopant concentration is increased. Independently of this, an increased amount of dopant of the same conductivity type as the IGFET's channel zone diffuses to the upper semiconductor surface. This diffusion, which causes the net channel surface dopant concentration to increase, is a primary factor behind the reverse short-channel effect reported for non-haloed IGFETs.

IGFETs fabricated in accordance with the invention display a reverse short-channel effect. That is, the magnitude of threshold voltage $V_T$ of like-polarity long-channel IGFETs manufactured according to the same, or largely the same, fabrication process of the invention decreases with increasing channel length. This is illustrated by the roll-off compensating curves in FIGS. 6 and 8 for n-channel IGFETs at channel length values of up to 1.4 μm at the low end of the long-channel regime. The reverse short-channel effect in the present IGFETs appears to arise from a combination of (a) upper-surface dopant pile-up that occurs independent of halo dopant and (b) additional upper-surface dopant pile-up due to halo dopant.

The reverse short-channel effect in the present IGFETs appears to go beyond the limits of normal diffusion. With reference to FIGS. 19a, 22, and 23, the reverse short-channel effect in IGFETs manufactured according to the invention is experimentally observed at a channel length of 10-20 μm. On the other hand, the value of channel length needed for halo pockets 100 and 102 in long-channel IGFET 40 to be laterally separated is, at most, 1 μm if only normal diffusion is involved in forming pockets 100 and 102. This indicates that dopant redistribution occurs over distances much greater than that indicated by normal diffusion at the reduced thermal budget preferably employed in fabricating the present IGFETs. In other words, the p-type halo dopant in pockets 100 and 102 appears to move closer to the channel center than what would arise from normal diffusion.

FIGS. 37 and 38 present a model that facilitates understanding the relationship between the reverse short-channel effect in the present IGFETs and dopant redistribution in their channel zones, assuming that such dopant redistribution takes place over the longer distances mentioned above. FIG. 37 illustrates a vertical cross section of half of the structure of each of three symmetrical n-channel IGFETs manufactured according to the same, or largely the same, implementation of the present fabrication process so as to be of three different channel lengths. FIG. 38 depicts the dopant profile along the upper semiconductor surface in the direction along the channel length for each of the IGFETs in FIG. 37.

The three IGFETs in FIG. 37 implement long n-channel device 40 and are respectively labeled as n-channel IGFETs 40A, 40B, and 40C along vertical planes extending through their channel centers. Channel length L decreases in going from IGFET 40A to IGFET 40C. The half structures of IGFETs 40A, 40B, and 40C respectively have halo pockets 100A, 100B, and 100C which implement halo pocket 100. Since IGFETs 40A-40C are manufactured according to the same, or largely the same, process conditions, halo pockets 100A-100C each contain largely the same amount of p-type halo dopant per unit drain width.

FIG. 38 specifically shows how net dopant concentration $N_N$ varies with longitudinal distance into the channel zone along the upper semiconductor surface for each of IGFETs 40A-40C. As indicated above, enhanced dopant diffusion is assumed to occur in each of IGFETs 40A-40C. Curve segments 100A*, 100B*, and 100C* respectively represent the net dopant concentrations of halo pockets 100A-100C along the upper semiconductor surface. Curve segment 64*, which splits into curve segments 100A*-100C*, represents the net dopant concentration of channel zone 64 along the upper semiconductor surface. Curve segment 64* has a pedestal caused by imposition of the p-type APT dopant on the background channel doping level. Inasmuch as the background channel doping level is normally much less than the surface doping level of the APT dopant, the pedestal in curve segment 64* constitutes the surface doping level of the APT dopant. Curve segments 60E* and 60M* in FIG. 38 respectively represent the net surface dopant concentrations of source/drain extension 60E and main source/drain portion 60M.

IGFET 40A represents a device of great channel length. In IGFET 40A, the p-type halo dopant initially located along each source/drain extension 60E or 62E spreads freely towards the channel center. Curve segment 100A*, representing the net surface dopant concentration of halo pocket 100A, is shaped like an asymmetric bell that ends at the pedestal level of the APT implant in moving towards the channel center. Threshold voltage $V_T$ of IGFET 40A is determined from Eq. 1 subject to average net channel dopant concentration $N_C$ in Eq. 1 being replaced with the peak value of curve segment 100A*. The peak concentration value is employed because it generally presents the higher barrier to current flow and therefore controls threshold voltage $V_T$.

As channel length L is reduced in going from IGFET 40A through IGFET 40B to IGFET 40C while still being in the long-channel regime, the fixed amount of p-type halo dopant per unit drain width at each end of channel zone 64 is confined within a progressively smaller volume. Hence, the bell shape of the halo dopant that defines halo portion 100 compresses laterally and reaches a higher peak as shown by curve segments 100B* and 100C* in FIG. 38. Using Eq. 1 to determine long-channel threshold voltage $V_{T0}$ with the peak values of curve segments 100B* and 100C* being substituted for average net channel dopant concentration $N_C$ in FIG. 1, threshold voltage $V_T$ increases in going from IGFET 40A through IGFET 40B to IGFET 40C. Alternatively stated, threshold voltage $V_T$ decreases with increasing channel length, thereby evincing the reverse short-channel effect.

In going from shortest long-channel IGFET 40C to short-channel IGFET 42 (not shown here), halo pocket 100C merges with its twin 102C (not shown) to form extended halo pocket 104 of IGFET 42. With halo dopant being present at the channel center in IGFET 42, the net surface dopant concentration along the channel center in IGFET 42 is greater than the pedestal level of the APT dopant. Because even less volume is available to contain the fixed amount of p-type halo dopant per unit drain width in IGFET 42, the peak of the net surface dopant concentration in extended halo pocket 104 is greater than the peak of curve segment 100C* for IGFET 40C. The overall value of average net channel dopant concentration $N_C$ thereby rises sufficiently to alleviate short-channel threshold voltage roll-off.

The mechanism responsible for enhancing the lateral spreading of the halo dopant appears to be pair-enhanced diffusion which takes place during the high-temperature transient of the RTA in the source/drain-halo anneal. Consider the situation in which source/drain extensions 60E and 62E are formed with arsenic. Prior to implanting arsenic to form extensions 60E and 62E, the monosilicon crystal below gate electrode 68P contains the following atomic species: (a) silicon atoms on crystal sites, (b) boron dopant atoms on substitutional sites, (c) silicon vacancies, and (d) silicon interstitials. Each of these four atomic species is present at its own level of equilibrium concentration.

Arsenic is a relatively large atom compared to boron. During the arsenic implantation to form source/drain extensions 60E and 62E, arsenic ions knock silicon atoms off their crystal sites. Silicon interstitials are thereby created at a level above the initial silicon interstitial level. In general, crystal damage caused by ion implantation increases the capability of diffusion to occur in the crystal because there are more sites for atoms to diffuse to.

During the initial part of the source/drain-halo RTA, silicon interstitials pair up with boron atoms to form (silicon interstitial)-(boron substitutional) pairs. The (silicon interstitial)-(boron substitutional) pairs diffuse through the crystal generally towards the upper semiconductor surface where a large amount of imperfections can be tolerated. Eventually, the interstitial-boron pairs break apart. The boron atoms generally settle at substitutional sites within the crystal while the silicon interstitials generally concentrate at the upper semiconductor surface.

A similar type of pair-enhanced diffusion accounts for additional lateral spreading in long p-channel IGFET 120 where the dopant atoms in the crystal lattice are n-type atoms such as phosphorus. Ions of the p-type dopant, normally boron, implanted to form source/drain zones 140 and 142 have sufficient energy to knock silicon atoms off their crystal sites and create silicon interstitials. During the source/drain-halo anneal, silicon interstitial-n-type dopant substitutional pairs are formed and diffuse through the crystal in the manner described above.

For pair-enhanced diffusion, the flux (current density) $\vec{J}_{(AI)}$ of the pairs AI of substitutional halo dopant atom A and interstitial atom I is given approximately as follows:

$$\vec{J}_{(AI)} = -D_{(AO)} \nabla (KC_{(A)}^{TOT}), \quad K > 1 \qquad (25)$$

where $D_{(AO)}$ is the equilibrium diffusion constant of halo dopant atoms A, K is a dimensionless spatially dependent parameter which describes the degree of local diffusion enhancement, and $C_{(A)}^{TOT}$ is the total single/paired concentration of halo dopant atoms A in the crystal. As indicated above, spatially dependent parameter K is greater than 1. If parameter K equaled 1, Eq. 25 would describe normal diffusion.

To simplify the analysis, assume that spatial parameter K is approximately constant. Eq. 25 than becomes:

$$\vec{J}_{(AI)} = -D_{(AO)} K \nabla C_{(A)}^{TOT}, K > 1 \qquad (26)$$

Eqs. 25 and 26 both indicate that, for pair-enhanced diffusion to take place, there must be a strong gradient in the total dopant concentration at the location where pair-enhanced diffusion is to occur. Also, pair-enhanced diffusion requires a source of silicon interstitials.

Figure 39:
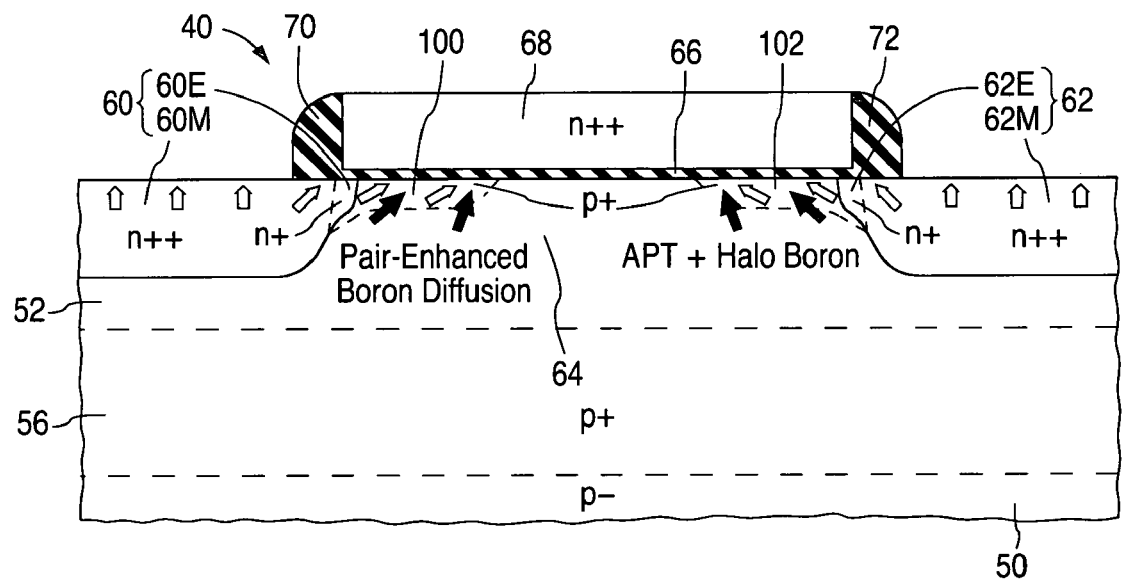
FIG. 39 is a front cross-sectional view of the long n-channel IGFET of FIG. 9a in which pair-enhanced diffusion of boron occurs.

FIG. 39 presents a model of how pair-enhanced boron diffusion in long n-channel IGFET 40 accounts for greater lateral boron halo diffusion. In source/drain extensions 60E and 62E which respectively adjoin halo pockets 100 and 102 in IGFET 40, ion implantation of the n-type source/drain extension dopant, typically arsenic, causes extensions 60E and 62E to have a high concentration of silicon interstitials. The n-type source/drain extension dopant in extensions 60E and 62E has a strong vertical gradient towards the upper semiconductor surface. The silicon interstitials, either alone or paired with boron atoms, move toward the upper semiconductor surface.

In the channel-zone material along the pn junction between upper body-material portion 52 and each source/drain extension 60E or 62E, the silicon interstitials move vertically to available upper semiconductor surface sites, including those located laterally far into the intended channel-zone location and thus far from the junction between body-material portion 52 and each extension 60E or 62E. This leads to an angled flux of silicon interstitials towards the channel center and upper surface of the intended channel zone as shown in FIG. 39. Due to the p-type halo and APT implants, an angled flux of boron halo dopant occurs in generally the same direction and towards the same location. Pair-enhanced diffusion of boron thereby takes place over abnormally long distances towards the channel center and upper semiconductor surface.

Near the channel center of IGFET 40, normal diffusion occurs with the head of the p-type APT dopant. Since the APT dopant is implanted relatively deep into p-type body material 50 and since the normal APT dopant atoms, boron, are relatively small, the APT implant produces a relatively small amount of silicon interstitials. The APT boron dopant near the channel center undergoes relatively little pair-enhanced diffusion. Referring to FIG. 38, the dopant profile along the upper semiconductor surface near the channel center reaches the pedestal level produced by the APT dopant.

Figure 40A:
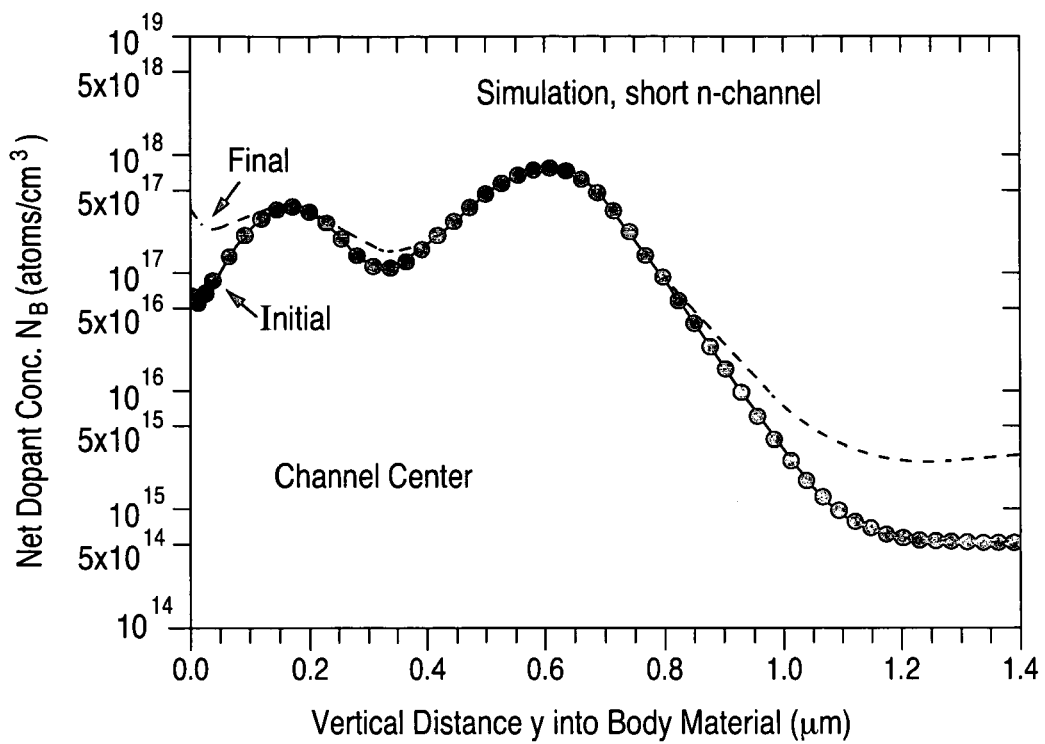
FIGS. 40a and 40b are exemplary graphs of net dopant concentration as a function of vertical distance into the body material along vertical planes respectively situated near a source/drain zone and extending through the channel center for computer simulations of a symmetrical short n-channel IGFET manufactured according to the invention.
Figure 40B:
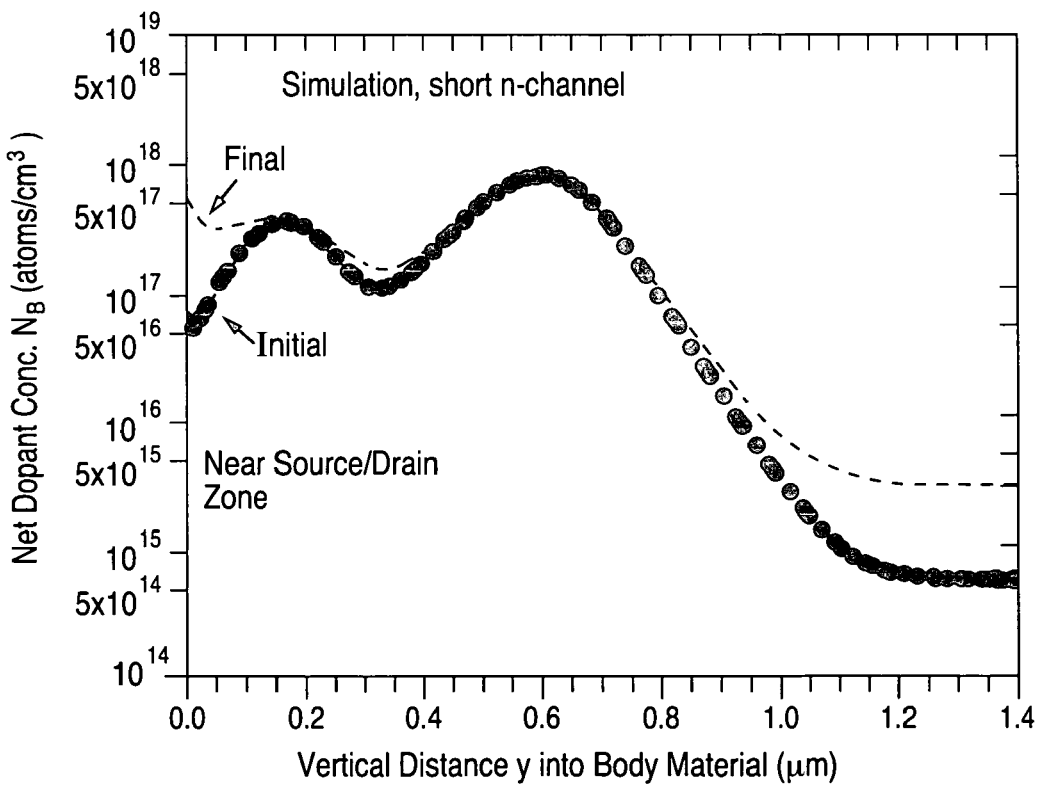

For comparison purposes, FIGS. 40a and 40b present a computer simulation of the vertical dopant profiles for a short n-channel IGFET of process design Z in the first lot of experimental wafers. FIG. 40a is taken along the channel center. FIG. 40b is taken along a location near a source/drain zone. Since the IGFET in FIGS. 40a and 40b is a short-channel device corresponding to short n-channel IGFET 42, the halo and APT dopants are both present at the channel center and along the source/drain zone location.

FIGS. 40a and 40b illustrate how the p-type halo doping operation and the source/drain-halo RTA affect the vertical dopant profile in the short n-channel IGFET of design Z. The curves marked "Initial" represent the vertical dopant profiles directly after formation of seal-oxide layer 208 and thus prior to the introduction of the p-type halo dopant and the n-type source/drain extension dopant into the semiconductor body. The curves marked "Final" represent the vertical dopant profiles directly after the source/drain-halo RTA and thus after the p-type halo doping operation. As FIG. 40a indicates, the net dopant concentration in the channel zone along the upper semiconductor surface is roughly $4 \times 10^{17}$ atoms/cm$^3$ at the channel center and greater near each source/drain zone. This enables threshold voltage $V_T$ of the simulated n-channel IGFET to be approximately 0.4 V.

Silicon interstitials can be produced by mechanisms other than introducing semiconductor dopant into a semiconductor body. For example, atoms of the semiconductor material, silicon here, can be implanted into the silicon semiconductor body to form silicon interstitials. The advantage of using silicon atoms, or other non-dopant atoms, to produce silicon interstitials is that the total content of the dopant in the crystal is not changed. The energy and dosage of the silicon implants are determined in accordance with the parameters of the APT implant.

Asymmetrical IGFETs

The fabrication process of FIG. 16 can be directly utilized, or readily modified, to fabricate asymmetrical IGFETs according to the invention. Although the source/drain zones of a symmetrical IGFET can typically switch efficiently between functioning as source and functioning as drain, one of the source/drain zones of an asymmetrical IGFET normally functions permanently as the source while the other source/drain zone normally functions permanently as the drain. An asymmetrical IGFET typically provides higher drive current at the same leakage current than a comparable symmetrical IGFET.

Figure 41A:
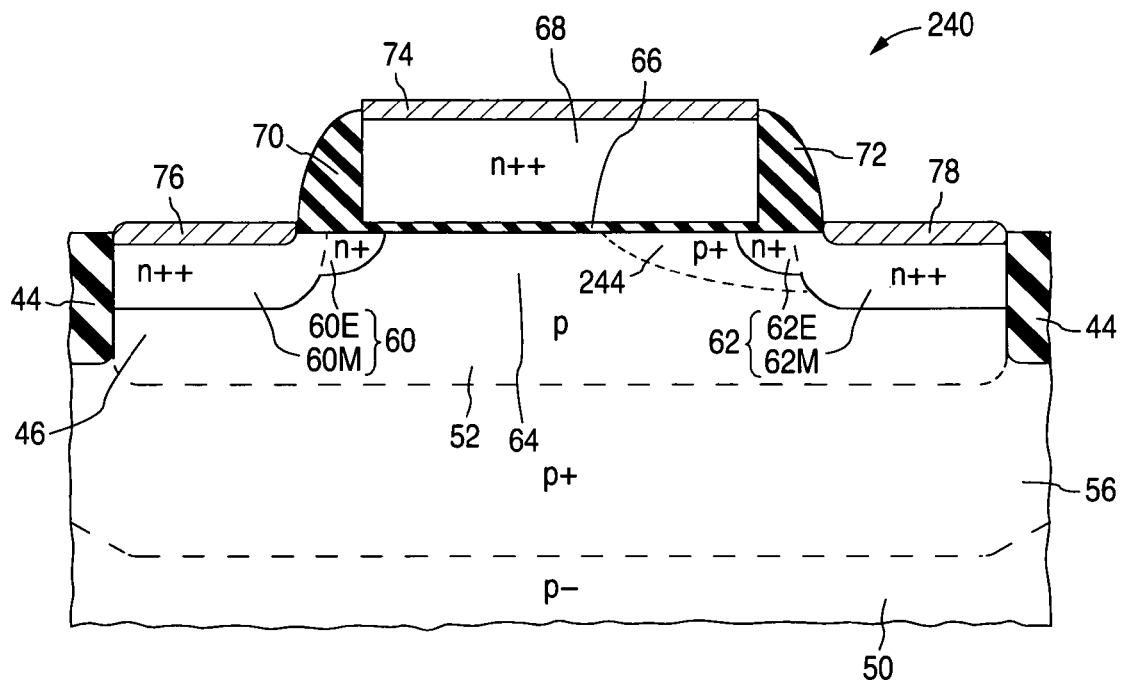
FIGS. 41a and 41b are front cross-sectional views of respective asymmetrical long and short n-channel IGFETs configured and manufactured according to the invention.
Figure 41B:
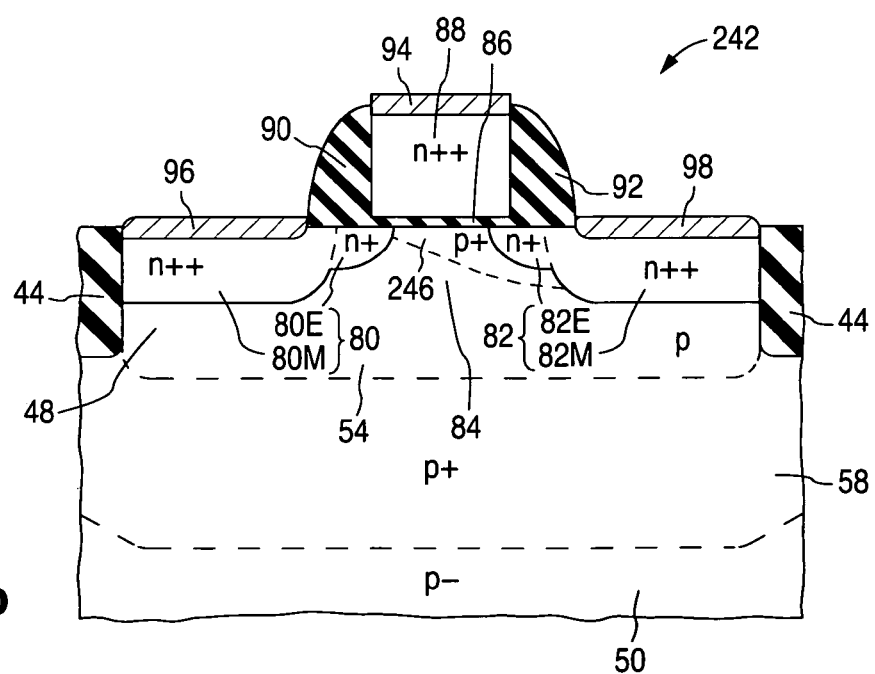

FIGS. 41a and 41b respectively illustrate asymmetrical n-channel IGFETs 240 and 242 configured according to the invention. IGFET 240 is a long-channel device arranged the same as long-channel IGFET 40 except that the p-type halo implant for IGFET 240 is performed in such a way that IGFET 240 has only a single halo pocket portion 244 situated along source/drain zone 62 rather than symmetrical halo pocket portions 100 and 102 situated respectively along source/drain zones 60 and 62. Similarly, IGFET 242 is a short-channel device arranged the same as short-channel IGFET 42 except that the halo implant for IGFET 242 is performed so that IGFET 242 has a single asymmetrical halo pocket portion 246 situated primarily along source-drain zone 82 rather than extended halo pocket portion 104 situated symmetrically along source/drain zones 80 and 82. Halo pocket 246 extends fully across channel zone 84 in short-channel IGFET 42 and adjoins source/drain zone 80 along a smaller area than where halo pocket 246 adjoins source/drain zone 82.

Asymmetrical IGFETs 240 and 242 may be part of the same overall semiconductor structure and thus are manufactured according to the same-fabrication process. Alternatively, IGFETs 240 and 242 may be part of separately fabricated, and therefore different, semiconductor structures. In the latter case, largely the same fabrication process is employed to manufacture IGFETs 240 and 242. The semiconductor structure or structures containing IGFET 240 and/or IGFET 242 typically contains p-channel IGFETs, including one or more asymmetrical p-channel IGFETs configured in a similar, but complementary, manner to n-channel IGFETs 240 and 242. Also, the semiconductor structure or structures containing IGFET 240 and/or IGFET 242 may include one or more symmetrical n-channel IGFETs 40 and 42 and symmetrical p-channel IGFETs 120 and 122.

Figure 42A:
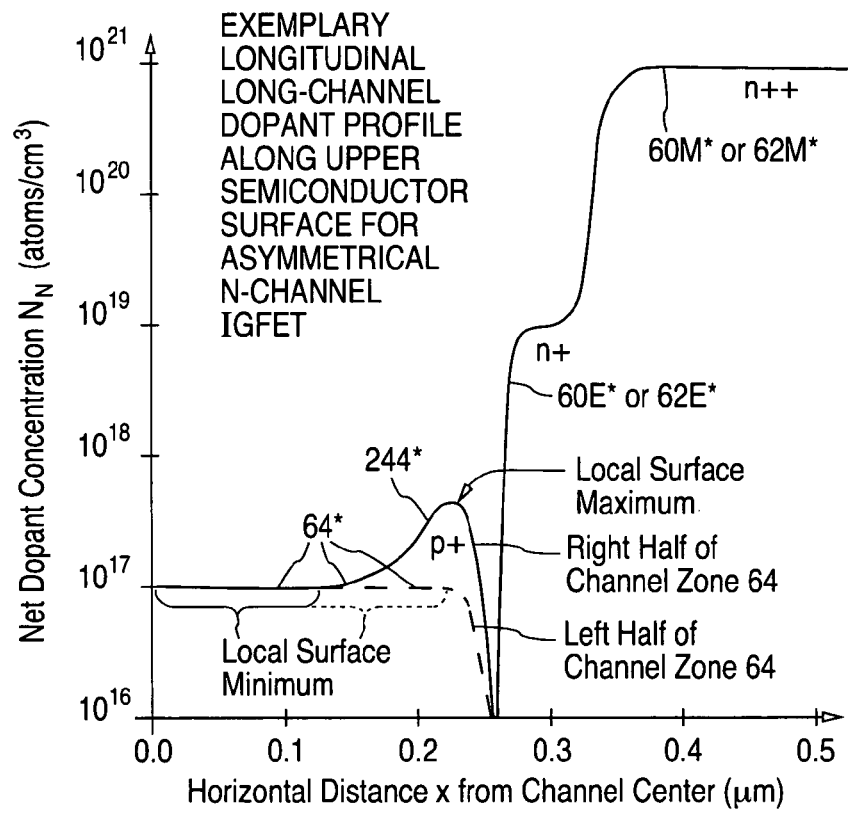
FIGS. 42a and 42b are exemplary graphs of net dopant concentration as a function of longitudinal horizontal distance from the channel center for the respective long and short n-channel IGFETs of FIGS. 41a and 41b.

The net dopant concentration of channel zone 64 in long-channel IGFET 240 reaches a local surface minimum along the upper semiconductor surface in the longitudinal direction at a location between source/drain zones 60 and 62. In this regard, FIG. 42*a* presents an example of how net dopant concentration $N_N$ in IGFET 240 varies along the upper semiconductor surface in the longitudinal direction. Aside from the difference caused by the presence of single halo pocket 244 rather than symmetrical halo pockets 100 and 102, the surface dopant profile in FIG. 42*a* for IGFET 240 is substantially the same as the surface dopant profile in FIG. 10*a* for IGFET 40. Horizontal distance x in FIG. 42*a* is measured the same as in FIG. 10*a*. Curve segment 244\* in FIG. 42*a* represents the net dopant concentration in halo pocket 244 along the upper semiconductor surface.

The solid-line portion of curve segment 64\* in FIG. 42*a* represents the net surface dopant concentration in the right half of channel zone 64 from the channel center to source/drain zone 62. Part of the solid-line portion of curve segment 64\* is also marked 244\* since halo pocket 244 lies in the right half of channel zone 64. The dashed-line portion of curve segment 64\* in FIG. 42*a* represents the net surface dopant concentration in the left half of channel zone 64 from the channel center to source/drain zone 60.

The longitudinal local surface minimum in the net dopant concentration of channel zone 64 for IGFET 240 occurs in an upper semiconductor surface portion situated between halo pocket 244 and source/drain zone 60. As indicated by the flat portion of the solid-line and dashed-line portions of curve segment 64\* in FIG. 42*a*, the net dopant concentration of channel zone 64 for IGFET 240 is approximately constant at the longitudinal local surface minimum along a non-zero portion of an imaginary line (not shown) extending longitudinally from the channel center along the upper semiconductor surface toward each source/drain zone 60 or 62. Accordingly, the net dopant concentration of channel zone 64 in IGFET 240 is approximately constant at the longitudinal local surface minimum along a non-zero portion of a longer imaginary line (likewise, not shown) extending longitudinally between source/drain zones 60 and 62 along the upper semiconductor surface. One end of the non-zero portion of the longer line terminates at halo pocket 244. The other end of the non-zero portion of the longer line terminates close to source/drain zone 60.

As indicated by the solid-line portion of curve segment 64\* in FIG. 42*a*, the net surface dopant concentration of channel zone 64 in IGFET 240 increases in moving away from the location of the local surface minimum longitudinally toward source/drain zone 62 and longitudinally reaches a local surface maximum close to source/drain extension 62E. The longitudinal local surface maximum in the net surface dopant concentration of channel zone 64 of IGFET 42 is, of course, caused by halo pocket 244. In moving from the location of the local surface minimum longitudinally toward source/drain zone 60, the net surface dopant concentration in channel zone 64 of IGFET 240 drops to zero upon reaching source/drain zone 60. This is indicated by the dashed-line part of curve segment 64\* in FIG. 42*a*. Hence, the surface dopant profile in channel zone 64 of IGFET 240 is longitudinally shaped like a long half saddle.

Figure 42B:
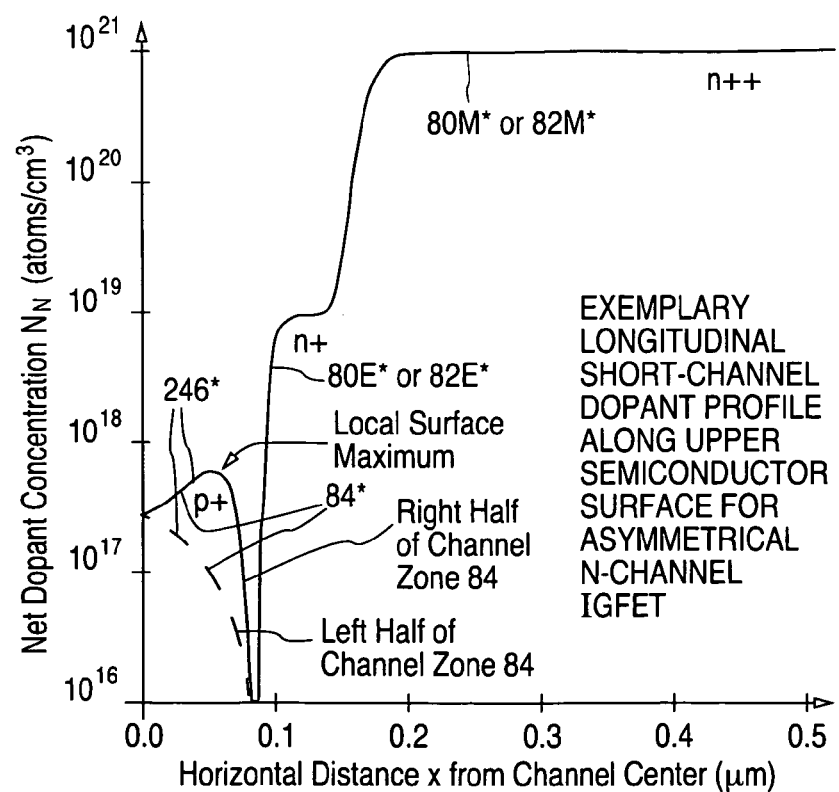

Along the upper semiconductor surface, the net dopant concentration of channel zone 84 in short-channel IGFET 242 has a longitudinal shape that basically constitutes the limit of the net surface dopant concentration of channel zone 64 in long-channel IGFET 240 as the channel length is made quite small. In this regard, FIG. 42*b* presents an example of how net dopant concentration $N_N$ in short-channel IGFET 42 varies along the upper semiconductor surface in the longitudinal direction. Aside from differences caused by the presence of asymmetrical halo pocket 246 rather than symmetrical extended halo pocket 104, the surface dopant profile in FIG. 42*b* for IGFET 242 is substantially the same as the surface dopant profile in FIG. 10*b* for IGFET 42. Horizontal distance x in FIG. 42*b* is measured the same as in FIG. 10*b*. Curve segment 246\* in FIG. 42*b* represents the net dopant concentration in halo pocket 246 along the upper semiconductor surface.

The solid-line portion of curve segment 84\* in FIG. 42*b* represents the net surface dopant concentration in the right half of channel zone 84 from the channel center to source/drain zone 82. The dashed-line portion of curve segment 84\* in FIG. 42*b* represents the net surface dopant concentration in the left half of channel zone 84 from the channel center to source/drain zone 80. Curve segment 84\* is also labeled 246\* since halo pocket 246 extends fully across channel zone 84.

As indicated by the solid-line and dashed-line portions of curve segment 84\* in FIG. 42*b*, the net surface dopant concentration of channel zone 84 in IGFET 242 longitudinally reaches a local surface maximum along the upper semiconductor surface at a location near source/drain zone 82 and longitudinally decreases in going from the location of the longitudinal local surface minimum toward source/drain zone 80. The longitudinal local surface maximum in the net surface dopant concentration of channel zone 84 in IGFET 242 is, of course, caused by halo pocket 246. Unlike long-channel IGFET 240, the net dopant concentration of channel zone 84 in short-channel IGFET 242 normally does not longitudinally reach a local surface minimum along the upper semiconductor surface between source/drain zones 80 and 82.

The p-type halo implant for asymmetrical IGFET 240 or 242 is performed so that the halo ions pass directly by only one of the opposite transverse sides of the IGFET's then-existent gate electrode structure (68P/208 or 88P/208) and into the underlying monosilicon to form halo pocket 244 or 246. In the example of FIG. 41*a* or 41*b*, the halo ions pass directly by only the right-hand transverse side of the then-existent gate electrode structure of IGFET 240 or 242. A suitable technique is employed to prevent the halo ions from passing directly by the other transverse side of the IGFET's then-existent gate electrode structure.

The mask-control technique disclosed in Wang et al, U.S. patent application Ser. No. 09/540,734, cited above, can be utilized to form halo pocket 244 or 246 when the p-type halo implantation is performed by angled implantation. In this case, the shape of opening 230 in photoresist mask 220 is controlled in the manner described above in connection with Eq. 21 and the immediately following material so that ions of the p-type halo dopant pass directly by only one of the opposite transverse sides of the then-existent gate electrode structure of IGFET 240 or 242 without significantly impairing the ability of the ions of the n-type source/drain extension dopant to pass directly by both transverse sides of the then-existent gate electrode structure of IGFET 240 or 242 and into the underlying monosilicon to form a source/drain extensions 60E and 62E or 80E and 82E.

The preceding mask-control technique is likewise employed when the semiconductor structure is to contain one or more asymmetrical long or short p-channel IGFETs configured in a similar, but complementary, manner to n-channel IGFET 240 or 242. By fabricating the asymmetrical IGFETs as described here, one or more of symmetrical IGFETs 40, 42, 120, and 122 can be readily incorporated into a semiconductor structure containing one or more of asymmetrical n-channel IGFETs 240 and 242 and their asymmetrical p-channel counterparts.

Asymmetrical IGFET 242 achieves short-channel threshold voltage roll-off compensation in largely the same way as symmetrical IGFET 42. When IGFET 242 is provided in the same semiconductor structure as IGFET 42, the dosage of the p-type halo ions impinging on the upper semiconductor surface area allocated for IGFET 242 is approximately the same as the dosage of the p-type halo ions impinging on the upper semiconductor area allocated for IGFET 42. Since the p-type halo ions pass directly by only one of the transverse sides of the then-existent gate electrode structure of IGFET 242, the total amount of p-type halo dopant in channel zone 84 of IGFET 242 per unit drain width is typically approximately half the total amount of p-type halo dopant in channel zone 84 of IGFET 42 per unit drain width. At the same short-channel value of channel length L, the total increase in average net channel dopant concentration $N_C$ for IGFET 242 is thus approximately half the total increase in concentration $N_C$ for IGFET 42. This may lead to a slight difference in the short-channel threshold voltage roll-off compensation between IGFETs 242 and 42. Asymmetrical IGFET 242 will normally have a slightly lower threshold voltage than symmetrical IGFET 42.

When asymmetrical IGFET 242 is formed in the same semiconductor structure as symmetrical IGFET 42, a blocking mask can be placed over the upper semiconductor surface area allocated for IGFET 42 during part of the p-type halo implantation. By appropriately choosing the amount of p-type halo dopant blocked from entering channel zone 84 of IGFET 42, IGFETs 242 and 42 can achieve roughly the same amount of short-channel threshold voltage roll-off compensation at the same channel length. IGFETs 242 and 42 should then have roughly the same threshold voltage.

Asymmetrical IGFET 240 or 242 is typically utilized in the situation where one of source/drain zones 60 and 62 or 80 and 82 permanently serves as the source, while the other of source/drain zones 60 and 62 or 80 and 82 permanently serves as the drain. In this case, halo pocket 244 or 246 is normally placed along the source. The same applies to asymmetrical long and short p-channel IGFETs configured in a similar, but complementary, manner to n-channel IGFETs 240 and 242.

IGFETs 240 and 242 can be modified to include the p-type isolation dopant of IGFETs 110 and 120. The same likewise applies to the asymmetrical p-channel counterparts of n-channel IGFETs 240 and 242. Short-channel threshold voltage roll-off is alleviated in such isolation-dopant variations of n-channel IGFETs 240 and 242 and their asymmetrical p-channel counterparts in substantially the same way as in asymmetrical IGFETs 240 and 242 and thus in largely the same way as in symmetrical IGFETs 40 and 42.

Variations

While the invention has been described with reference to particular embodiments, this description is solely for the purpose of illustration and is not to be construed as limiting the scope of the invention claimed below. For example, in a situation where one of the source/drain zones of an IGFET serves permanently as the source while the other source/drain zone serves permanently as the drain, a source/drain extension zone in an IGFET of the invention may only be provided as part of the drain so that the IGFET is an asymmetrical device. If the IGFET is also asymmetrical in that ions of the halo dopant of the IGFET pass directly by only one of the transverse sides of the IGFET's then-existent gate electrode structure during the halo implantation, a halo pocket portion for the IGFET is then normally present only along, or primarily along, the source.

Any of the IGFETs configured according to the invention may, subject to what is stated above, generally be present in the same semiconductor structure as any other IGFET configured according to the invention regardless of (a) whether the two IGFETs are of the same or opposite polarity type, (b) the channel lengths of the IGFETs, and (c) the symmetrical/asymmetrical nature of the IGFETs. Similarly, a capability for manufacturing any two IGFETs configured according to the invention may be incorporated into an implementation of the present fabrication process regardless of whether the two IGFETs are actually present in any single semiconductor structure manufactured according to the invention.

The present semiconductor structure may include like-polarity IGFETs whose channel lengths extend approximately perpendicular to each other. In that case, the angled halo ion implantation for the IGFETs may include two additional parts performed at suitable azimuthal orientations, normally opposite to each other, i.e., 180° apart, and typically respectively perpendicular, i.e., at 90°, to the other two parts of the angled implantation. When the azimuthal angles for the four parts of the halo implantation respectively differ from 0°, 90°, 180° and 270° relative to a reference line extending in the longitudinal direction of one of the IGFETs, the angled ion implantation at each consecutive pair of azimuthal angles typically at least partially overcomes transverse halo asymmetry that would otherwise result from utilizing only two opposite ones of the azimuthal angles. In such a case, preferred values for the azimuthal angles may be 45°, 135°, 225°, and 315°.

The fabrication process of the invention can be combined with one or more other process modules to produce semiconductor structures having gate dielectric layers of two or more significantly different thicknesses. Taking note that the fabrication process of FIG. 16 at a nominal gate dielectric thickness of 4 nm forms a low-voltage process module, a high-voltage process module at a greater nominal gate dielectric thickness, e.g., 7 nm, can be combined with the fabrication process of FIG. 16 at the nominal gate dielectric thickness of 4 nm. Various modifications and applications may thus be made by those skilled in the art without departing from the true scope and spirit of the invention as defined in the appended claims.

We claim:

1. A method of fabricating first and second opposite-polarity field-effect transistors from a semiconductor body having (i) first body material of a first conductivity type and (ii)

second body material of a second conductivity type opposite to the first conductivity type, the method comprising:

separately introducing (i) first, second, and third body-material semiconductor dopants of the first conductivity type into the first body material such that the three body-material dopants of the first conductivity type reach respective maximum dopant concentrations at three respective materially different locations in the first body material and (ii) first and second body-material semiconductor dopants of the second conductivity type into the second body material such that the two body-material dopants of the second conductivity type reach respective maximum dopant concentrations at two respective materially different locations in the second body material;

subsequently defining (i) a gate electrode for the first transistor above, and vertically separated by gate dielectric material for the first transistor from, a portion of the first body material intended to be a channel zone for the first transistor and (ii) a gate electrode for the second transistor above, and vertically separated by gate dielectric material for the second transistor from, a portion of the second body material intended to be a channel zone for the second transistor; and subsequently introducing (i) further semiconductor dopant of the second conductivity type into the semiconductor body to form a pair of source/drain zones of the second conductivity type for the first transistor laterally separated by its channel zone and (ii) further semiconductor dopant of the first conductivity type into the semiconductor body to form a pair of source/drain zones of the first conductivity type for the second transistor laterally separated by its channel zone such that, upon completion of fabrication of the transistors, (a) the semiconductor body has an upper surface to which the channel and source/drain zones extend, (b) the location of the maximum concentration of each body-material dopant of the first conductivity type extends continuously laterally so as to underlie at least part of each of the first transistor's source/drain zones below the body's upper surface, and (c) the location of the maximum concentration of each body-material dopant of the second conductivity type extends continuously laterally so as to underlie at least part of each of the second transistor's source/drain zones below the body's upper surface.

2. A method as in claim 1 wherein the separately introducing act includes introducing third body-material semiconductor dopant of the second conductivity type into the second body material such that, upon completion of fabrication of the transistors, (a) the third body-material dopant of the second conductivity type reaches a maximum dopant concentration at a materially different location in the second body material than the locations of the maximum concentrations of the other two body-material dopants of the second conductivity type and (b) the location of the maximum concentration of the third body-material dopant of the second conductivity type also extends continuously laterally so as to underlie at least part of each of the second transistor's source/drain zones below the body's upper surface.

3. A method as in claim 1 wherein, upon completion of fabrication of the transistors, (a) the first body material has a net dopant concentration that reaches three vertically separate local subsurface maxima along an imaginary line that extends generally perpendicular to the body's upper surface through the first transistor's channel zone and into underlying matter of the first body material and (b) the three local subsurface maxima in the net dopant concentration of the first body material respectively largely occur along the locations of the maximum concentrations of the first, second, and third dopants of the first conductivity type.

4. A method as in claim 3 wherein, upon completion of fabrication of the transistors, the net dopant concentration of the first body material decreases in moving both upward and downward away from the location of the maximum concentration of each of the first, second, and third dopants of the first conductivity type.

5. A method as in claim 3 wherein, upon completion of fabrication of the transistors, (a) the second body material has a net dopant concentration that reaches two vertically separate local subsurface maxima along an imaginary line that extends generally perpendicular to the body's upper surface through the second transistor's channel zone and into underlying matter of the second body material and (b) the two local subsurface maxima in the net dopant concentration of the second body material respectively largely occur along the locations of the maximum concentrations of the first and second dopants of the second conductivity type.

6. A method as in claim 5 wherein, upon completion of fabrication of the transistors, the net dopant concentration of the second body material decreases in moving both upward and downward away from the location of the maximum concentration of each of the first and second dopants of the second conductivity type.

7. A method as in claim 1 wherein, upon completion of fabrication of the transistors, the location of the maximum concentration of each of the first, second, and third dopants of the first conductivity type underlies substantially all of each of the first transistor's source/drain zones.

8. A method as in claim 7 wherein, upon completion of fabrication of the transistors, the location of the maximum concentration of each of the first and second dopants of the second conductivity type underlies substantially all of each of the second transistor's source/drain zones.

9. A method as in claim 1 wherein (i) the introduction of the first, second, and third dopants of the first conductivity type during the separately introducing act comprises ion implanting the first, second, and third dopants of the first conductivity type and (ii) the introduction of the first and second dopants of the second conductivity type during the separately introducing act comprises ion implanting the first and second dopants of the second conductivity type.

10. A method as in claim 1 further including, subsequent to the act of defining the gate electrodes, introducing additional semiconductor dopant of the first conductivity type into at least the intended channel-zone portion of the first body material such that, upon completion of fabrication of the transistors, the additional dopant of the first conductivity type has a dopant concentration which, in the first transistor's channel zone along the body's upper surface, longitudinally reaches a first local surface minimum at a location between the first transistor's source/drain zones.

11. A method as in claim 10 wherein, upon completion of fabrication of the transistors, the concentration of the additional dopant of the first conductivity type increases in moving along the body's upper surface from the location of the first local surface minimum toward each of the first transistor's source/drain zones.

12. A method as in claim 10 wherein, upon completion of fabrication of the transistors, the concentration of the additional dopant of the first conductivity type increases in moving along the body's upper surface from the location of the first local surface minimum toward only one of the first transistor's source/drain zones.

13. A method as in claim 10 further including, subsequent to the act of defining the gate electrodes, introducing additional semiconductor dopant of the second conductivity type into at least the intended channel-zone portion of the second body material such that, upon completion of fabrication of the transistors, the additional dopant of the second conductivity type has a dopant concentration which, in the second transistor's channel zone along the body's upper surface, longitudinally reaches a second local surface minimum at a location between the second transistor's source/drain zones.

14. A method as in claim 13 wherein, upon completion of fabrication of the transistors, the concentration of the additional dopant of the first conductivity type increases in moving along the body's upper surface from the location of the first local surface minimum toward each of the first transistor's source/drain zones.

15. A method as in claim 14 wherein, upon completion of fabrication of the transistors, the concentration of the additional dopant of the second conductivity type increases in moving along the body's upper surface from the location of the second local surface minimum toward each of the second transistor's source/drain zones.

16. A method as in claim 14 wherein, upon completion of fabrication of the transistors, the concentration of the additional dopant of the second conductivity type increases in moving along the body's upper surface from the location of the second local surface minimum toward only one of the second transistor's source/drain zones.

17. A method as in claim 13 wherein, upon completion of fabrication of the transistors, the concentration of the additional dopant of the first conductivity type increases in moving along the body's upper surface from the location of the first local surface minimum toward only one of the first transistor's source/drain zones.

18. A method as in claim 17 wherein, upon completion of fabrication of the transistors, the concentration of the additional dopant of the second conductivity type increases in moving along the body's upper surface from the location of the second local surface minimum toward each of the second transistor's source/drain zones.

19. A method as in claim 17 wherein, upon completion of fabrication of the transistors, the concentration of the additional dopant of the second conductivity type increases in moving along the body's upper surface from the location of the second local surface minimum toward only one of the second transistor's source/drain zones.

20. A method as in claim 1 further including, subsequent to the act of defining the gate electrodes, introducing additional semiconductor dopant of the second conductivity type into at least the intended channel-zone portion of the second body material such that, upon completion of fabrication of the transistors, the additional dopant of the second conductivity type has a dopant concentration which, in the second transistor's channel zone along the body's upper surface, longitudinally reaches a local surface minimum at a location between the second transistor's source/drain zones.

21. A method as in claim 20 wherein, upon completion of fabrication of the transistors, the concentration of the additional dopant of the second conductivity type increases in moving along the body's upper surface from the location of the local surface minimum toward each of the second transistor's source/drain zones.

22. A method as in claim 20 wherein, upon completion of fabrication of the transistors, the concentration of the additional dopant of the second conductivity type increases in moving along the body's upper surface from the location of the local surface minimum toward only one of the second transistor's source/drain zones.

23. A method as in claim 1 wherein the act of introducing the further dopant of the second conductivity type for forming the first transistor's source/drain zones comprises:
   introducing first further semiconductor dopant of the second conductivity type through an opening in a first mask, through the body's then-existent upper surface, and into a pair of laterally separated primary segments of the semiconductor body using the first mask, the first transistor's gate electrode, and any material along the first transistor's gate electrode as a dopant-blocking shield;
   providing first spacer material to the transverse sides of the first transistor's gate electrode; and
   introducing second further semiconductor dopant of the second conductivity type through an opening in a second mask, through the body's then-existent upper surface, and into a pair of laterally separated further segments of the semiconductor body using the second mask, the first transistor's gate electrode, and the first spacer material as a dopant-blocking shield.

24. A method as in claim 23 further including introducing additional semiconductor dopant of the first conductivity type through the opening in the first mask into at least the intended channel-zone portion of the first body material using the first mask, the first transistor's gate electrode, and any material along the first transistor's gate electrode as a dopant-blocking shield such that, upon completion of fabrication of the transistors, the additional dopant of the first conductivity type has a dopant concentration which, in the first transistor's channel zone along the body's upper surface, longitudinally reaches a local surface minimum at a location between the first transistor's source/drain zones.

25. A method as in claim 23 wherein the act of introducing the further dopant of the first conductivity type for forming the second transistor's source/drain zones comprises:
   introducing first further semiconductor dopant of the first conductivity type through an opening in a third mask, through the body's then-existent upper surface, and into a pair of laterally separated primary segments of the semiconductor body using the third mask, the second transistor's gate electrode, and any material along the second transistor's gate electrode as a dopant-blocking shield;
   providing second spacer material to the transverse sides of the second transistor's gate electrode; and
   introducing second further semiconductor dopant of the first conductivity type through an opening in a fourth mask, through the body's then-existent upper surface, and into a pair of laterally separated further segments of the semiconductor body using the fourth mask, the second transistor's gate electrode, and the second spacer material as a dopant-blocking shield.

26. A method as in claim 25 further including introducing additional semiconductor dopant of the second conductivity type through the opening in the third mask into at least the intended channel-zone portion of the second body material using the third mask, the second transistor's gate electrode, and any material along the second transistor's gate electrode as a dopant-blocking shield such that, upon completion of fabrication of the transistors, the additional dopant of the second conductivity type has a dopant concentration which, in the second transistor's channel zone along the body's upper surface, longitudinally reaches a local surface minimum at a location between the second transistor's source/drain zones.

27. A method as in claim 25 further including introducing additional semiconductor dopant of the first conductivity type through the opening in the first mask into at least the intended channel-zone portion of the first body material using the first mask, the first transistor's gate electrode, and any material along the first transistor's gate electrode as a dopant-blocking shield such that, upon completion of fabrication of the transistors, the additional dopant of the first conductivity type has a dopant concentration which, in the first transistor's channel zone along the body's upper surface, longitudinally reaches a local surface minimum at a location between the first transistor's source/drain zones.

28. A method as in claim 27 further including introducing additional semiconductor dopant of the second conductivity type through the opening in the third mask into at least the intended channel-zone portion of the second body material using the third mask, the second transistor's gate electrode, and any material along the second transistor's gate electrode as a dopant-blocking shield such that, upon completion of fabrication of the transistors, the additional dopant of the second conductivity type has a dopant concentration which, in the second transistor's channel zone of the second transistor along the body's upper surface, longitudinally reaches a local surface minimum at a location between the second transistor's source/drain zones.

29. A method of fabricating first and second opposite-polarity field-effect transistors from a semiconductor body having (i) first body material of a first conductivity type and (ii) second body material of a second conductivity type opposite to the first conductivity type, the method comprising:

separately introducing (i) first, second, and third body-material semiconductor dopants of the first conductivity type into the first body material such that the three body-material dopants of the first conductivity type reach respective maximum dopant concentrations at three respective materially different locations in the first body material and (ii) first and second body-material semiconductor dopants of the second conductivity type into the second body material such that the two body-material dopants of the second conductivity type reach respective maximum dopant concentrations at two respective materially different locations in the second body material;

subsequently defining (i) a gate electrode for the first transistor above, and vertically separated by gate dielectric material for the first transistor from, a portion of the first body material intended to be a channel zone for the first transistor and (ii) a gate electrode for the second transistor above, and vertically separated by gate dielectric material for the second transistor from, a portion of the second body material intended to be a channel zone for the second transistor; and subsequently introducing (i) further semiconductor dopant of the second conductivity type into the semiconductor body to form a pair of source/drain zones of the second conductivity type for the first transistor laterally separated by its channel zone and (ii) further semiconductor dopant of the first conductivity type into the semiconductor body to form a pair of source/drain zones of the first conductivity type for the second transistor laterally separated by its channel zone such that, upon completion of fabrication of the transistors, (a) the semiconductor body has an upper surface to which the channel and source/drain zones extend, (b) a pair of channel surface depletion regions extend along the body's upper surface respectively into the channel zones so as to reach respective maximum thicknesses at respective locations in the channel zones, (c) the location of the maximum concentration of each of the three body-material dopants of the first conductivity type occurs below the location of the first transistor's channel surface depletion region at its maximum thickness, (d) the location of the maximum concentration of each of the two body-material dopants of the second conductivity type occurs below the location of the second transistor's channel surface depletion region at its maximum thickness, (e) each of the two deepest ones of the locations of the maximum concentrations of the three body-material dopants of the first conductivity type extends continuously laterally so as to underlie at least part of each of the first transistor's source/drain zones, and (f) the deepest one of the locations of the maximum concentrations of the two body-material dopants of the second conductivity type extends continuously laterally so as to underlie at least part of each of the second transistor's source/drain zones.

30. A method as in claim 29 wherein, upon completion of fabrication of the transistors, (a) the shallowest one of the locations of the maximum concentrations of the three body-material dopants of the first conductivity type extends continuously laterally so as to underlie at least part of each of the first transistor's source/drain zones and (b) the shallowest one of the locations of the maximum concentrations of the two body-material dopants of the second conductivity type extends continuously laterally so as to underlie at least part of each of the second transistor's source/drain zones.

31. A method as in claim 29 wherein the separately introducing act includes introducing third body-material semiconductor dopant of the second conductivity type into the second body material such that, upon completion of fabrication of the transistors, (a) the third body-material dopant of the second conductivity type reaches a maximum dopant concentration at a materially different location in the second body material than the locations of the maximum concentrations of the first and second body-material dopants of the second conductivity type and (b) the location of the maximum concentrations of the third body-material dopant of the second conductivity type extends continuously laterally so as to underlie at least part of each of the second transistor's source/drain zones.

32. A method as in claim 31 wherein, upon completion of fabrication of the transistors, (a) the shallowest one of the locations of the maximum concentrations of the three body-material dopants of the first conductivity type extends continuously laterally so as to underlie at least part of each of the first transistor's source/drain zones and (b) the shallowest one of the locations of the maximum concentrations of the three body-material dopants of the second conductivity type extends continuously laterally so as to underlie at least part of each of the second transistor's source/drain zones.

33. A method as in claim 29 wherein, upon completion of fabrication of the transistors, (a) the first body material has a net dopant concentration that reaches three vertically separate local subsurface maxima along an imaginary line that extends generally perpendicular to the body's upper surface through the first transistor's channel zone and into underlying matter of the first body material and (b) the three local subsurface maxima in the net dopant concentration of the first body material respectively largely occur along the locations of the maximum concentrations of the first, second, and third dopants of the first conductivity type.

34. A method as in claim 33 wherein, upon completion of fabrication of the transistors, the net dopant concentration of the first body material decreases in moving both upward and downward away from the location of the maximum concentration of each of the first, second, and third dopants of the first conductivity type.

35. A method as in claim 33 wherein, upon completion of fabrication of the transistors, (a) the second body material has a net dopant concentration that reaches two vertically separate local subsurface maxima along an imaginary line that extends generally perpendicular to the body's upper surface through the second transistor's channel zone and into underlying matter of the second body material and (b) the two local subsurface maxima in the net dopant concentration of the second body material respectively largely occur along the locations of the maximum concentrations of the first and second dopants of the second conductivity type.

36. A method as in claim 35 wherein, upon completion of fabrication of the transistors, the net dopant concentration of the second body material decreases in moving both upward and downward away from the location of the maximum concentration of each of the first and second dopants of the second conductivity type.

37. A method as in claim 29 wherein, upon completion of fabrication of the transistors, the location of the maximum concentration of each of the first, second, and third dopants of the first conductivity type underlies substantially all of each of the first transistor's source/drain zones.

38. A method as in claim 37 wherein, upon completion of fabrication of the transistors, the location of the maximum concentration of each of the first and second dopants of the second conductivity type underlies substantially all of each of the second transistor's source/drain zones.

39. A method as in claim 29 wherein (i) the introduction of the first, second, and third dopants of the first conductivity type during the separately introducing act comprises ion implanting the first, second, and third dopants of the first conductivity type and (ii) the introduction of the first and second dopants of the second conductivity type during the separately introducing act comprises ion implanting the first and second dopants of the second conductivity type.

40. A method as in claim 29 further including, subsequent to the act of defining the gate electrodes, introducing additional semiconductor dopant of the first conductivity type into at least the intended channel-zone portion of the first body material such that, upon completion of fabrication of the transistors, the additional dopant of the first conductivity type has a dopant concentration which, in the first transistor's channel zone along the body's upper surface, longitudinally reaches a first local surface minimum at a location between the first transistor's source/drain zones.

41. A method as in claim 40 wherein, upon completion of fabrication of the transistors, the concentration of the additional dopant of the first conductivity type increases in moving along the body's upper surface from the location of the first local surface minimum toward each of the first transistor's source/drain zones.

42. A method as in claim 40 wherein, upon completion of fabrication of the transistors, the concentration of the additional dopant of the first conductivity type increases in moving along the body's upper surface from the location of the first local surface minimum toward only one of the first transistor's source/drain zones.

43. A method as in claim 40 further including, subsequent to the act of defining the gate electrodes, introducing additional semiconductor dopant of the second conductivity type into at least the intended channel-zone portion of the second body material such that, upon completion of fabrication of the transistors, the additional dopant of the second conductivity type has a dopant concentration which, in the second transistor's channel zone along the body's upper surface, longitudinally reaches a second local surface minimum at a location between the second transistor's source/drain zones.

44. A method as in claim 43 wherein, upon completion of fabrication of the transistors, the concentration of the additional dopant of the first conductivity type increases in moving along the body's upper surface from the location of the first local surface minimum toward each of the first transistor's source/drain zones.

45. A method as in claim 44 wherein, upon completion of fabrication of the transistors, the concentration of the additional dopant of the second conductivity type increases in moving along the body's upper surface from the location of the second local surface minimum toward each of the second transistor's source/drain zones.

46. A method as in claim 44 wherein, upon completion of fabrication of the transistors, the concentration of the additional dopant of the second conductivity type increases in moving along the body's upper surface from the location of the second local surface minimum toward only one of the second transistor's source/drain zones.

47. A method as in claim 43 wherein, upon completion of fabrication of the transistors, the concentration of the additional dopant of the first conductivity type increases in moving along the body's upper surface from the location of the first local surface minimum toward only one of the first transistor's source/drain zones.

48. A method as in claim 47 wherein, upon completion of fabrication of the transistors, the concentration of the additional dopant of the second conductivity type increases in moving along the body's upper surface from the location of the second local surface minimum toward each of the second transistor's source/drain zones.

49. A method as in claim 47 wherein, upon completion of fabrication of the transistors, the concentration of the additional dopant of the second conductivity type increases in moving along the body's upper surface from the location of the second local surface minimum toward only one of the second transistor's source/drain zones.

50. A method as in claim 29 further including, subsequent to the act of defining the gate electrodes, introducing additional semiconductor dopant of the second conductivity type into at least the intended channel-zone portion of the second body material such that, upon completion of fabrication of the transistors, the additional dopant of the second conductivity type has a dopant concentration which, in the second transistor's channel zone along the body's upper surface, longitudinally reaches a local surface minimum at a location between the second transistor's source/drain zones.

51. A method as in claim 50 wherein, upon completion of fabrication of the transistors, the concentration of the additional dopant of the second conductivity type increases in moving along the body's upper surface from the location of the local surface minimum toward each of the second transistor's source/drain zones.

52. A method as in claim 50 wherein, upon completion of fabrication of the transistors, the concentration of the additional dopant of the second conductivity type increases in moving along the body's upper surface from the location of the local surface minimum toward only one of the second transistor's source/drain zones.

* * * * *